US012612507B1

(12) United States Patent
Bartlett

(10) Patent No.: US 12,612,507 B1
(45) Date of Patent: Apr. 28, 2026

(54) PROGRAMMABLE LIQUID METAL MICROSTRUCTURES FOR MULTIFUNCTIONAL SOFT THERMAL COMPOSITES AND METHODS FOR MAKING SAME

(71) Applicant: Iowa State University Research Foundation, Inc., Ames, IA (US)

(72) Inventor: Michael D. Bartlett, Blacksburg, VA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 325 days.

(21) Appl. No.: 17/660,972

(22) Filed: Apr. 27, 2022

Related U.S. Application Data

(60) Provisional application No. 63/201,410, filed on Apr. 28, 2021.

(51) Int. Cl.
| | |
|---|---|
| *H01B 1/22* | (2006.01) |
| *C08J 3/20* | (2006.01) |
| *C08J 3/24* | (2006.01) |
| *C08K 3/08* | (2006.01) |
| *H05K 1/02* | (2006.01) |
| *H05K 1/09* | (2006.01) |

(52) U.S. Cl.
CPC ................. *C08K 3/08* (2013.01); *C08J 3/203* (2013.01); *C08J 3/24* (2013.01); *H01B 1/22* (2013.01); *H05K 1/0283* (2013.01); *H05K 1/095* (2013.01); *C08J 2300/26* (2013.01); *C08K 2201/001* (2013.01); *H05K 2201/0314* (2013.01)

(58) Field of Classification Search
CPC ...... C08K 3/08; C08K 2201/001; C08J 3/203; C08J 3/24; C08J 2300/26; H01B 1/22; H05K 1/0283; H05K 1/095; H05K 2201/0314
See application file for complete search history.

(56) References Cited

U.S. PATENT DOCUMENTS

| | | | |
|---|---|---|---|
| 9,173,979 B2 | 11/2015 | Kelly et al. | |
| 2017/0218167 A1 | 8/2017 | Majidi et al. | |
| 2020/0362218 A1* | 11/2020 | Kazem | ...................... B22F 9/06 |

FOREIGN PATENT DOCUMENTS

| | | | | |
|---|---|---|---|---|
| WO | WO-2019136252 A1 * | 7/2019 | ............. | C08G 77/04 |

OTHER PUBLICATIONS

US 10,912,680 B2, 02/2021, Griffin et al. (withdrawn)
Programmable Liquid Metal Microstructures for Multifunctional Soft Thermal Composites, Haque et al., Adv. Funct. Mater. 2020, 30, 2000832.*
Bartlett et al., "High thermal conductivity in soft elastomers with elongated liquid metal inclusions," PNAS, Feb. 28, 2017, vol. 114, No. 9, pp. 2143-2148.
Dinachali et al., "Thermo-Solvent Annealing of Polystyrene-Polydimethylsiloxane Block Copolymer Thin Films," ACS Macro Letters, Apr. 17, 2015, vol. 4, pp. 500-504.
Dinachali et al., "Supporting Information: Thermo-Solvent Annealing of Polystyrene-Polydimethylsiloxane Block Copolymer Thin Films," ACS Macro Letter, Apr. 17, 2015, vol. 4, 2 pages.
Haque et al., "Programmable Liquid Metal Microstructures for Multifunctional Soft Thermal Composites," Advanced Functional Materials, Jun. 18, 2020, vol. 30, No. 2000832, pp. 1-8.
Jeong et al., "Mechanically Stretchable and Electrically Insulating Thermal Elastomer Composite by Liquid Alloy Droplet Embedment," Scientific Reports, Dec. 16, 2015, vol. 5, No. 18257, pp. 1-10.
Musil et al., "Hard Nanocomposite Coatings," Comprehensive Materials Processing, Apr. 7, 2014, vol. 4, pp. 325-353.
Pogrebnjak et al., "Hard Nanocomposite Coatings, Their Structure and Properties," Nanocomposites—New Trends and Developments, Sep. 27, 2012, pp. 123-160.
Tutika et al., "Mechanical and Functional Trade-offs in Multiphase Liquid Metal, Solid Particle Soft Composites," Author Manuscript, Advanced Functional Materials, Sep. 4, 2018, vol. 28, Issue 45, pp. 1-7.

* cited by examiner

*Primary Examiner* — Haidung D Nguyen
(74) *Attorney, Agent, or Firm* — McKee, Voorhees & Sease, PLC

(57) ABSTRACT

Soft, elastically deformable composites of multifunctional materials for electronics, robotics, and reconfigurable structures. Liquid metal (LM) droplets dispersed in elastomer matrices has unique combinations of soft mechanical response with exceptional electrical and thermal functionalities. These properties are strongly dependent on the material composition and microstructure. Control of LM microdroplet morphology to program mechanical and functional properties is by annealed-deformation shaping LM droplets in soft composites to create programmable microstructures in stress-free materials. Thermo-mechanical shaping is one example of annealed-deformation shaping. This enables LM loadings up to 70% by volume with prescribed particle aspect ratios and orientation, enabling control of microstructure throughout the bulk of the material. Through this microstructural control in soft composites, a material which simultaneously achieves a thermal conductivity as high as 13.0 W m$^{-1}$ K$^{-1}$ (>70× increase over polymer matrix) with low modulus (<1.0 MPa) and high stretchability (>750% strain) is demonstrated in stress-free conditions.

18 Claims, 119 Drawing Sheets
(119 of 119 Drawing Sheet(s) Filed in Color)

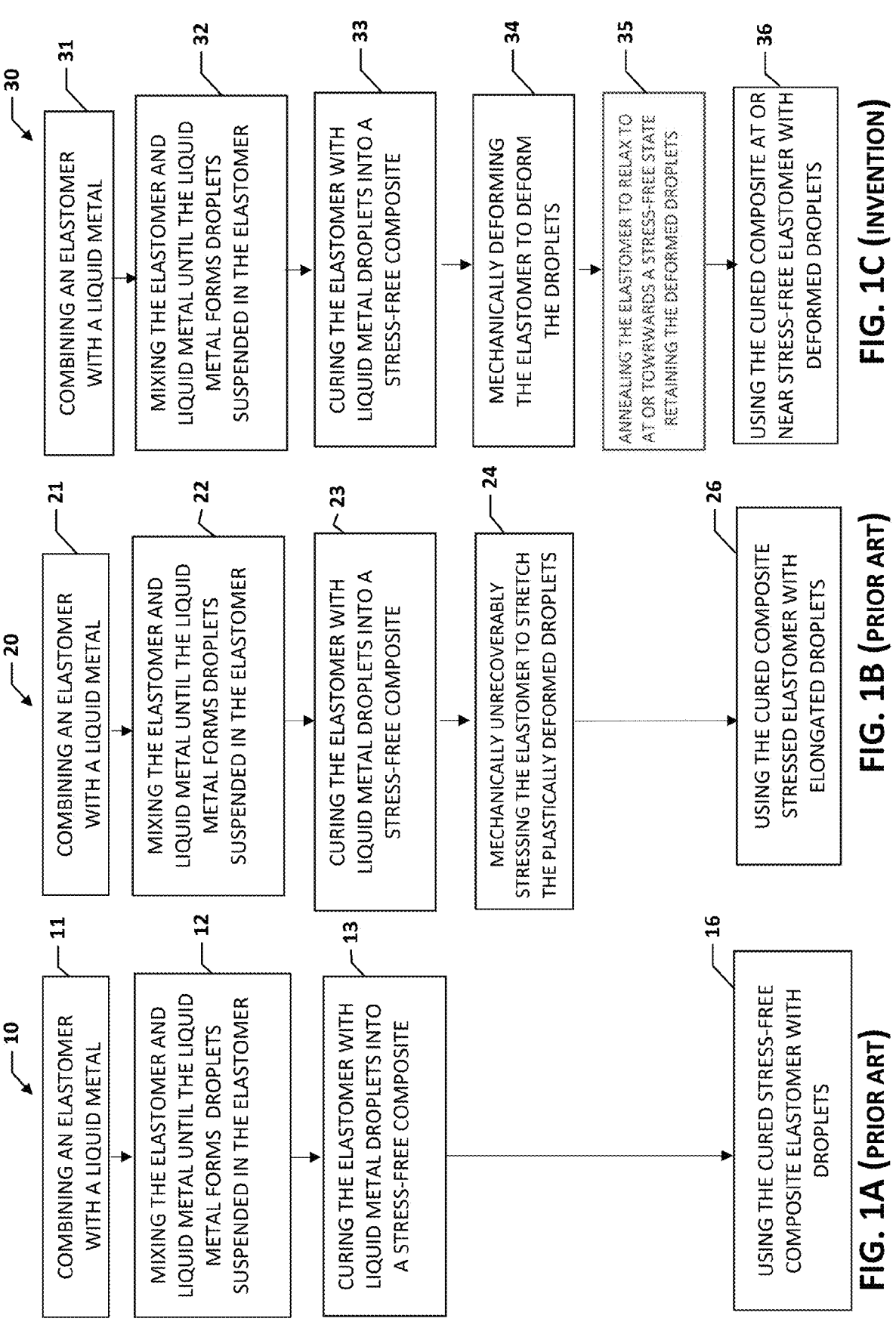

FIG. 1C (INVENTION)

30

31 COMBINING AN ELASTOMER WITH A LIQUID METAL

32 MIXING THE ELASTOMER AND LIQUID METAL UNTIL THE LIQUID METAL FORMS DROPLETS SUSPENDED IN THE ELASTOMER

33 CURING THE ELASTOMER WITH LIQUID METAL DROPLETS INTO A STRESS-FREE COMPOSITE

34 MECHANICALLY DEFORMING THE ELASTOMER TO DEFORM THE DROPLETS

35 ANNEALING THE ELASTOMER TO RELAX TO AT OR TOWARDS A STRESS-FREE STATE RETAINING THE DEFORMED DROPLETS

36 USING THE CURED COMPOSITE AT OR NEAR STRESS-FREE ELASTOMER WITH DEFORMED DROPLETS

21 COMBINING AN ELASTOMER WITH A LIQUID METAL

22 MIXING THE ELASTOMER AND LIQUID METAL UNTIL THE LIQUID METAL FORMS DROPLETS SUSPENDED IN THE ELASTOMER

23 CURING THE ELASTOMER WITH LIQUID METAL DROPLETS INTO A STRESS-FREE COMPOSITE

24 MECHANICALLY UNRECOVERABLY STRESSING THE ELASTOMER TO STRETCH THE PLASTICALLY DEFORMED DROPLETS

26 USING THE CURED COMPOSITE STRESSED ELASTOMER WITH ELONGATED DROPLETS

11 COMBINING AN ELASTOMER WITH A LIQUID METAL

12 MIXING THE ELASTOMER AND LIQUID METAL UNTIL THE LIQUID METAL FORMS DROPLETS SUSPENDED IN THE ELASTOMER

13 CURING THE ELASTOMER WITH LIQUID METAL DROPLETS INTO A STRESS-FREE COMPOSITE

16 USING THE CURED STRESS-FREE COMPOSITE ELASTOMER WITH DROPLETS

Supplemental Information 39 (30%)

37

39 (70%)

37

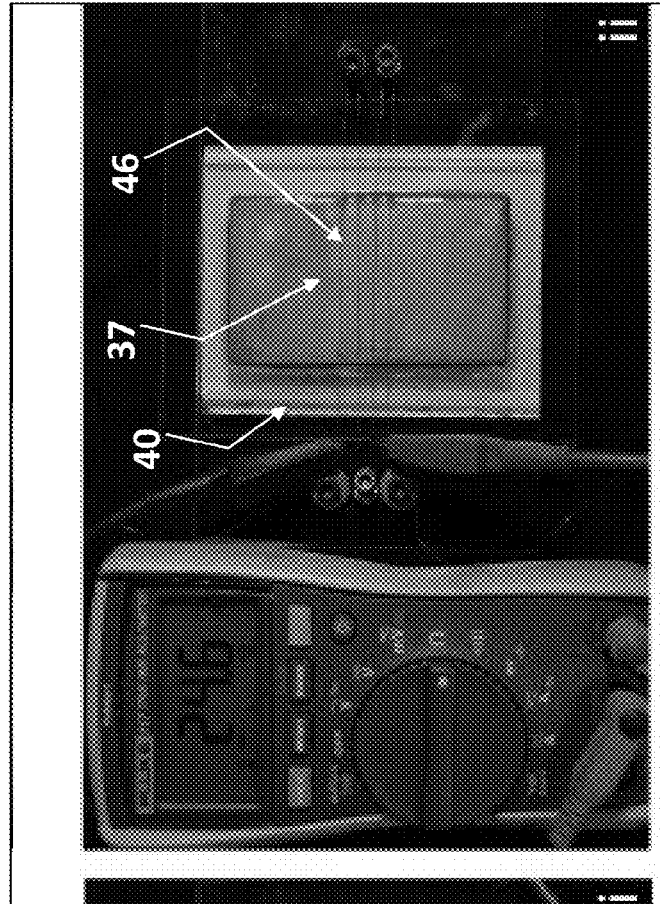
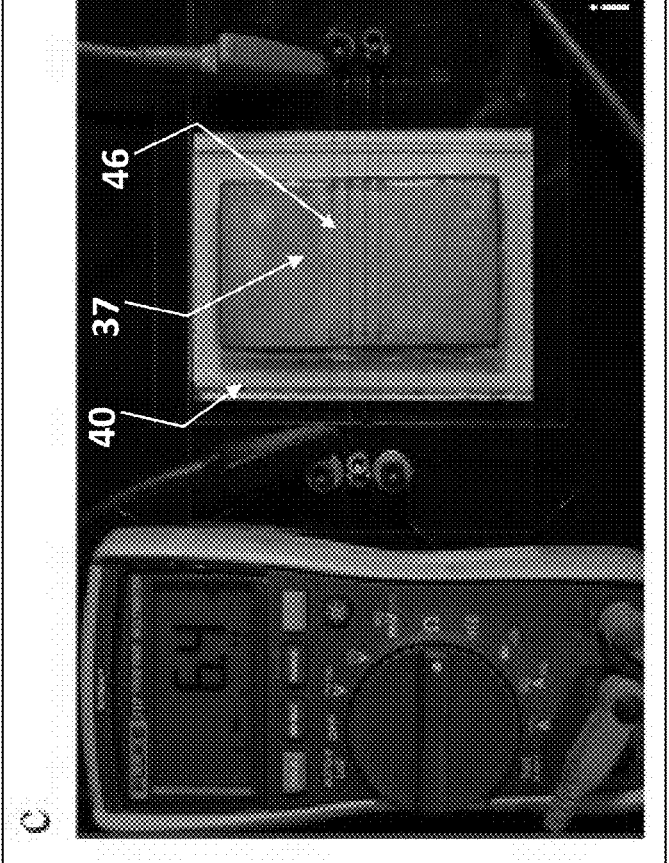
FIG. 11C

Figure 15A:
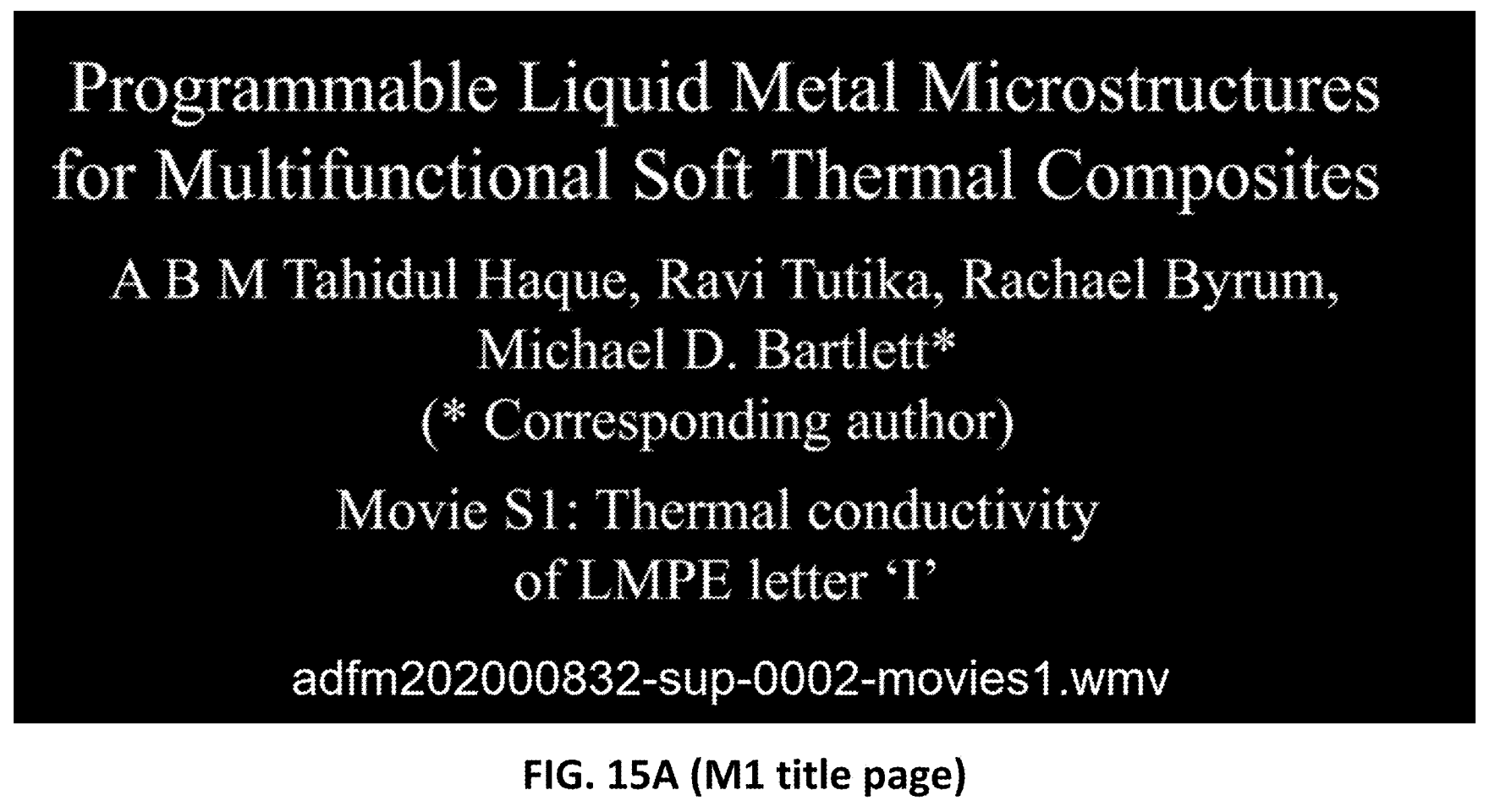

Programmable Liquid Metal Microstructures for Multifunctional Soft Thermal Composites A B M Tahidul Haque, Ravi Tutika, Rachael Byrum, Michael D. Bartlett*

(* Corresponding author)

Movie S1: Thermal conductivity of LMPE letter 'I' adfm202000832-sup-0002-movies1.wmv

FIG. 15A (M1 title page)

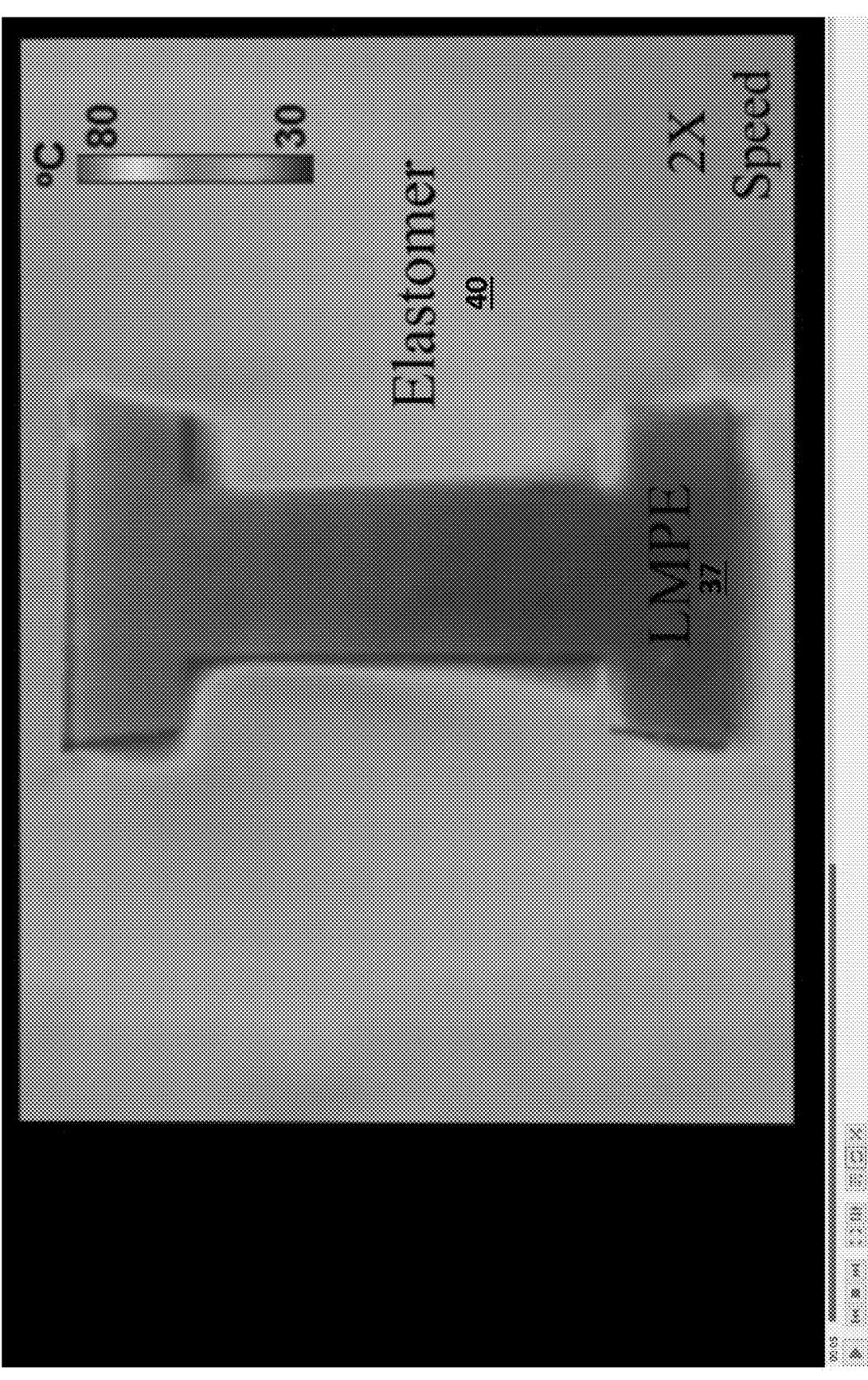
FIG. 15B (M1 @ 5 seconds (s))

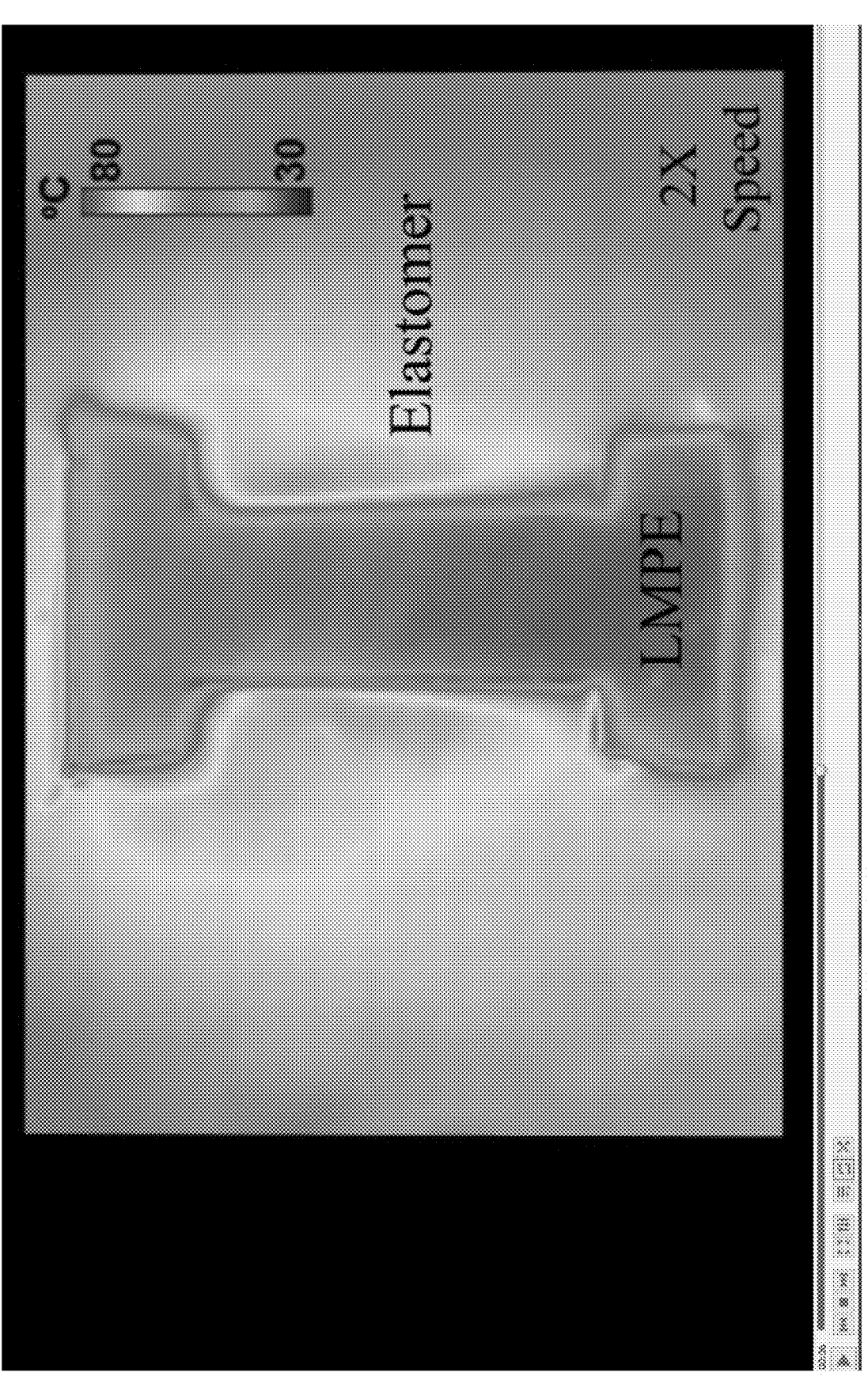
FIG. 15C (M1 @ 6s)

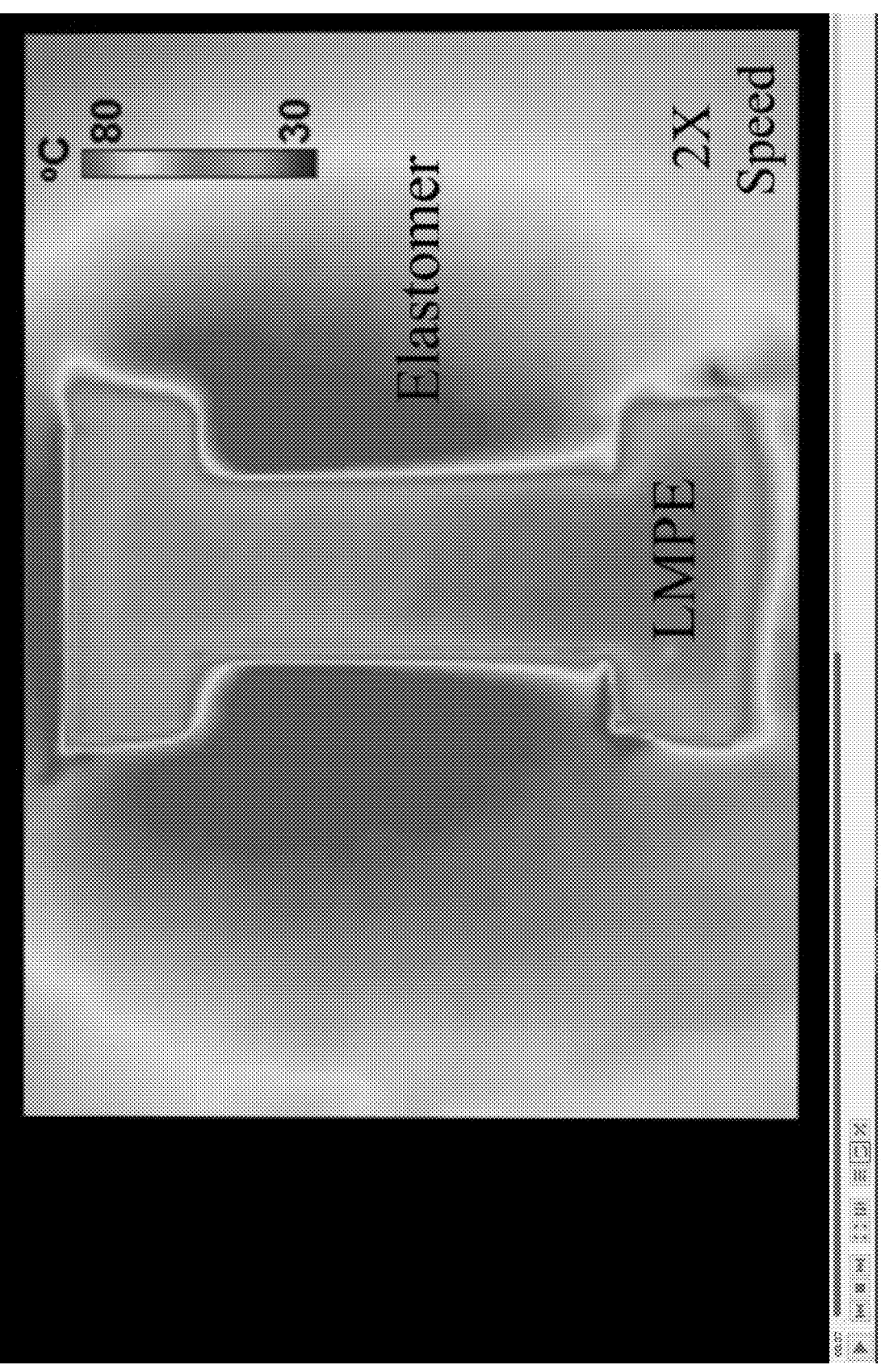
FIG. 15D (M1 @ 7s)

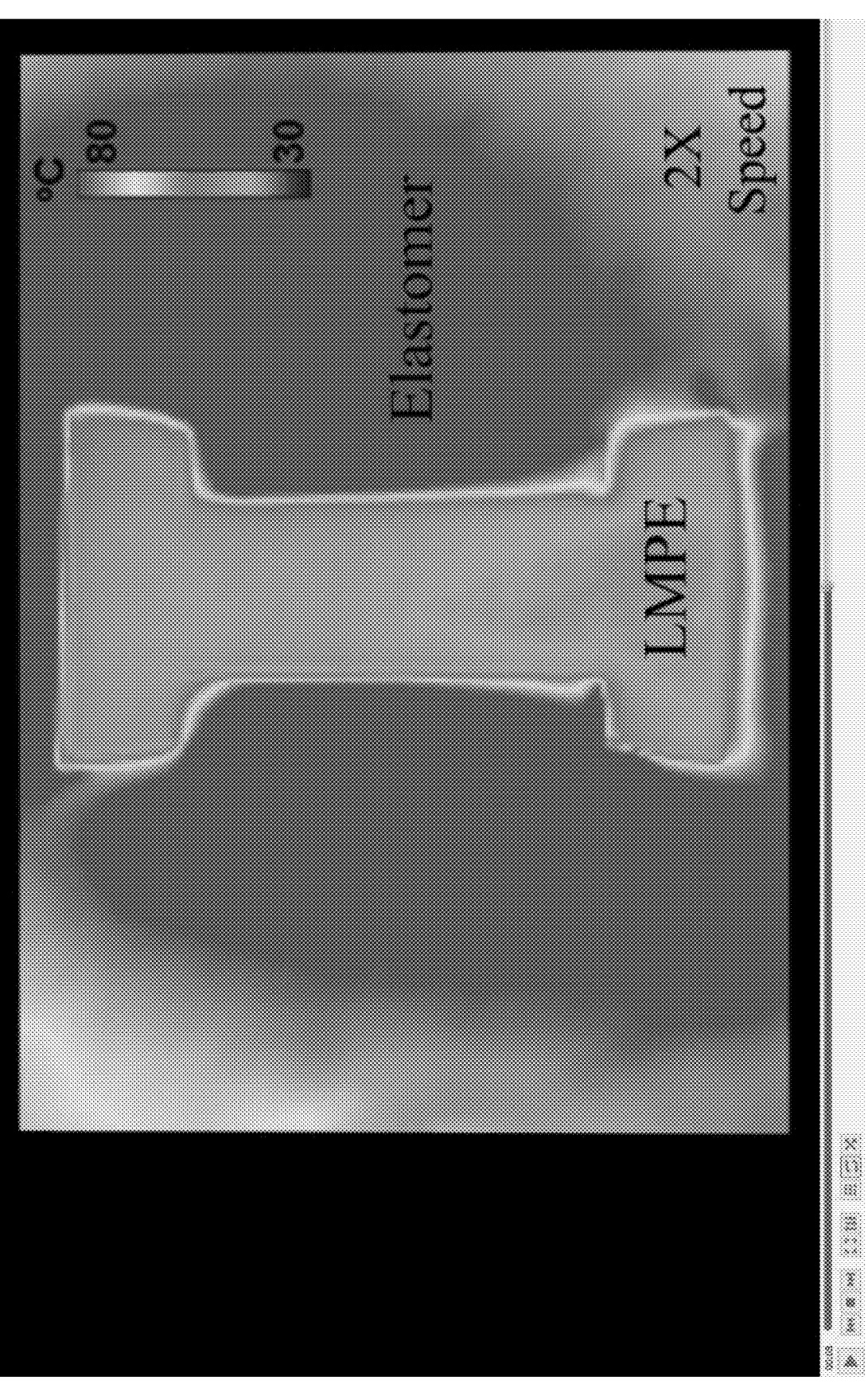
FIG. 15E (M1 @ 8s)

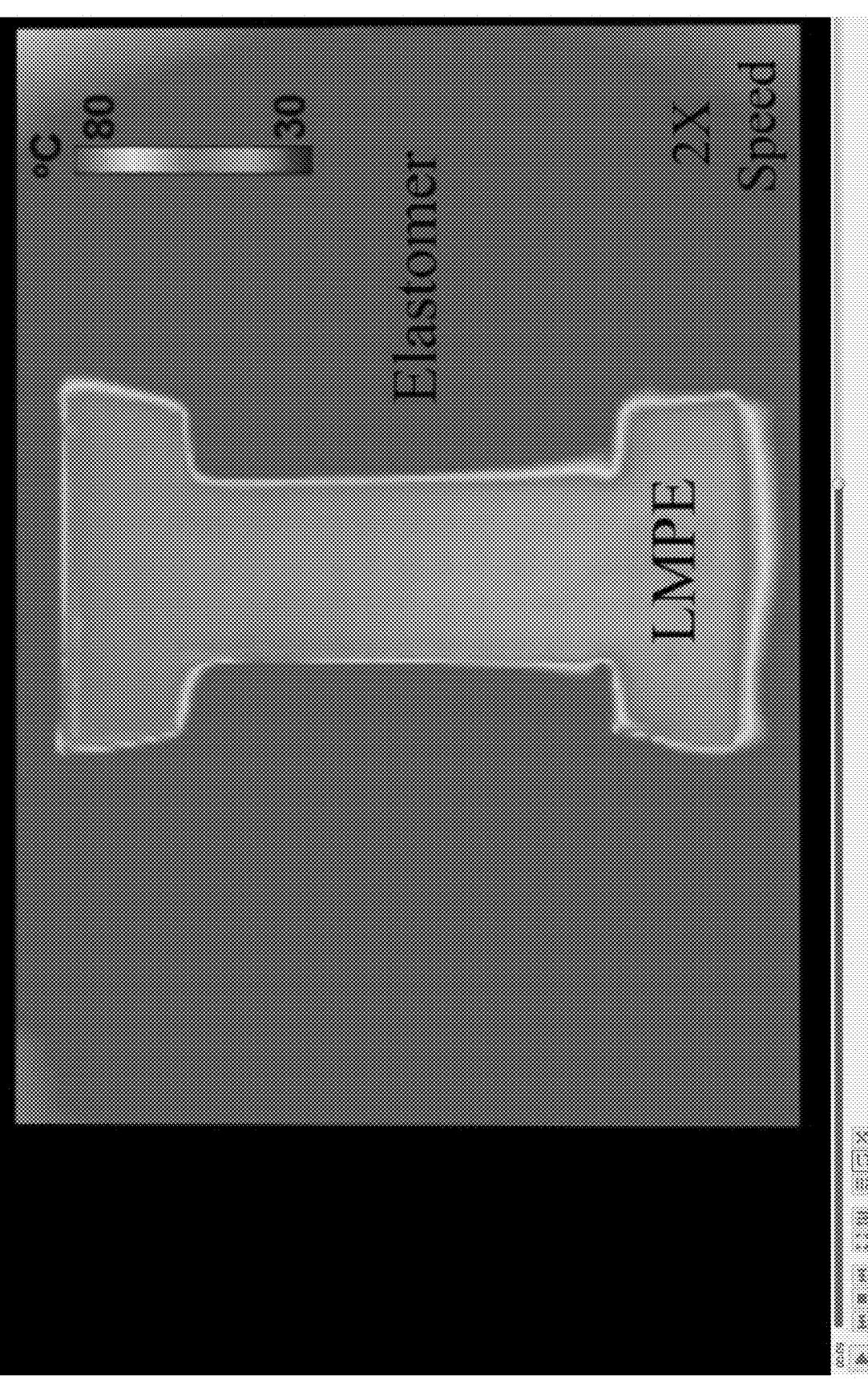
FIG. 15F (M1 @ 9s)

FIG. 15G (M1 @ 10s)

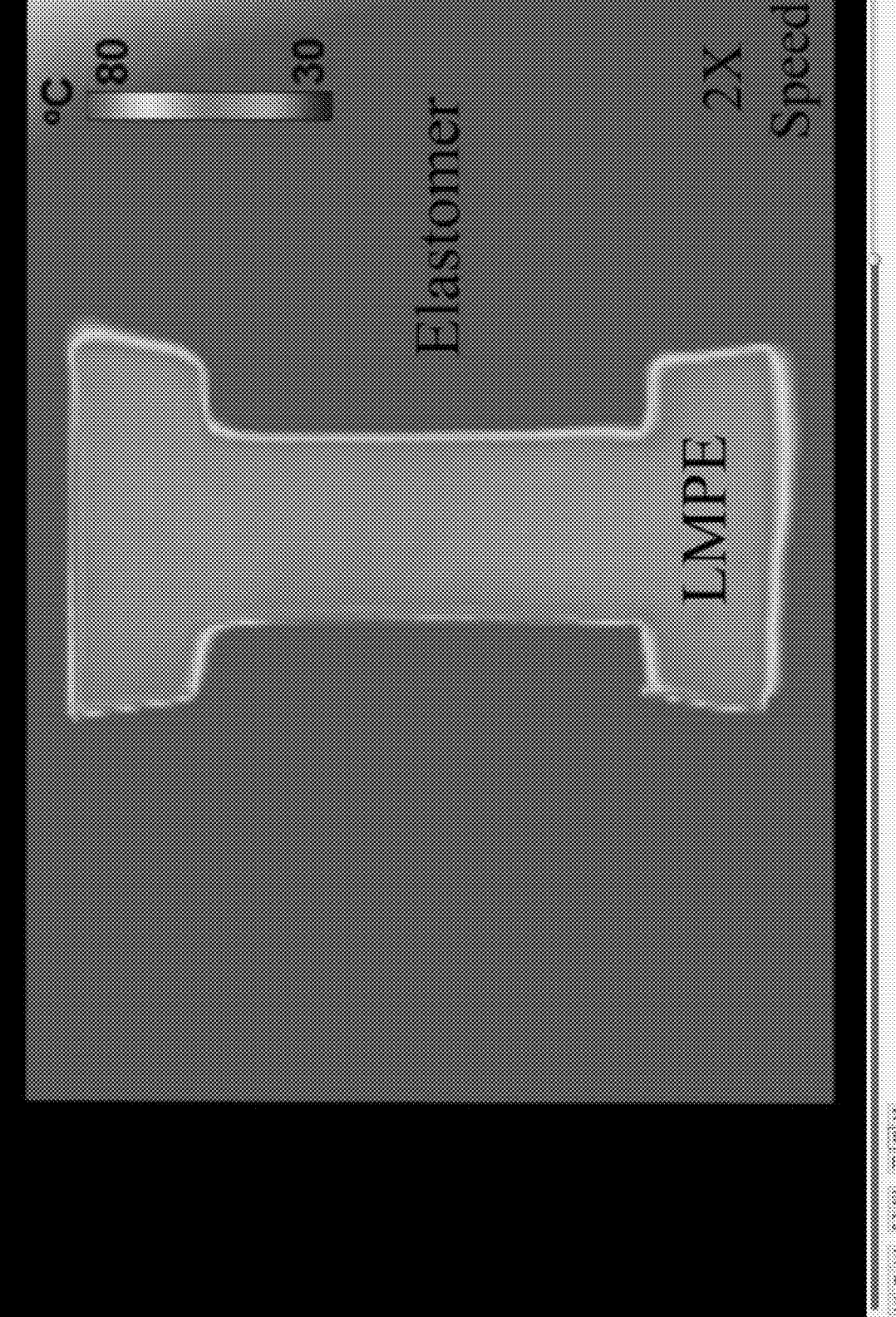
FIG. 15H (M1 @ 11s)

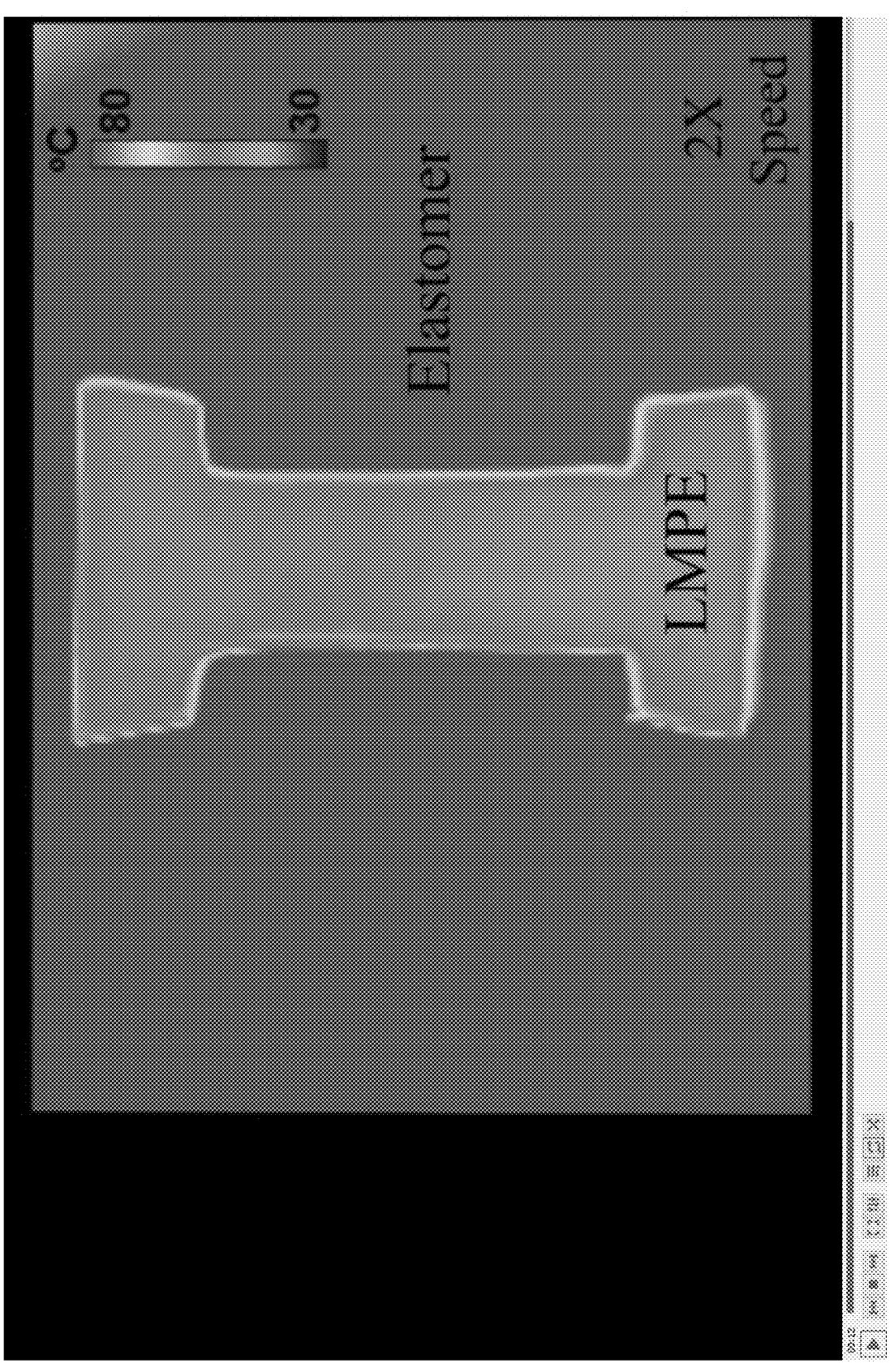
FIG. 15I (M1 @ 12s)

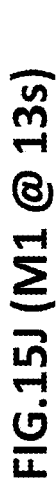
FIG.15J (M1 @ 13s)

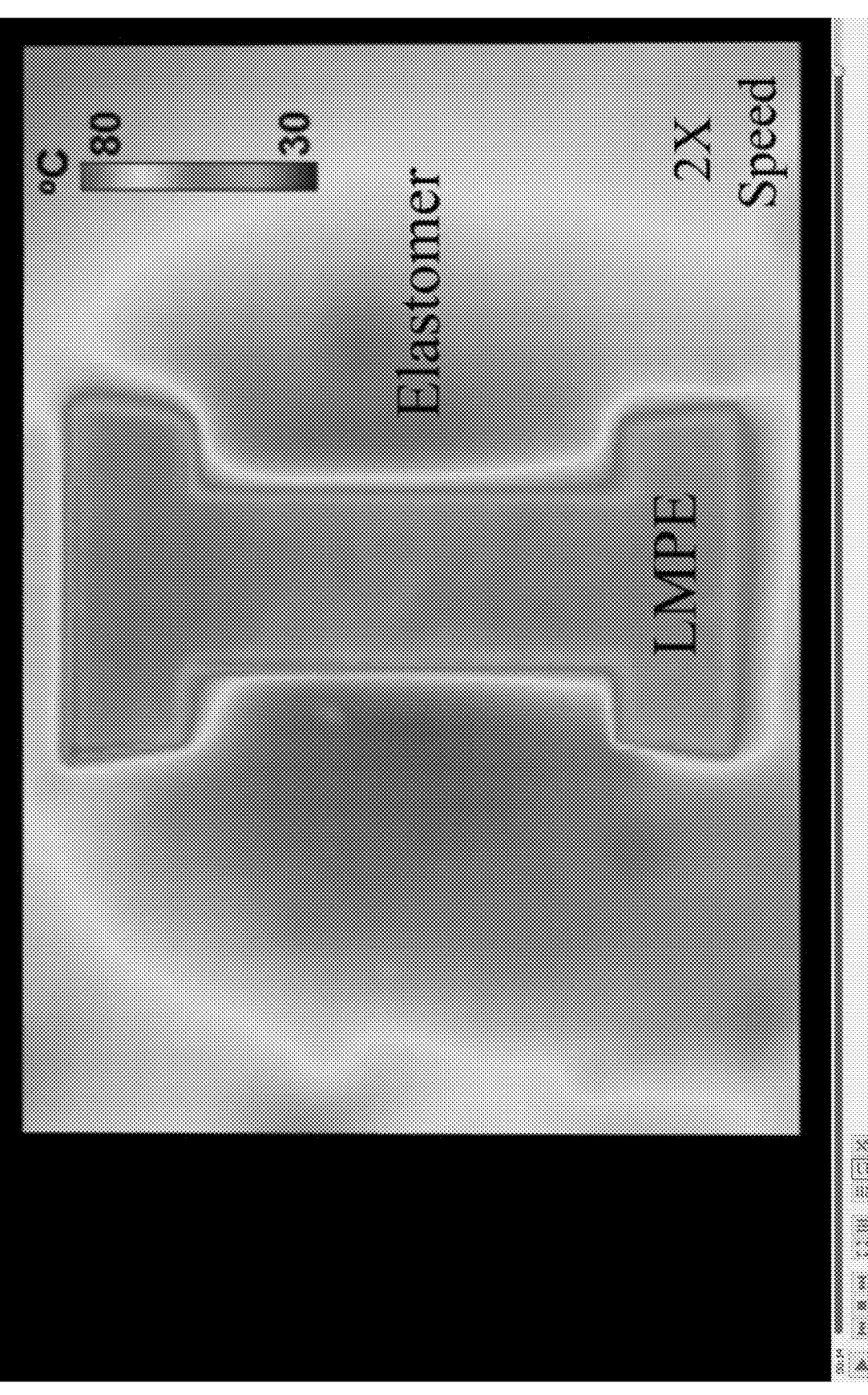
FIG. 15K (M1 @ 14s)

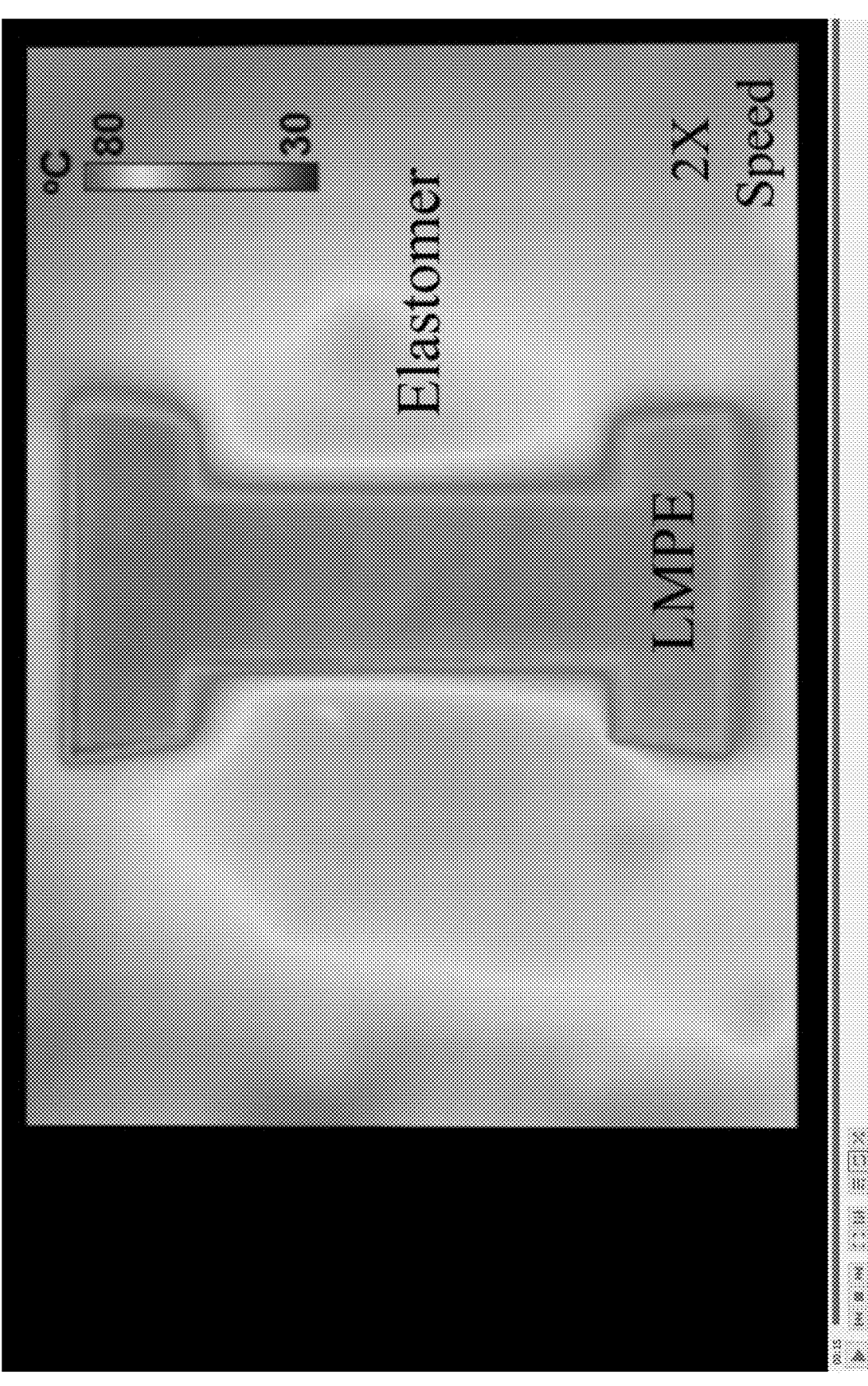
FIG. 15L (M1 @ 15s)

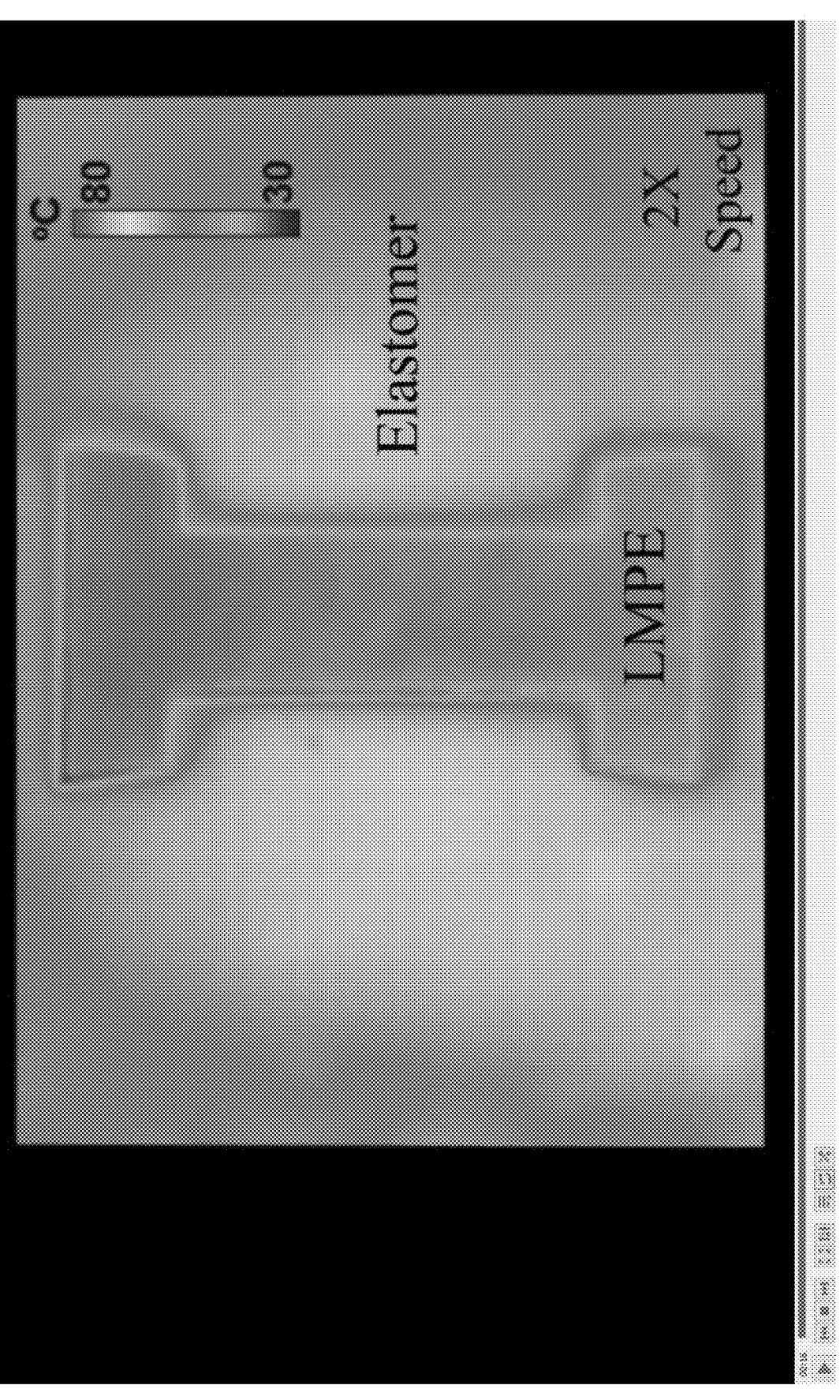
FIG. 15M (M1 @ 16s)

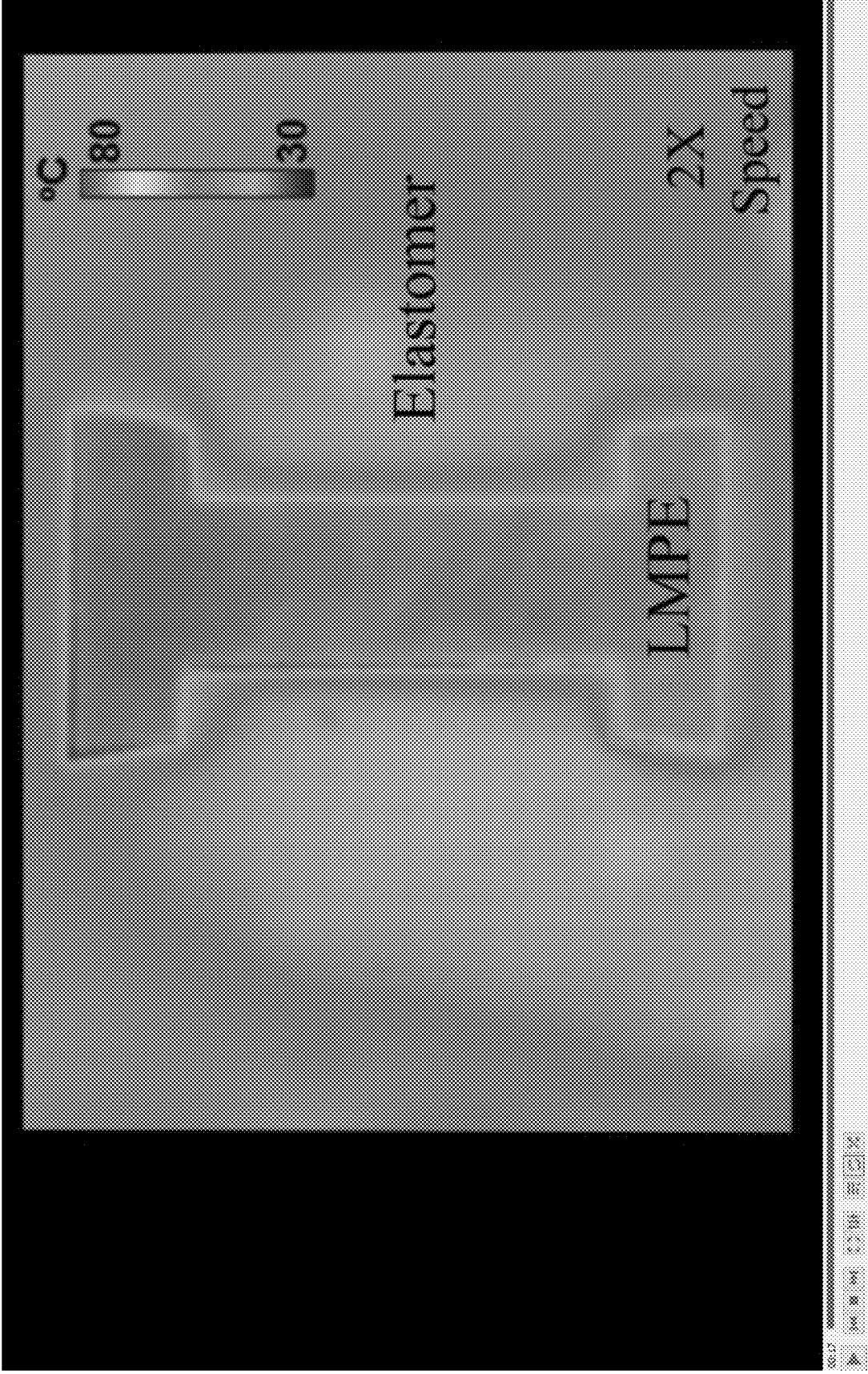
FIG. 15N (M1 @ 17s)

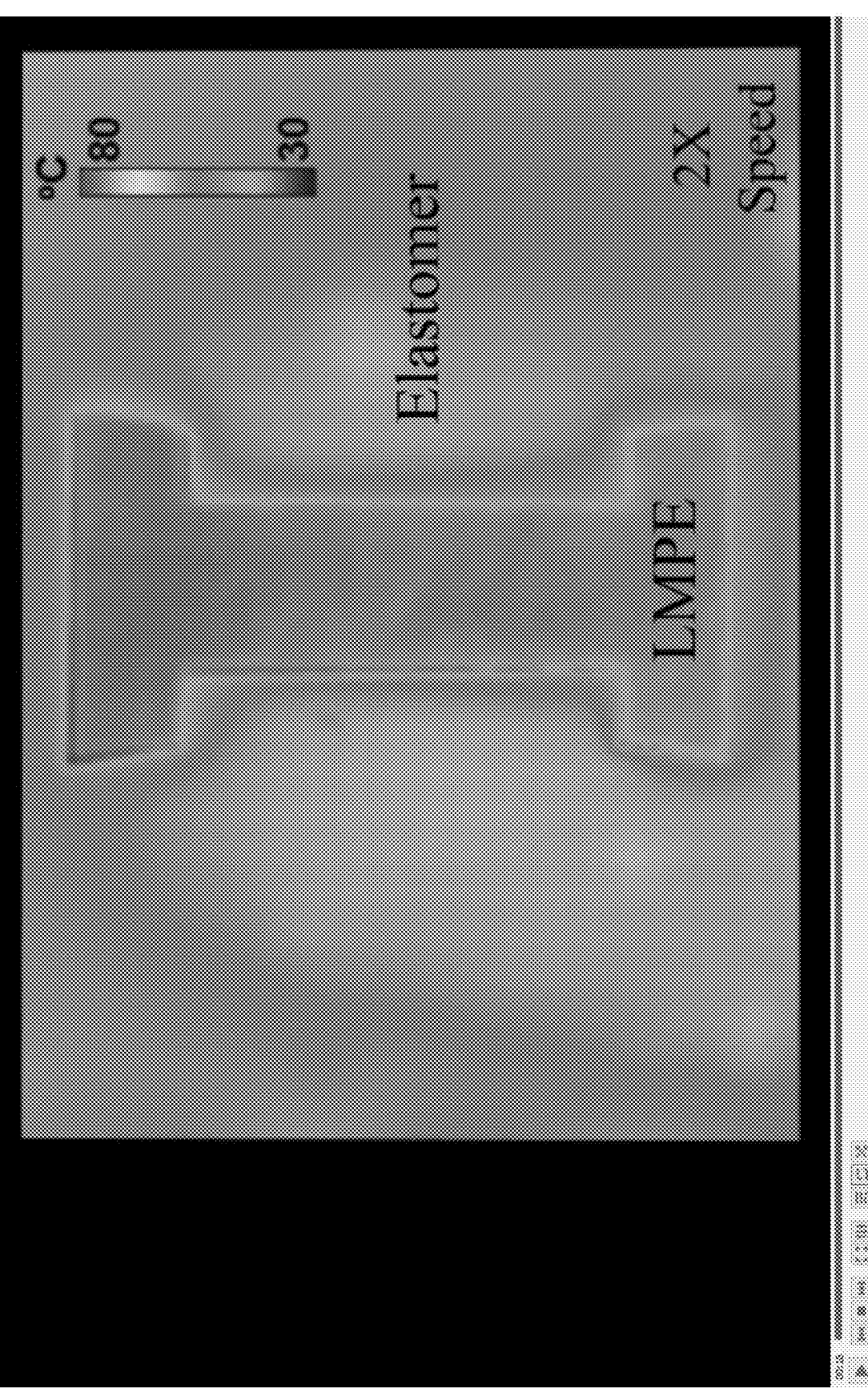
FIG. 150 (M1 @ 18s)

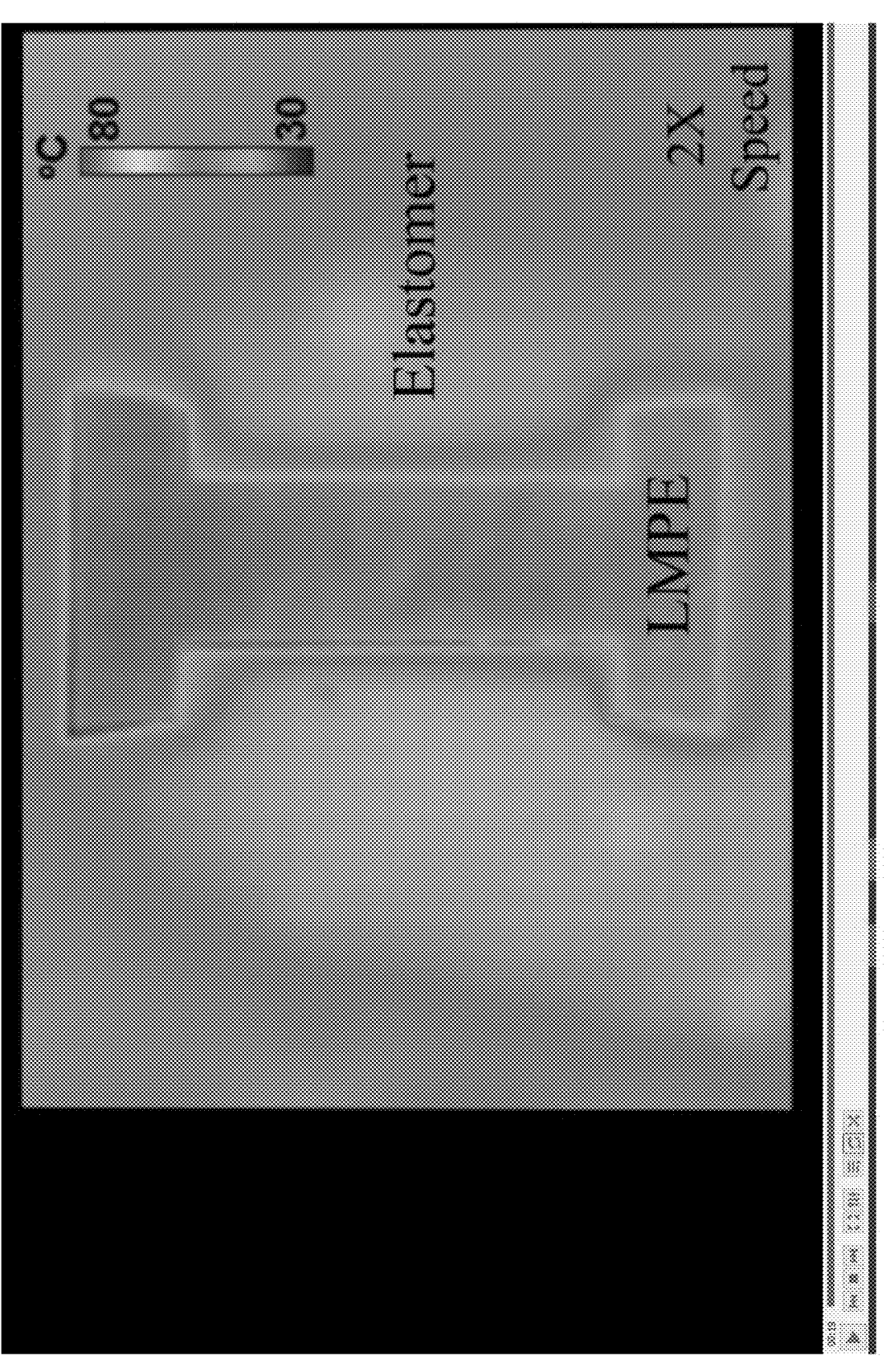
FIG. 15P (M1 @ 19s)

Programmable Liquid Metal Metal Microstructures for Multifunctional Soft Thermal Composites A B M Tahidul Haque, Ravi Tutika, Rachael Byrum, Michael D. Bartlett*

(* Corresponding author)

Movie S2: Thermal management of resistive heater adfm202000832-sup-0003-movies2.wmv FIG.16A (M2 title page)

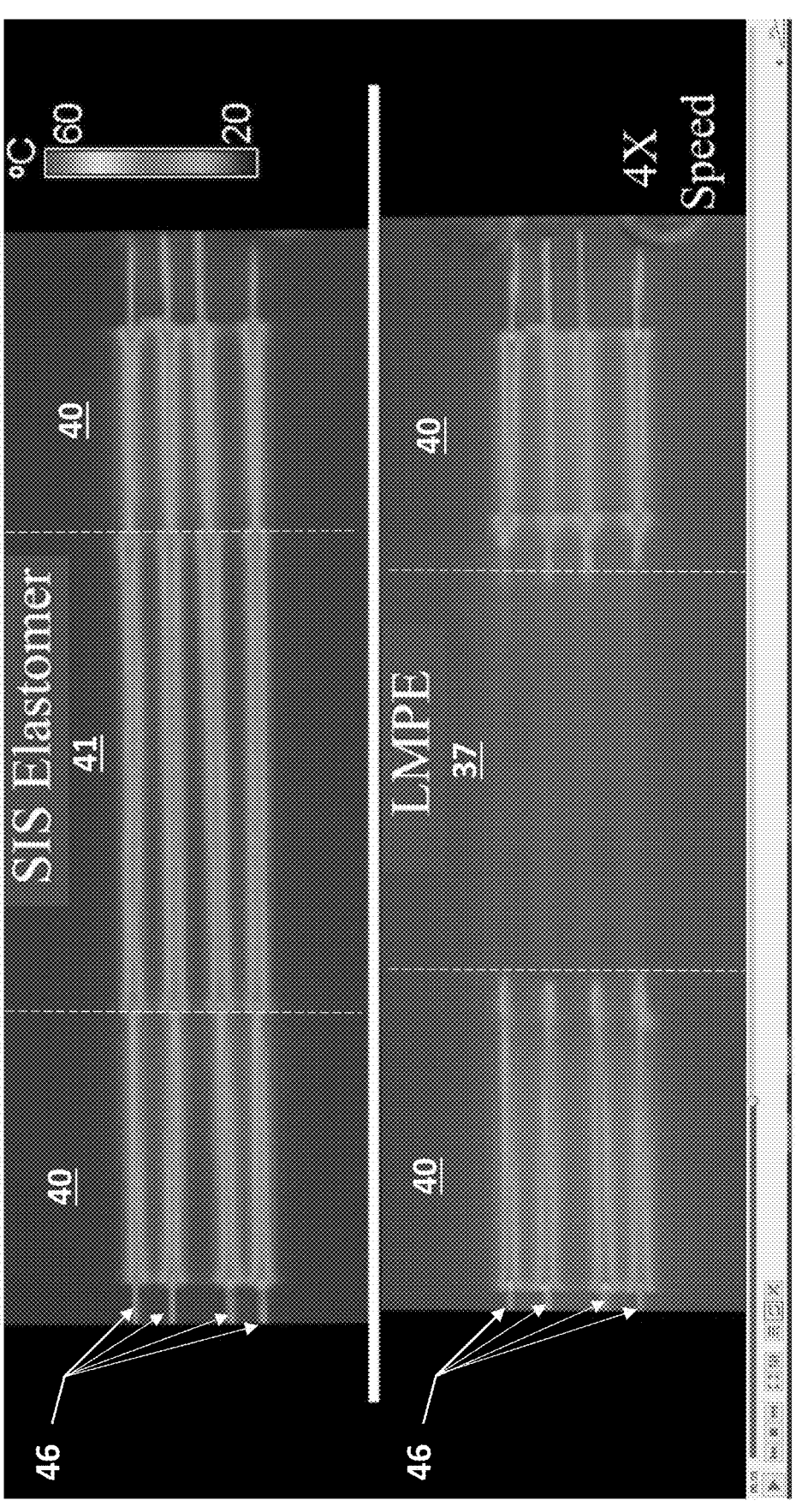
FIG. 16B (M2 @ 5s)

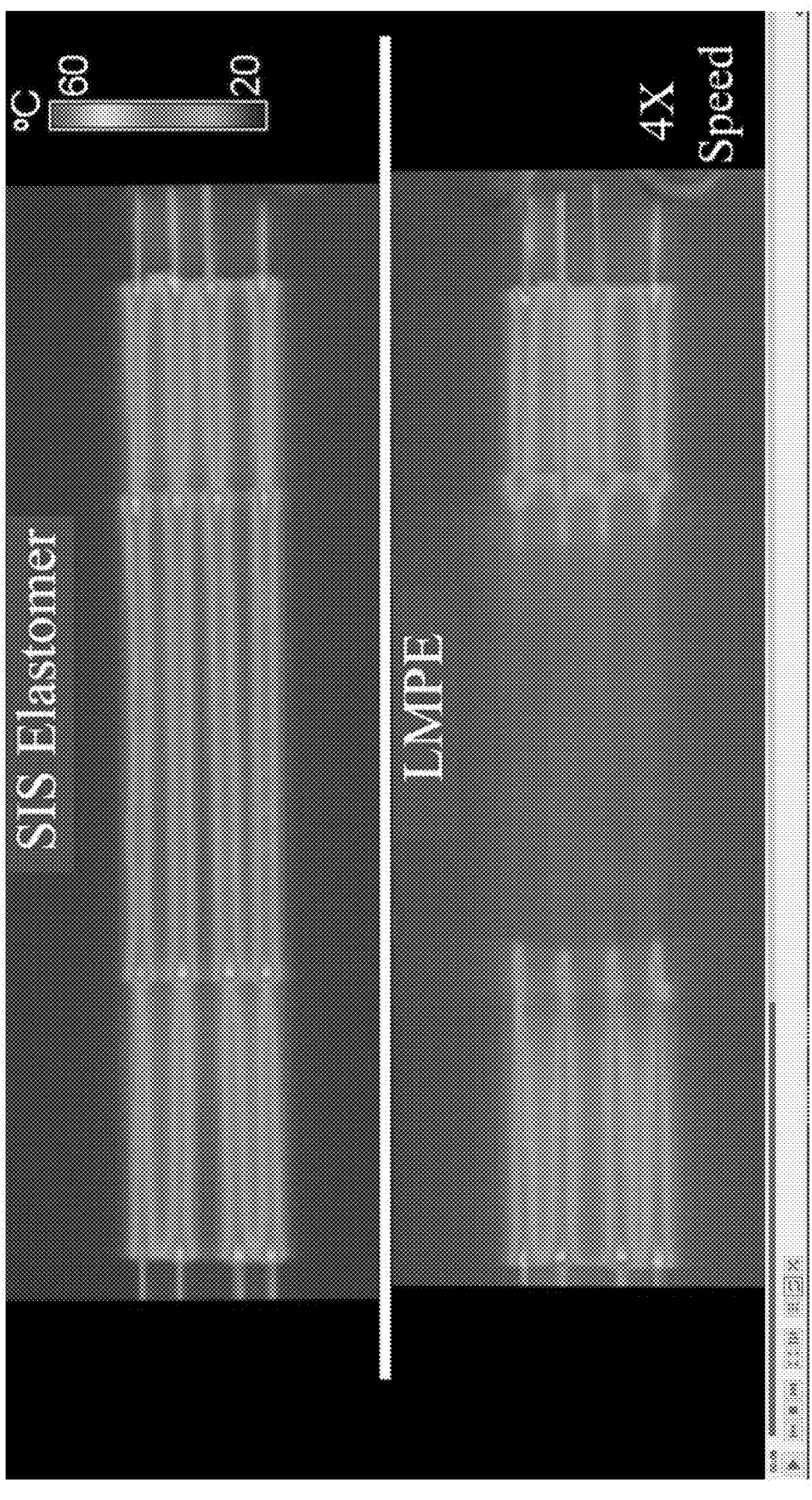
FIG. 16C (M2 @ 6s)

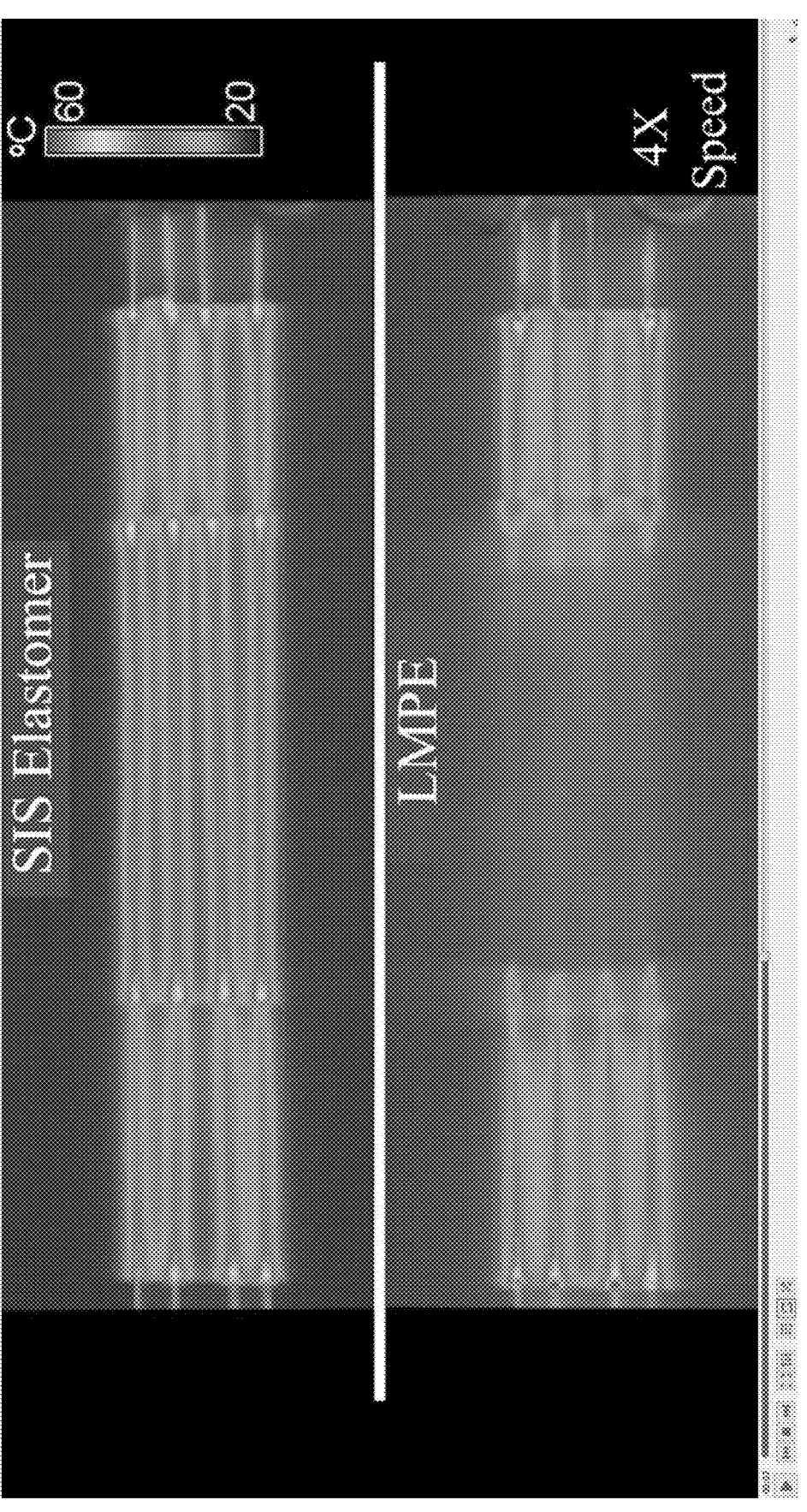
FIG. 16D (M2 @ 7s)

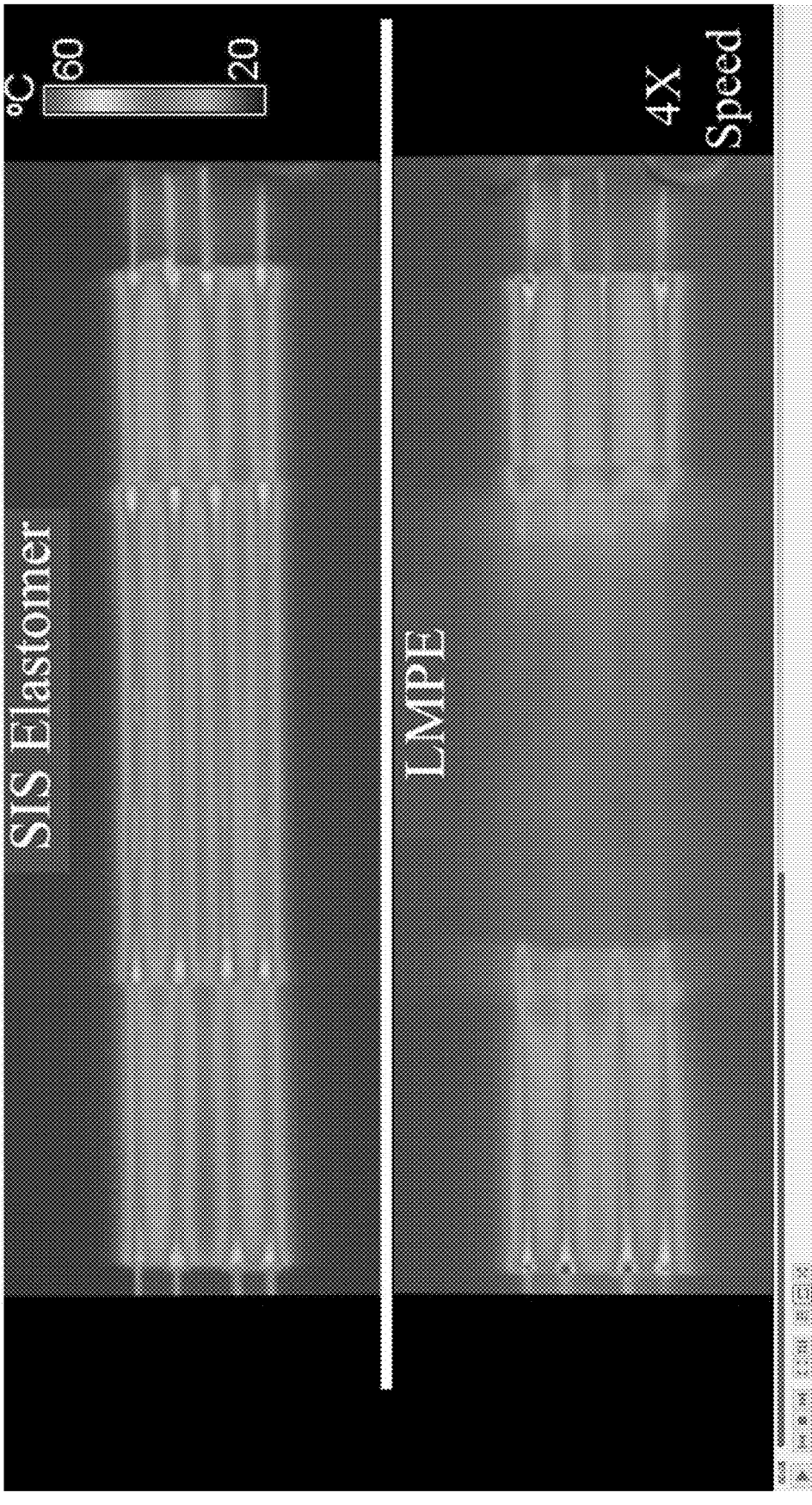
FIG. 16E (M2 @ 8s)

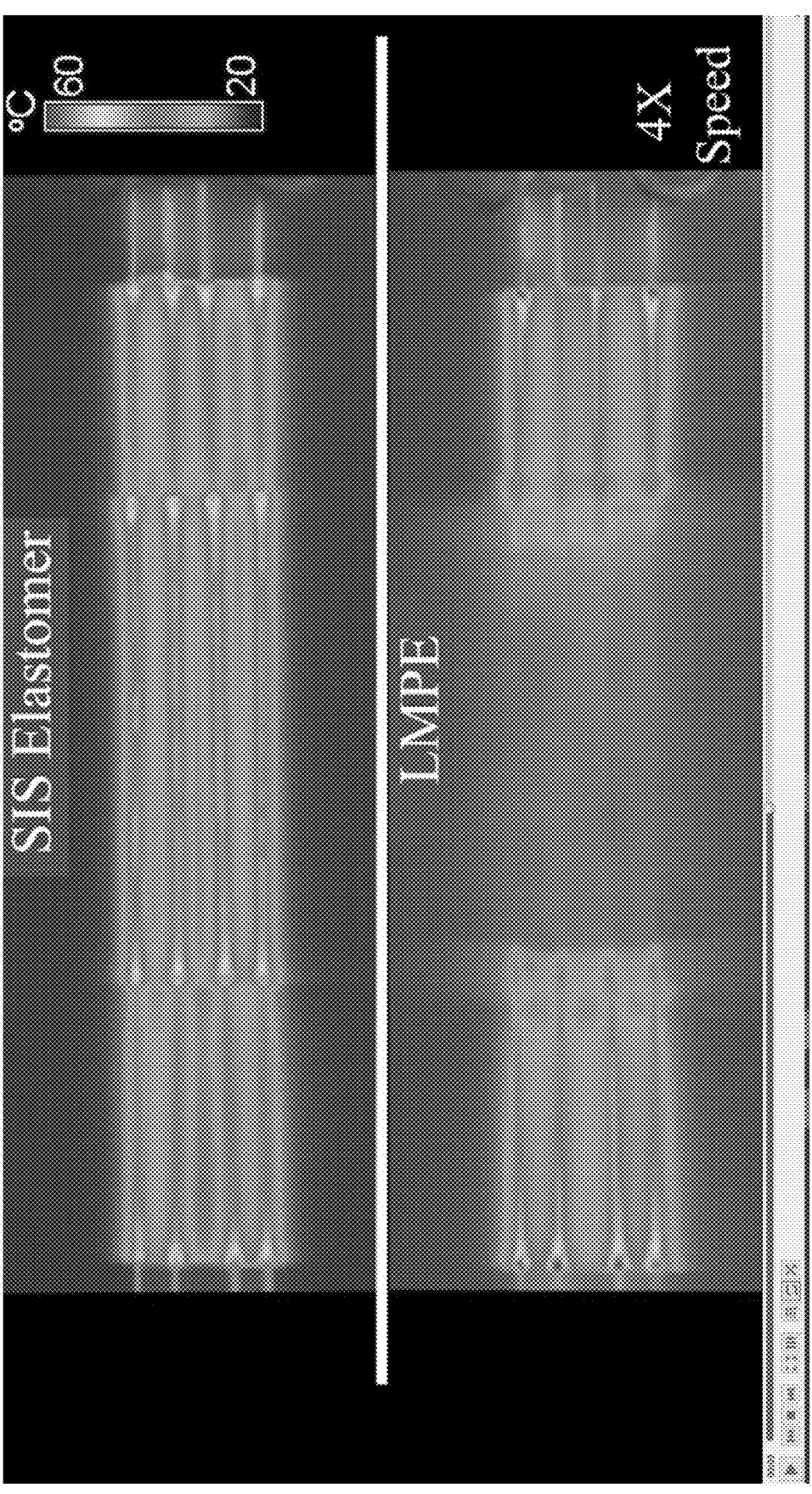
FIG. 16F (M2 @ 9s)

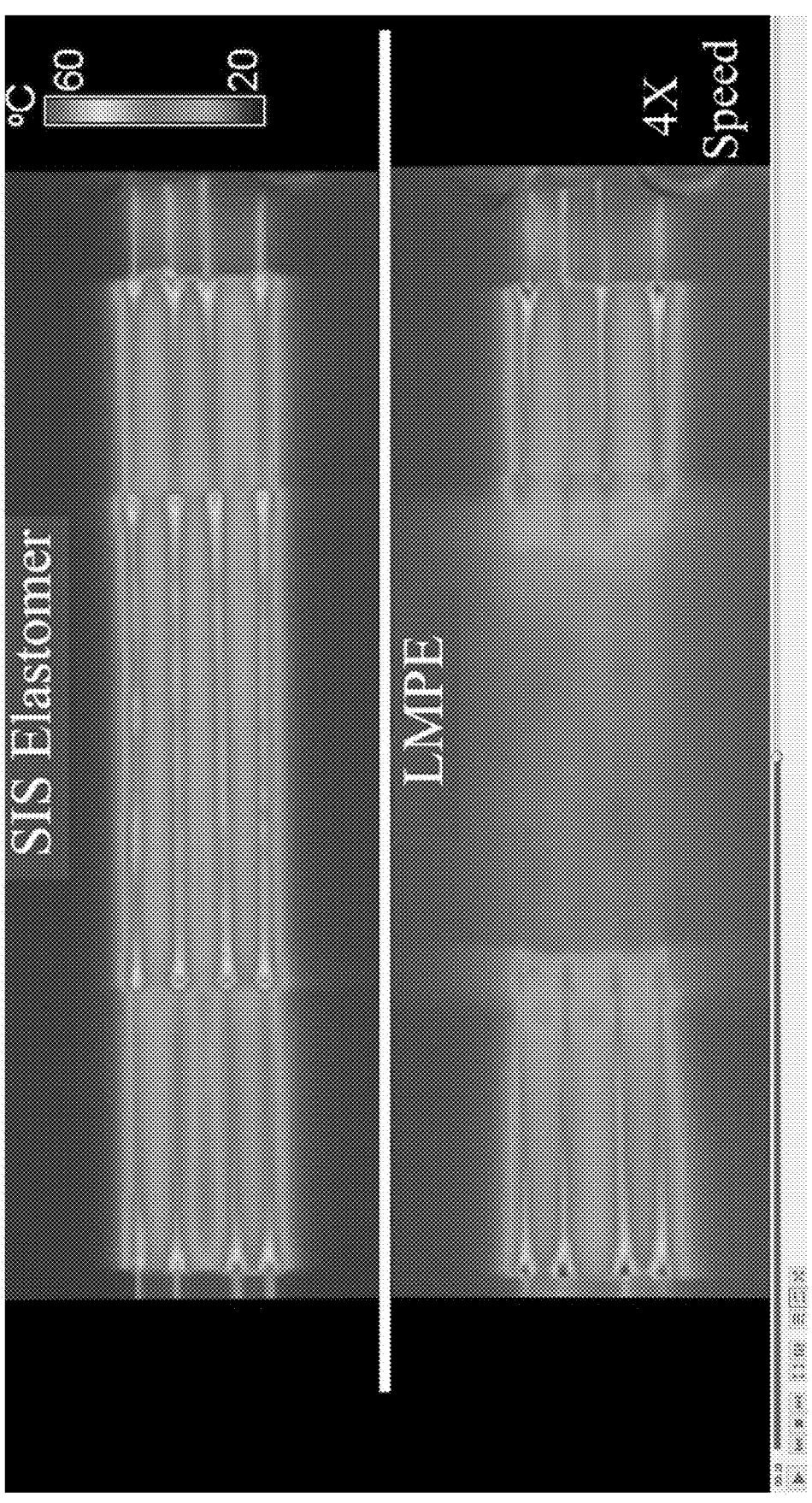
FIG. 16G (M2 @ 10s)

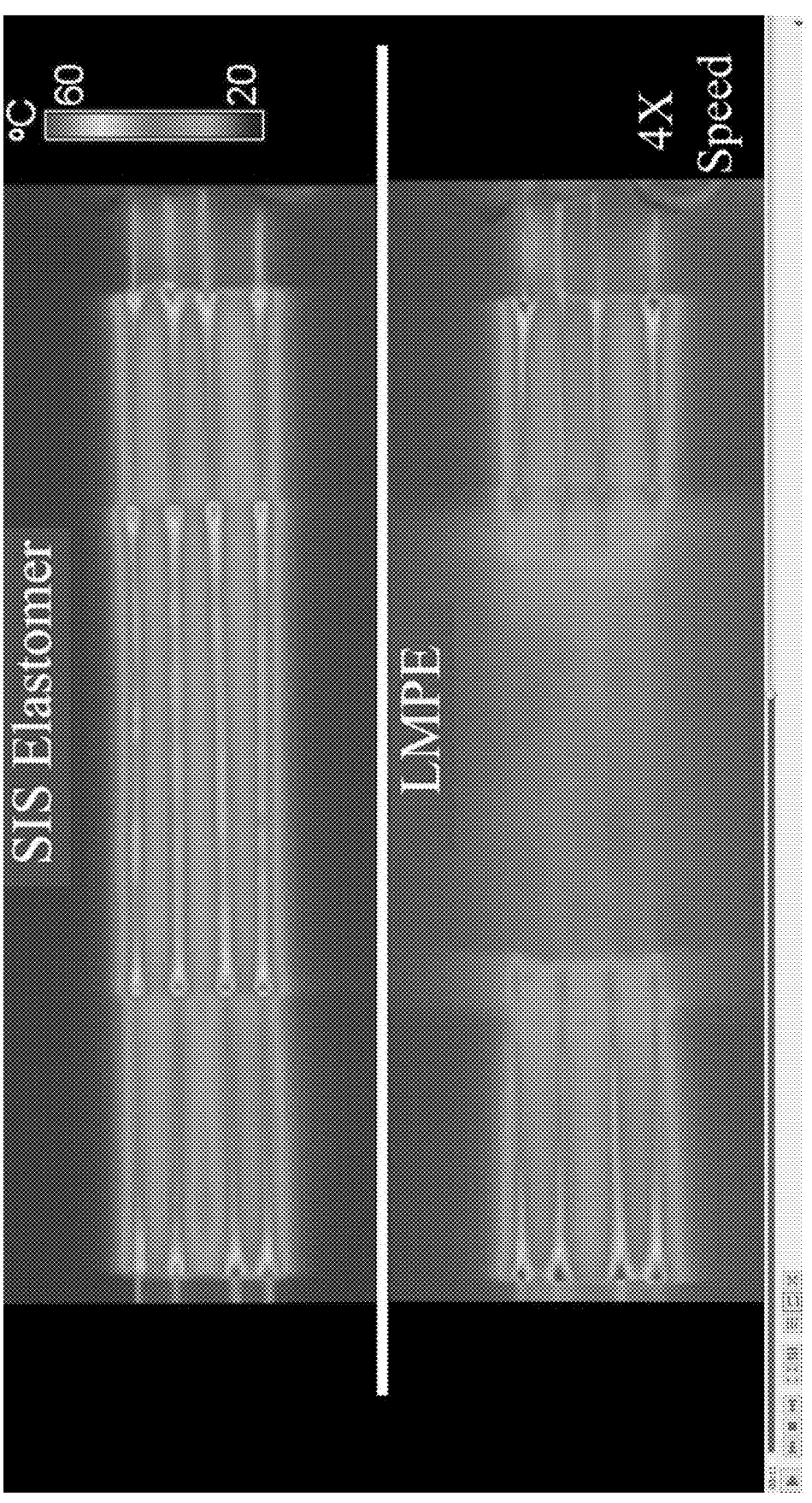
FIG. 16H (M2 @ 11s)

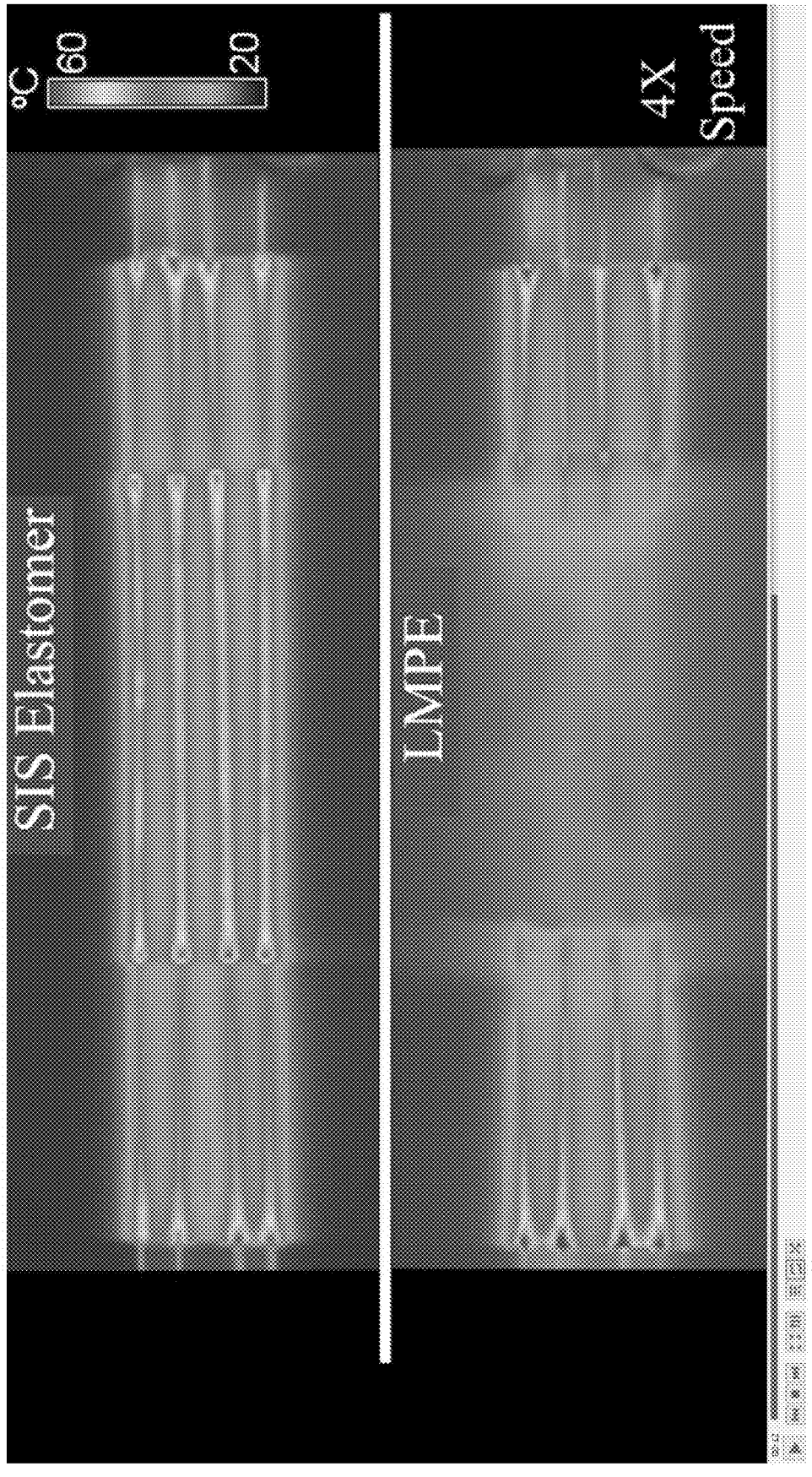
FIG. 16I (M2 @ 12s)

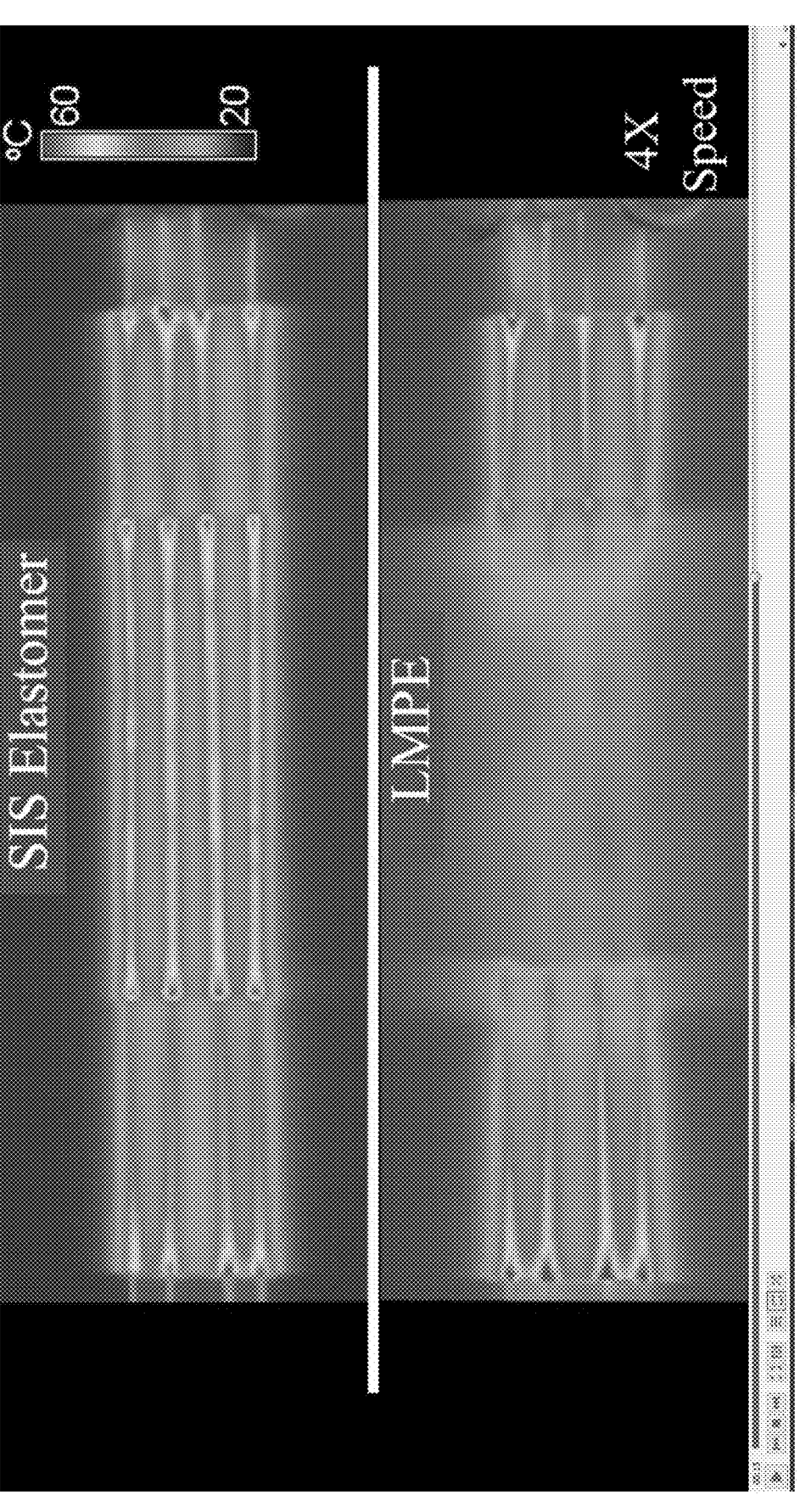
FIG. 16J (M2 @ 13s)

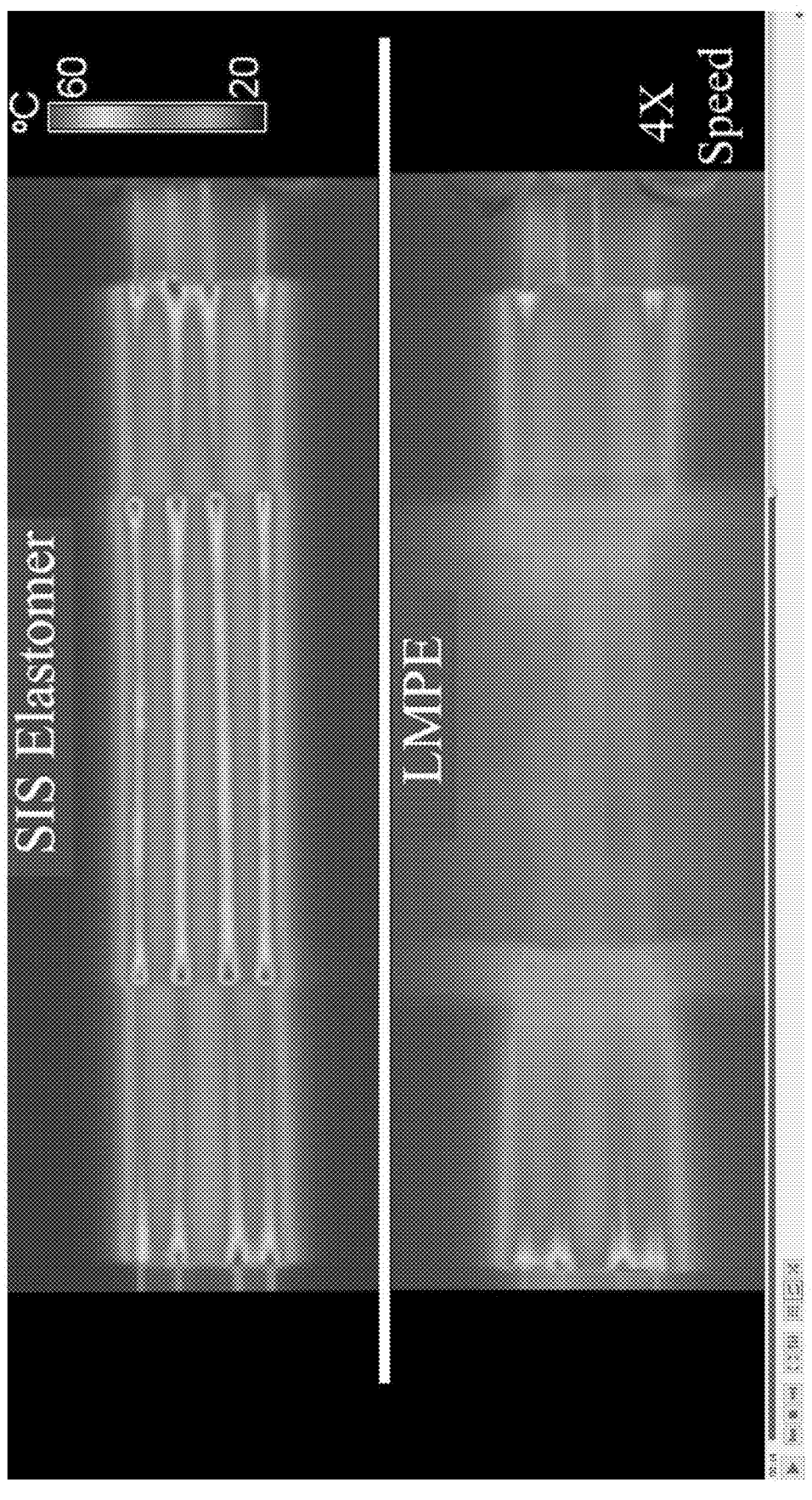
FIG. 16K (M2 @ 14s)

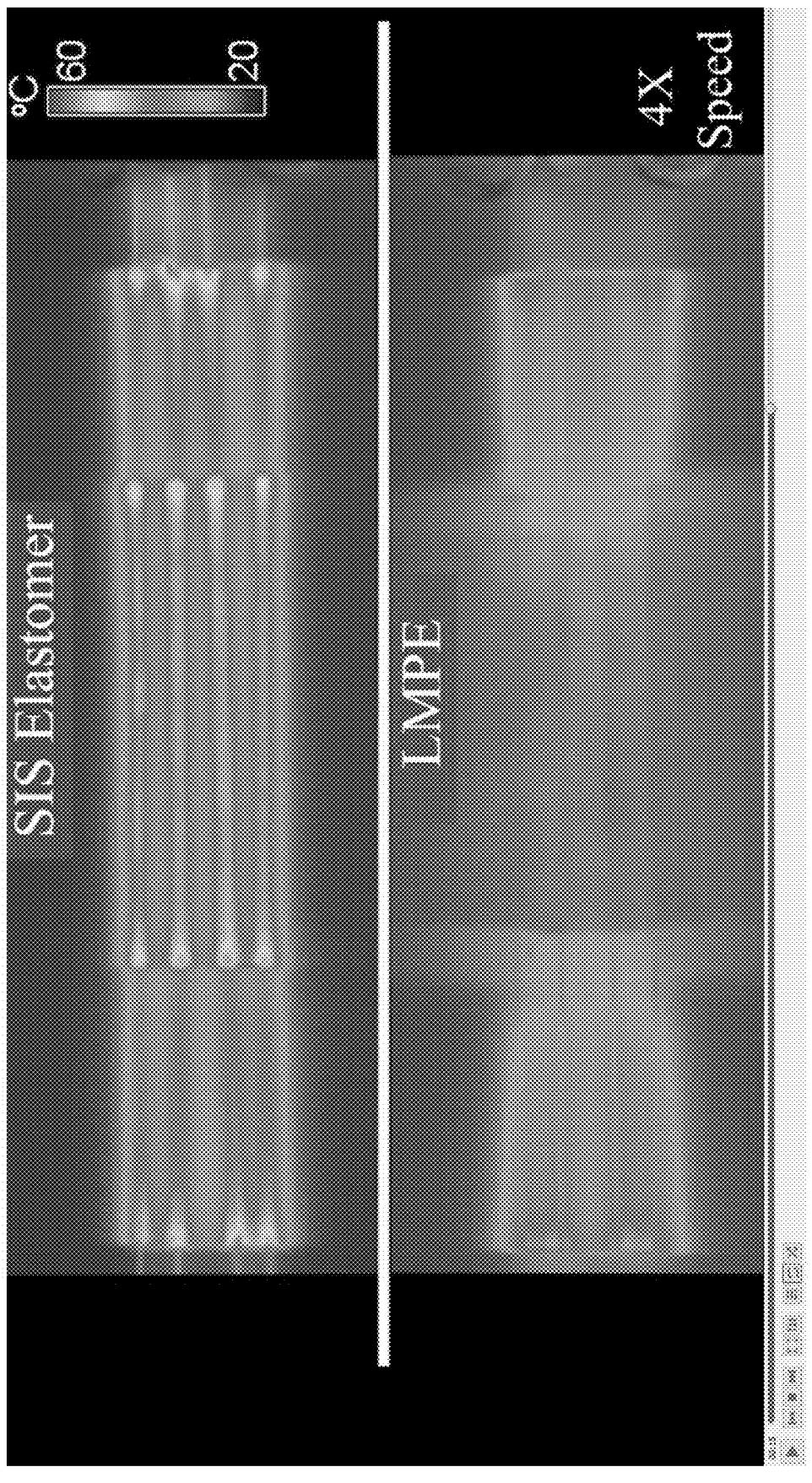
FIG. 16L (M2 @ 15s)

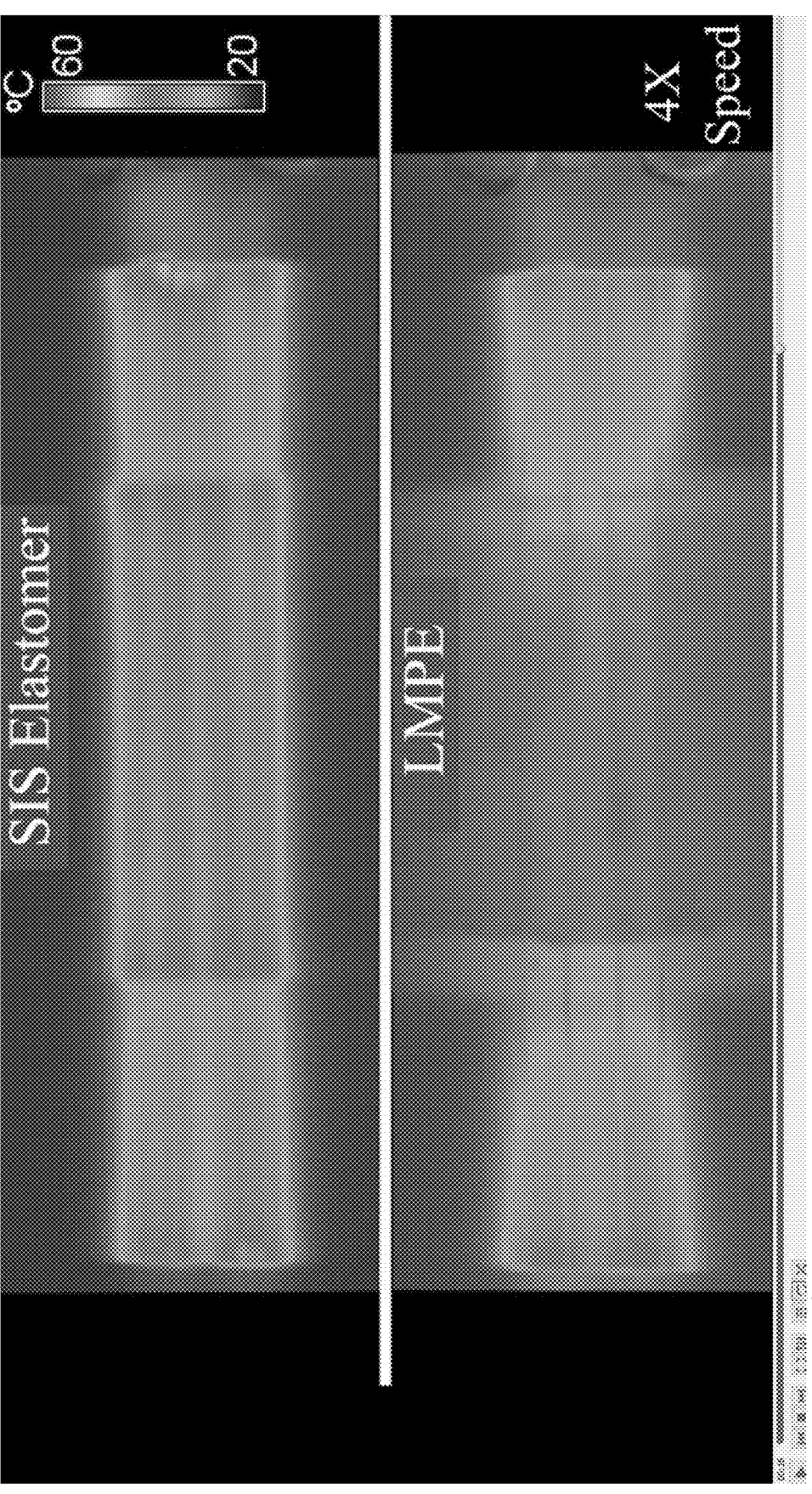
FIG. 16M (M2 @ 16s)

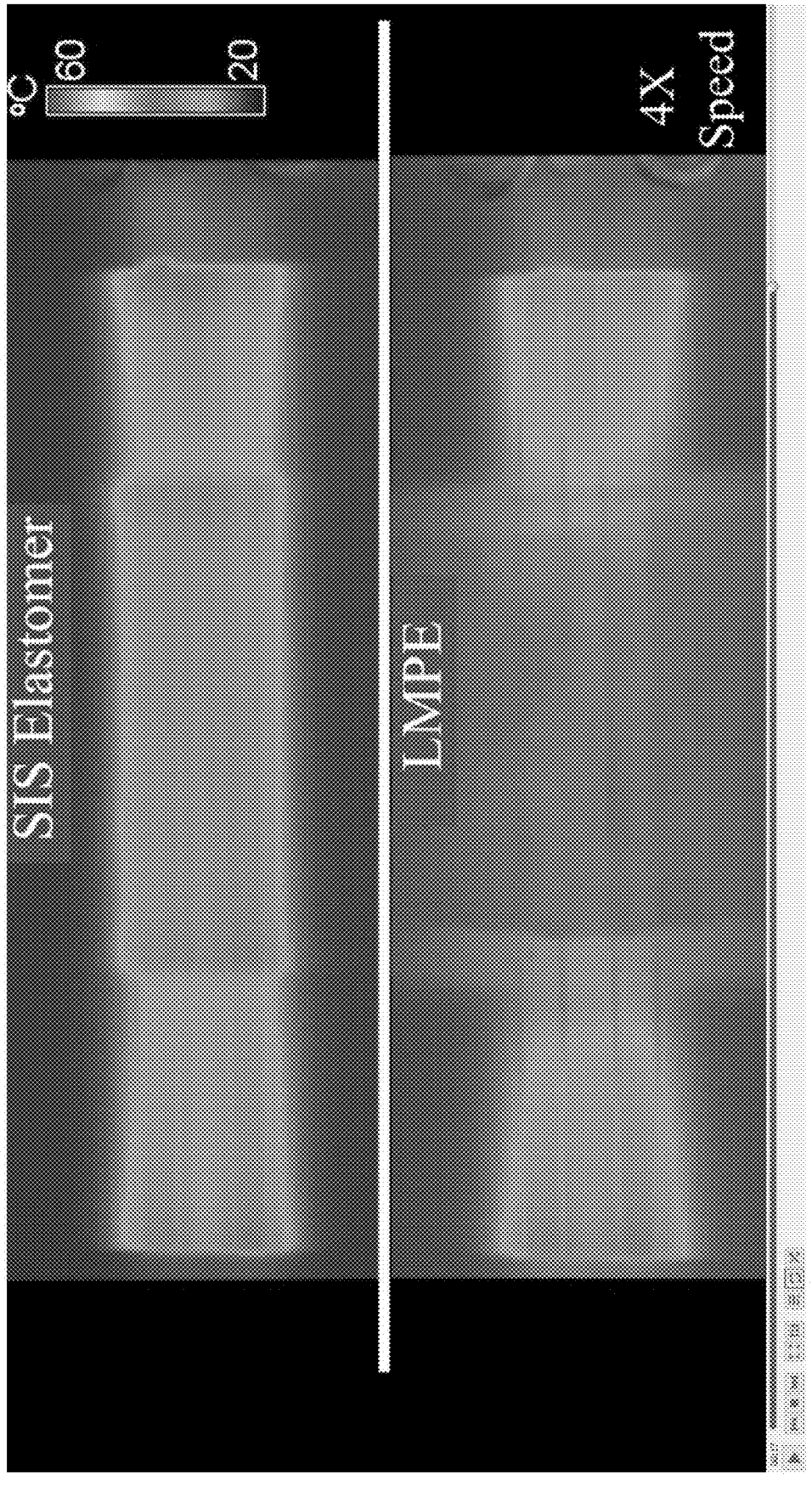
FIG. 16N (M2 @ 17s)

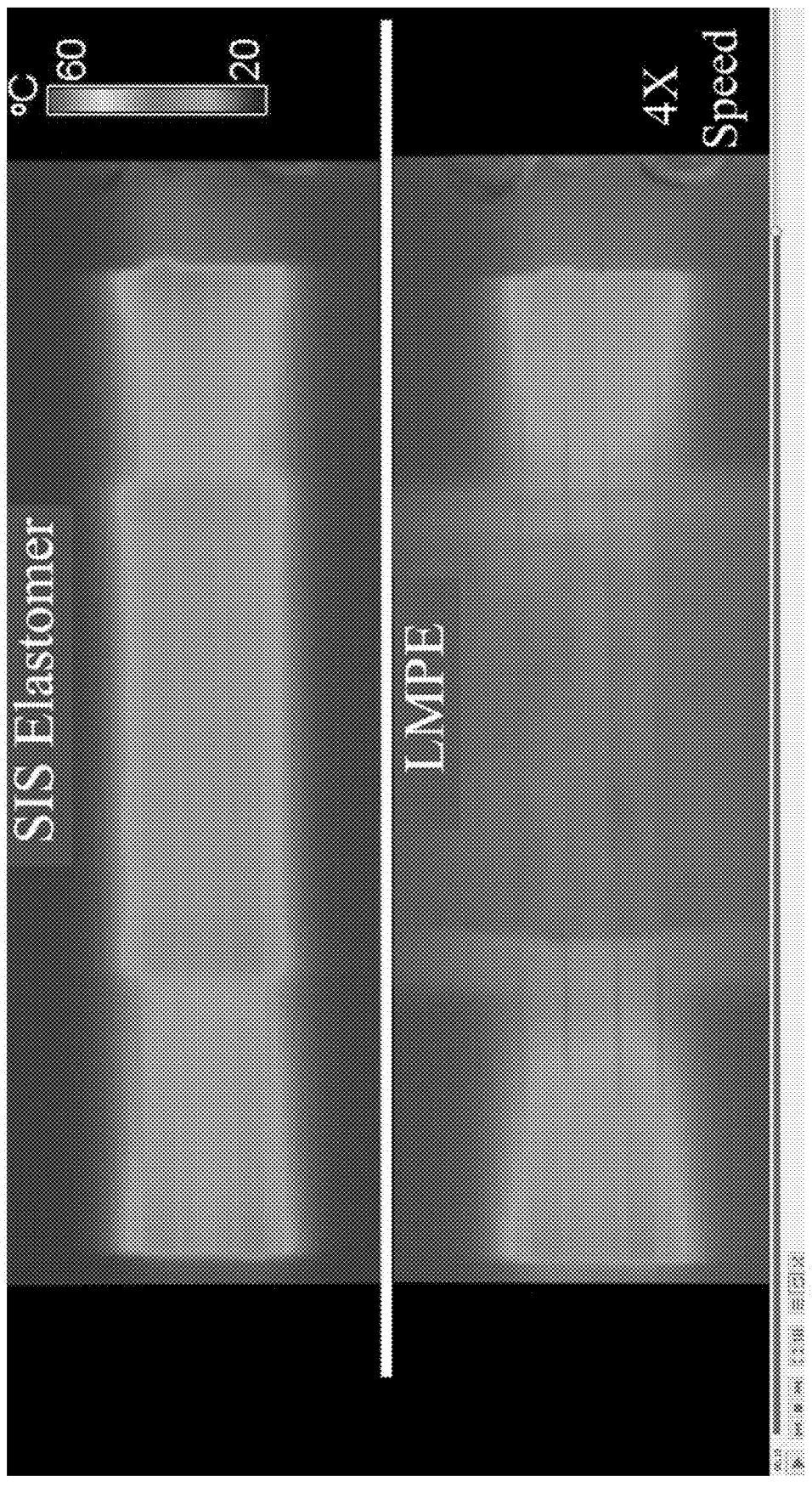
FIG. 16O (M2 @ 18s)

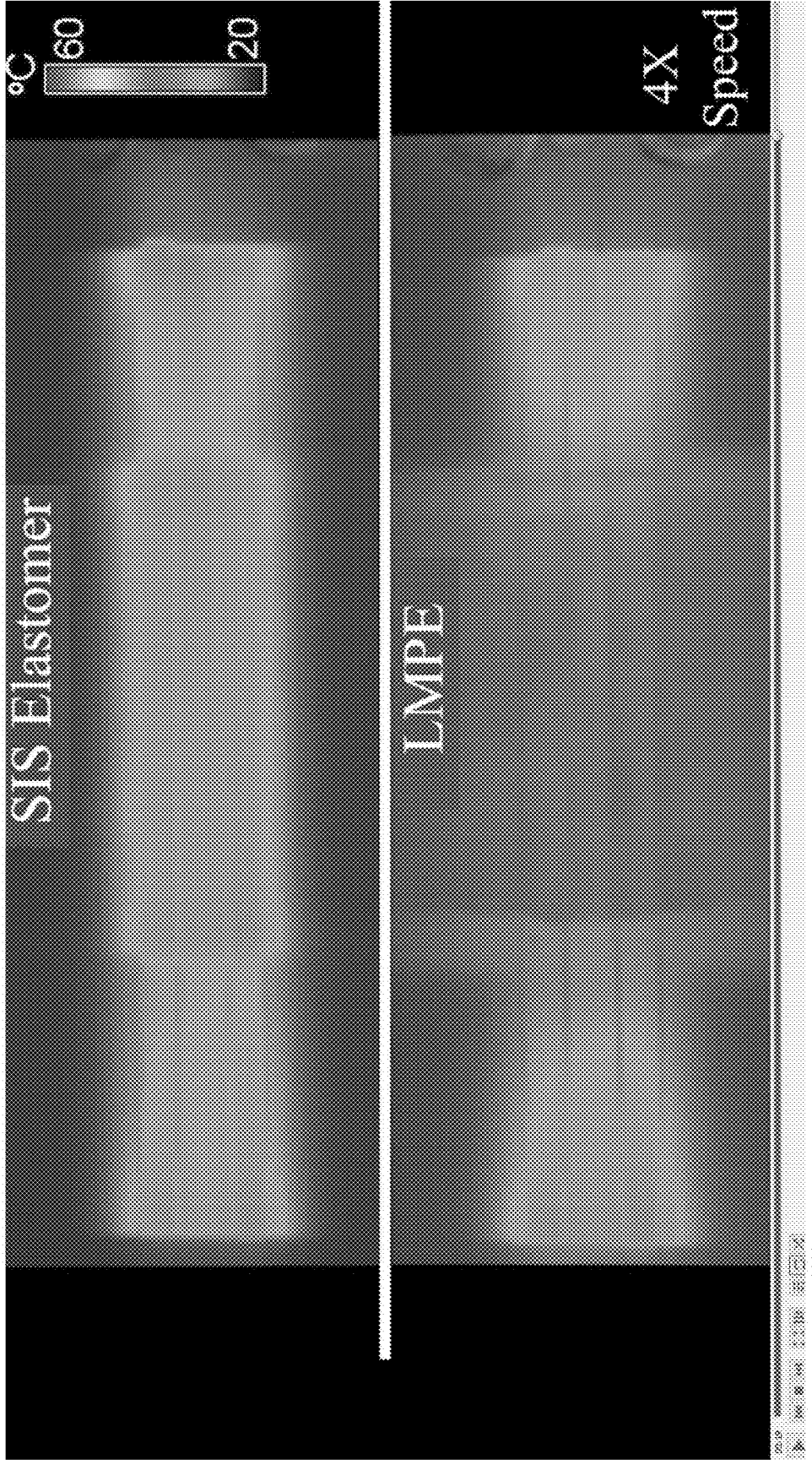
FIG. 16P (M2 @ 19s)

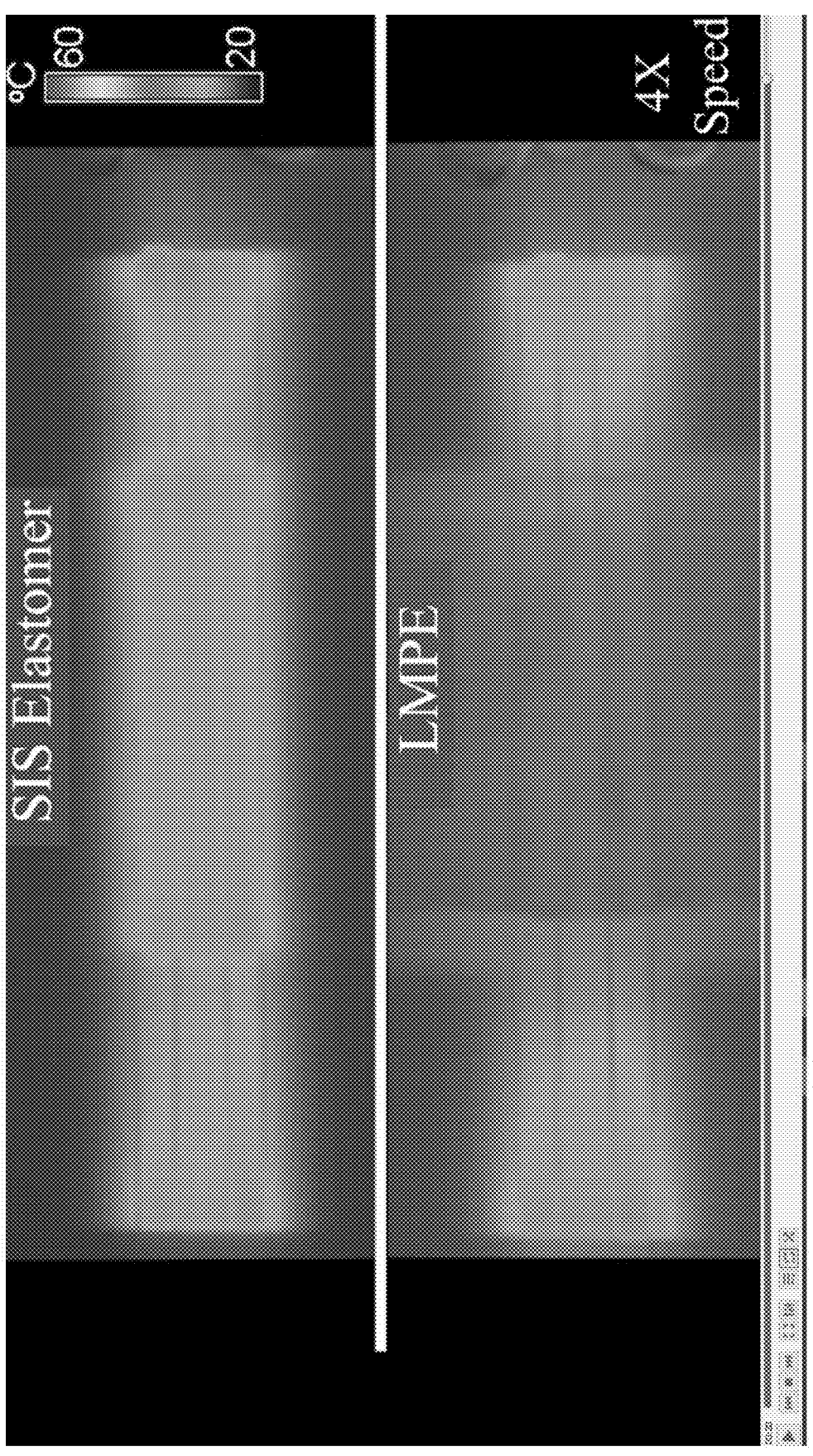
FIG. 16Q (M2 @ 20s)

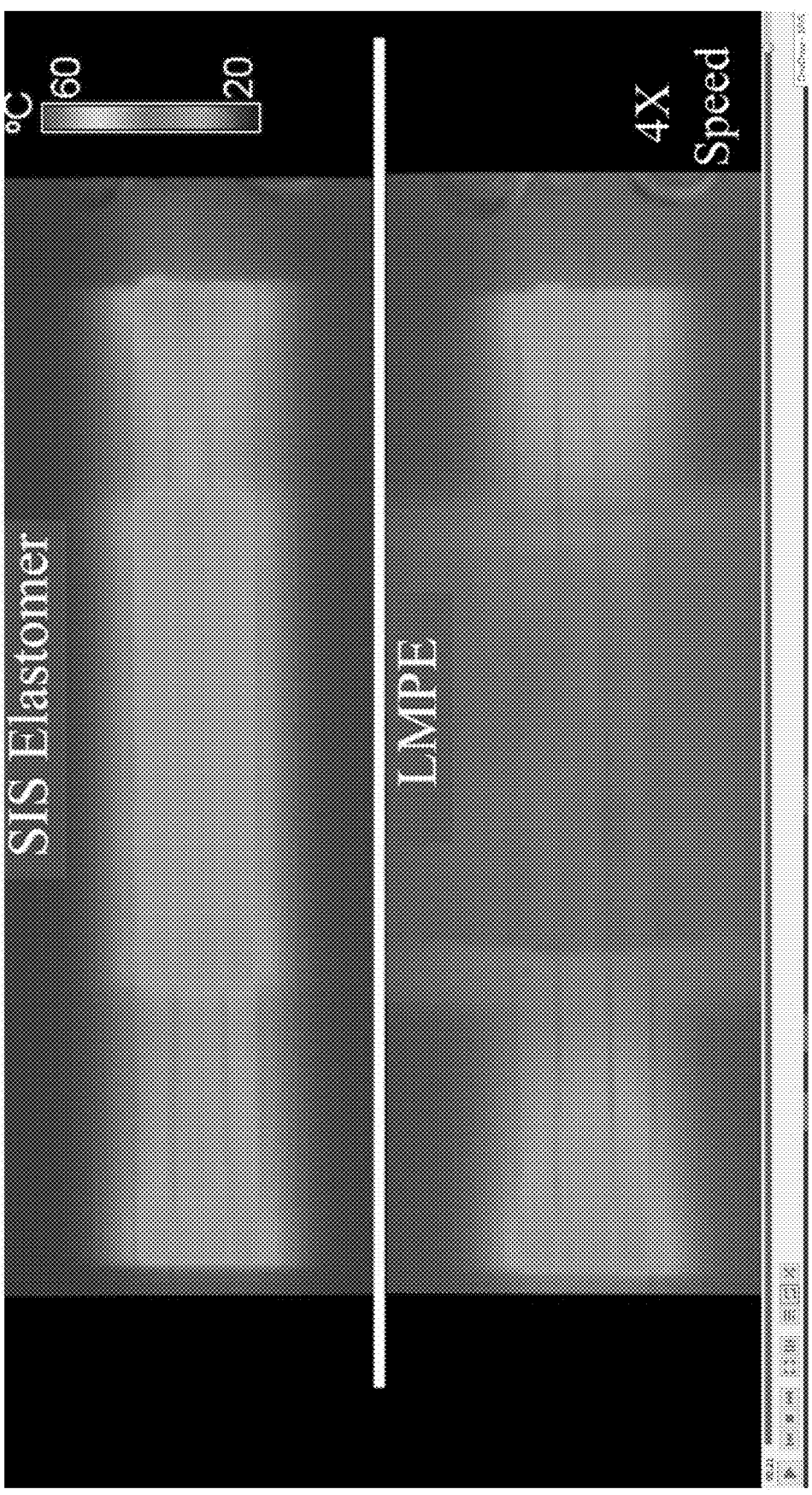
FIG. 16R (M2 @ 21s)

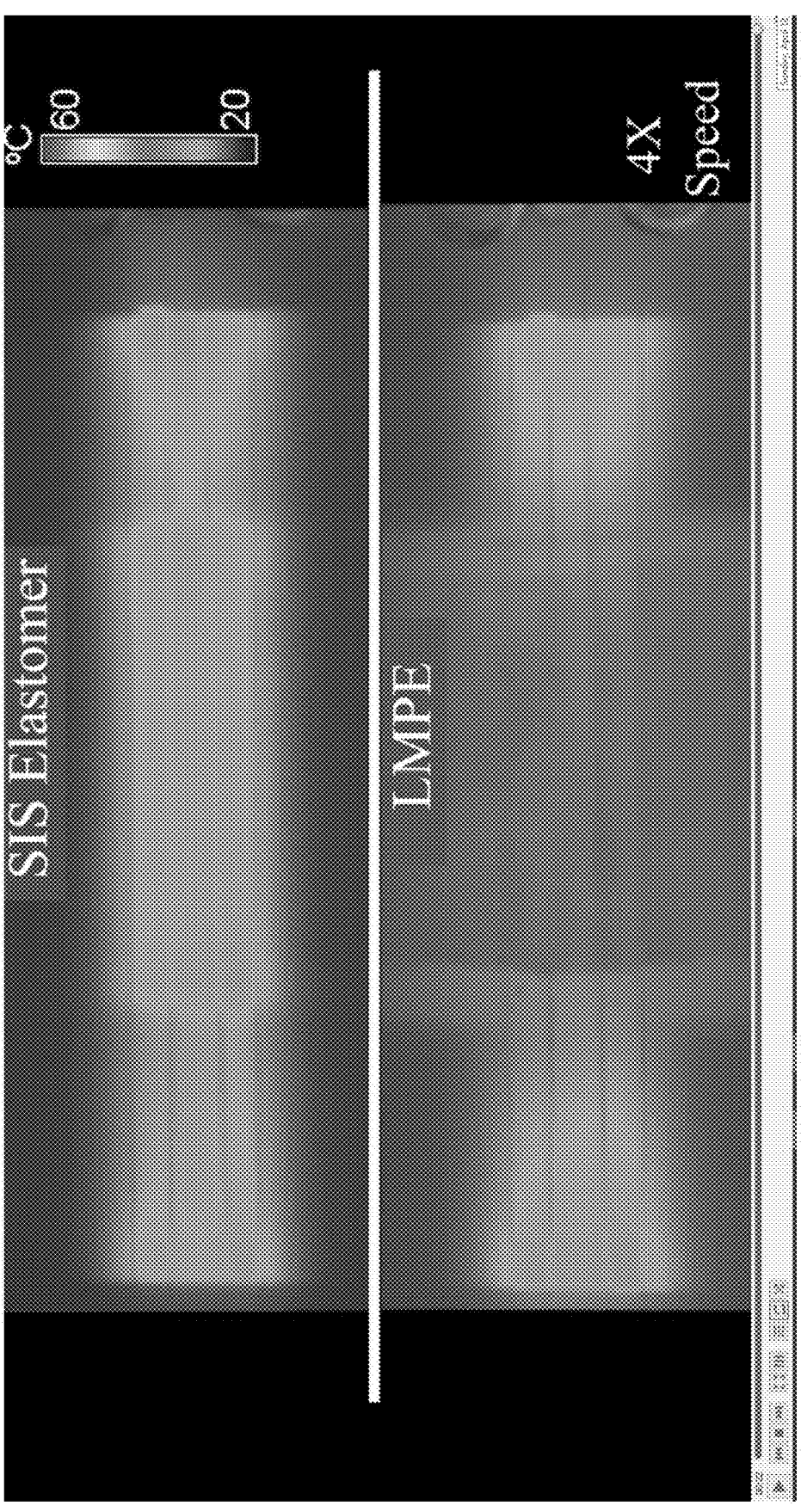
FIG. 16S (M2 @ 22s)

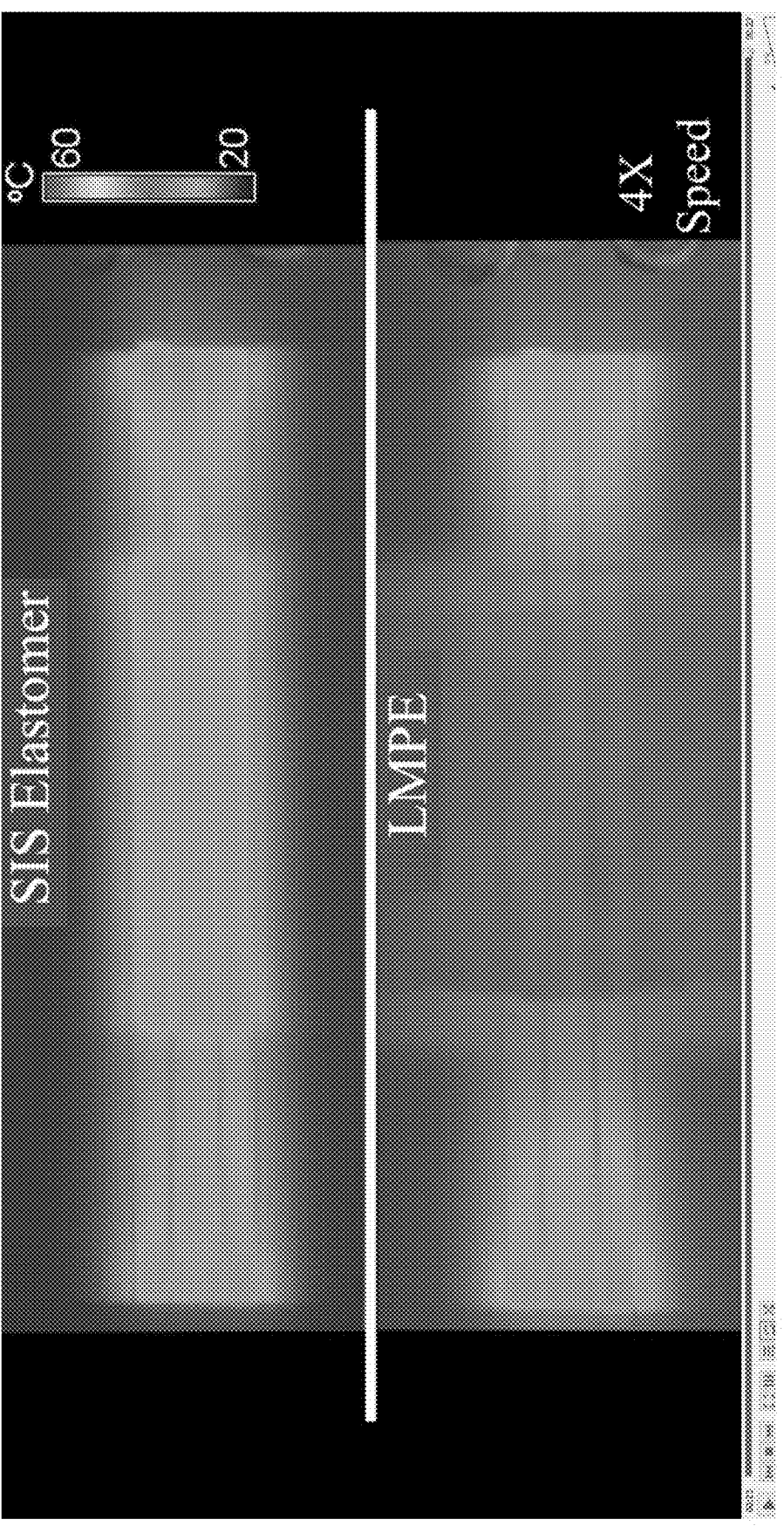
FIG. 16T (M2 @ 23s)

Figure 17A:
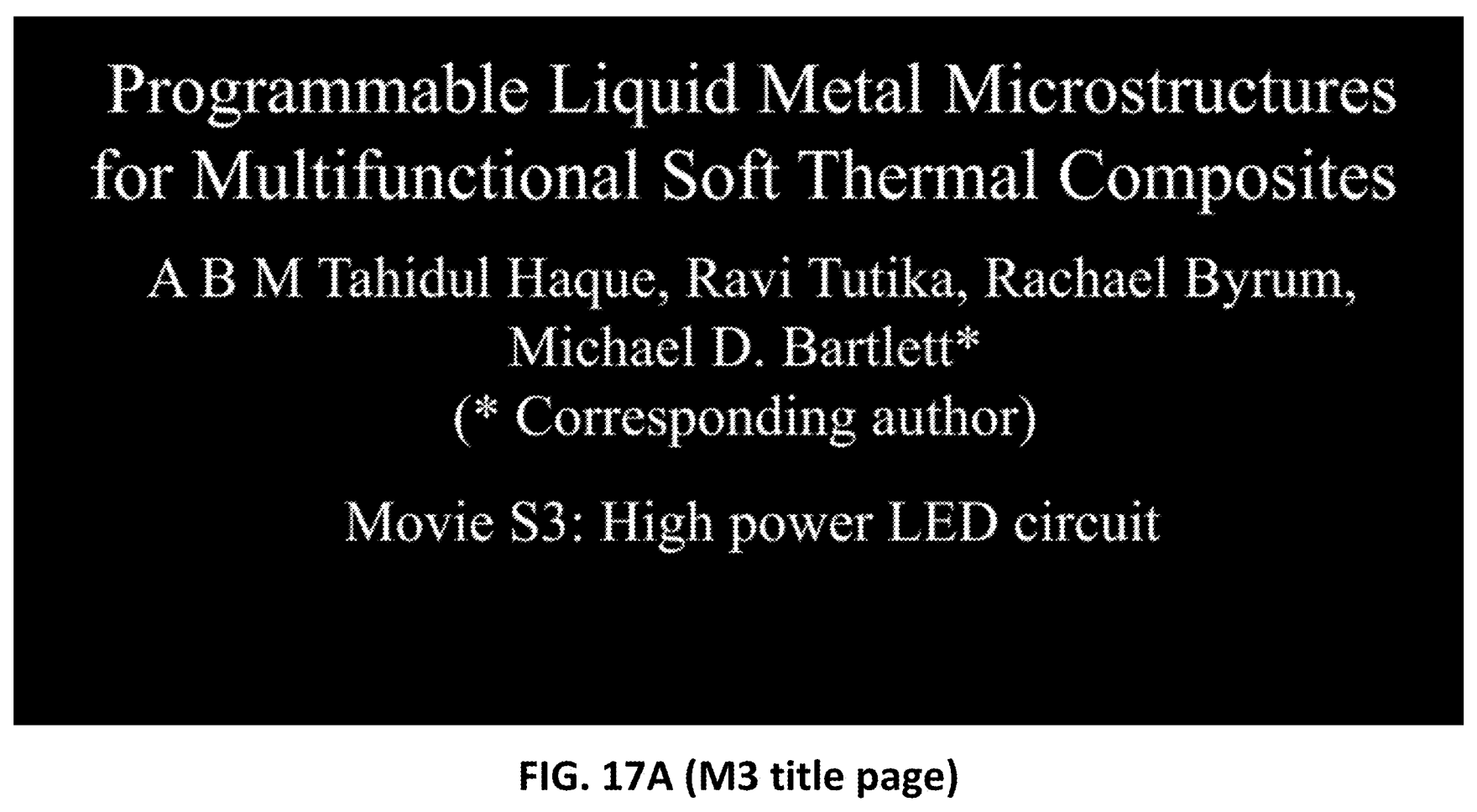

Programmable Liquid Metal Microstructures for Multifunctional Soft Thermal Composites A B M Tahidul Haque, Ravi Tutika, Rachael Byrum, Michael D. Bartlett*

(* Corresponding author)

Movie S3: High power LED circuit

FIG. 17A (M3 title page)

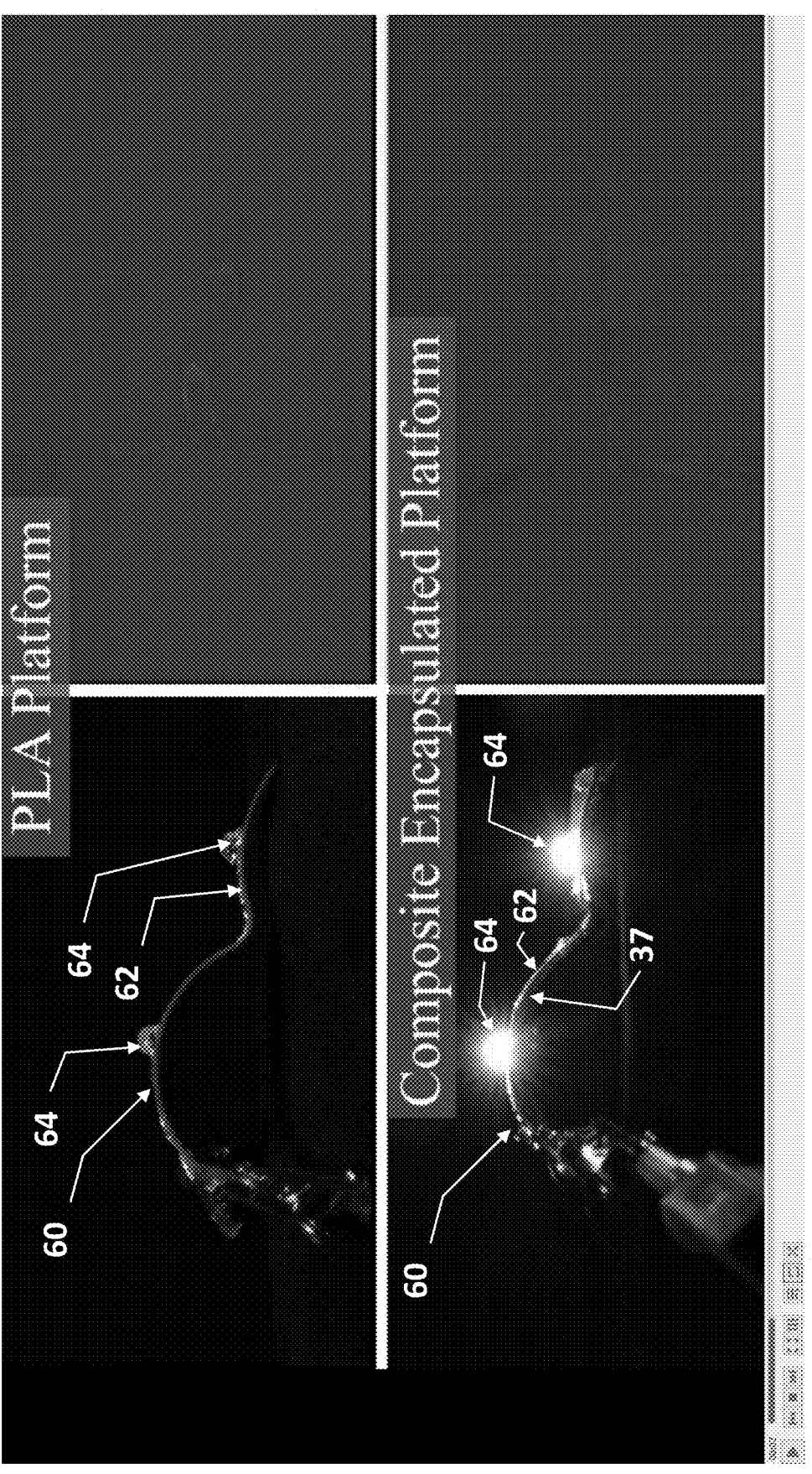
FIG.17B (M3 @2s)

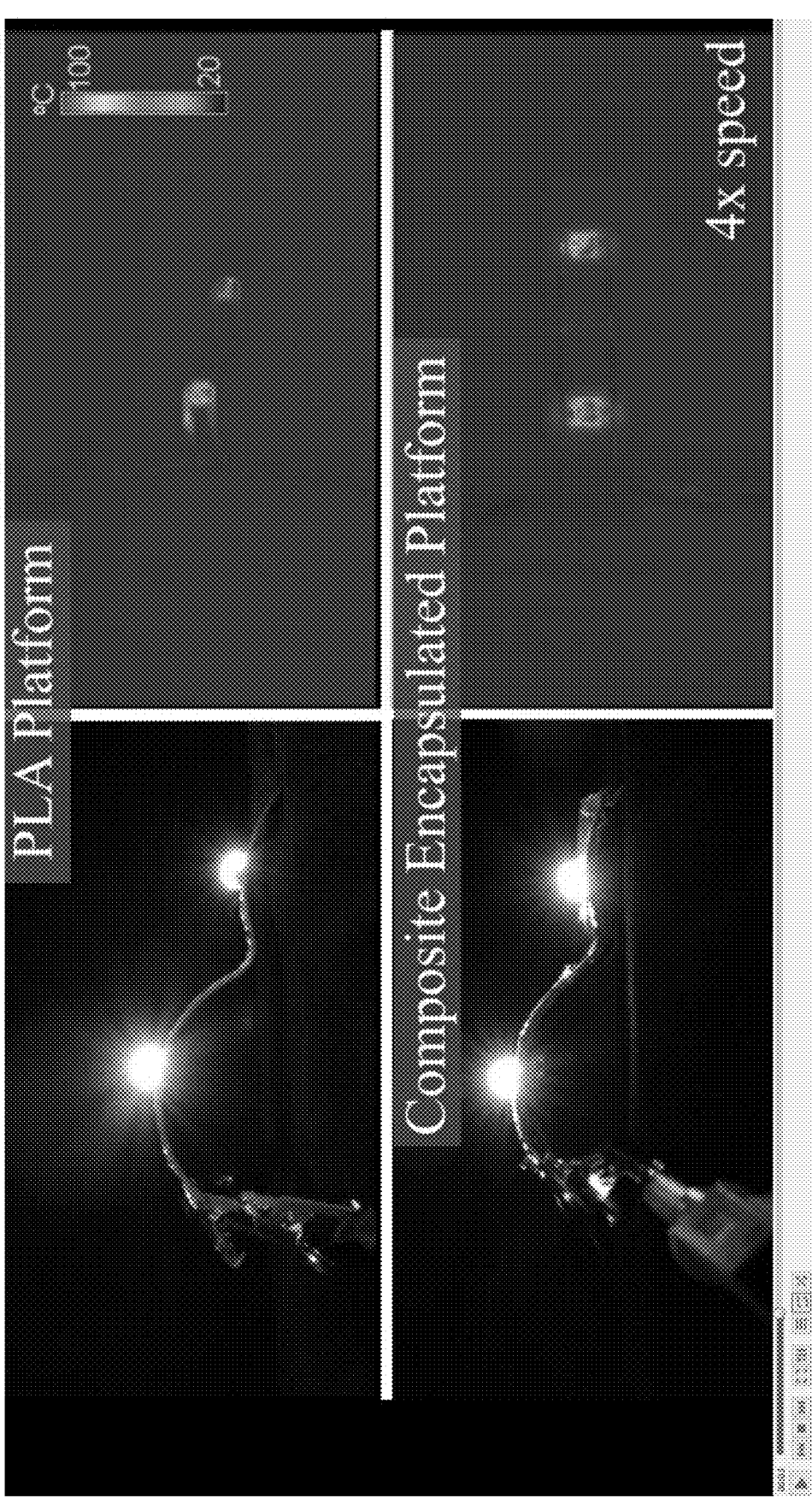
FIG. 17C (M3 @ 3s)

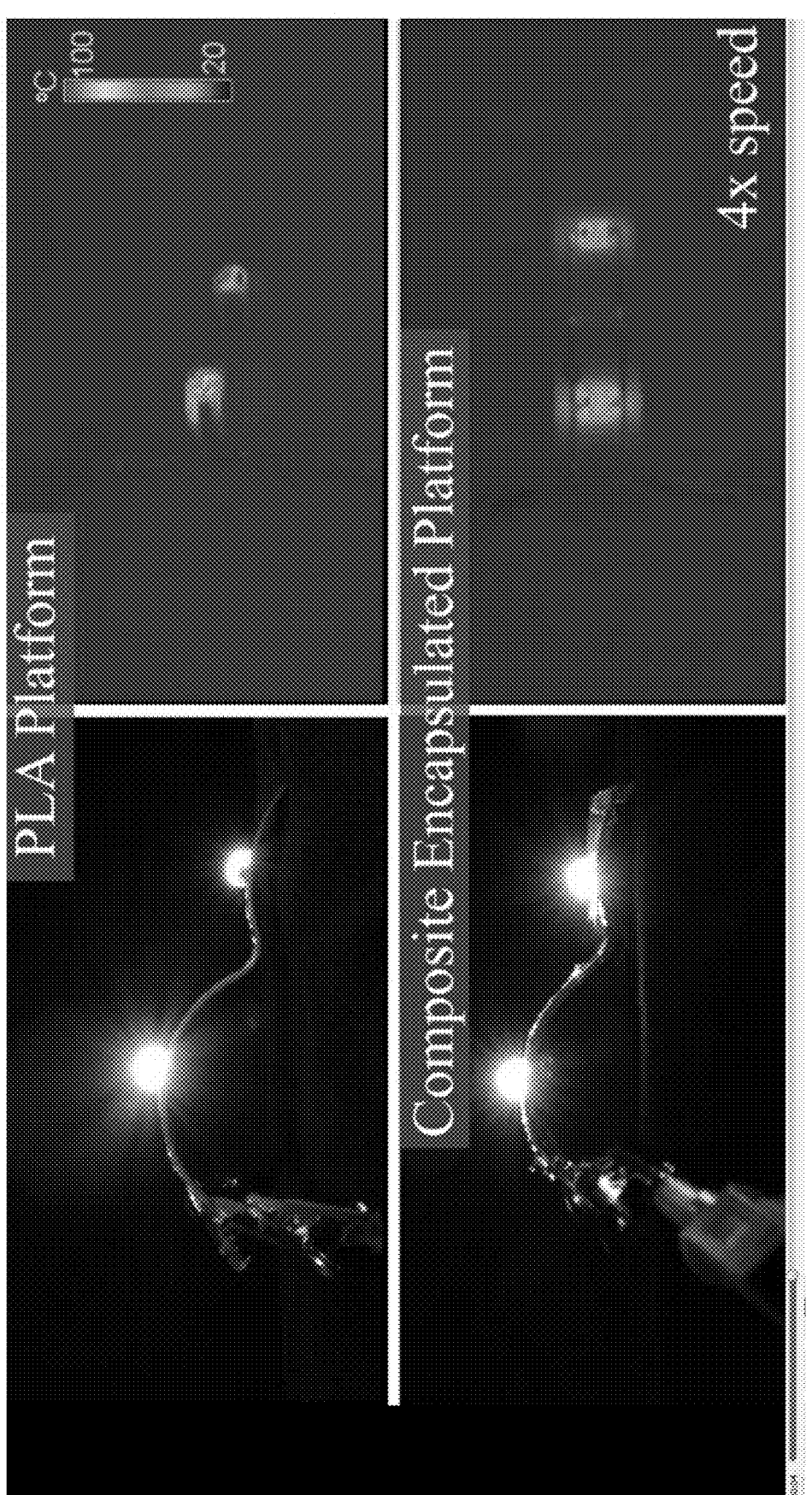
FIG. 17D (M3 @ 4s)

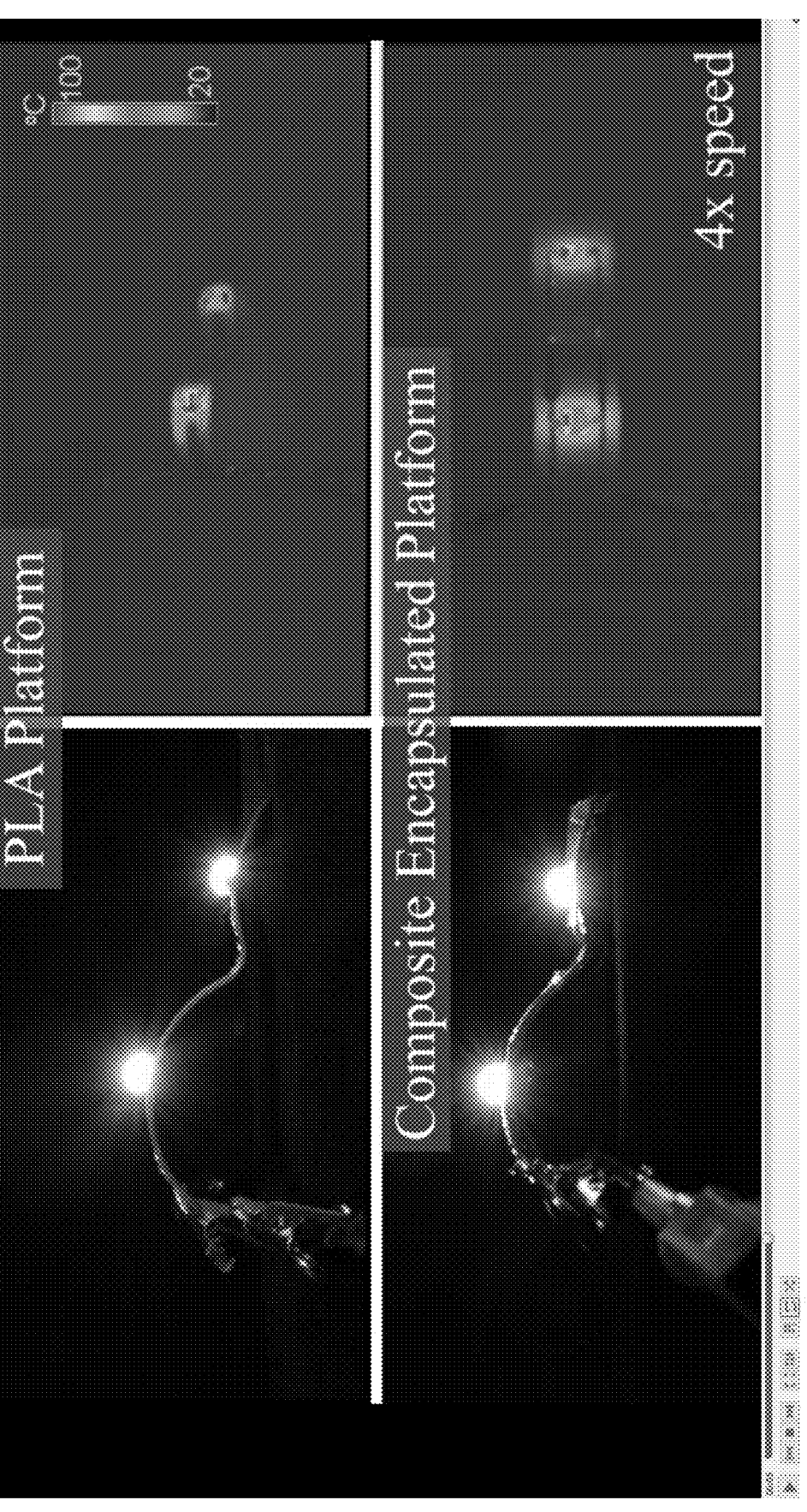
FIG. 17E (M3 @ 5s)

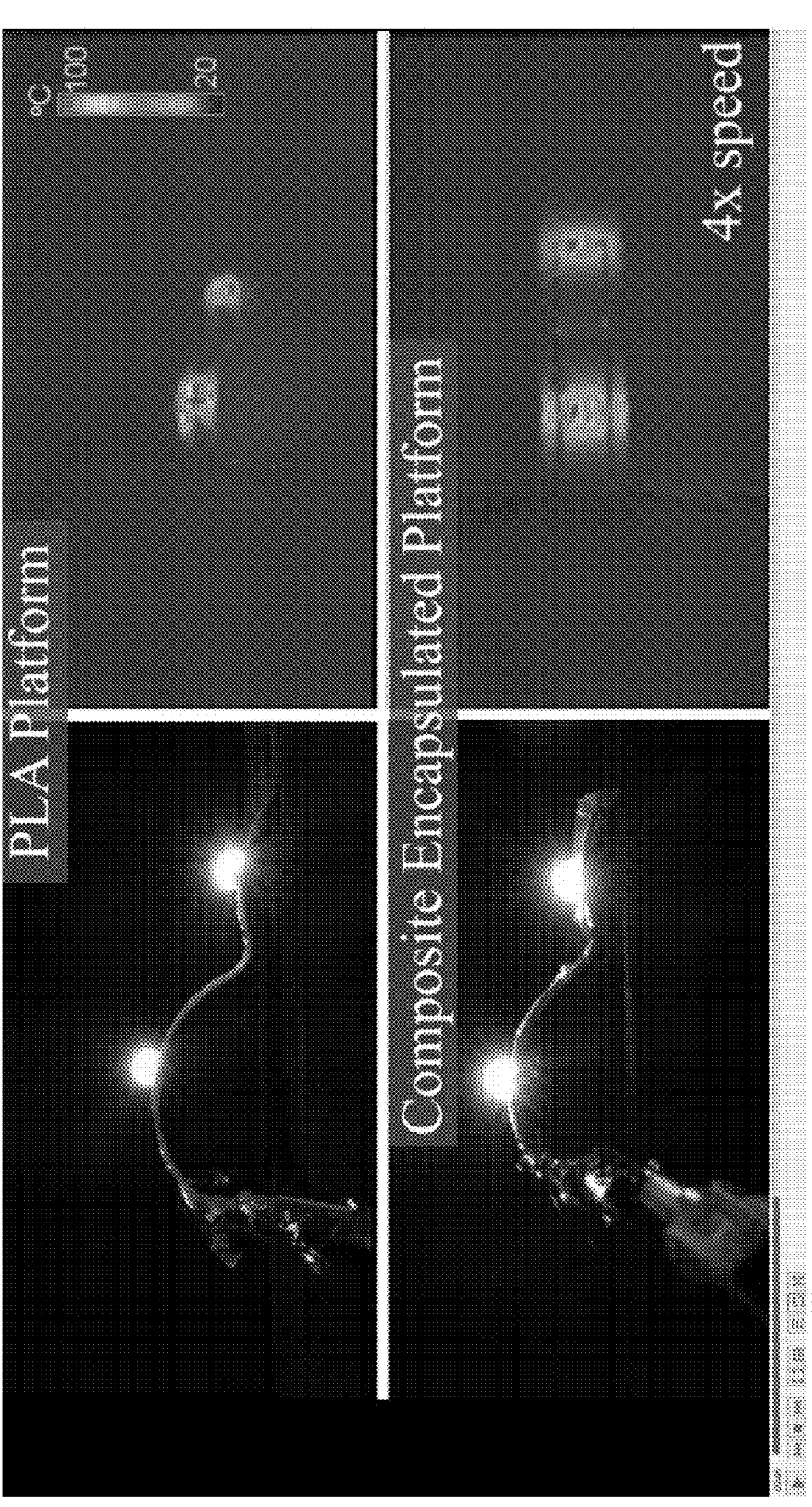
FIG. 17F (M3 @ 6s)

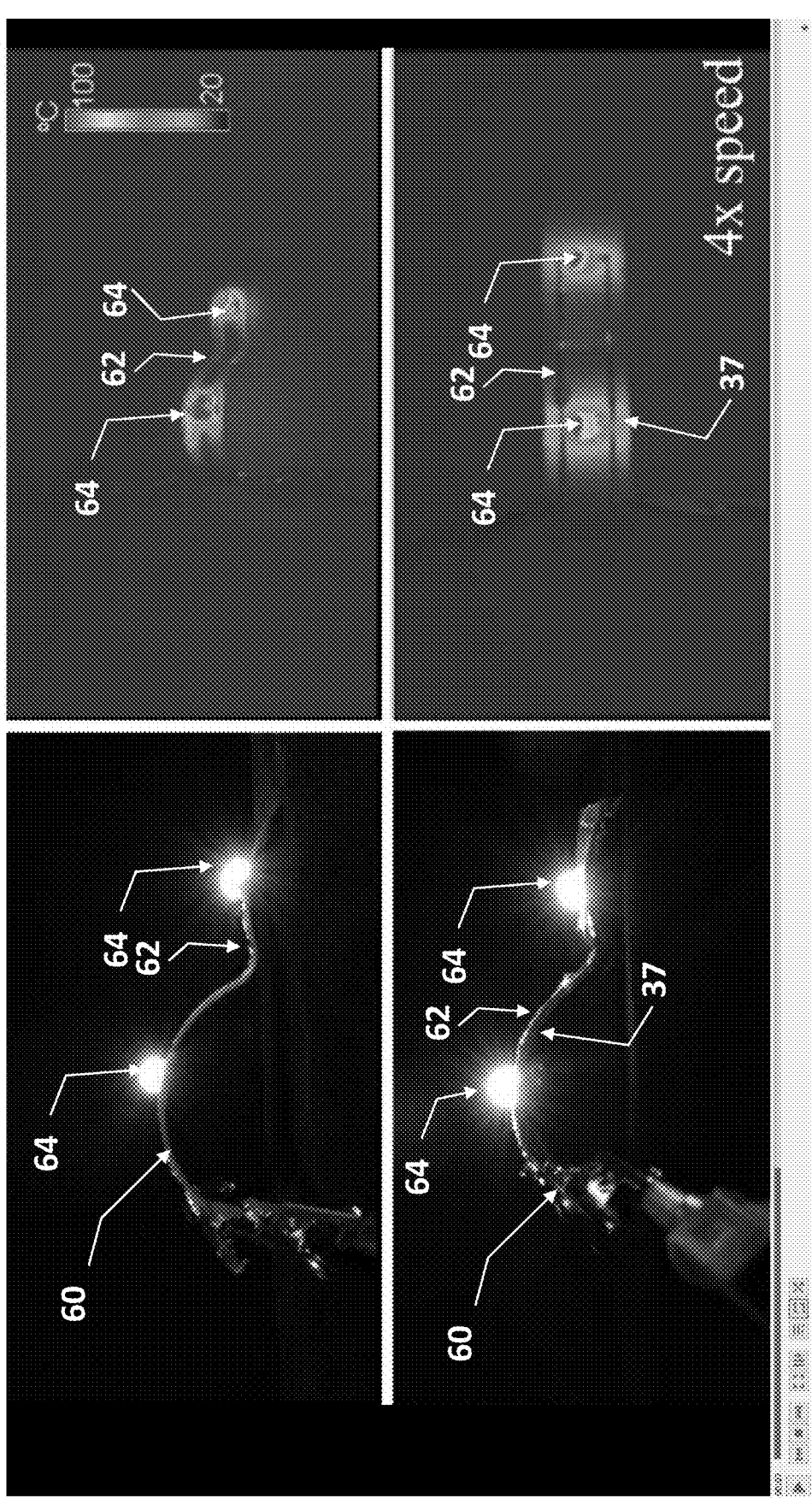
FIG. 17G (M3 @ 7s)

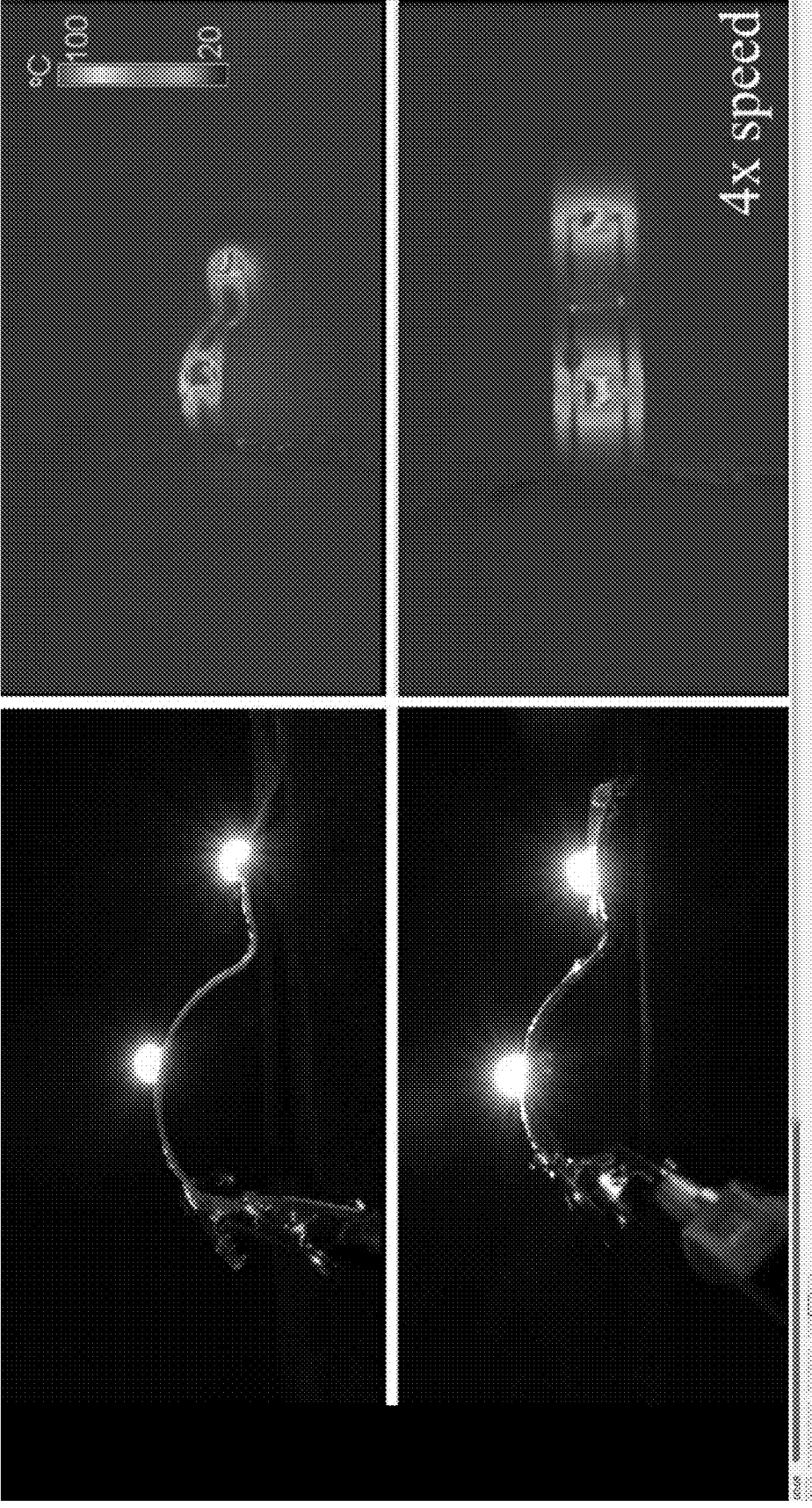
FIG.17H (M3 @ 8s)

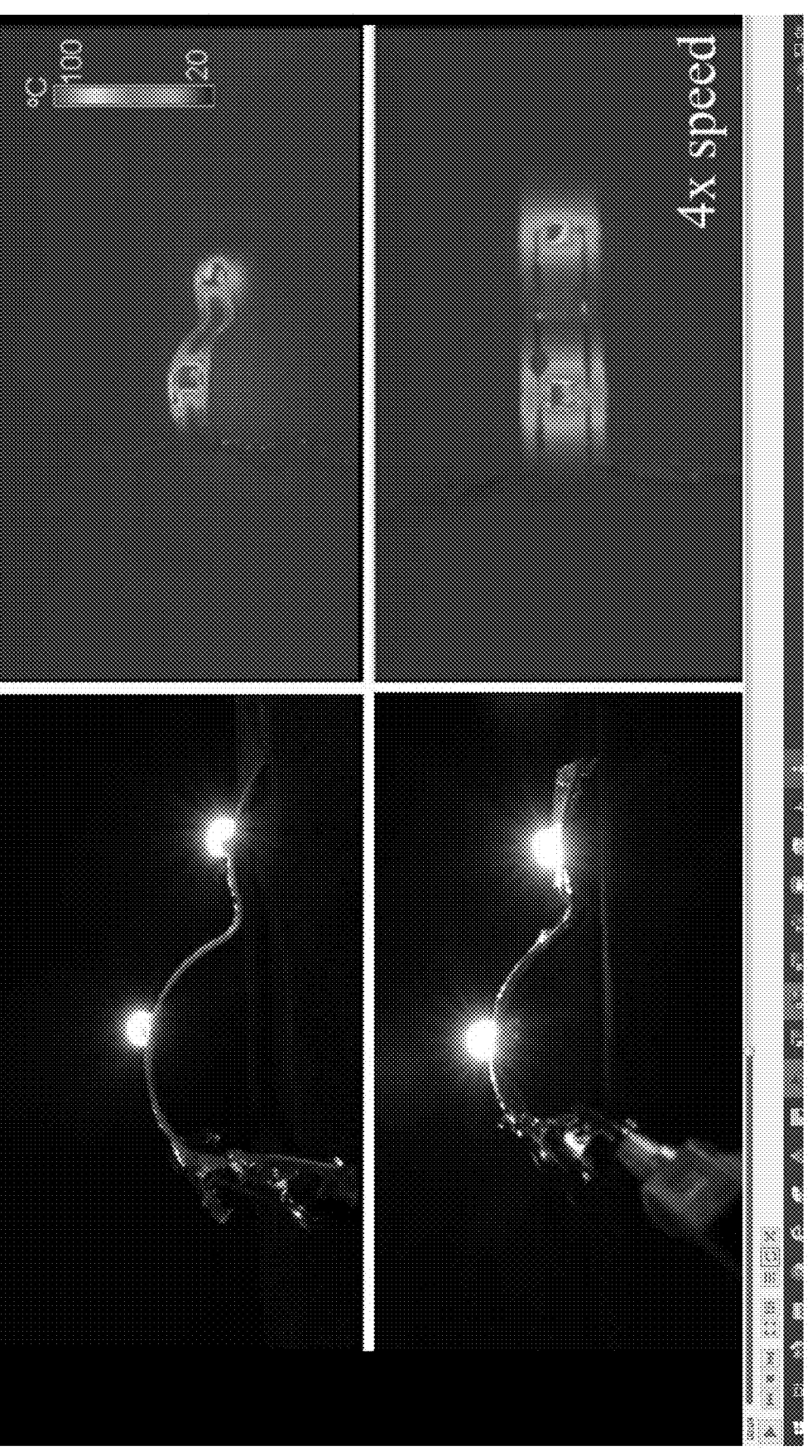
FIG. 17I (M3 @ 9s)

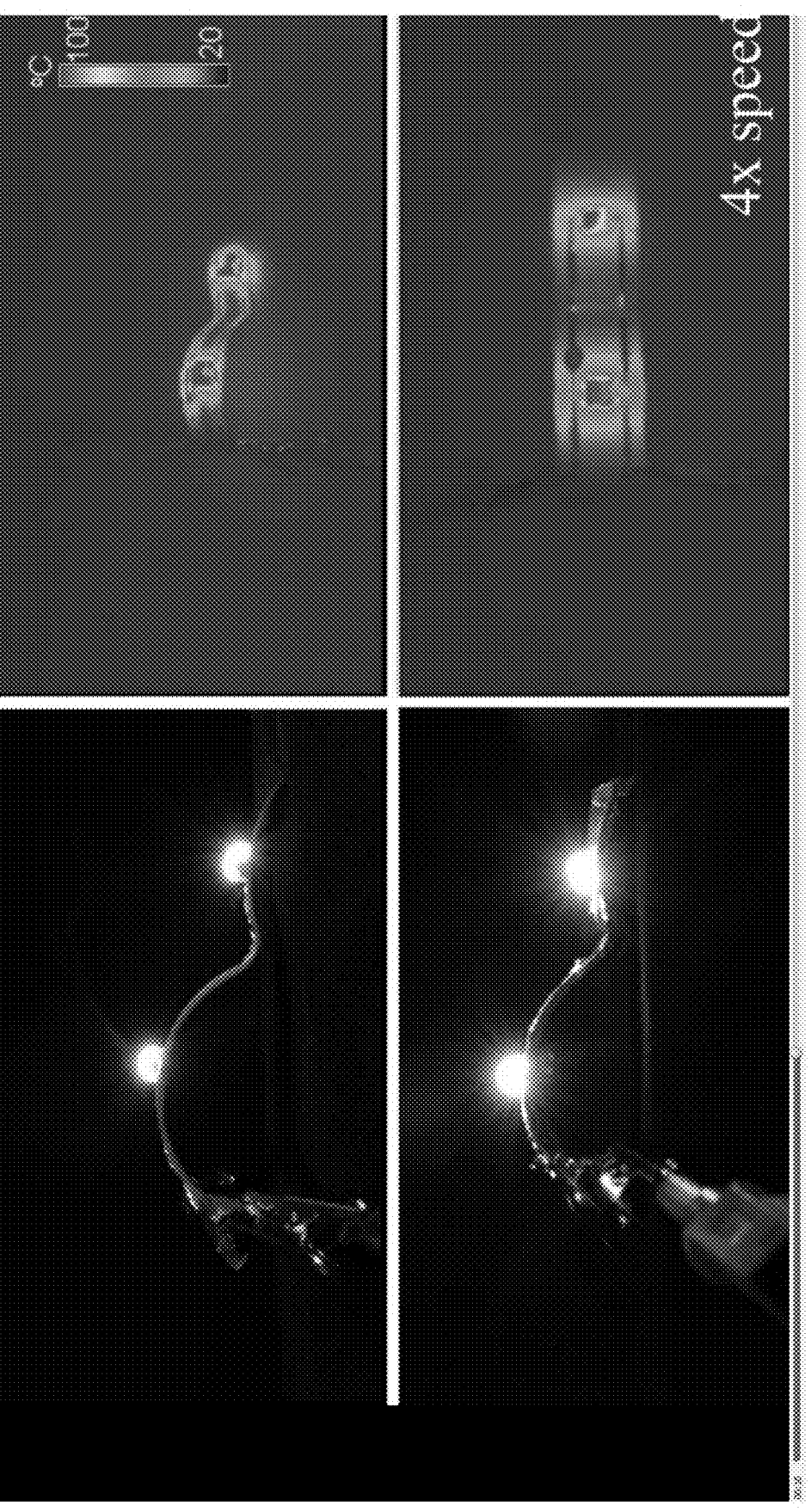
FIG. 17J (M3 @ 10s)

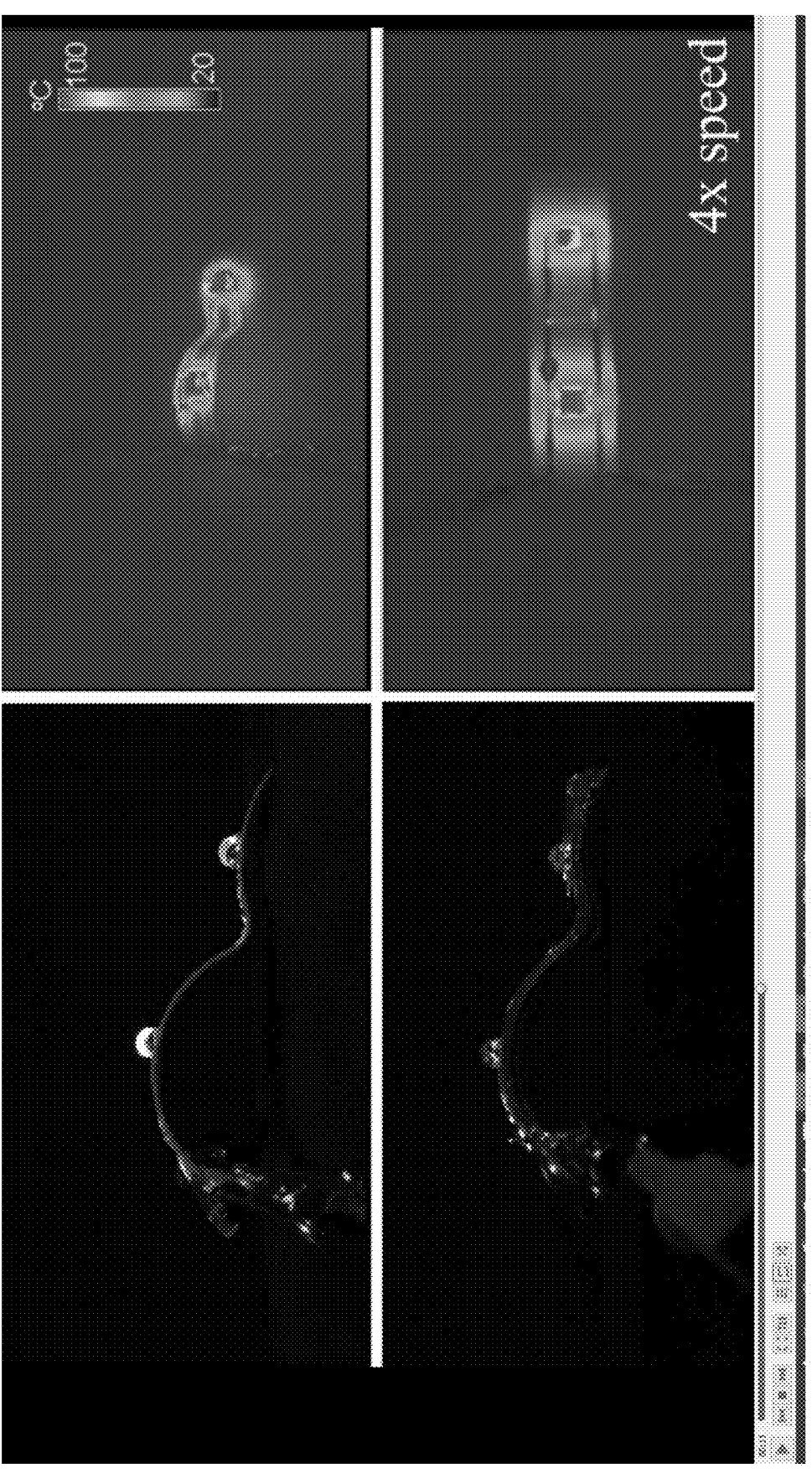
FIG. 17K (M3 @ 11s)

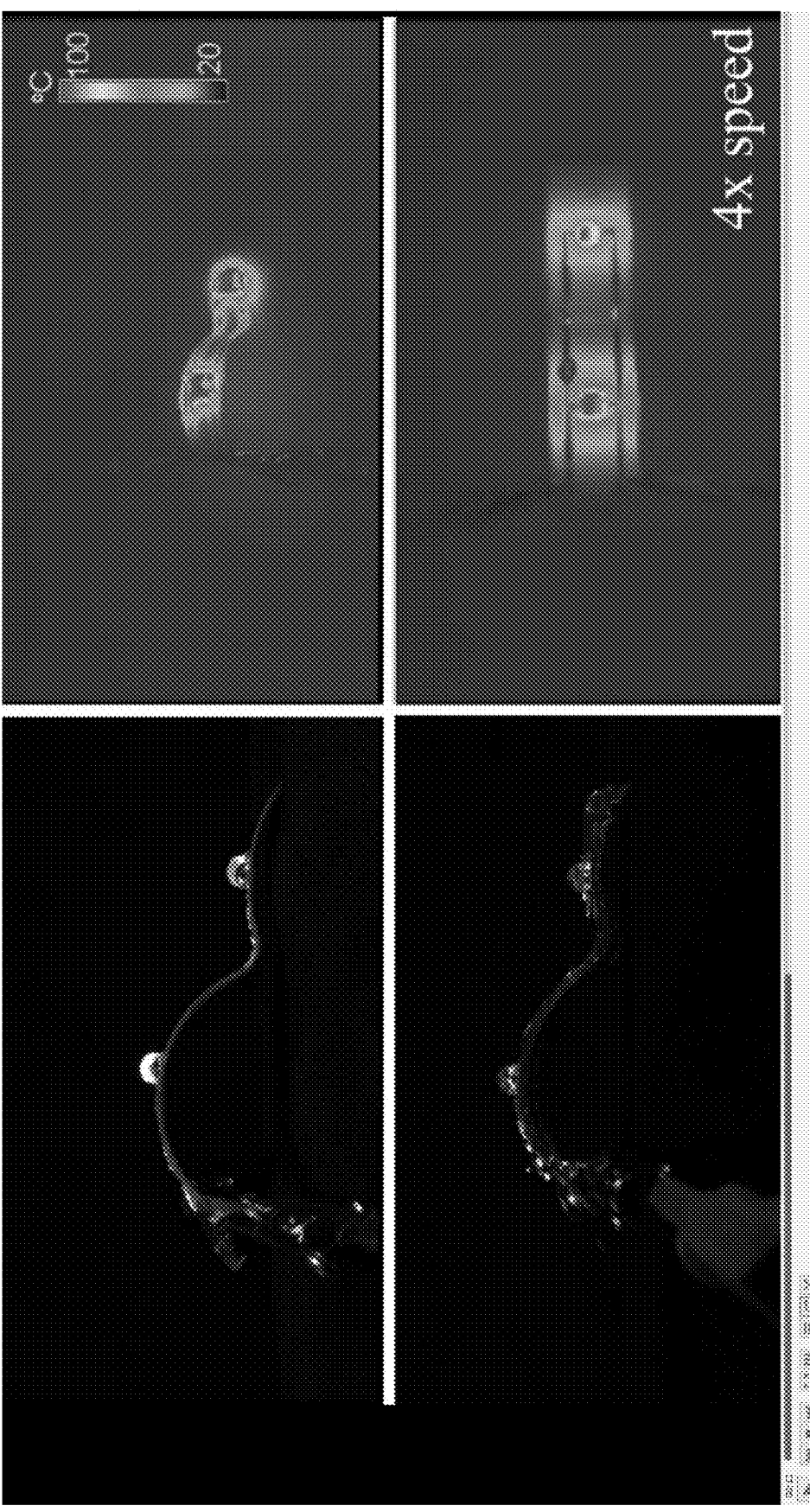
FIG. 17L (M3 @ 12s)

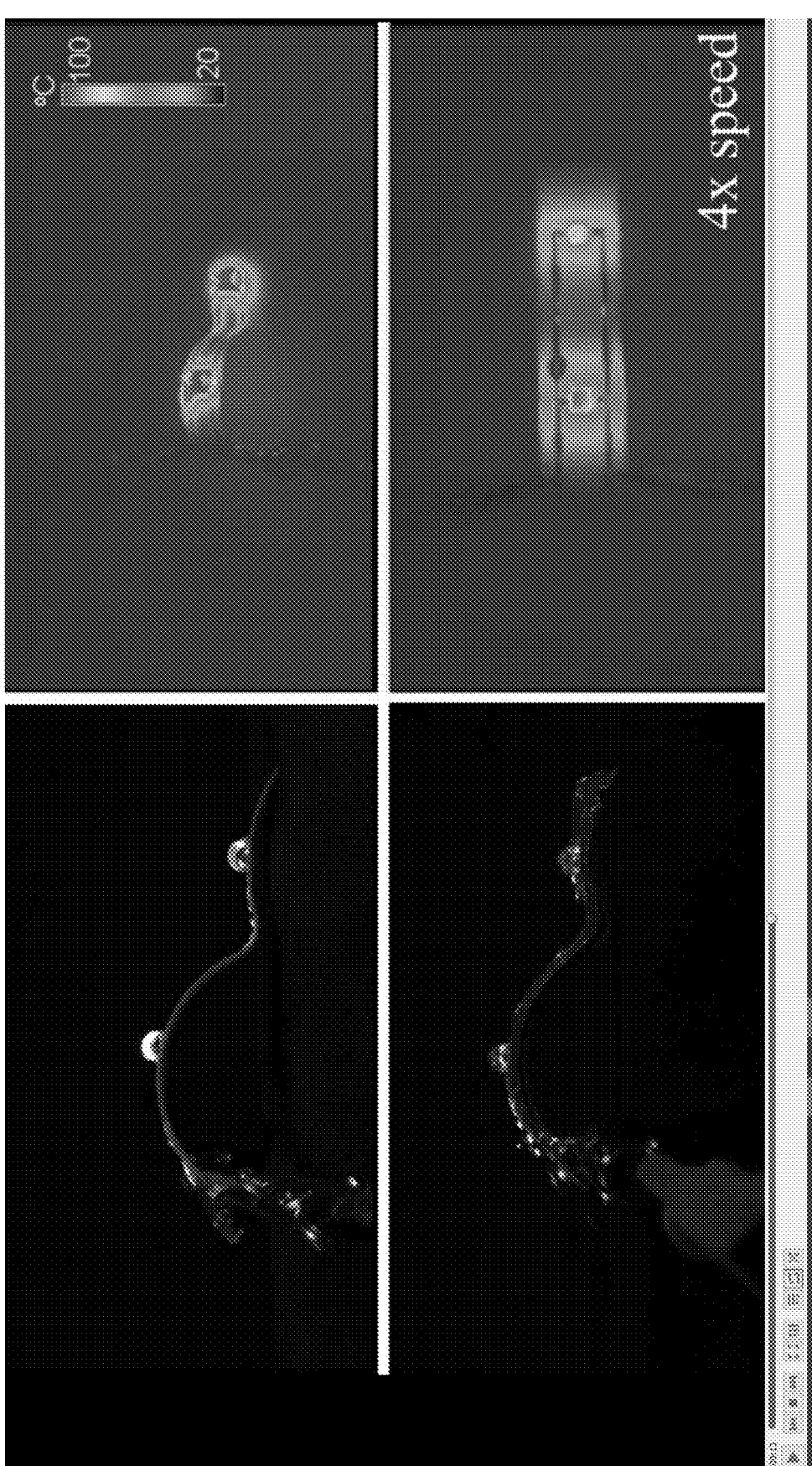
FIG. 17M (M3 @ 13s)

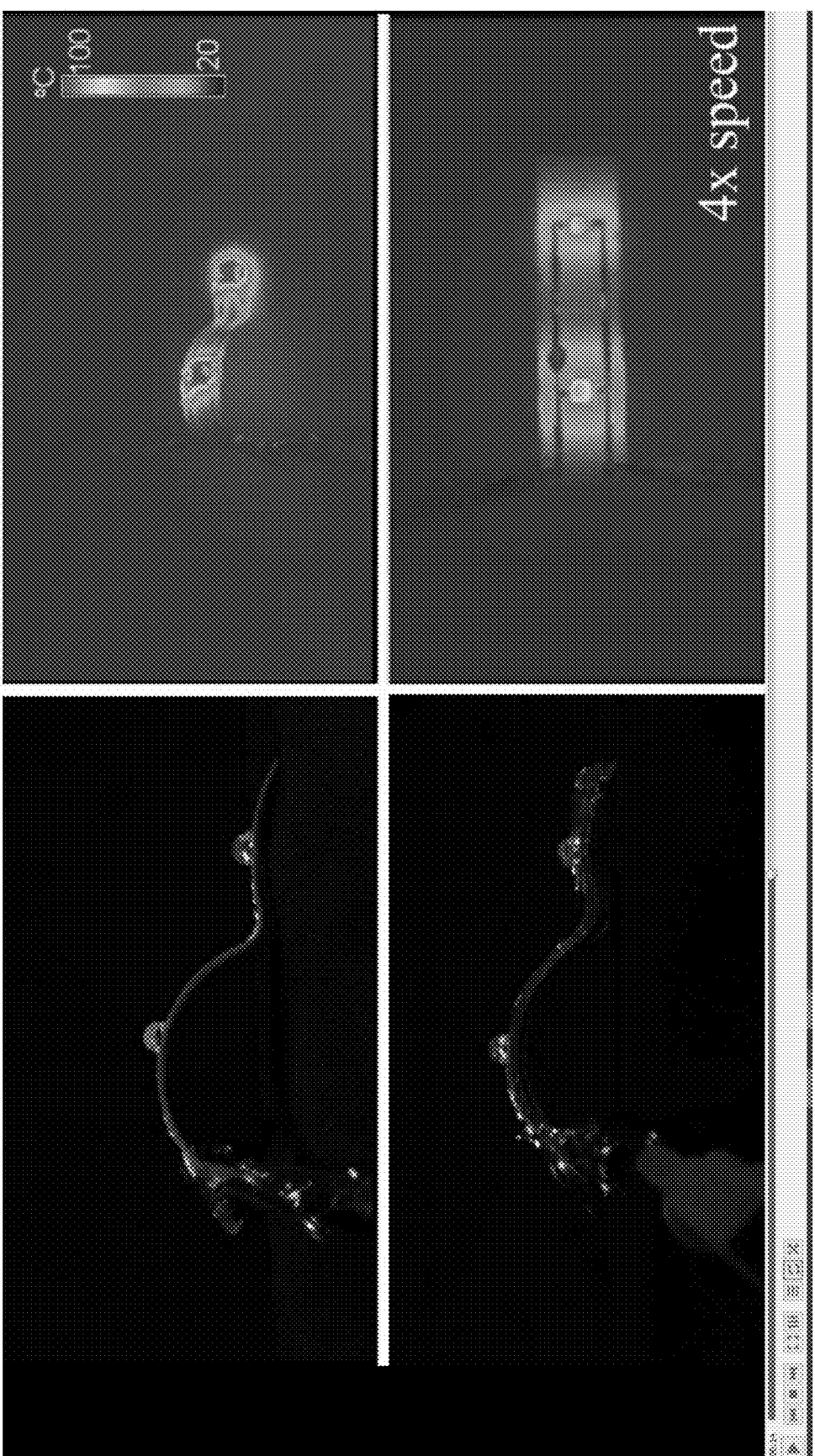
FIG. 17N (M3 @ 14s)

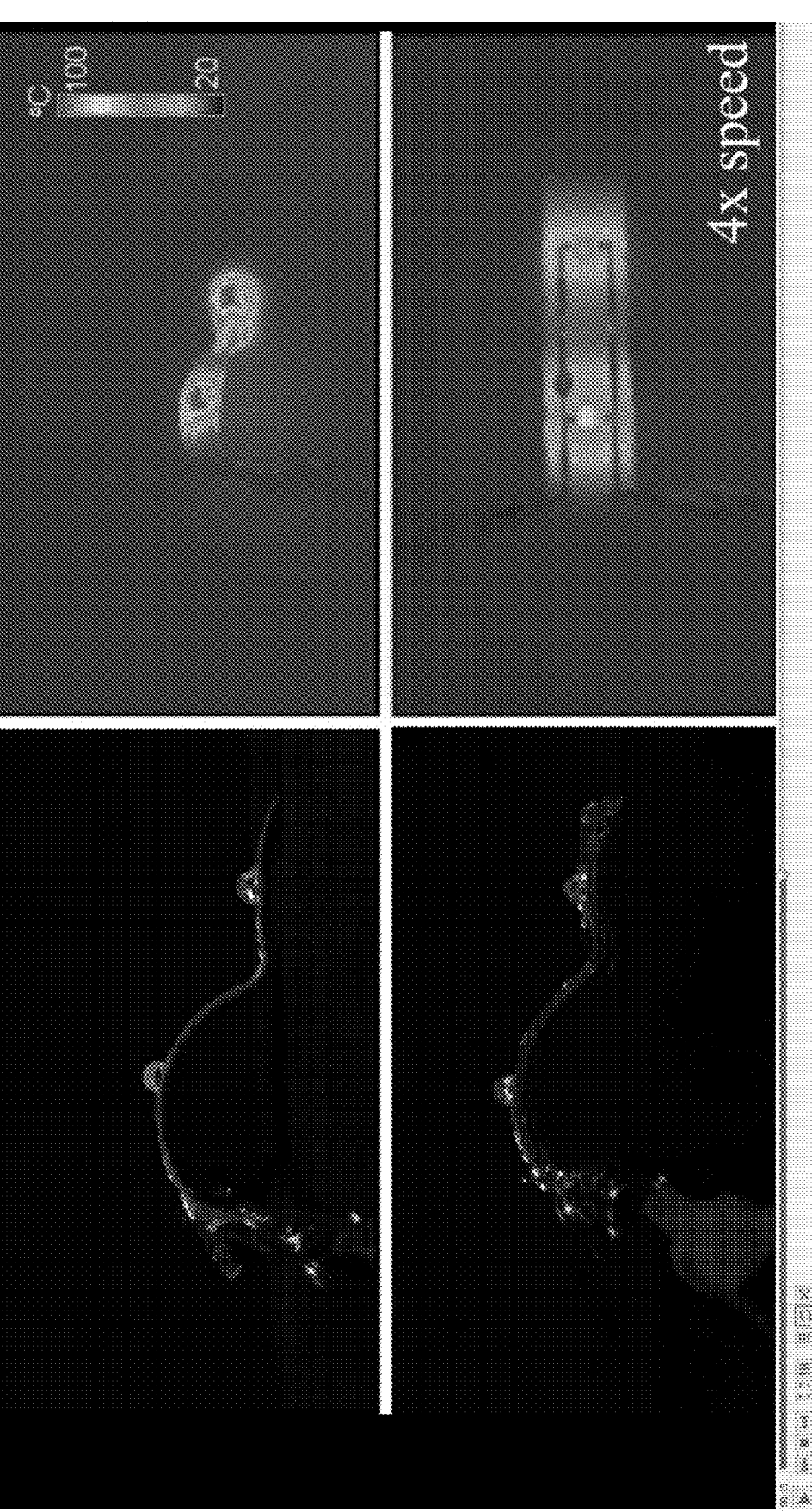
FIG.17O (M3 @ 15s)

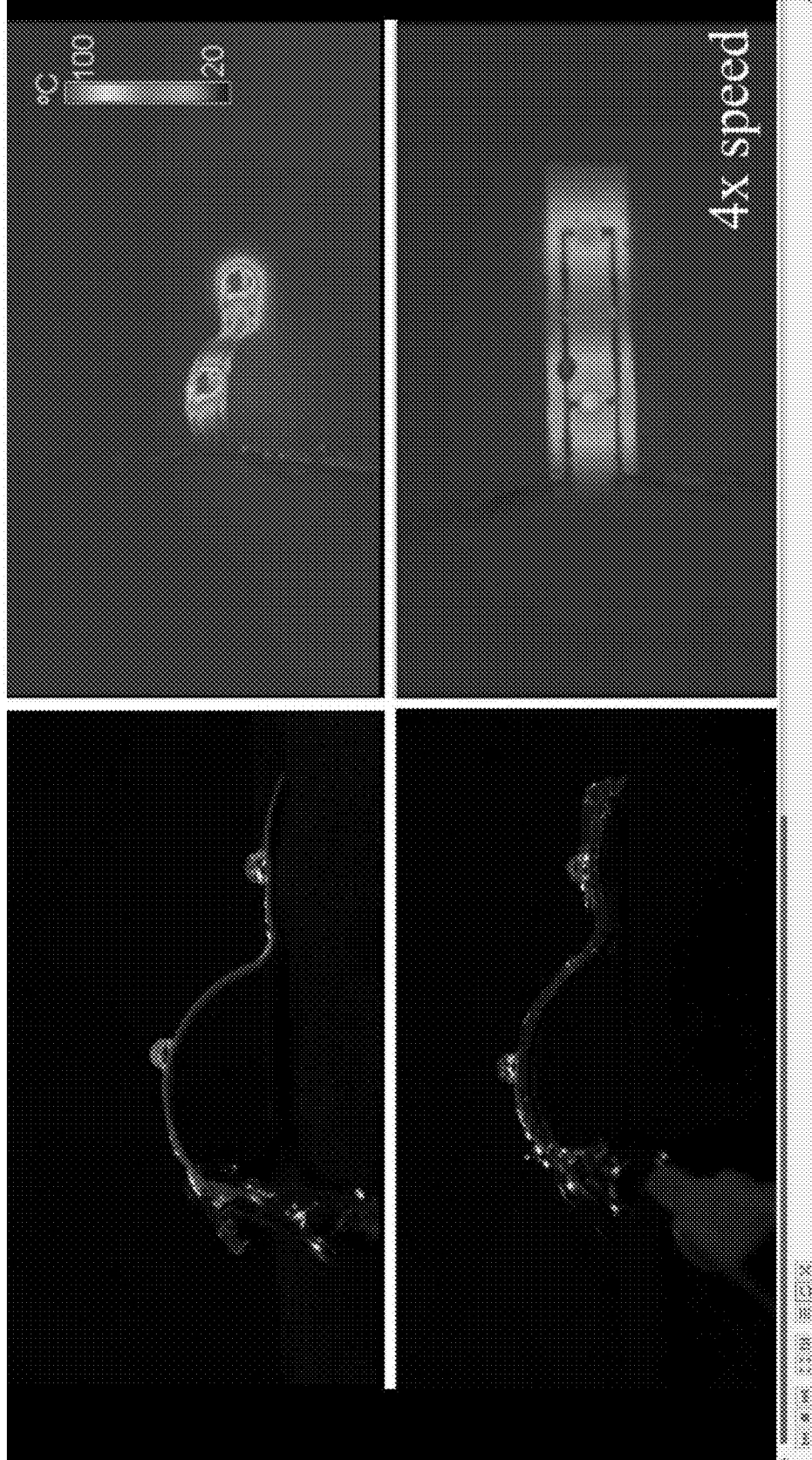
FIG. 17P (M3 @ 16s)

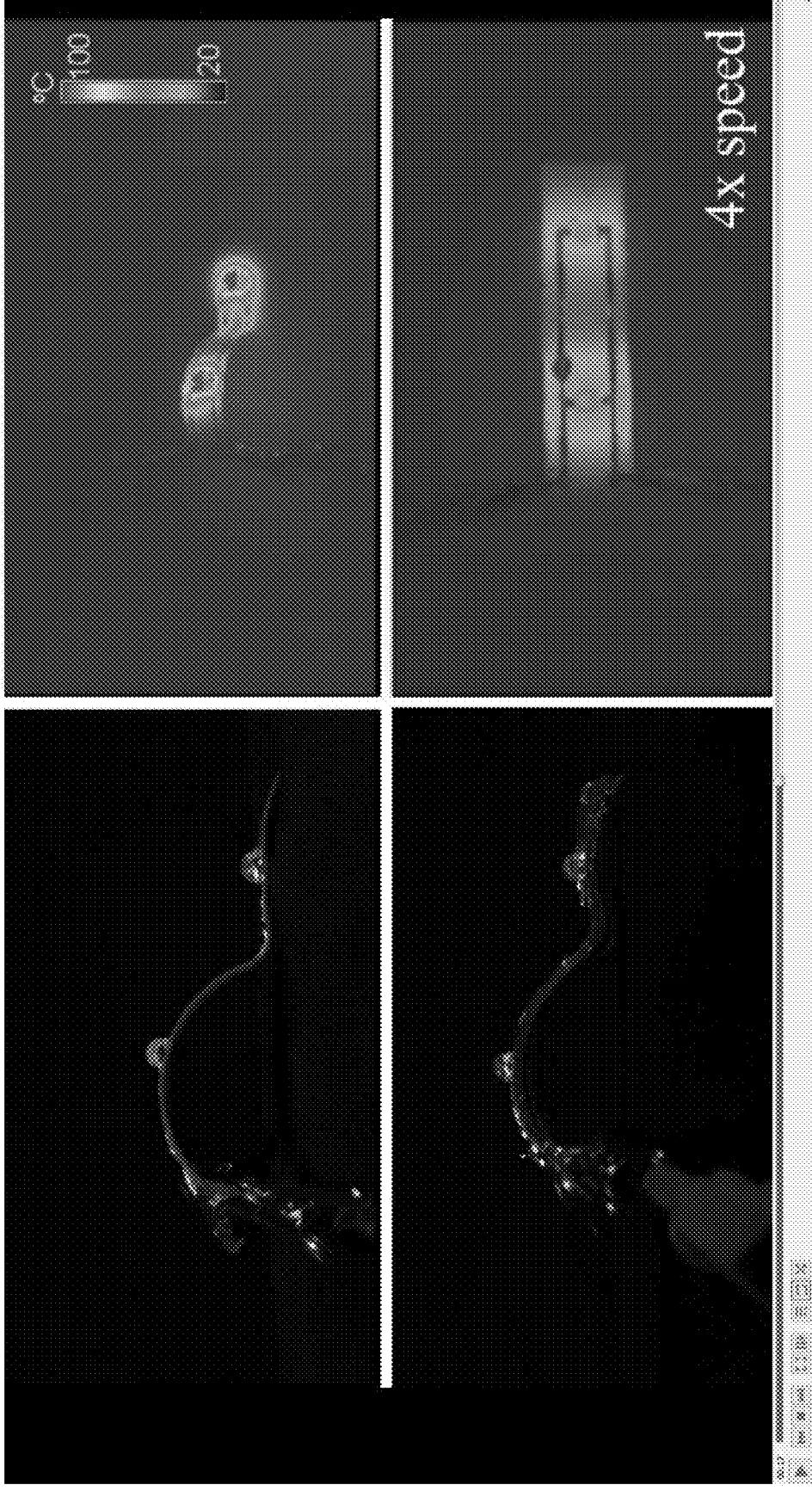
FIG. 17Q (M3 @ 17s)

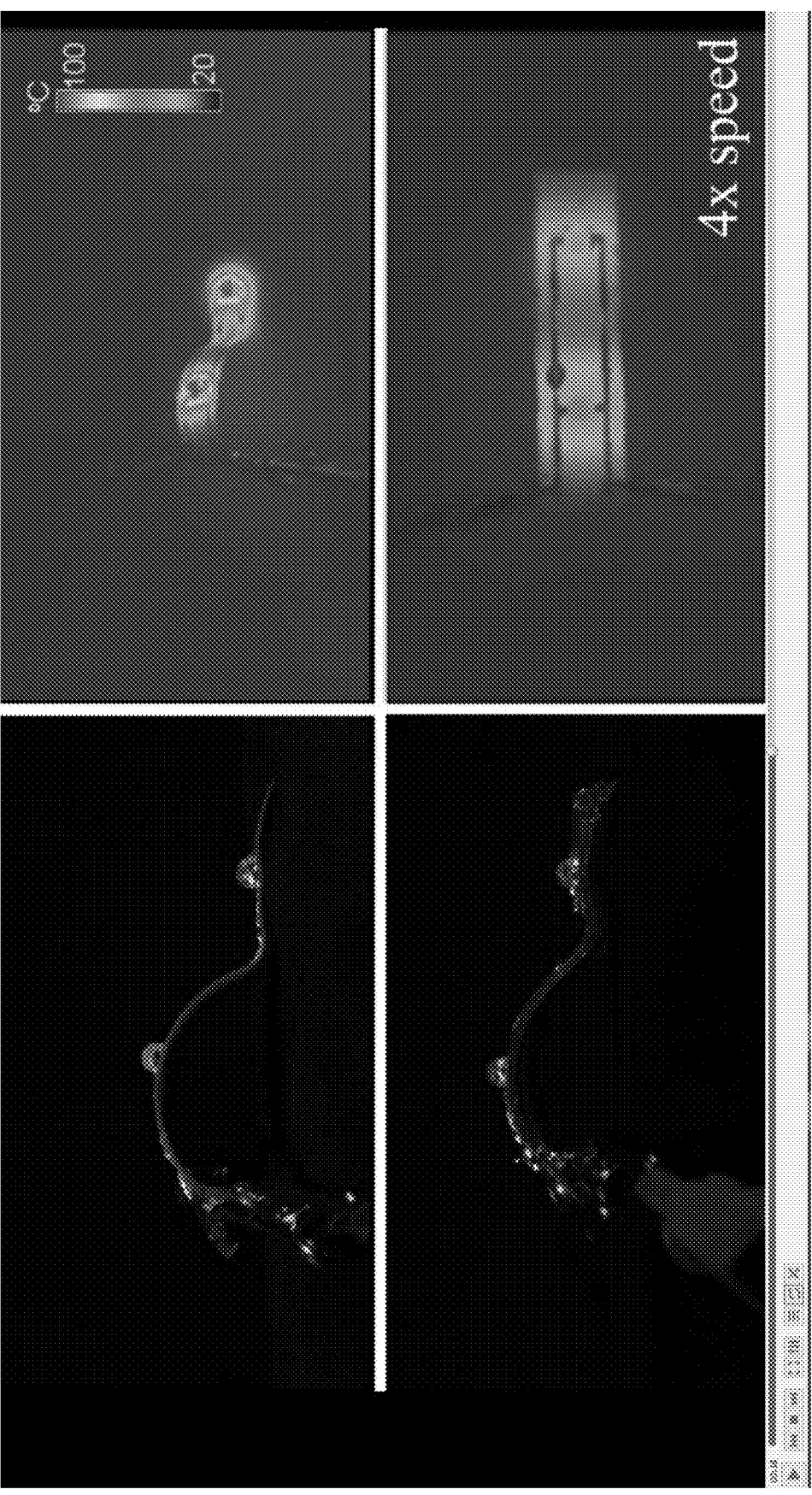
FIG.17R (M3 @ 18s)

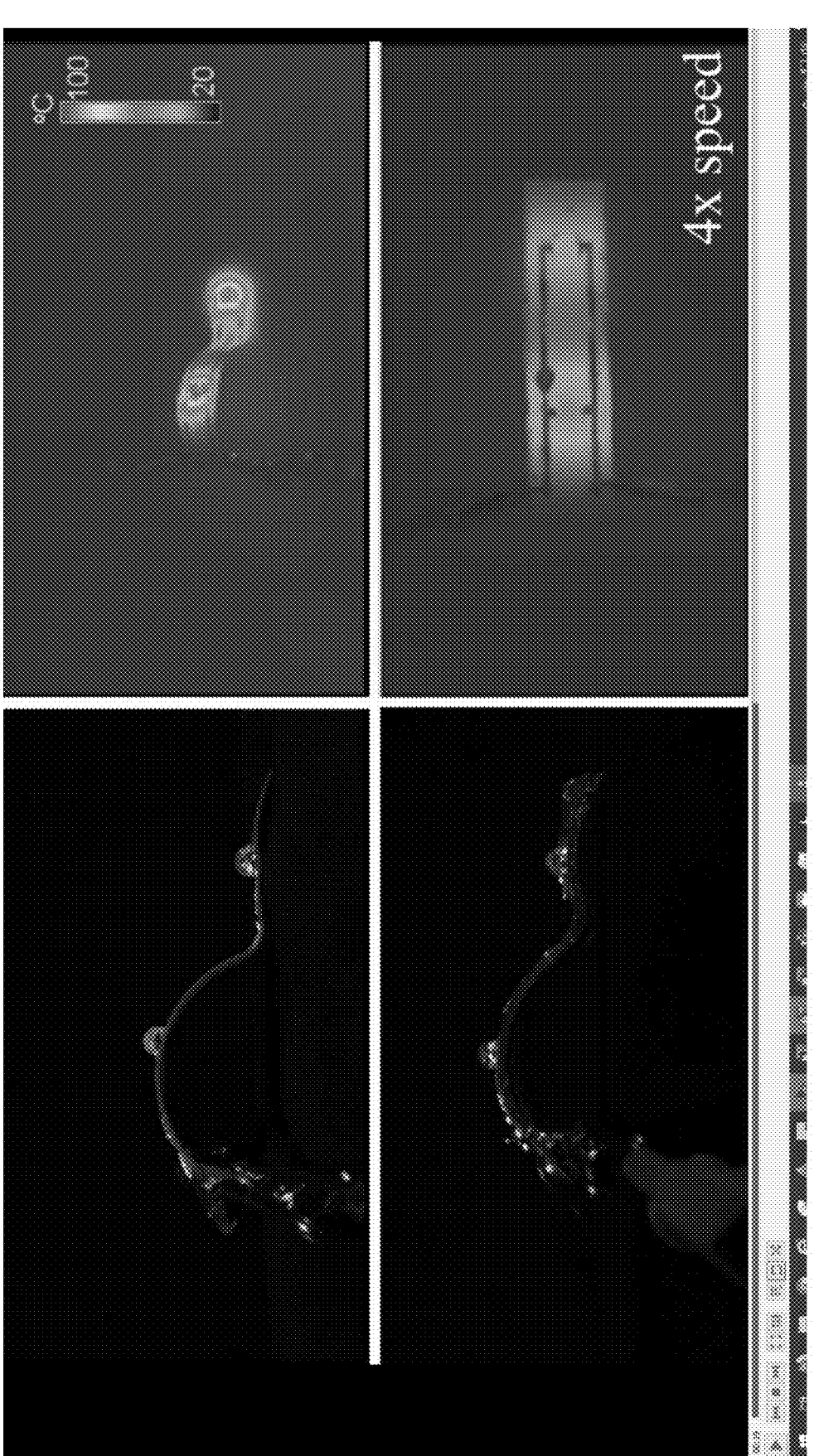
FIG. 17S (M3 @ 19s)

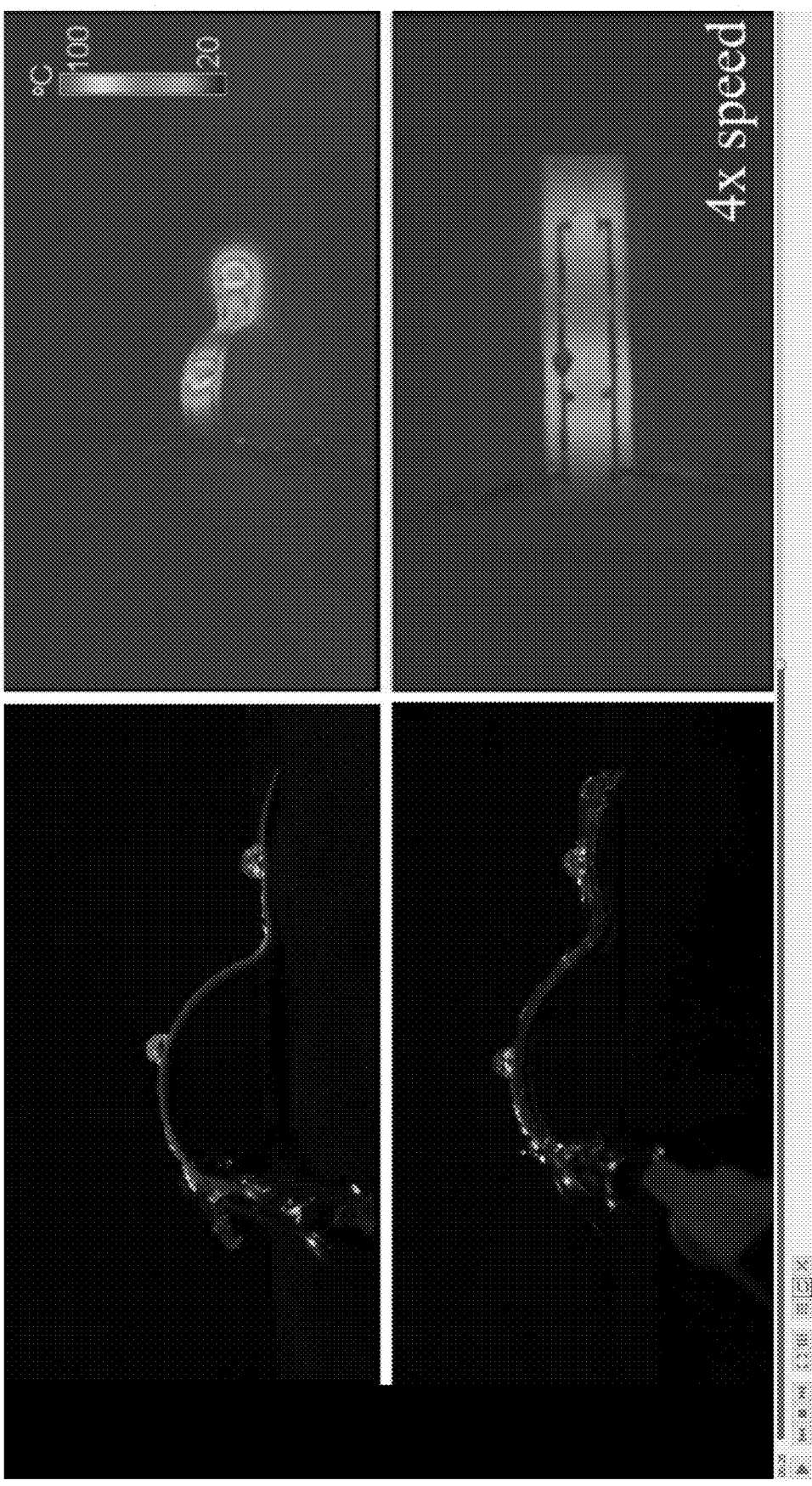
FIG. 17T (M3 @ 20s)

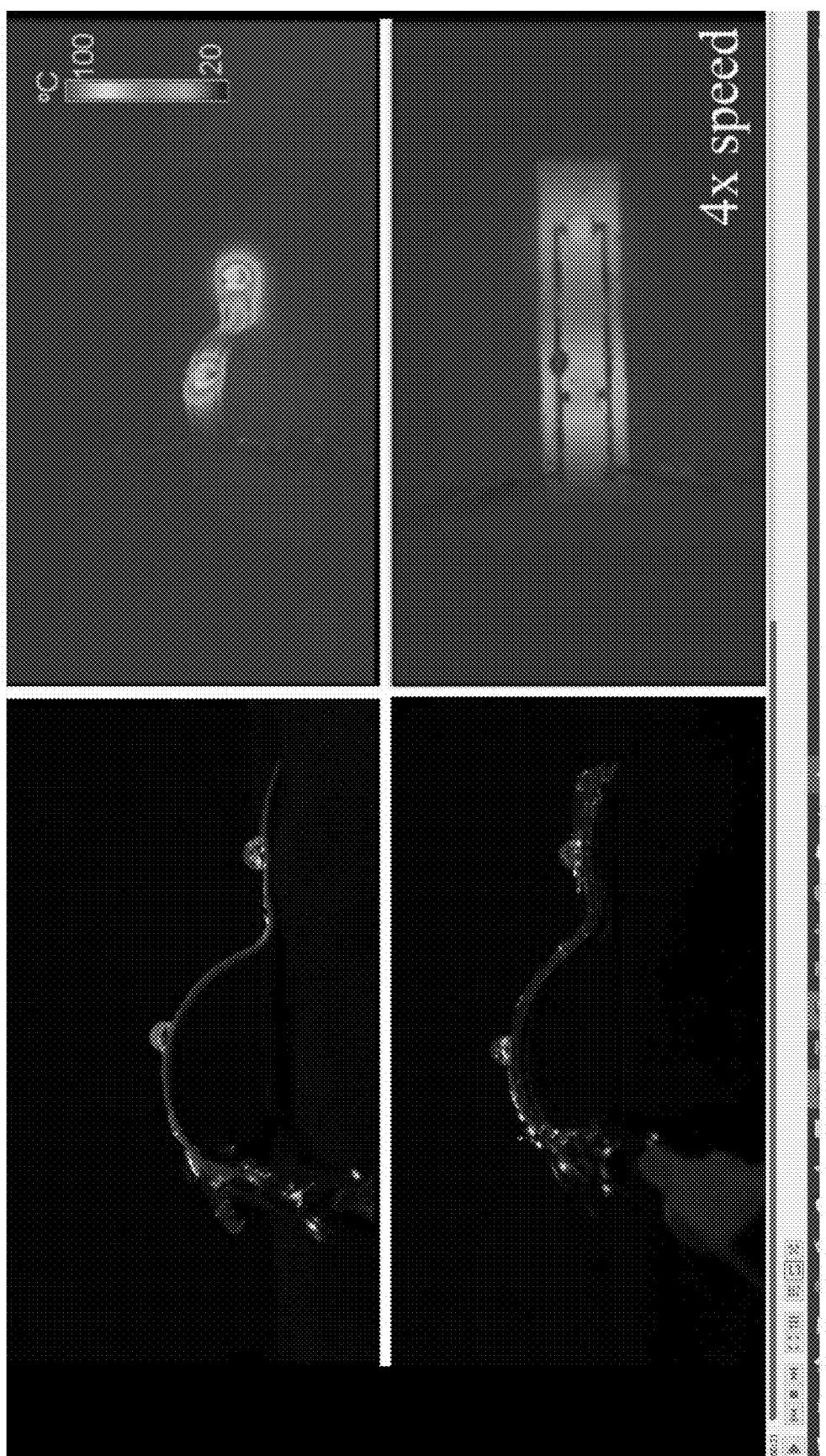
FIG. 17U (M3 @ 21s)

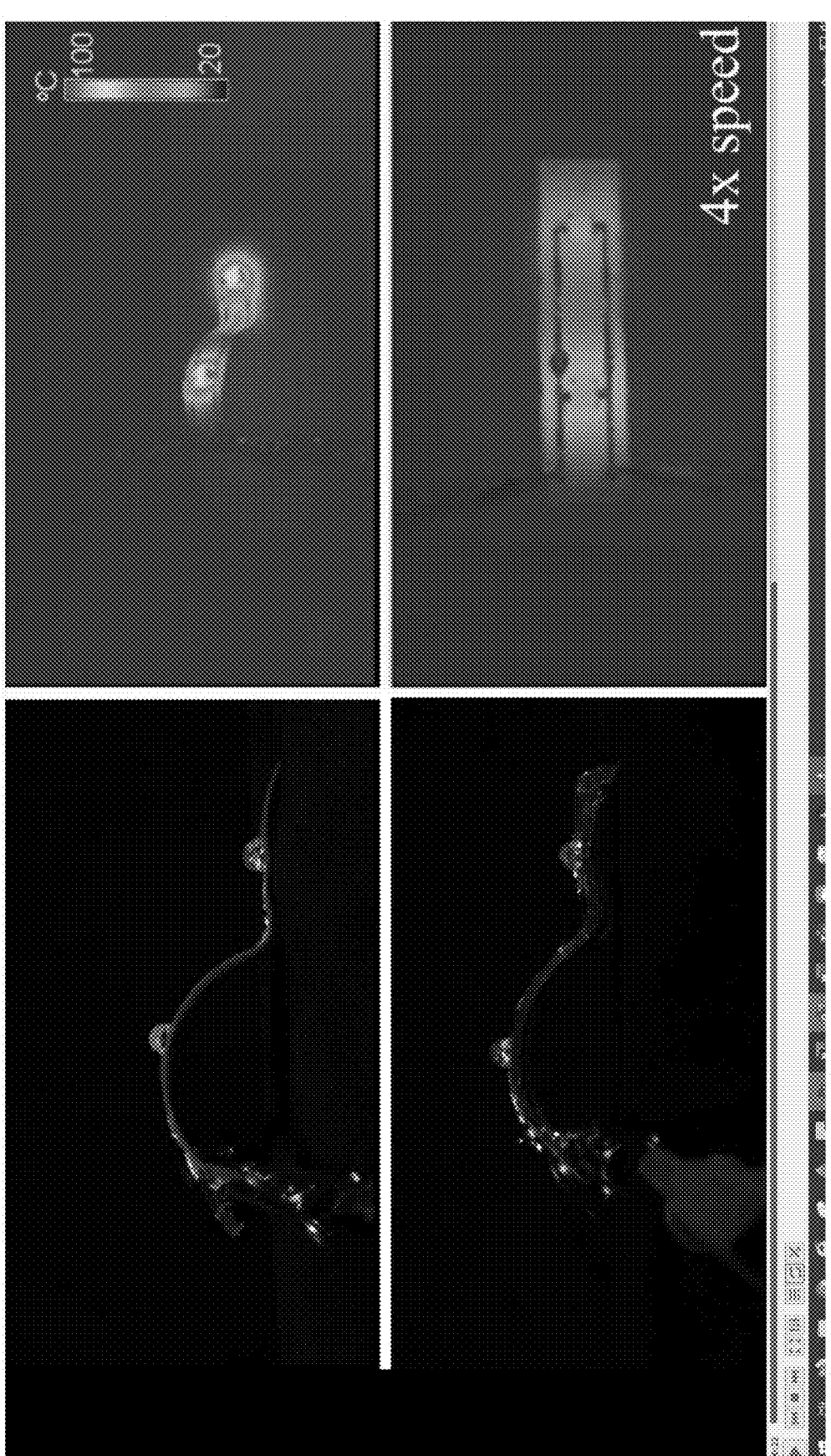
FIG. 17V (M3 @ 22s)

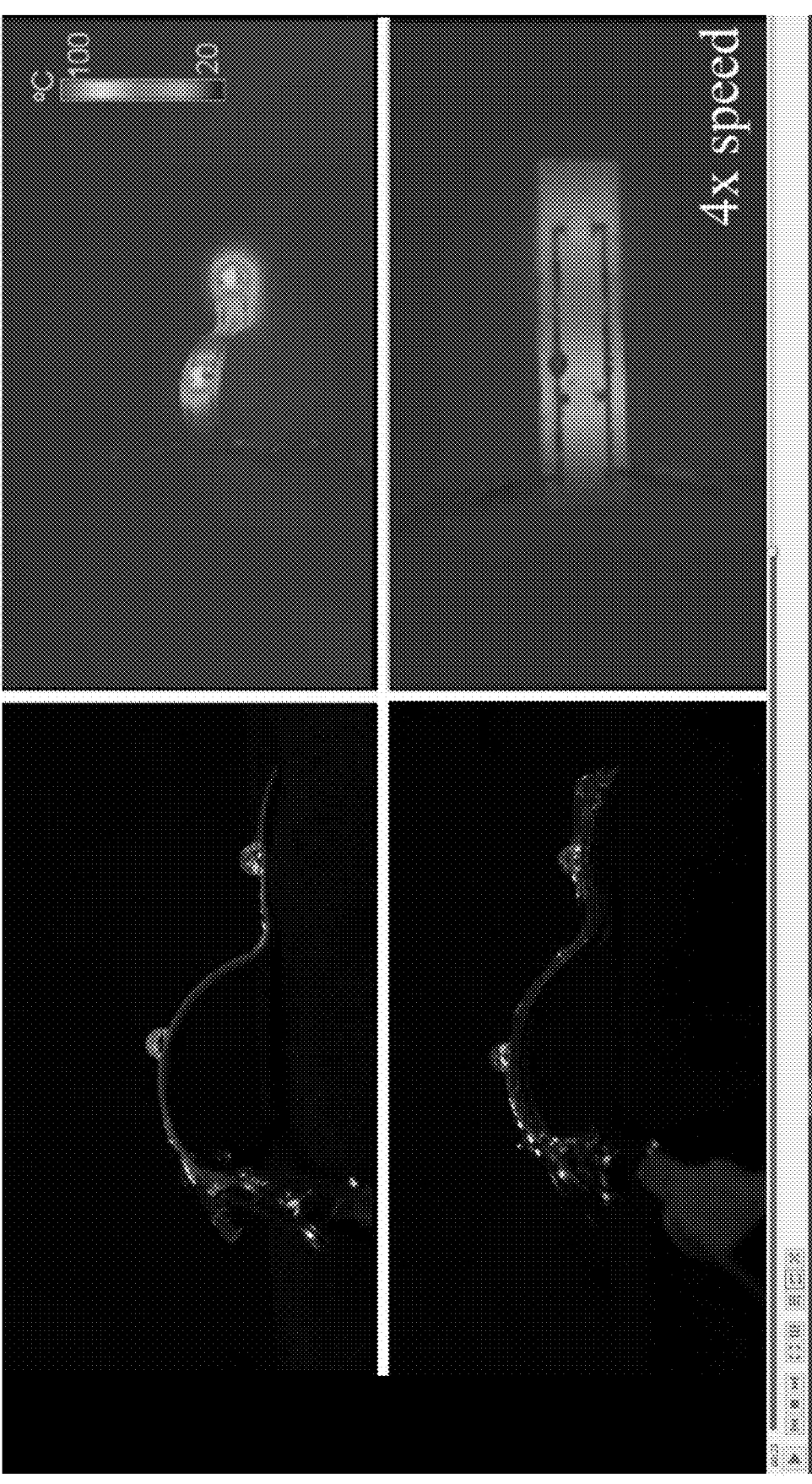
FIG. 17W (M3 @ 23s)

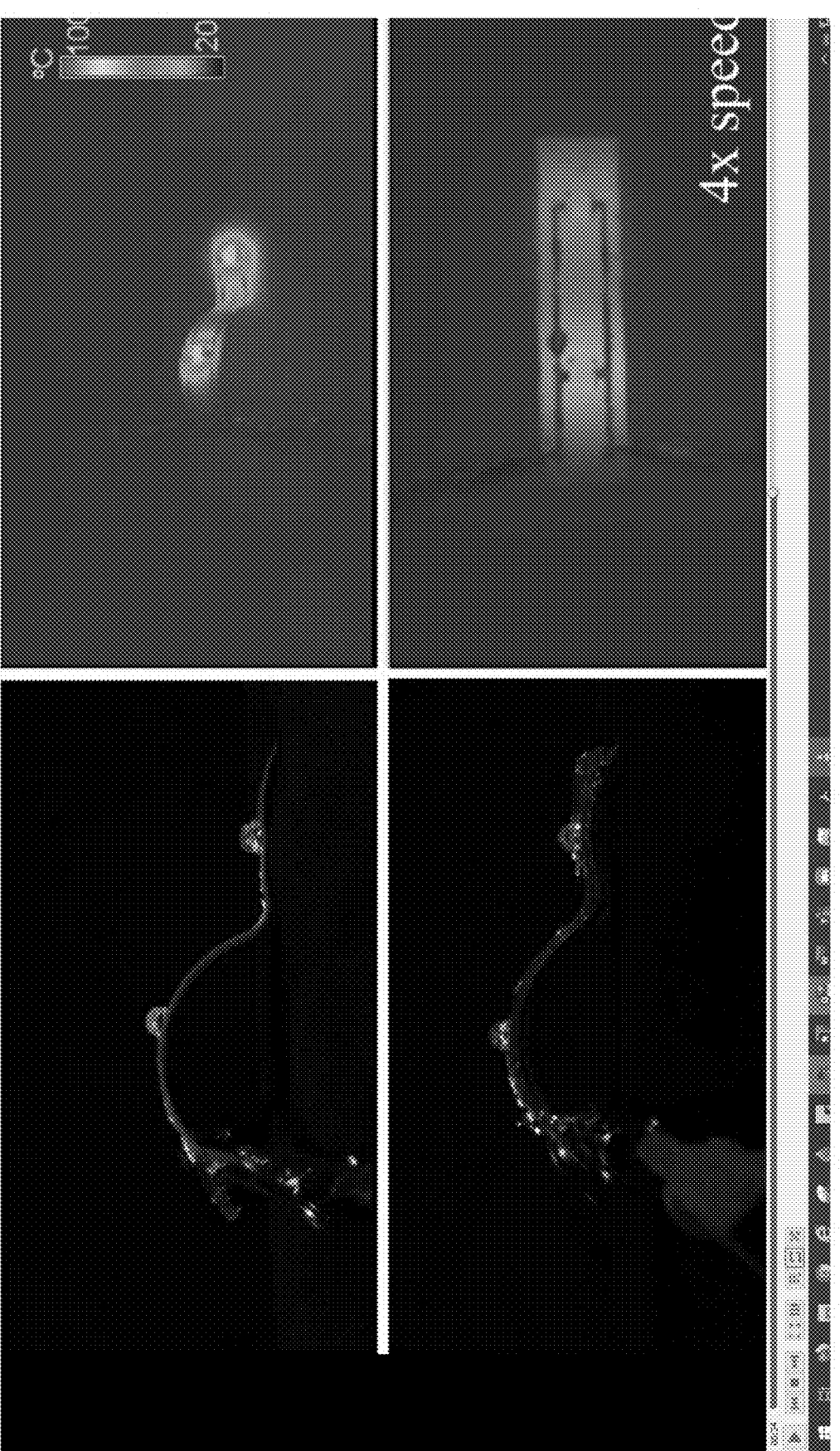
FIG. 17X (M3 @ 24s)

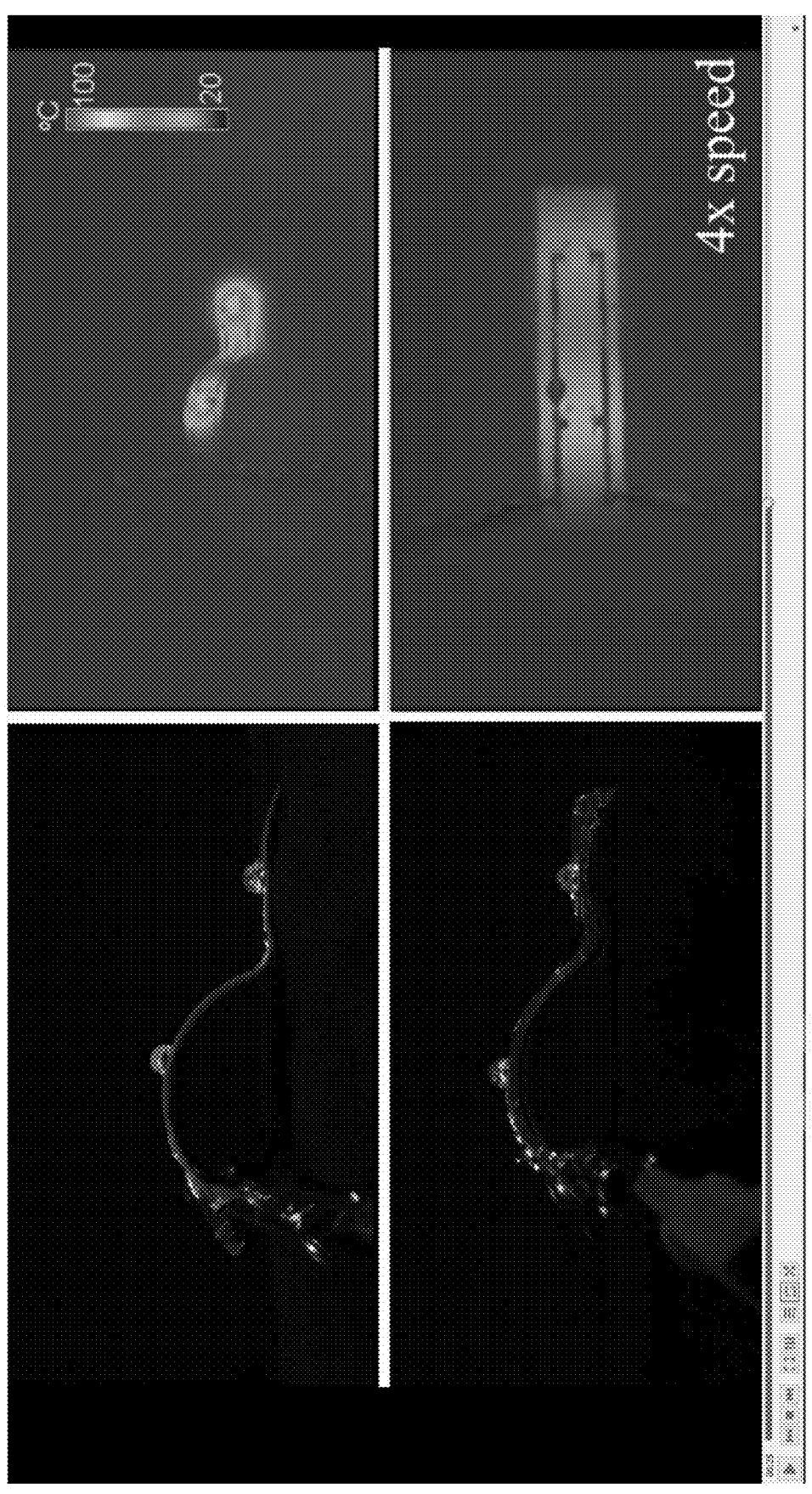
FIG. 17Y (M3 @ 25s)

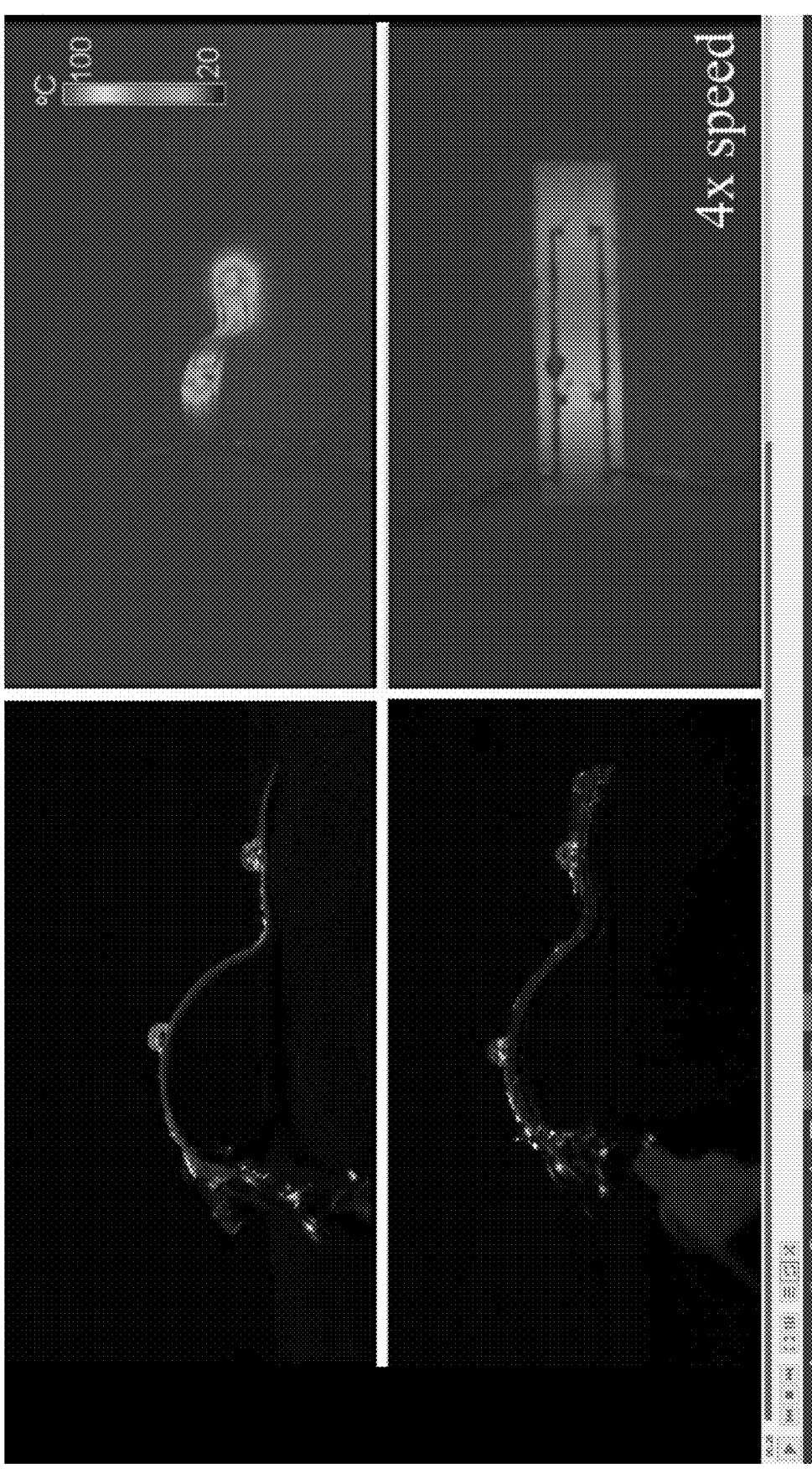
FIG. 17Z (M3 @ 26s)

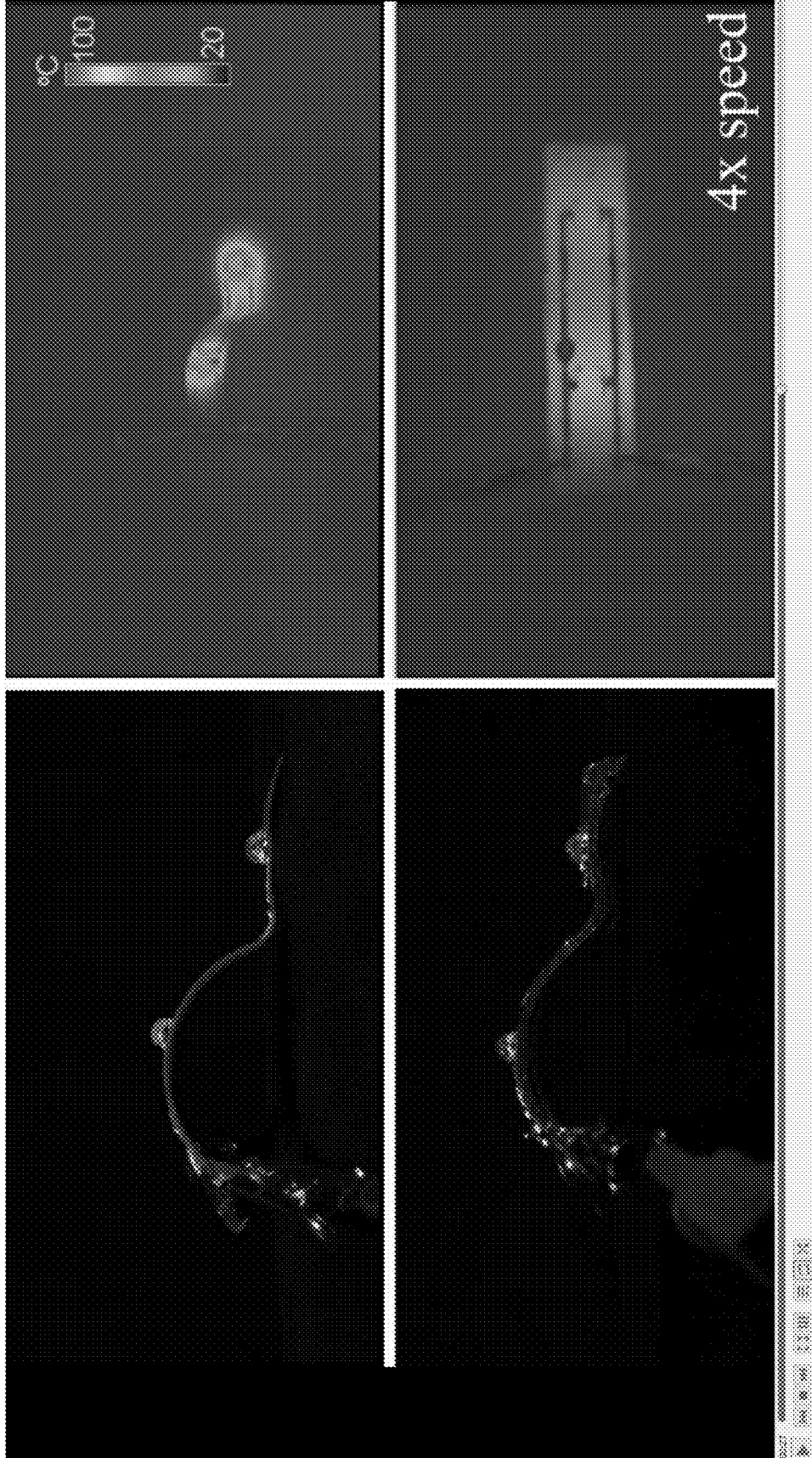
FIG. 17AA (M3 @ 27s)

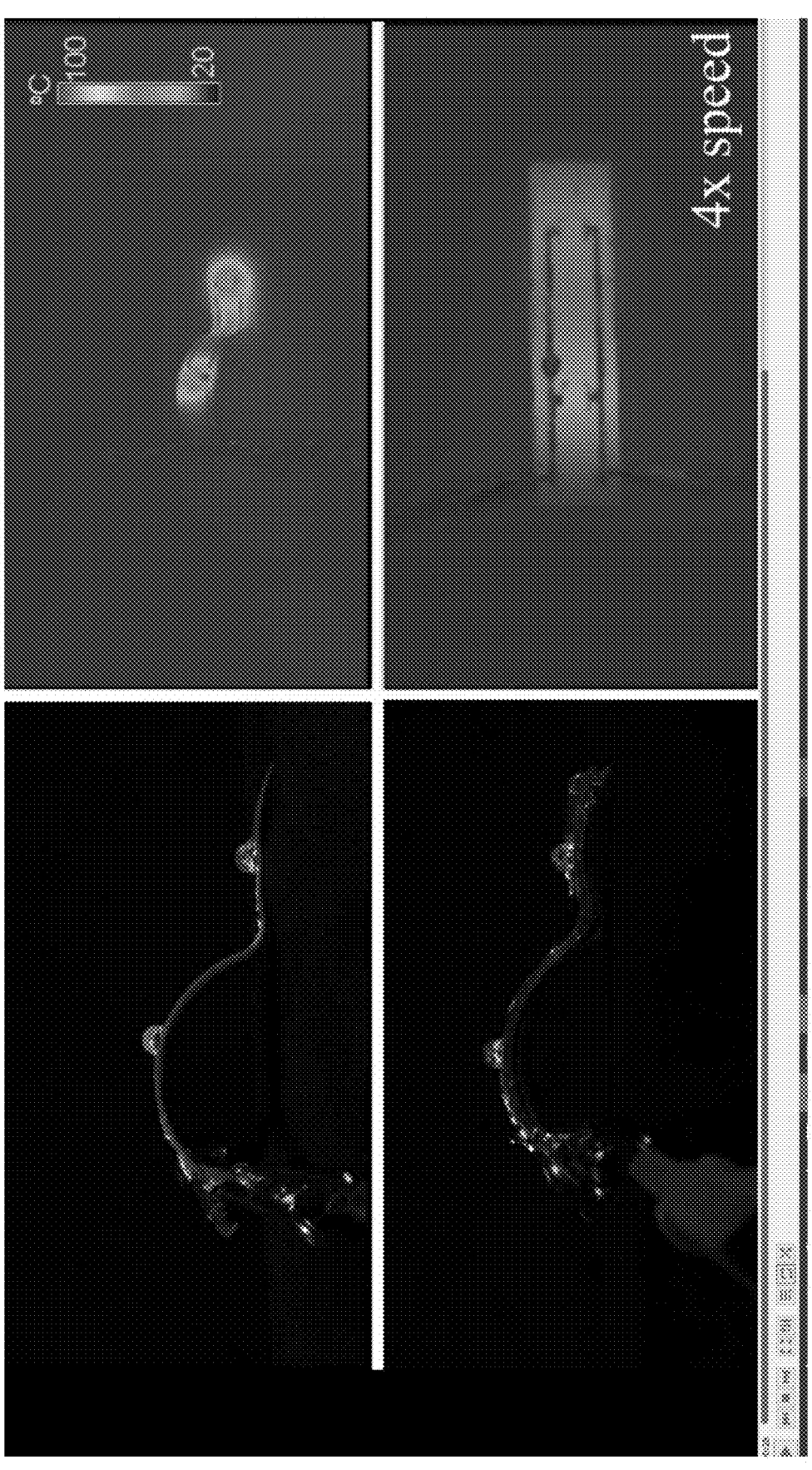
FIG. 17BB (M3 @ 28s)

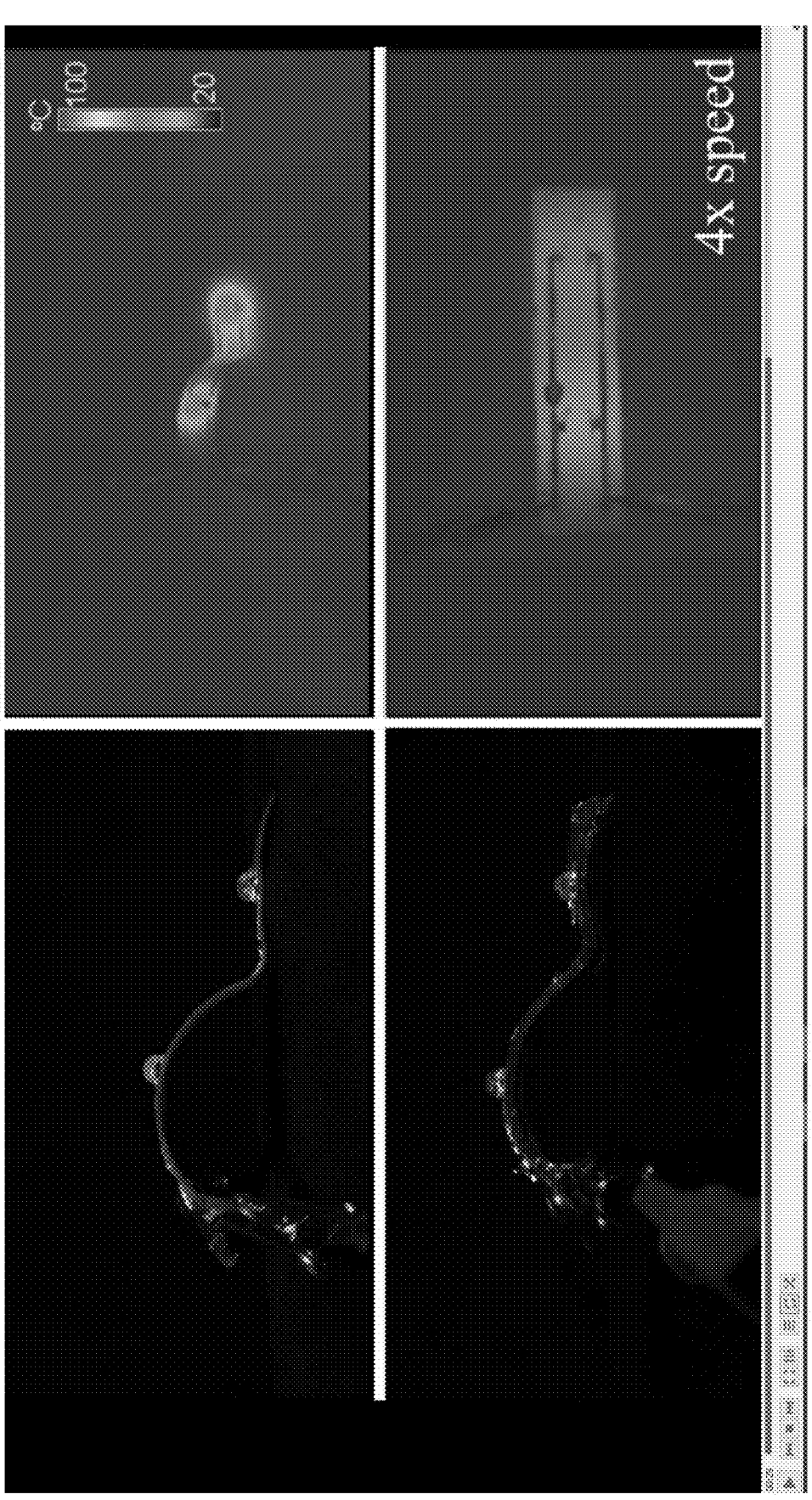
FIG.17CC (M3 @ 29s)

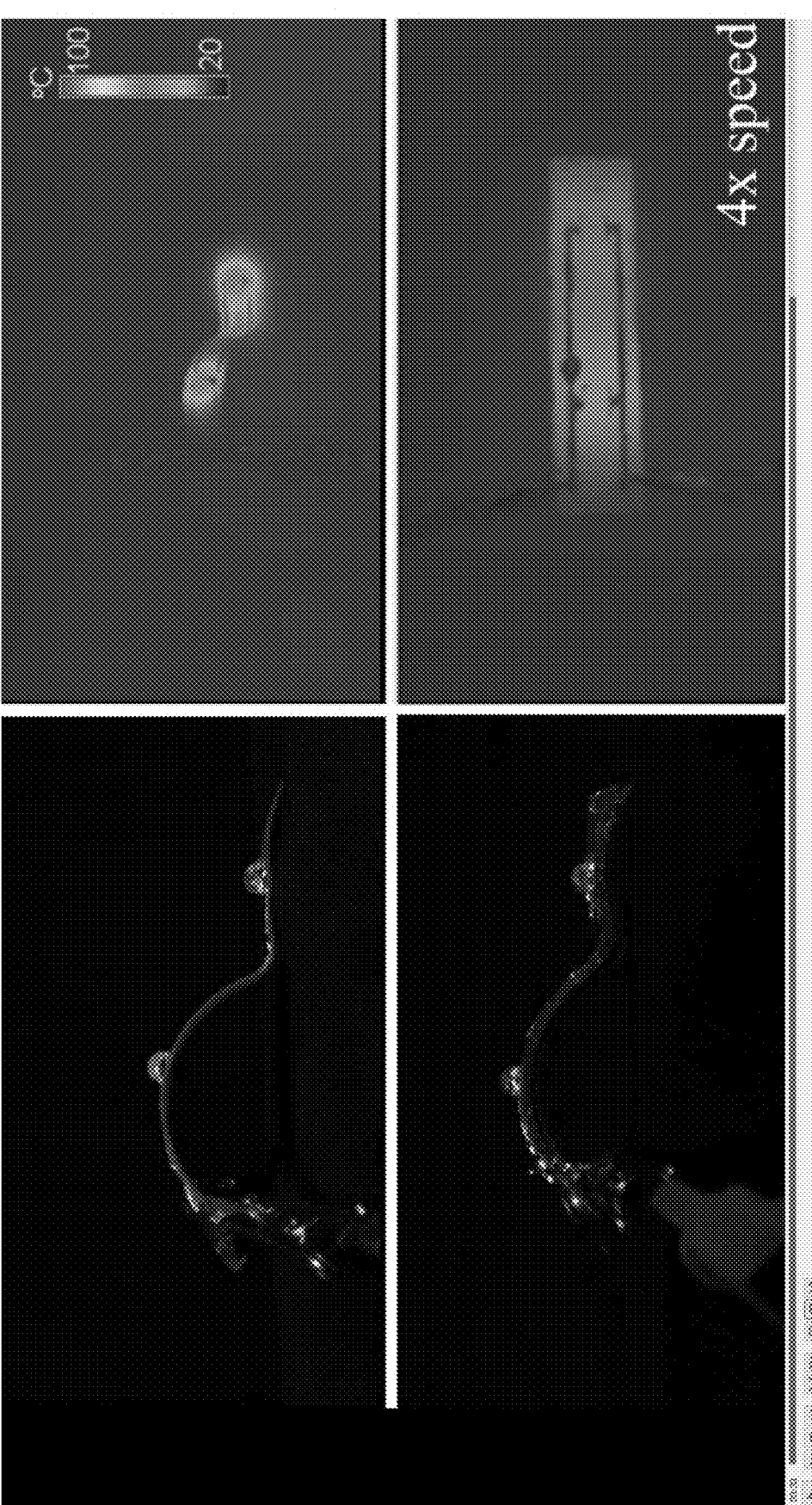
FIG. 17DD (M3 @ 30s)

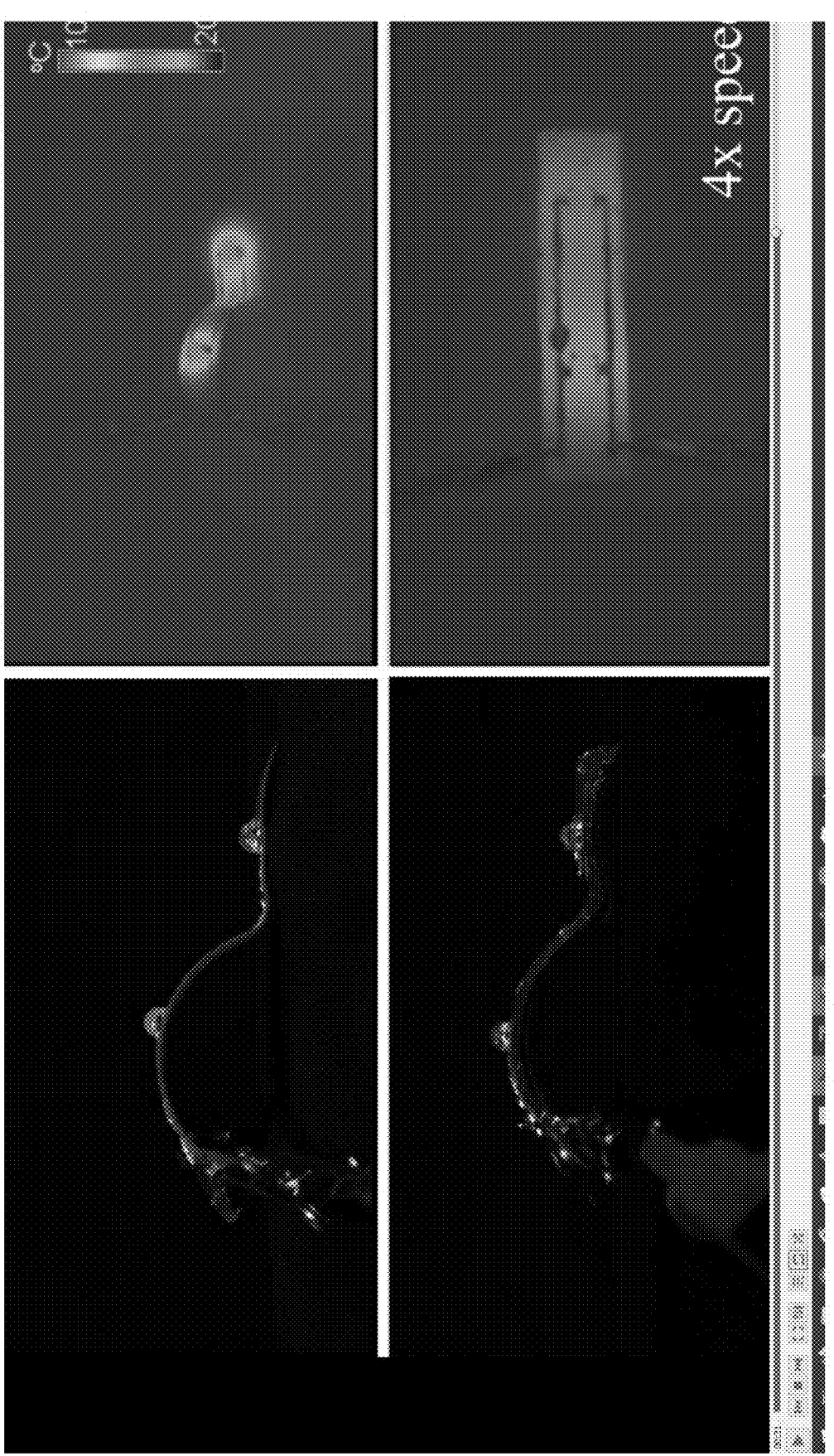
FIG. 17EE (M3 @ 31s)

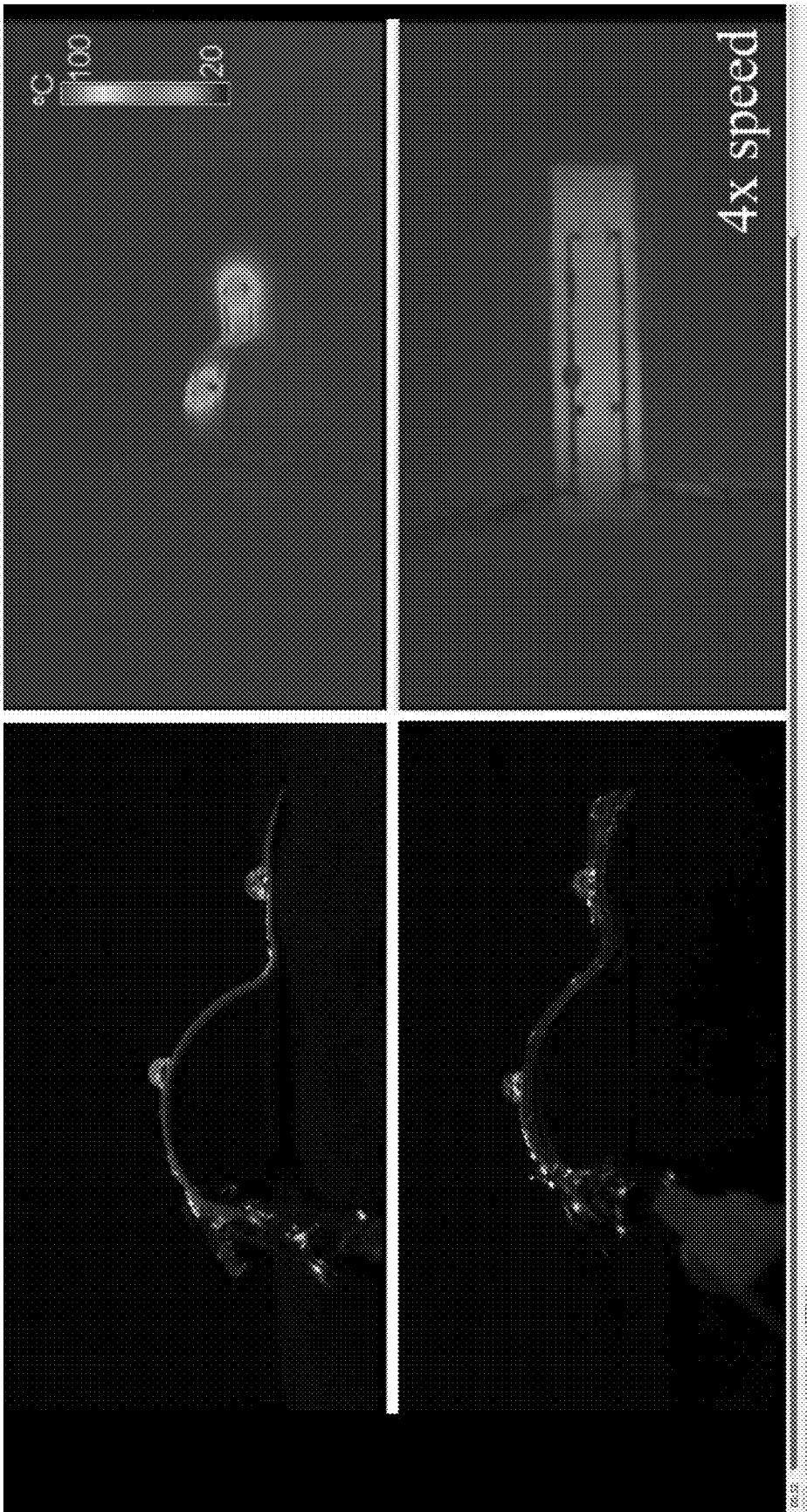
FIG.17FF (M3 @ 32s)

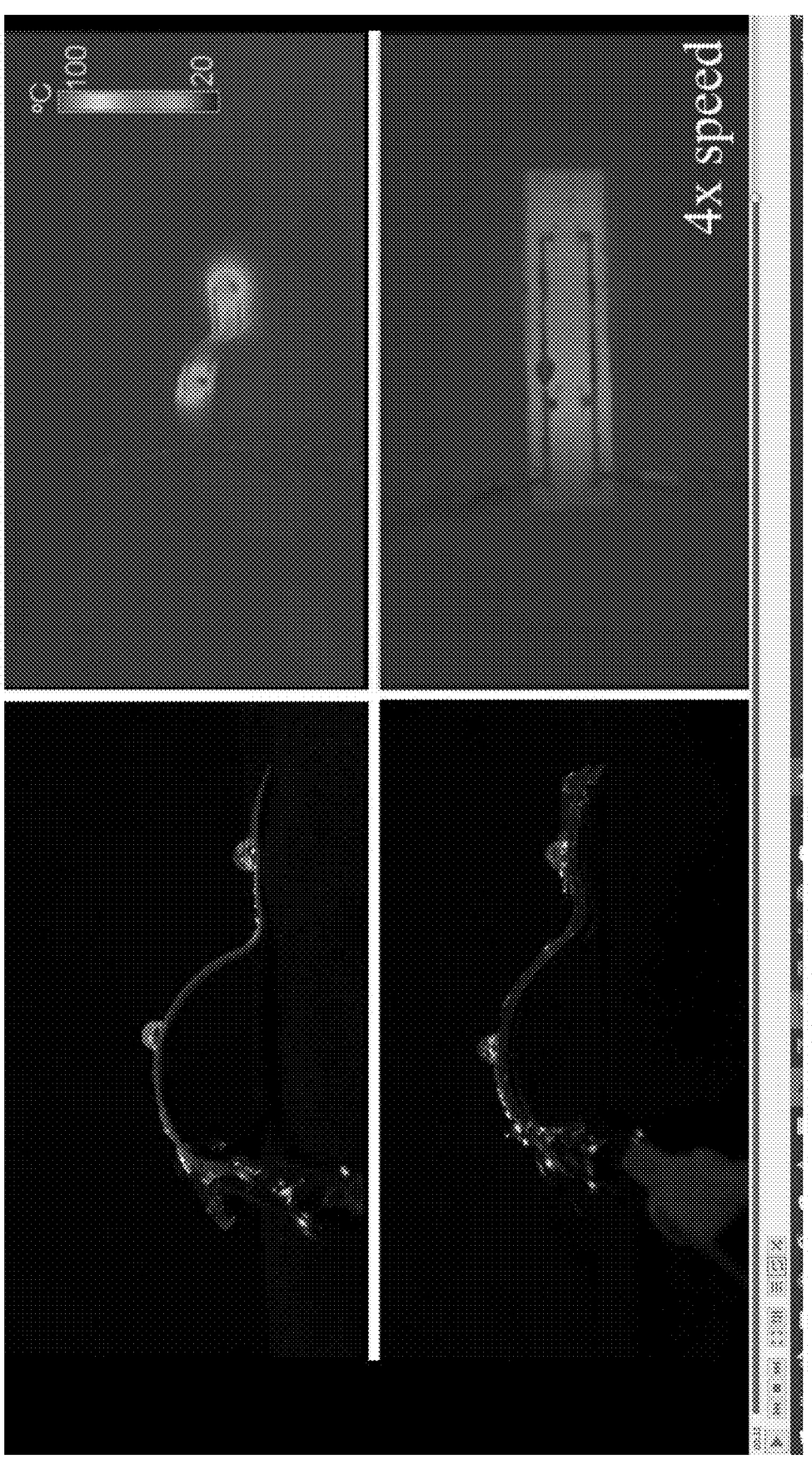
FIG. 17GG (M3 @ 33s)

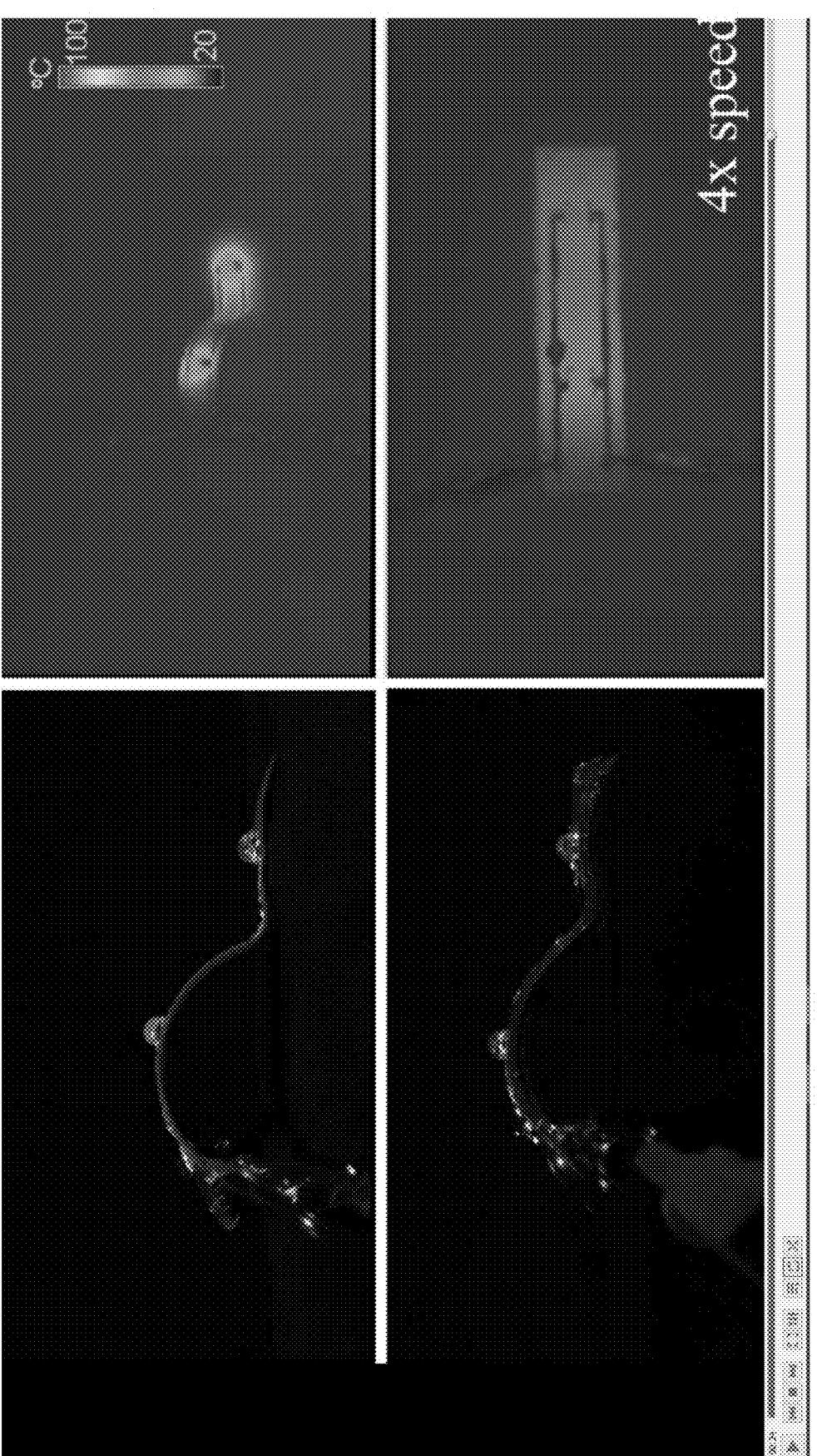
FIG. 17HH (M3 @ 34s)

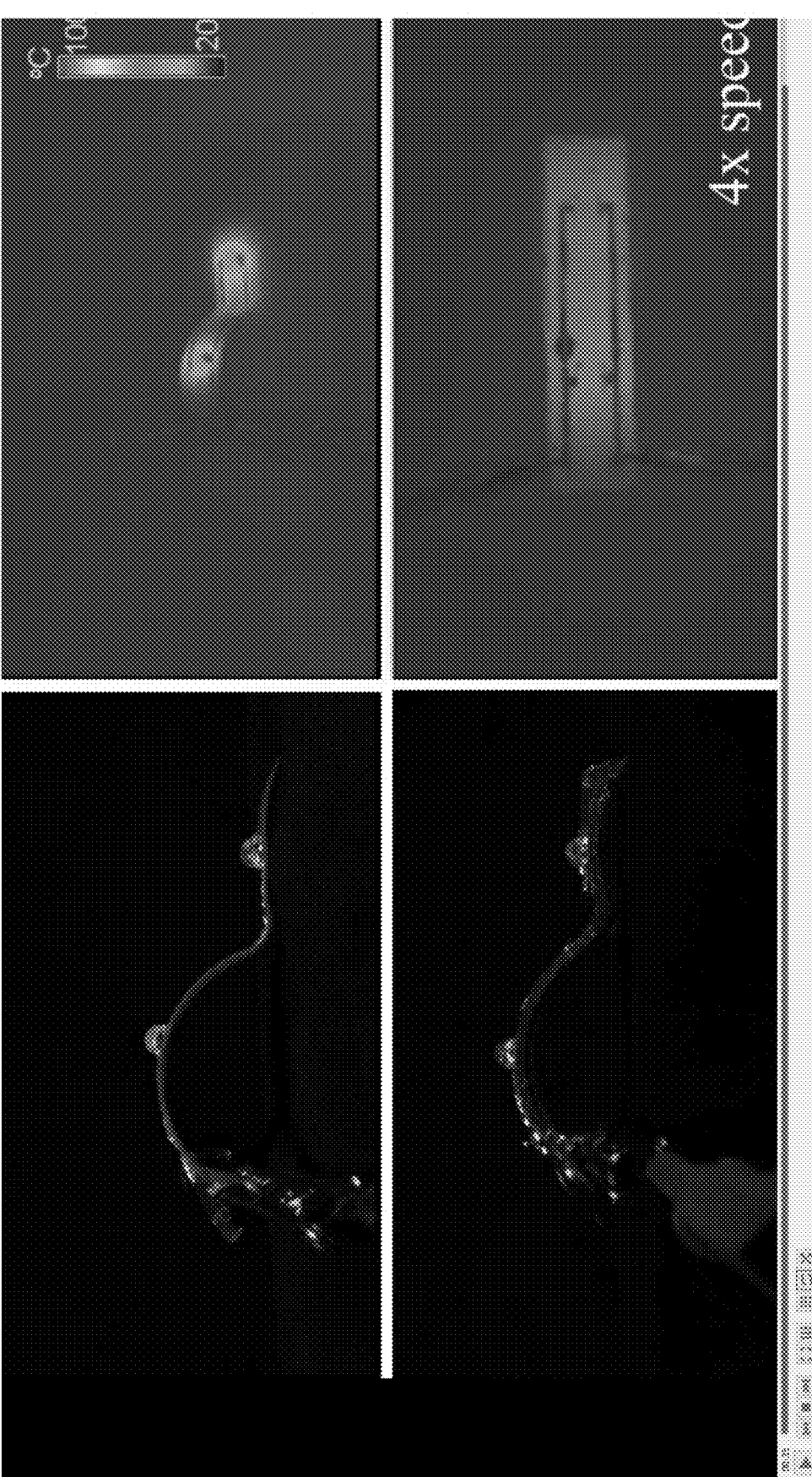
FIG. 17II (M3 @ 35s)

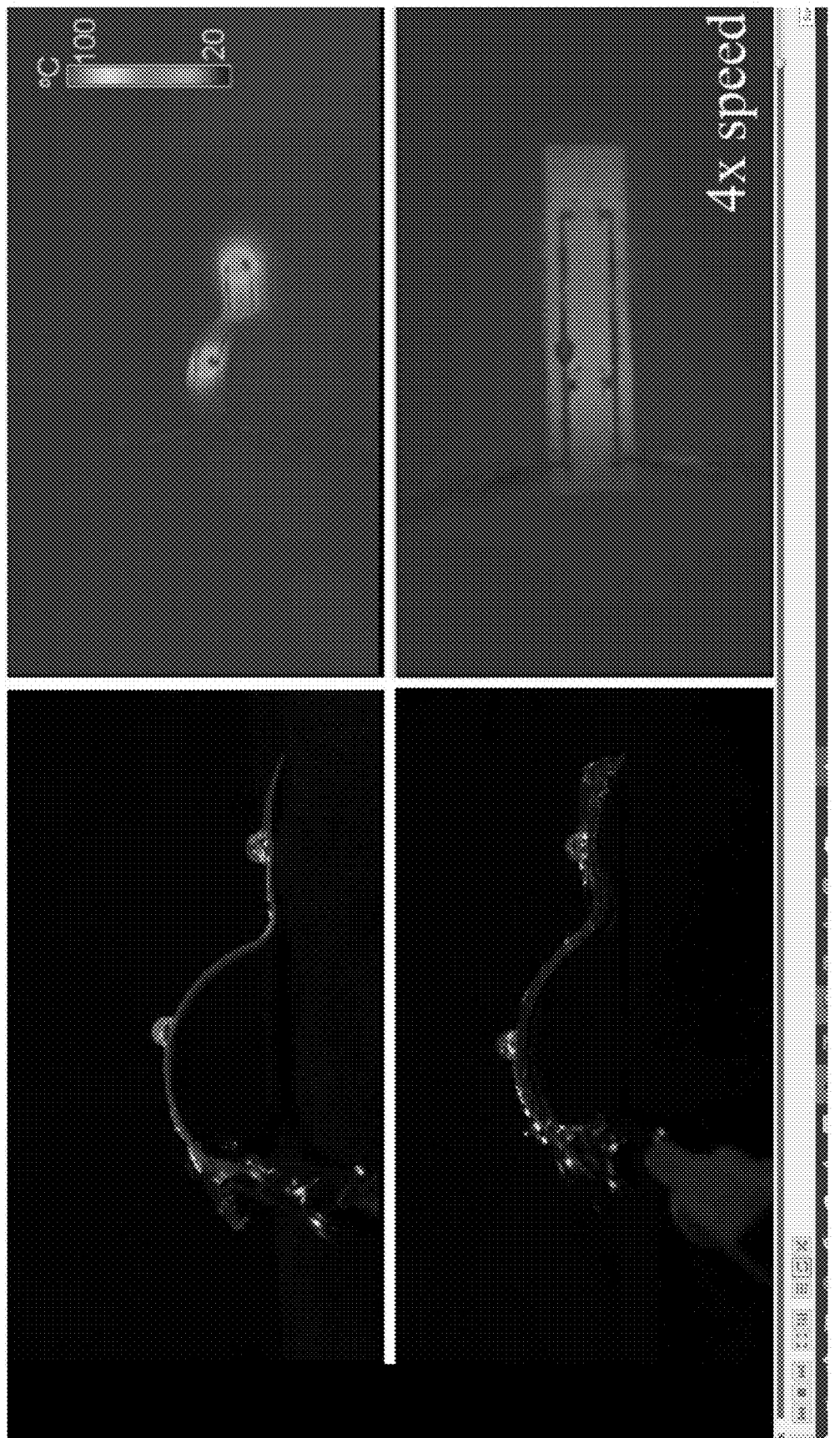
FIG. 17JJ (M3 @ 36s)

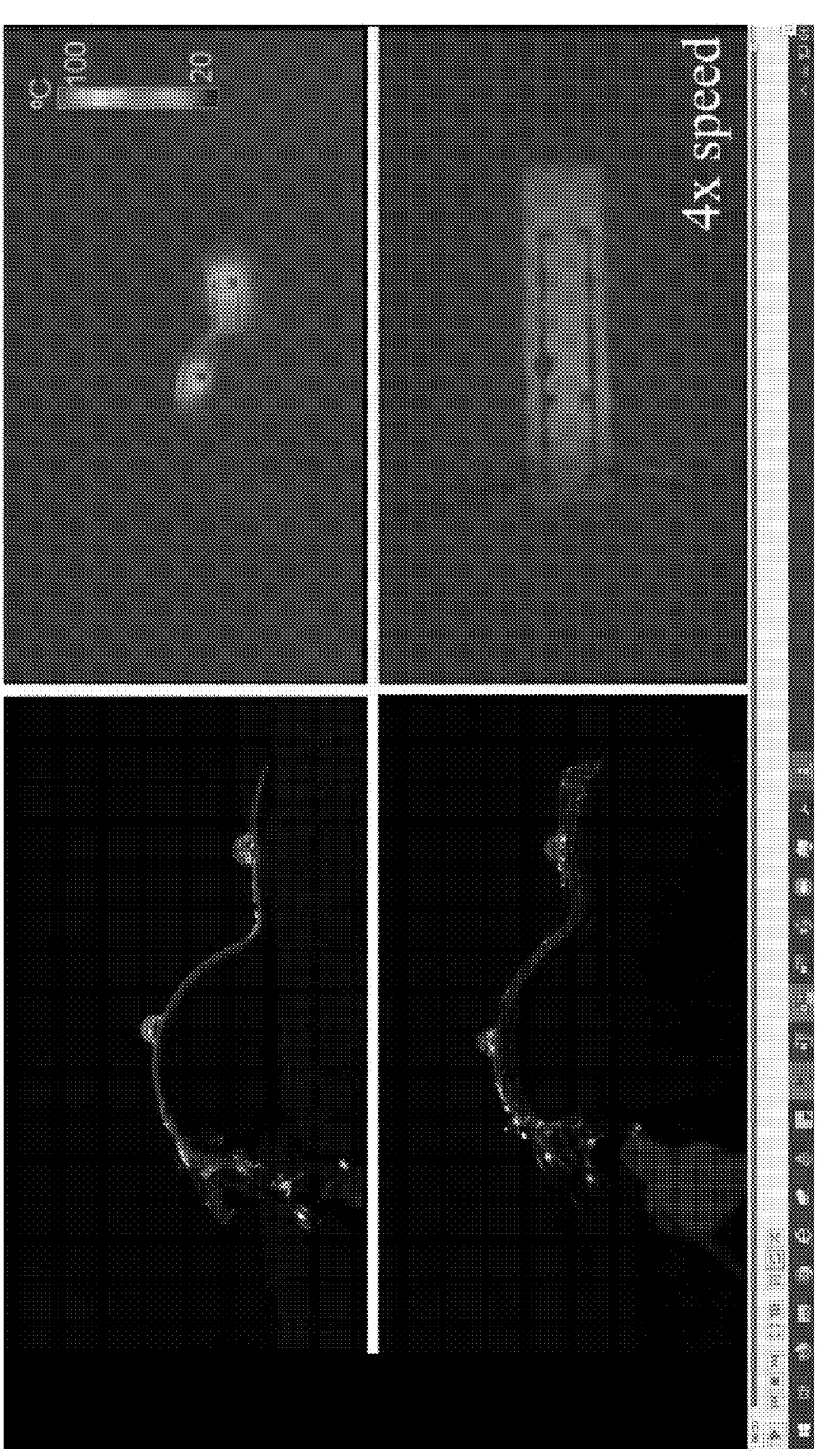
FIG. 17KK (M3 @ 37s)

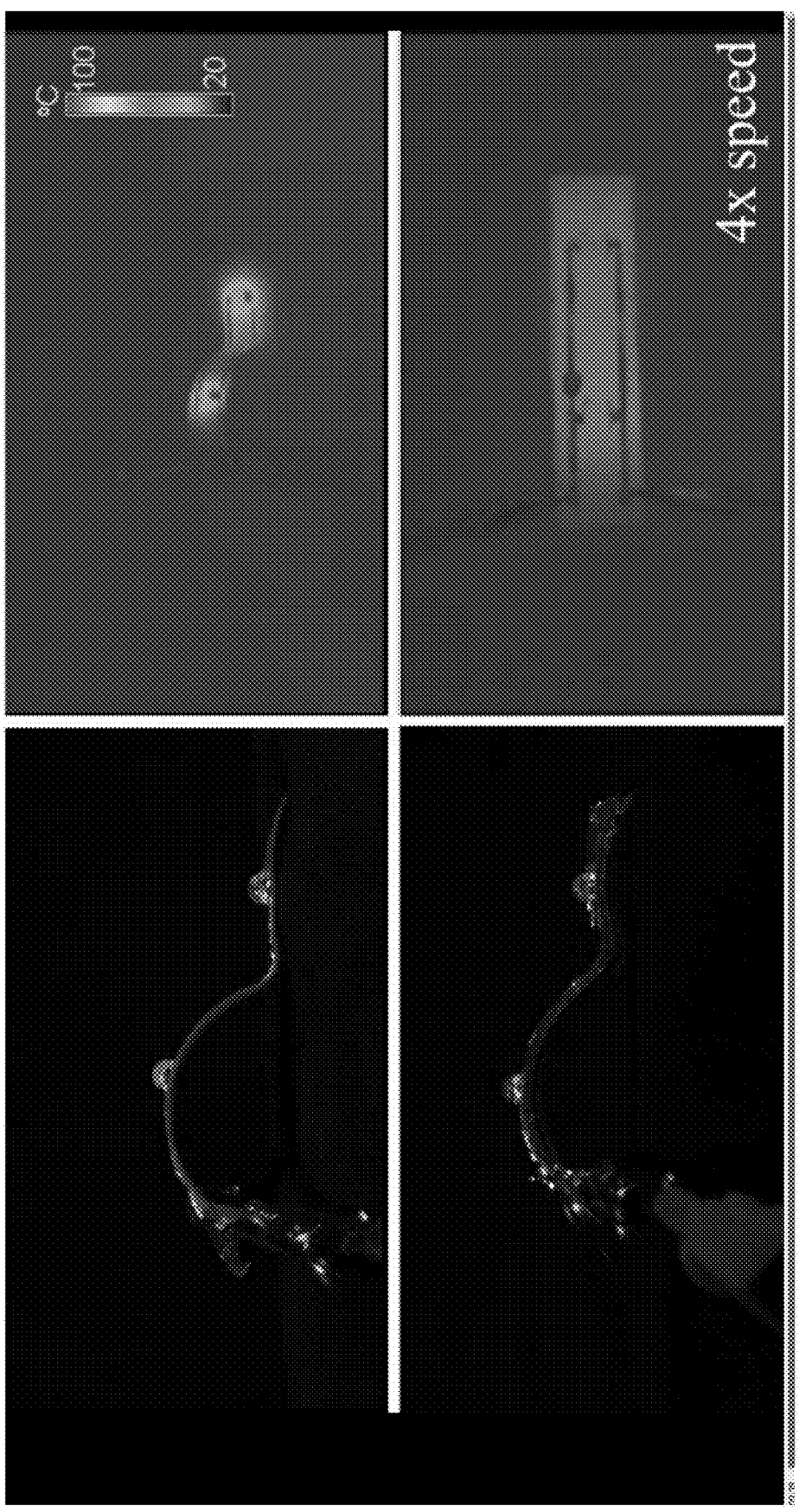
FIG. 17LL (M3 @ 38s)

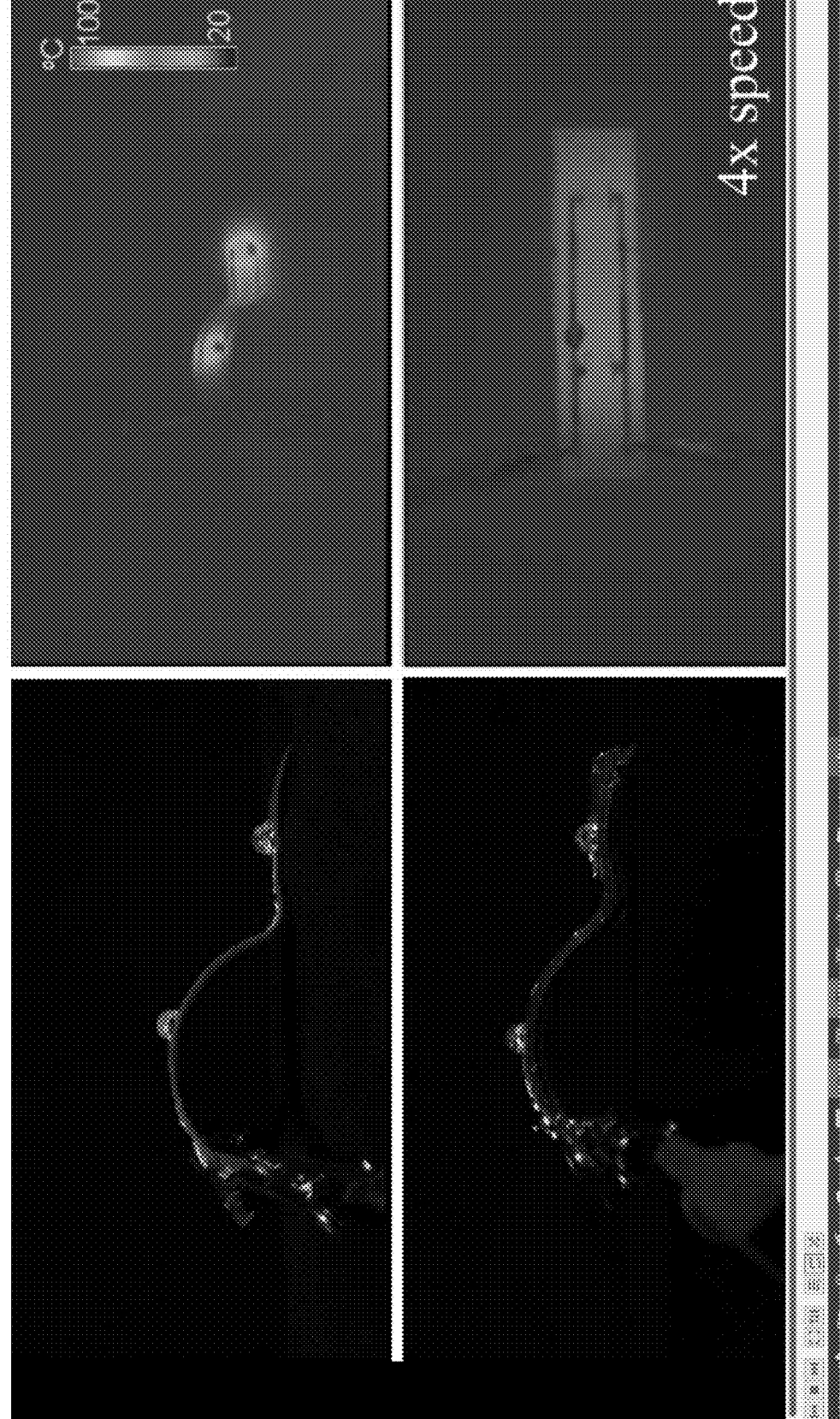
FIG. 17MM (M3 @ 39s)

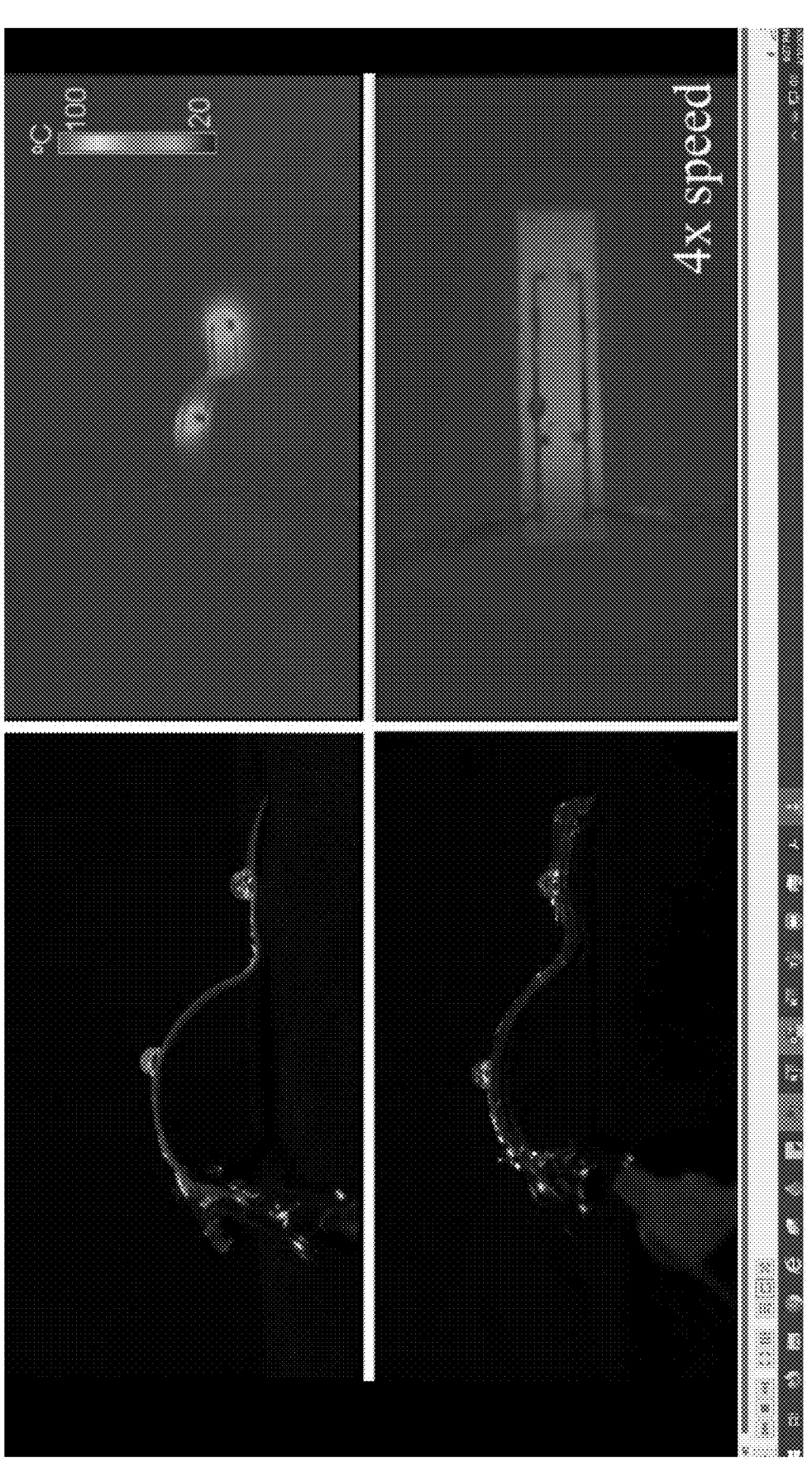
FIG. 17NN (M3 @ 40s)

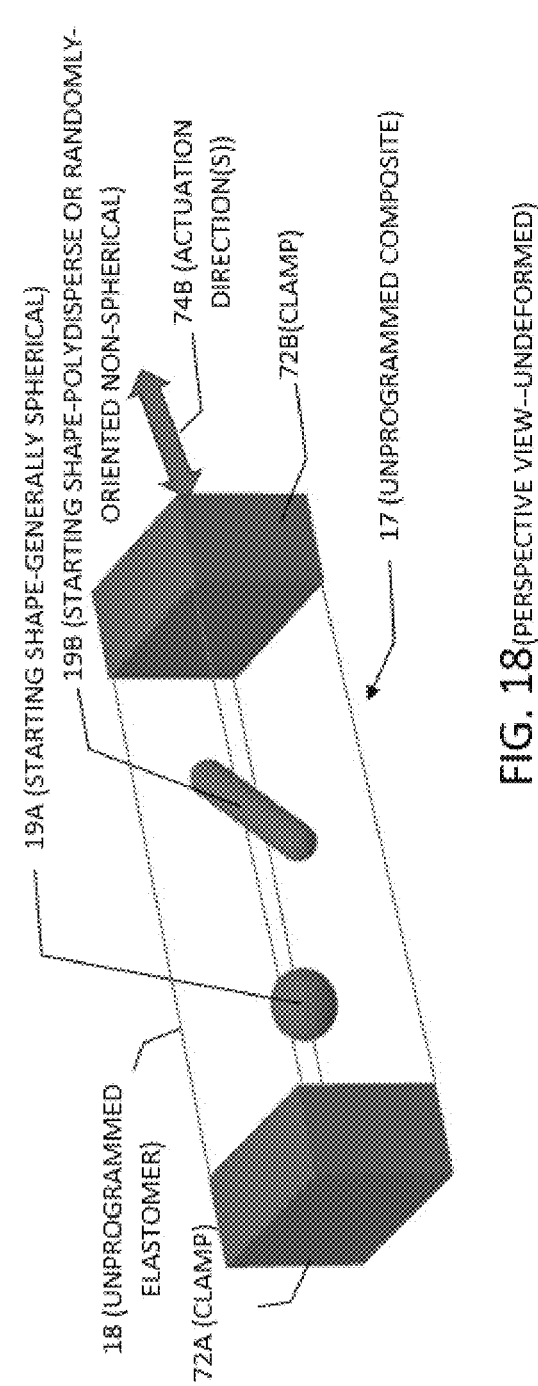
FIG. 18 (PERSPECTIVE VIEW—UNDEFORMED)

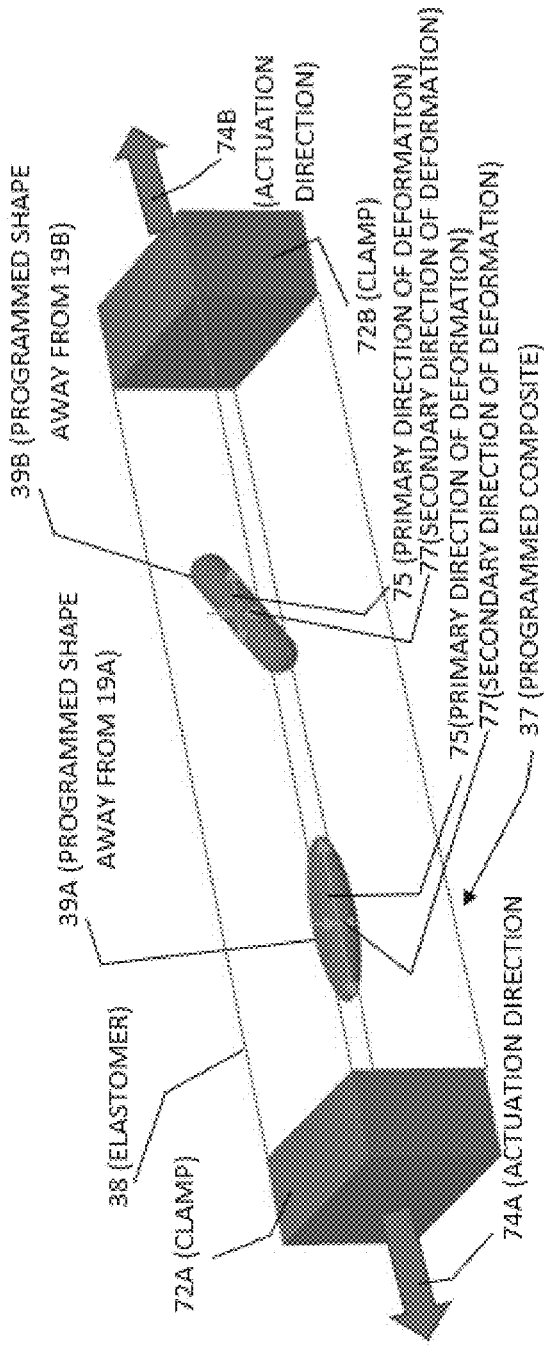
FIG. 19 (PERSPECTIVE VIEW—DEFORMED BY UNI-AXIAL STRETCHING)

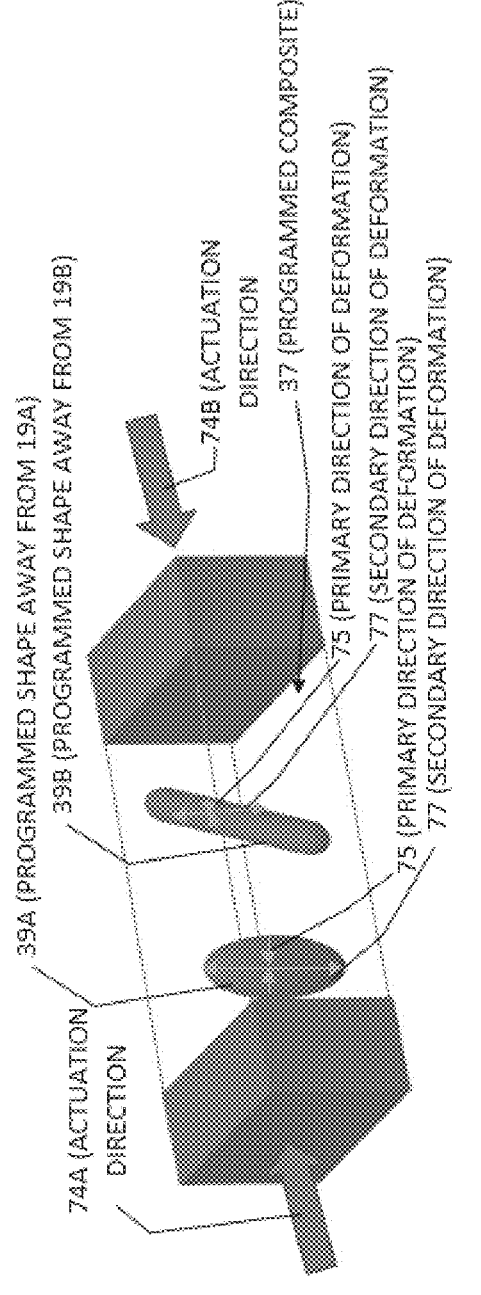
39A (PROGRAMMED SHAPE AWAY FROM 19A)
39B (PROGRAMMED SHAPE AWAY FROM 19B)
74B (ACTUATION DIRECTION)
37 (PROGRAMMED COMPOSITE)
75 (PRIMARY DIRECTION OF DEFORMATION)
77 (SECONDARY DIRECTION OF DEFORMATION)
75 (PRIMARY DIRECTION OF DEFORMATION)
77 (SECONDARY DIRECTION OF DEFORMATION)
74A (ACTUATION DIRECTION)
FIG. 20 (PERSPECTIVE VIEW—DEFORMED BY UNIAXIAL COMPRESSING)

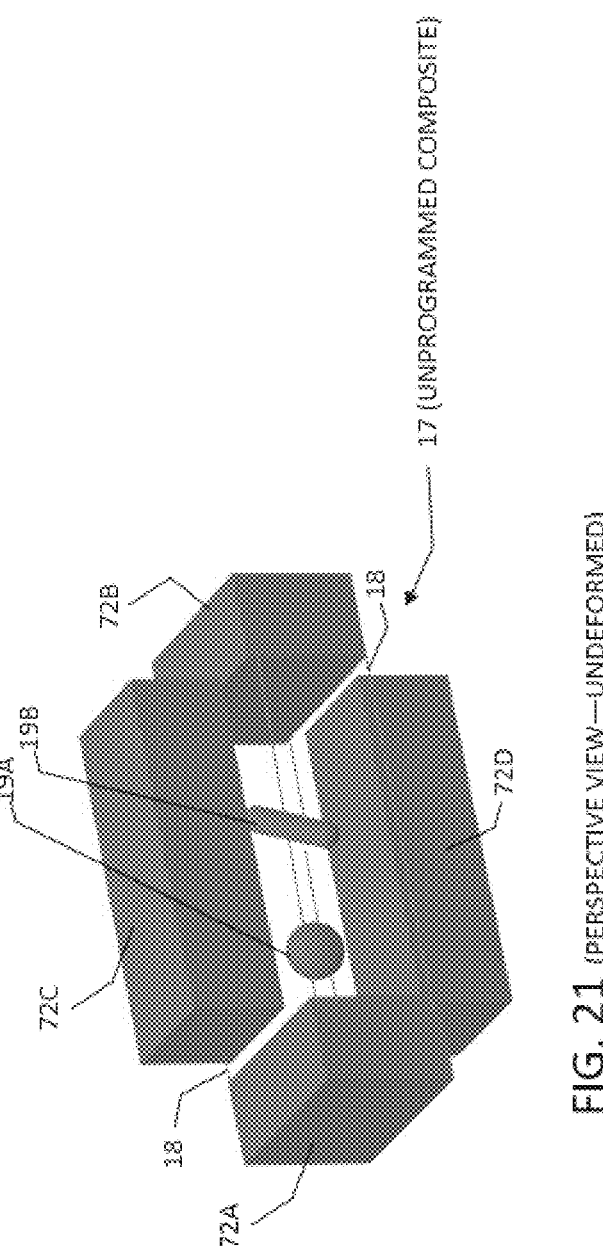
FIG. 21 (PERSPECTIVE VIEW—UNDEFORMED)

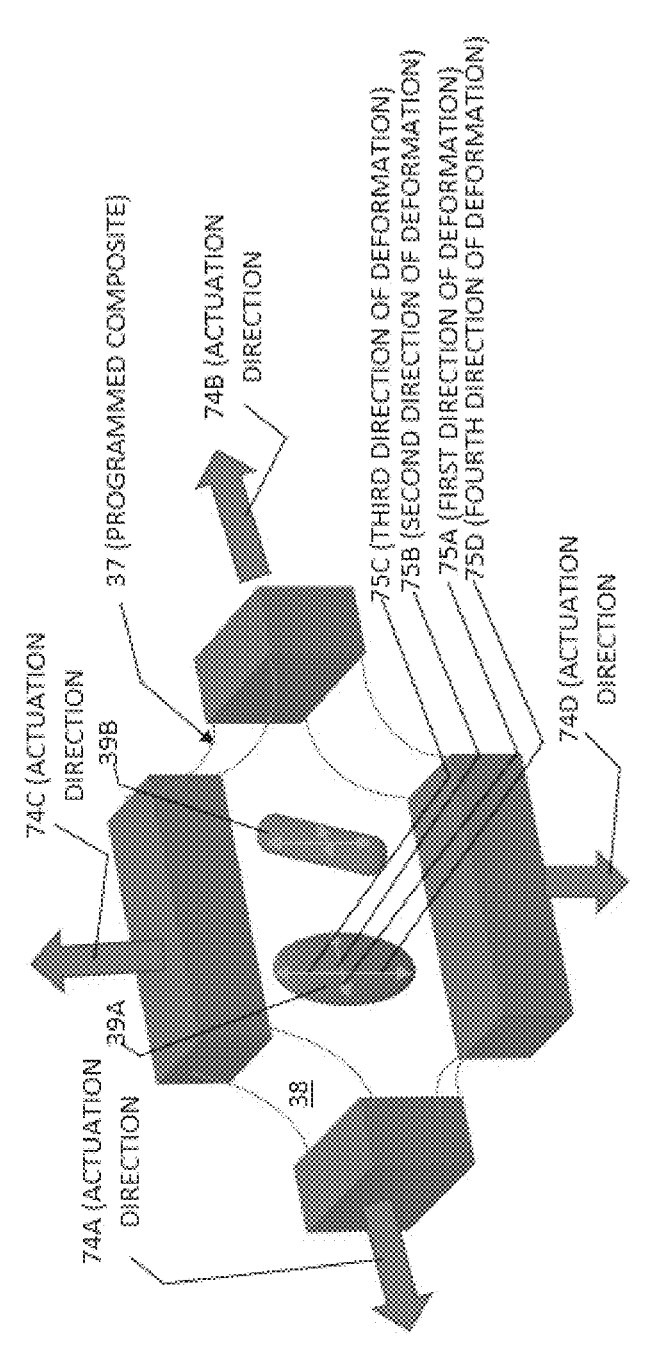
FIG. 22 (PERSPECTIVE VIEW—DEFORMED BY BI-AXIAL STRETCHING)

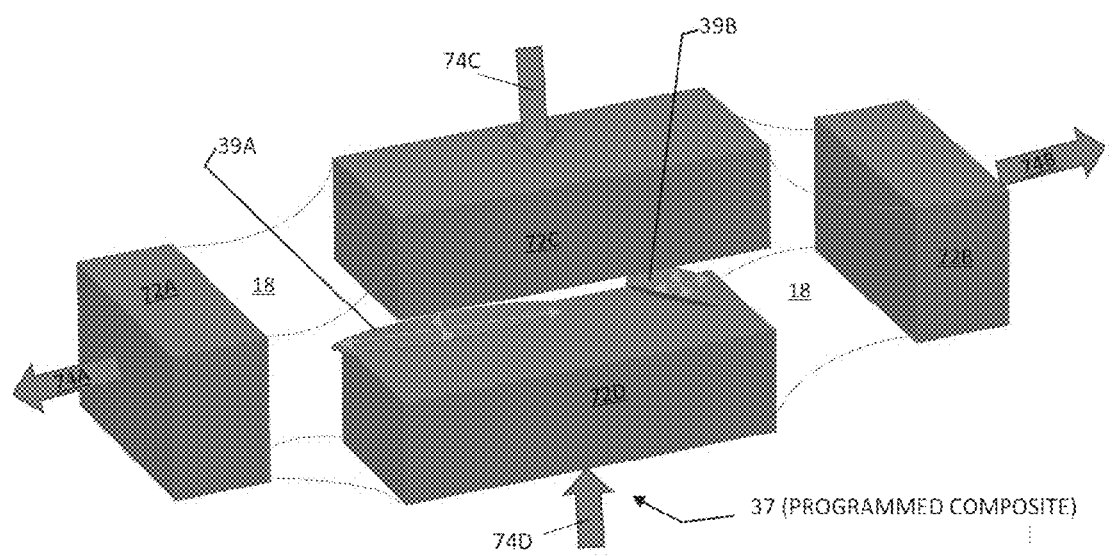
FIG. 23 (PERSPECTIVE VIEW—DEFORMED BY BI-AXIAL STRETCHING & COMPRESSING)

PROGRAMMABLE LIQUID METAL MICROSTRUCTURES FOR MULTIFUNCTIONAL SOFT THERMAL COMPOSITES AND METHODS FOR MAKING SAME

CROSS-REFERENCE TO RELATED APPLICATIONS

This application claims the benefit of Provisional Application U.S. Ser. No. 63/201,410 filed on Apr. 28, 2021, all of which is herein incorporated by reference in its entirety.

GOVERNMENT RIGHTS CLAUSE

This invention was made with Government support under Department of Defense grant no. D18AP00041. The government has certain rights in the invention.

1. BACKGROUND OF THE INVENTION

1.1. Field of the Invention

The present invention relates to composites of elastomeric material and liquid metal containing inclusions and, in particular, to tuning or programming mechanical and functional features of the composite.

1.2. Problems in the Art

Benefits of materials that have substantial elasticity, but substantial thermal conductivity, have been recognized in this technical art. Examples of work in this area, each of which is incorporated by reference herein in its entirety, include:

US 2017/0218167A1 to inventors Majidi et al, published Aug. 3, 2017 (hereinafter US 2017/0218167A1).

Bartlett, Kazam, Powell-Palm, Huang, Sun, Malen, and Majidi, *High thermal conductivity in soft elastomers with elongated liquid metal inclusions.*, PNAS| Feb. 28, 2017| vol. 114| no. 9| 2143-2148 www.pnas.org/cgi/doi/10.1073/pnas. 1616377114 (hereinafter Bartlett, et al., PNAS 2017).

Ravi Tutika, Shihuai H. Zhou, Ralph E. Napolitano, and Michael D. Bartlett* *Mechanical and Functional Trade offs in Multiphase Liquid Metal, Solid Particle Soft Composites, Adv. Funct. Mater.* 2018, 28, 1804336 (hereinafter Tutika, et al., Adv. Funct. Mater. 2018).

Seung Hee Jeong, Si Chen, Jinxing Huo, Erik Kristofer Gamstedt, Johan Liu, Shi-Li Zhang, Zhi-Bin Zhang, Klas Hjort & Zhigang Wu, *Mechanically Stretchable and Electrically Insulating Thermal Elastomer Composite by Liquid Alloy Droplet Embedment*, Scientific Reports. 2015 Dec. 16:5:18257. DOI: 10.1038/srep18257 1 (hereinafter Jeong, et al, Scientific Reports 2015).

For example, composites of an elastic with liquid metal inclusions throughout have been shown to provide soft, elastic, thermally-conductive films or layers that can be wrapped or placed at or near heat-generating surfaces and be quite effective to conduct heat away from those surfaces, including surfaces that bend or otherwise are flexible.

Liquid metal inclusions in elastomers are generally spherical, random in shape and/or orientation, or poly disperse, as the result of typical techniques of fabricating such a composite (e.g., mixing of liquid metal and uncured elastomer). See, e.g., US 2017/0218167A1 and Jeong, et al, Scientific Reports 2015. It has been discovered that stretch-ing of the composite in a direction elongates the inclusions and can improve thermal conductivity of the composite. See, e.g., US 2017/0218167A1 and Bartlett, et al., PNAS 2017. It has been suggested to mechanically stretch such composites for that purpose. See, e.g., Bartlett, et al., PNAS 2017 and Tutika, et al., Adv. Funct. Mater. 2018. However, including hardware to keep a mechanically stretched composite in a stressed state for end use can be limiting in terms of how the composite can be used, increases complexity, and can be impractical. Furthermore, such stretching does not provide a composite in a stress-free state, which can be destructive of the elastic over time. It also limits the applications of the composite because it requires the imposed strain to be maintained during use. If the composite is not plastically deformed by the stretching and allowed to return to its original unstressed state, the liquid metal inclusions would return to their original shape and would lose any benefits of their stretched shape.

It has been suggested to mechanically stretch such a liquid metal/elastomer composite enough to achieve some plastic deformation of the elastomer as a way to influence some generally consistent elongation direction of the liquid metal inclusions while the composite is in a stressed state and at least retain some of that elongation when the mechanical stretching force(s) is/are removed, and the plastically deformed composite is considered in a stress-free state. This allows end use of the composite without somehow maintaining the stresses used to shape the liquid metal inclusions to influence them towards a consistent directional elongation of the liquid metal inclusions to improve thermal conductivity as compared to the composite before stretching. See US 2017/0218167A1 and Bartlett, et al. PNAS 2017. However, there can be substantial issues regarding the ability to control of the end result of such shaped liquid metal inclusions. For example, for this to even work, it first typically requires imposition of a relatively high strain (in US 2017/0218167A1 an example is to around 600% strain) to induce an unrecoverable plastic strain (in US 2017/0218167A1 it is about 210%), so that upon unloading of the composite to zero stress the composite does not elastically return to its original shape but rather at least retain some of the influenced elongation of the liquid metal inclusions remain permanent. It is difficult to known and control amount of initial strain to then get the correct amount of unrecoverable strain upon unloading to zero stress. There are issues of initial straining to high levels and producing unrecoverable strain in the elastomer, including possible issues with future elastic performance or useful life. Thus, there is room for improvement to be able to better program the final general shape of inclusions, including over prior work using plastic deformation of a composite of an elastomer and liquid metal inclusions.

The Introduction section of A. B. M. Haque, Ravi Tutika, Rachael L. Byrum and Michael D. Bartlett, *Programmable Liquid Metal Microstructures for Multifunctional Soft Thermal Composites*, Adv. Funct. Mater. 2020, 30, 2000832 (hereinafter Haque, et al., Adv. Funct. Mater. 2020, 30, 2000832) and incorporated by reference herein in its entirety, discusses in detail the work in this area and problems and deficiencies in the state of the art, as do US 2017/0218167A1, Bartlett et al PNAS 2017, Tutika et al.

Adv. Funct. Mater. 2018, and Jeong et al. Scientific Reports 2015.

Therefore, there is room for improvement in this art.

2. SUMMARY OF THE INVENTION

2.1. Objects, Features, and Advantages

It is a principal object, feature, and advantage of the present invention to provide methods, apparatus, and systems which improve over or solve problems and deficiencies in the state of the art.

Other objects, features, and/or advantages of the present invention are to provide apparatus, methods, and systems which include one or more of:

a. allow efficient and effective fabrication of composites that comprise elastomers with engineered highly-controlled liquid metal inclusions locked in a stress-free state by elastic deformation and annealing;

b. allow a wide-variety of uses and applications for such programmable composites; and c. allow the ability to tune or program specific mechanical and/or functional characteristics of the composite with substantial control.

2.2. Aspects of the Invention

We have developed a process to align liquid metal microstructures within an elastomer in a stress-free state. This allows for soft materials with high thermal conductivity that are electrically insulating. In contrast to previous work, this utilizes a stretching and annealing process to align liquid metal droplets in a thermoplastic elastomer. The material is annealed to lock in the microstructure, i.e., away from spheres and towards elongated inclusions, and even needle-like liquid metal inclusions, and to or at least towards a stress-free state for the composite. This allows a specificity and precision of control of the final characteristics of the locked in liquid metal droplets for a range of stretching not possible with existing techniques. This process will sometimes be referred to as annealed-deformation shaping of the liquid metal inclusions, in reference to a variety of ways to first elastically deform the elastomer to influence a change of shape of the LM inclusions and then any of a variety of ways to anneal the elastomer effectively towards an unstressed state to lock in those influenced shapes. In some specific embodiments of aspects of our invention, the deformation will be with mechanical techniques such as stretching or compressing, and the annealing will be thermal annealing. Those embodiments will sometimes be referred to as using thermo-mechanical shaping, in reference to a variety of ways to first elastically deform the elastomer to influence a change of shape of the LM inclusions by stretching or compressing or other mechanical influences and then annealing by thermal annealing. This is distinction to techniques such as discussed in US 2017/0218167A1 and Bartlett et al PNAS 2017, which use plastic deformation shaping, or other work that reports improved thermal conductivity of composites of elastomer and LM inclusions by stretching but do not lock in the stretched LM inclusions to the composite in a stress-free state.

This can be useful for, e.g., applications in thermal interface materials, wearable devices, and robotics.

As will be understood by those skilled in the art, when the liquid metal (LM) inclusions are discussed herein, in the context of the inclusions throughout the composite material as opposed to individually, they are characterized generally.

Not every LM inclusion will be the same. The characterizations will apply generally to them, but not necessarily individually. Some of the incorporated-by-references references herein call this a "statistical" characterization. For one example, when a composite with LM inclusions is created according to the incorporated-by-reference references herein, the LM inclusions are not the same size, and they might not even be of the same shape. This is dependent on the techniques and materials used. But whether they are all generally spherical and have generally a common statistical diameter, or whether they are polydisperse (of a range of sizes) they have generally a common statistical diameter. And if they are both polydisperse and of varying shapes, they tend to have a common statistical size, but they are randomly orientated relative to the axes of the composite. For another example, when a composite with LM inclusions is uniaxially stretched, change of shape may not be the same for all LM inclusions but there is a general elongating influence on at least many if not most LM inclusions in the direction of stretching.

On the other hand, when the LM inclusions are discussed herein in the context of individually, or relative to a more localized set of LM inclusions in the composite material, more specific characterizations of such individual LM inclusions are given to allow an understanding of how they function collectively or statistically throughout the entire composite material.

The discussion of LM inclusions in an elastomer in both the general ("statistical") context and in the specific context is similar to how others skilled in the art discuss composites with LM inclusions, as can be seen at incorporated by reference US 2017/0218167A1; Bartlett, et al., PNAS 2017; Tutika, et al., Adv. Funct. Mater. 2018); and Jeong, et al, Scientific Reports 2015, and the references cited in them.

As is known to those skilled in the art, composites with LM inclusions typically are created to have at least a substantially uniform distribution of at least mostly unconnected liquid metal filled inclusions throughout the three-dimensional boundaries of the elastomer. These inclusions can range from nano-scale to micro-scale in largest dimension in most cases but are not necessarily limited to that range. The separation distance between LM inclusions, and their average size, can be a function of the type of elastomer, the type of liquid metal, the amount of liquid metal relative to the amount of elastomer (the loading ratio), and the technique and parameters of mixing. In many mixing techniques, the LM inclusions tend on average to be more spherical than non-spherical (in some cases most if not almost all or all can be). But in some techniques, there can be some liquid metal inclusions that are more spherical or quite spherical (having in any cross-sectional plane an aspect ratio of major axis to minor axis at or towards 1:1), and some that are non-spherical and even more elliptical (having an aspect ratio in a cross-section plane of major axis MA to minor axis mA of MA:mA, where MA is greater than mA). In most techniques, there can be a distribution of sizes of the LM inclusions. However, in all the typical techniques, the orientations of LM inclusions are basically random. One such example is shown at FIGS. 1A-C of US 2017/0218167A1, where its technique of mixing LM and elastomer results in LM inclusions 103 in the three-dimensional interior of elastomer 102 to form composite 101 that have a relatively uniform statistical distribution of LM inclusions 103 that include both (a) a range of sizes of spherical or more spherical LM inclusions and (b) a range of sizes and shapes of non-spherical and more elliptical sizes and shapes but those non-spherical and more-elliptical sizes and shapes have random orientations within the elastomer 102 and relative to each other. FIG. 1A tries to give a diagrammatic view whereas FIGS. 1B and C show actual magnified images. In other references, for understanding, diagrammatic illustrations of LM inclusions, whether before or after any stretching, are basically uniform in size and shape, but actual examples are many times shown in magnified images.

Thus, as described herein, those skilled in the art understand that composites of elastomer and LM inclusions of the type relevant here will have a starting unstressed state with a plurality of LM inclusions distributed throughout its interior with a starting general or statistical size and shape, even though there can be variations between individual LM inclusions. Those skilled in the art understand that deforming the composite by uni-axial stretching will generally influence the shapes of those starting LM inclusions to at least some common elongation in the direction of stretching, even though there can be variations in amount of elongation for different LM inclusions. As discussed herein, other deformation (e.g., bi- or multi-axial stretching or compressing) can be applied to the elastomer that change shape in a statistically significant way for at least a substantial number of the LM inclusions.

As will be further discussed herein, according to aspects of the invention, after creation and deforming (one example being stretching) of the starting composite, and then effectively annealing the whole stretched composite at least towards relaxation (annealed-deformation shaping), the LM inclusions with the elastomer are generally locked into a new shape generally having changed shape over starting shape (e.g. more statistical significant elongation in the direction if deformation is uni-axial stretching), with the annealing bringing the whole composite towards a stress-free state for end uses. It is to be understood that depending on how and how much the composite is stretched (or otherwise mechanically influenced or deformed), the LM loading, and the elastomer and LM used (compared to the starting LM inclusions after stretching or deformation only), the LM inclusions will have both (a) at least more statistically significant elongation or different shaping than before stretching/compressing and annealing and (b) more general common statistically significant directional orientation than before stretching/compressing and annealing. This would occur even if the starting composite before deformation including LM inclusions of either more uniformly sized spherical shapes or more polydisperse sizes and different shapes with random directional orientations (non-aligned) before deformation (e.g., stretching or compressing) and annealing.

Thus, in aspects of the present invention, the result is statistically-significant, generally aligned elongation of LM inclusions, although the amount can vary throughout the composite. This differs from FIGS. 1A-C of US 2017/0218267A1 and other techniques with at least some non-spherical LM inclusions in that there is more directional alignment of LM inclusions than the random orientations in US 2017/0218267A1 or similar techniques. Thus, as will be appreciated by those skilled in the art, any description of LM inclusions relating to aspects of the invention will refer generally to a statistically-significant number of LM inclusions in the composite and does not mean either perfect alignment to a single direction, identical shapes, or that all LM inclusions are aligned, but rather that a statistically-significant number of LM inclusions are more elongated and/or more aligned relative to one another than before stretching/compression and annealing, or otherwise are more uniformly annealed deformation shaped than before deformation and annealing.

The discussions of individual LM inclusions provide understanding of how exemplary LM inclusions within a given composite are specifically affected by aspects of the invention, even though not all LM inclusions will have identical ending results.

One aspect of the invention is a stress-free composite elastomer with liquid metal inclusions, where the shape, size, and concentration of the inclusions can be selectively engineered by stretching the composite with a preselected concentration of liquid metal in an initial state to create a desired shape, size, and orientation of the inclusions across the elastomer, and then annealing the stretched composite effective to relax the elastomer towards or to a stress-free state while maintaining the size, orientation, and shape of the inclusions substantially as they were in stretched state (thermo-mechanical shaping of LM inclusions). As such, the composite can be tuned or programmed relative to one or more mechanical or functional characteristics desired for a particular application of the composite along a continuum between some elongation of LM inclusions and extreme elongation of LM inclusions, as well as a continuum of LM concentrations. As inclusions elongate (become more ellipsoidal), thermal conductivity will increase. Thus, aspects of the invention apply to any amount of locked-in increased elongation of at least a substantial number of LM inclusions. Thus, the designer can program increased elongation of LM generally in the composite according to need or desire. Locking-in the LM inclusions by effective annealing does not necessarily have to be annealing the elastomer to a fully stress-free or relaxed state. Intermediate relaxation may be acceptable or useful for certain applications. At least substantial relaxation by annealing is usually beneficial, and to at or near full relaxation can be preferred for many applications. The loading of liquid metal in the composite is another variable the designer can use in engineering/programming the properties of the final composite. In most cases, a loading of 0-70% by volume is most appropriate. Furthermore, in some embodiments according to the invention, coordinated control of type of liquid metal, type of elastomer, loading of liquid metal, and direction and amount of mechanical influence can be used by the designer according to need or desire for different results or end uses. Mechanical influence can be by uniaxial stretching. In some cases, it could be by bi-axial stretching (which would influence the liquid metal inclusions to a different shape than before bi-axial stretching. In some cases, influence of the liquid metal inclusions might even be by compressing the composite in at least one main direction. In some aspects, the mechanical influence can be in the plane of length and width of the composite. In some aspects it could be in the plane of thickness of the composite. Some embodiments of composites according to aspects of the invention could include more than just elastomer and liquid metal. Examples include other liquids or solids for a variety of reason, including to engineer into the composite other functions or properties (e.g., mechanical, electrical, thermal). For example, fillers of various types for different reasons are disclosed in the some of the cited references and could including in versions of the composite created according to aspects of the present invention. And the final composite according to aspects of the invention can be used in whole in an end application, or portions or sections of it removed and used. As will be appreciated by those skilled in the art, similar benefits are possible with other annealed-deformation shaping according to the invention. Other ways to deform the elastomer than stretching to influence a different shape of the LM inclusions are possible. Other ways to anneal than thermal annealing effective to lock in the deformed LM inclusions are possible.

Another aspect of the invention is a method of making at or near a stress-free composite elastomer with liquid metal inclusions. The method provides a starting material of liquid elastomer mixed with a concentration of liquid metal to create and distribute a plurality of generally spherical or randomly-oriented spherical and non-spherical liquid metal inclusions throughout the elastomer and curing the composite. The cured composite is stretched or strained according to direction and amount which stresses the elastomer but elongates the inclusions along the direction of stretching or strain. The size, shape, and orientation of at least a substantial number of the stretched inclusions is controlled. An annealing of the stretched composite is conducted in a manner which is effective to relax the elastomer to at or near a stress-free state while retaining the stretched inclusions. As such, the benefits of both the stretched inclusions and at or near a stress-free state of the elastomer are achieved. Benefits include useful thermal conductivity. Other benefits can include other functional or physical properties (e.g., conductive or insulative electrical properties, or mechanical properties). Again, as will be appreciated by those skilled in the art, similar benefits are possible with other annealed-deformation shaping according to the invention. Other ways to deform the elastomer than stretching to influence a different shape of the LM inclusions are possible.

Another aspect of the invention is a system which uses the at or near stress-free composite according to the apparatus or method above in a specific application. As will be appreciated by those skilled in the art, there are benefits to annealing to fully stress-free. But the invention is not necessarily limited thereto. It is possible with controlled annealing to partially relax or partially eliminate stress from the composite and use the annealed-deformation shaping according to the invention in a partially-relaxed end composite.

Another aspect is varying the concentration or loading of LM in the composite. For any given or desired aligned elongation of LM inclusions by stretching and annealing, the designer also can select an LM loading. This is another way of engineering or tuning the end composite. As will be appreciated by those skilled in the art, this aspect can be applied to other embodiments of the invention using annealed-deformation shaping of LM inclusions.

Another object is both engineering aligned elongation of LM including and selective loading of LM for a programmed thermo-mechanically shaped, or mechanically shaping followed by annealing (e.g., thermal or chemical) LM inclusions in a final composite, that is applied to any number of ways of annealed-deformation shaping of LM inclusions according to aspects of the invention.

These and other objects, features, aspects, or advantages of the invention will become more apparent with reference to the accompanying specification.

3. BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 1A and 1B are highly diagrammatic depictions of methods according to the prior art.

FIG. 1C is a highly diagrammatic depiction of a generalized version of the present invention.

FIGS. 2A-D, 3A-G, and 4A-G are illustrations related to a specific example of the present invention from Haque, et al., Adv. Funct. Mater. 2020, 30, 2000832.

FIGS. 2A-D are diagrammatic views, color photographs, color infrared images, and graphs relating to microstructure programming of a liquid metal programmed elastomers (LMPEs) according to exemplary embodiments of the invention.

FIGS. 3A-G are color optical micrographs and data regarding LMPEs according to exemplary embodiments of the invention.

FIGS. 4A-G are color infrared imaging, photographs, and data regarding thermal properties of LMPEs according to exemplary embodiments of the invention.

FIGS. 5A-F, 6A-B, 7, 8, 9, 10, 11A-C, 12, 13, and 14 are illustrations supplementing those of FIGS. 2-3 from Figures and Supplementing Information related to Haque, et al., Adv. Funct. Mater. 2020, 30, 2000832.

FIGS. 5A-F are color micrographs and data regarding particle analysis of LMPEs according to exemplary embodiments of the invention.

Figure 6A:
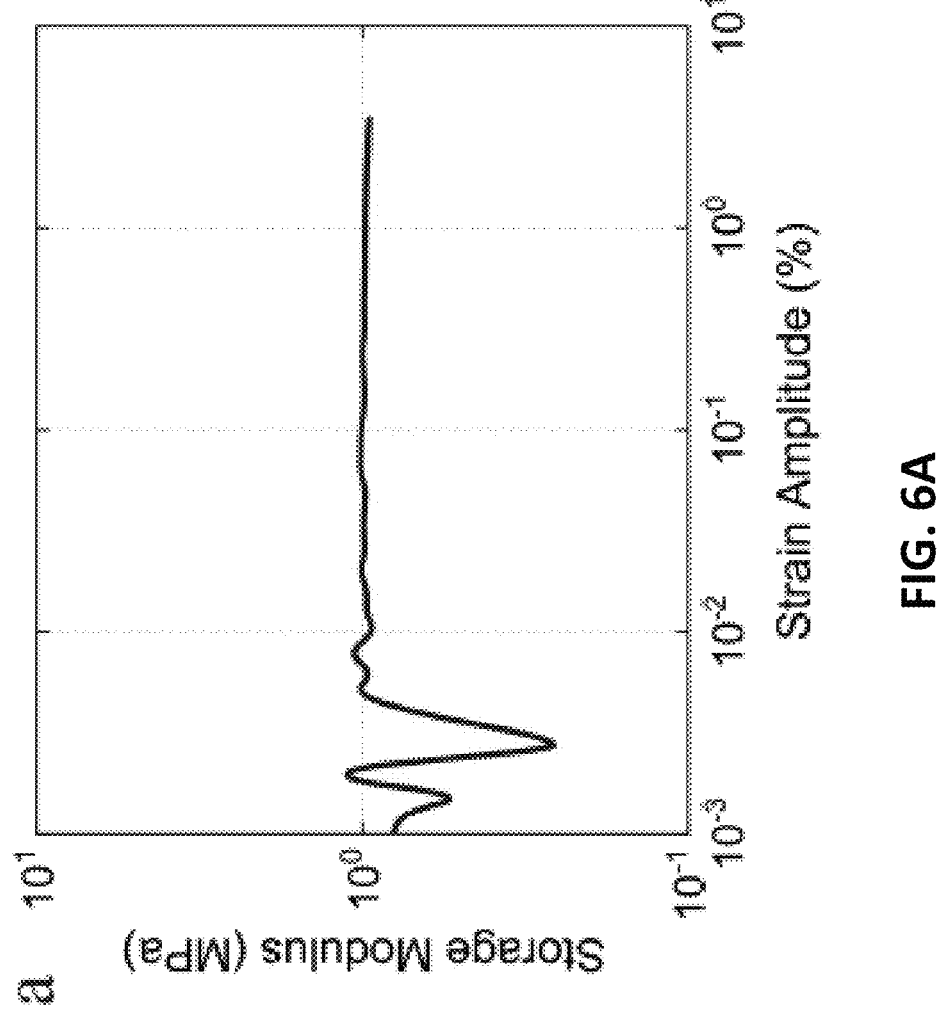
Figure 6B:
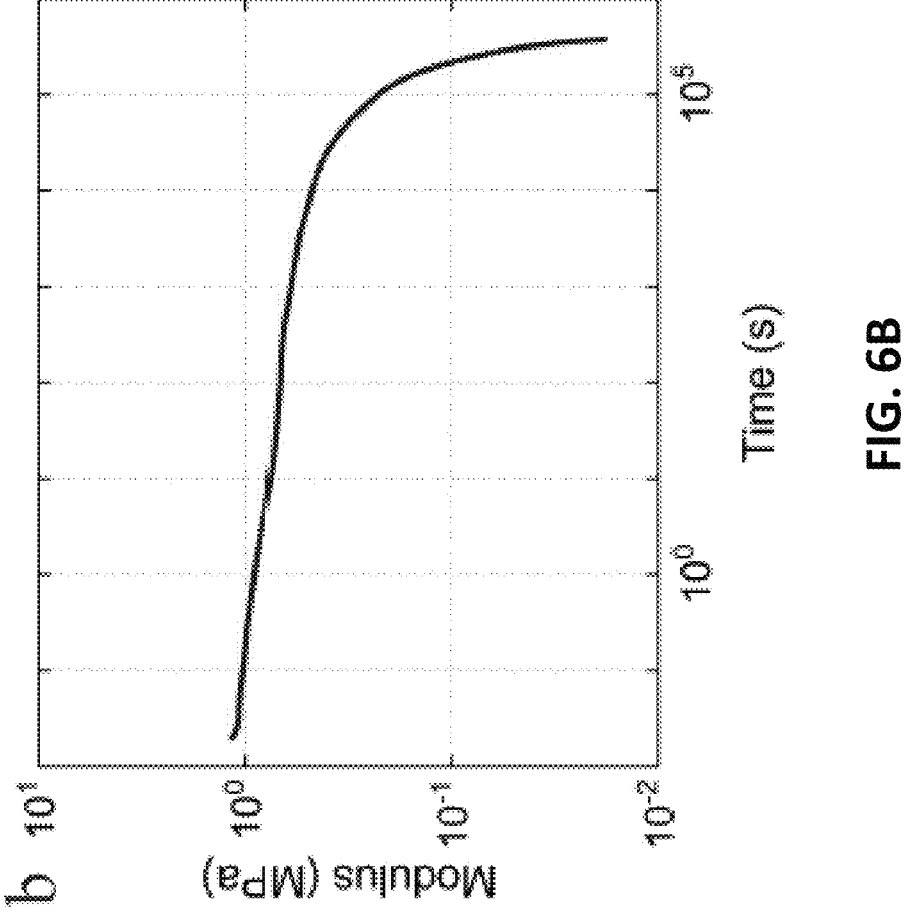

FIGS. 6A-B are data relating to dynamic mechanical analysis of LMPEs according to exemplary embodiments of the invention.

Figure 7:
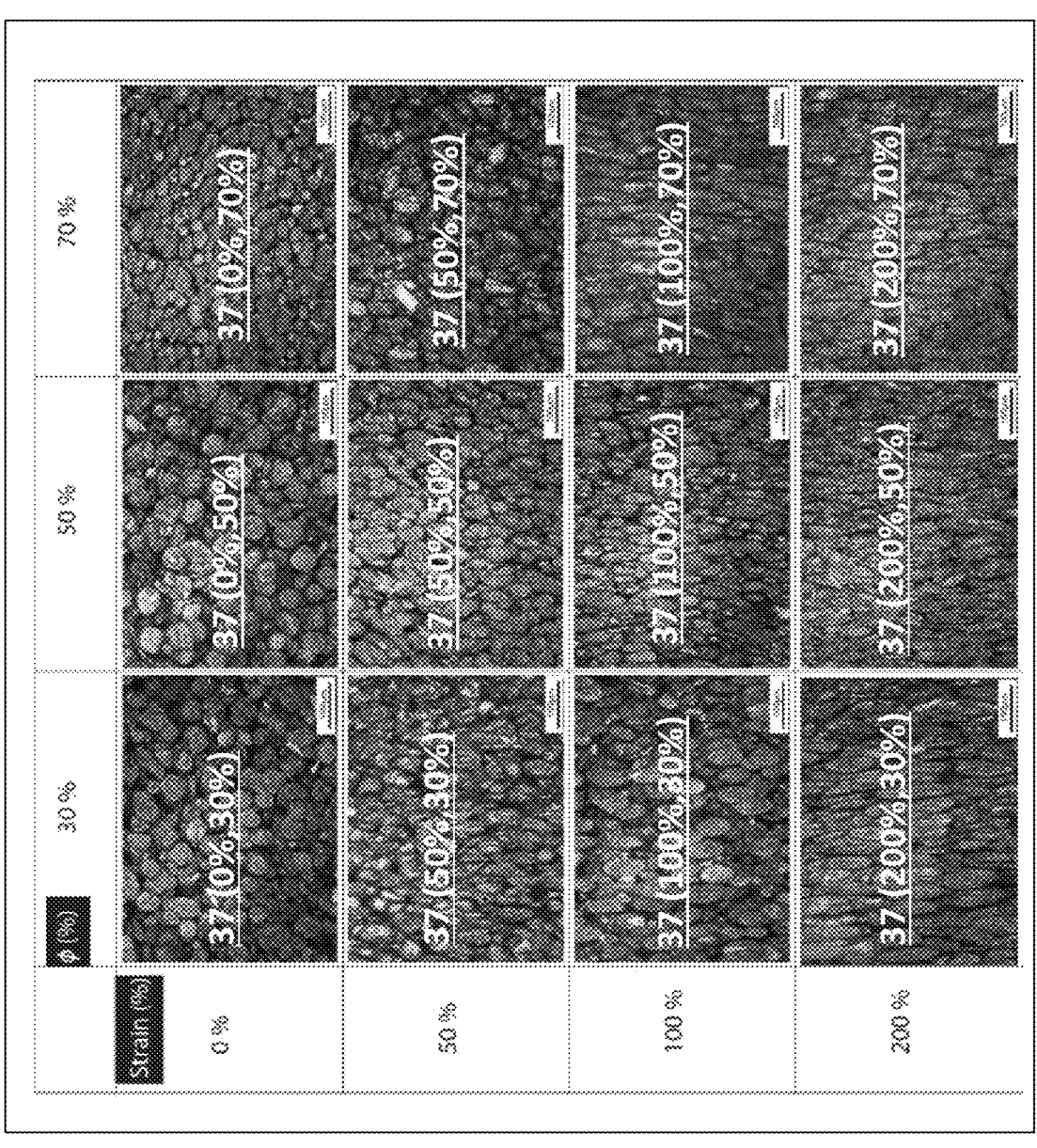

FIG. 7 is a set of color micrographs of LMPE microprogramming combinations according to exemplary embodiments of the invention.

Figure 8:
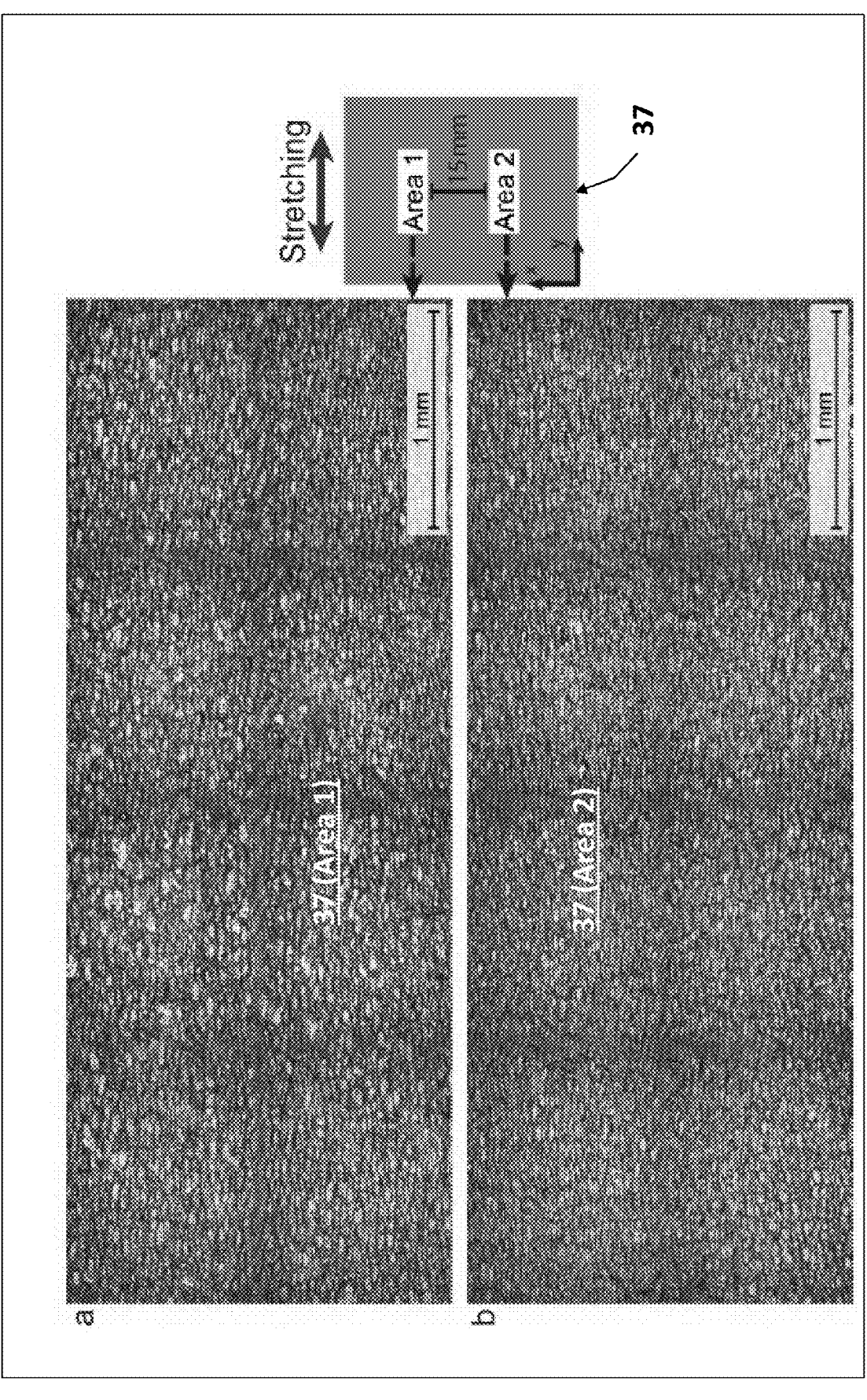

FIG. 8 is a set of color micrographs demonstrating uniform elongation of LM microstructure according to exemplary embodiments of the invention.

Figure 9:
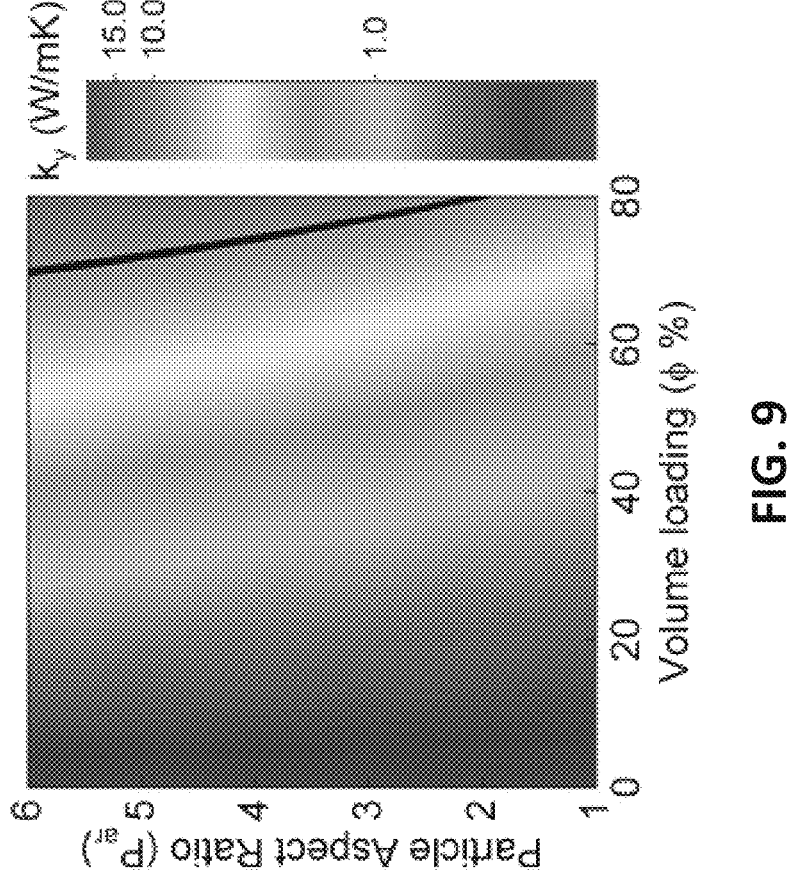

FIG. 9 is a color thermal conductivity contour plot of LMPE according to exemplary embodiments of the invention.

Figure 10:
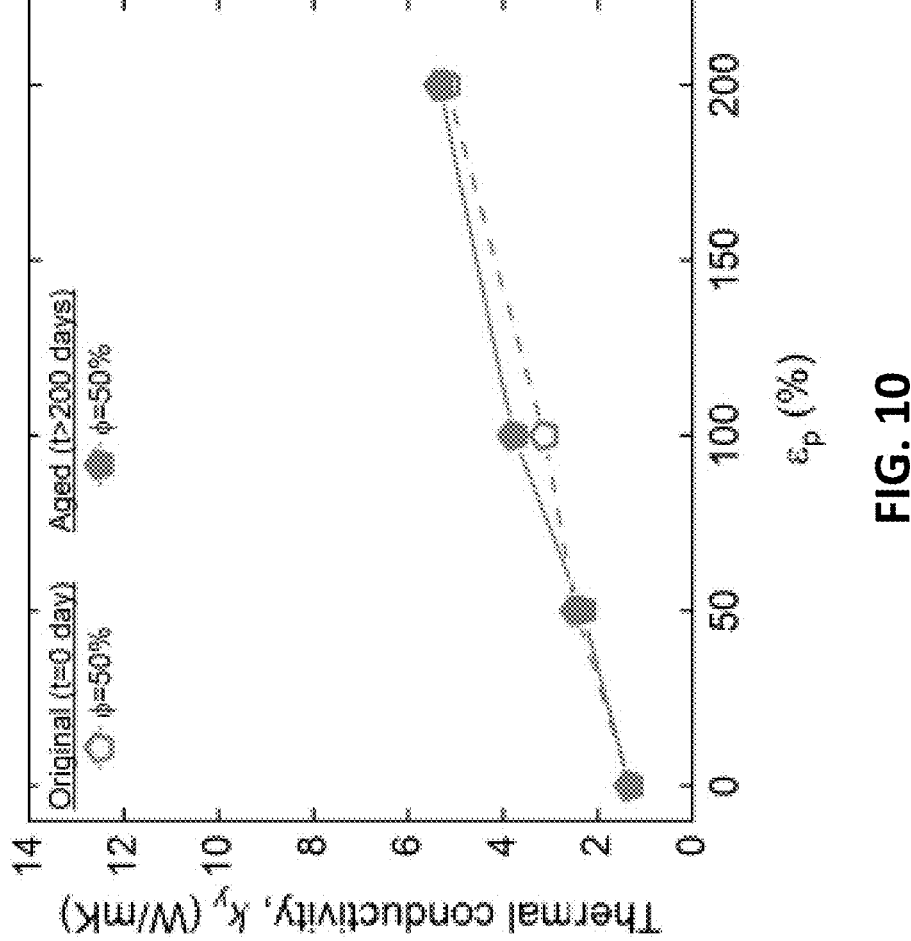

FIG. 10 is a chart of thermal conductivity data for different programming strains of LMPEs according to exemplary embodiments of the invention.

Figure 11A:
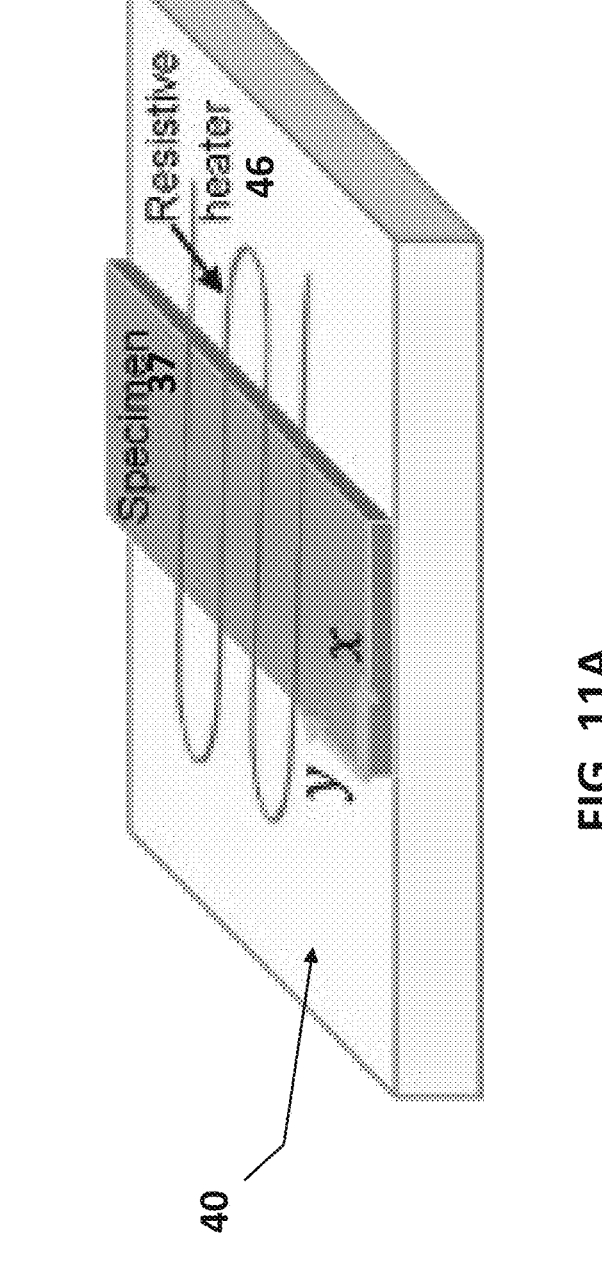
Figure 11B:
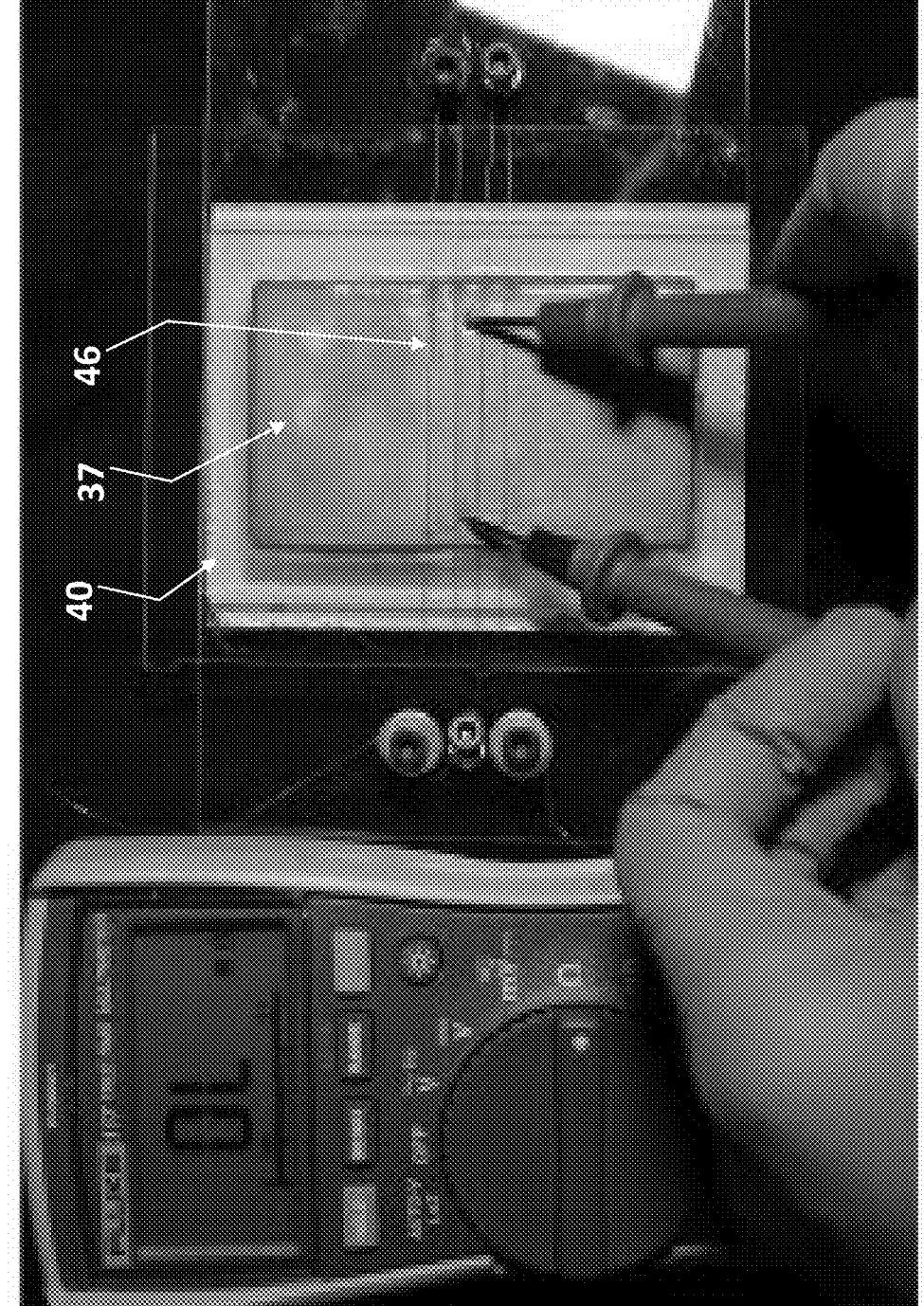

FIGS. 11A-C are photographs and diagrams illustrating testing of LMPEs according to exemplary embodiments of the invention.

Figure 12:
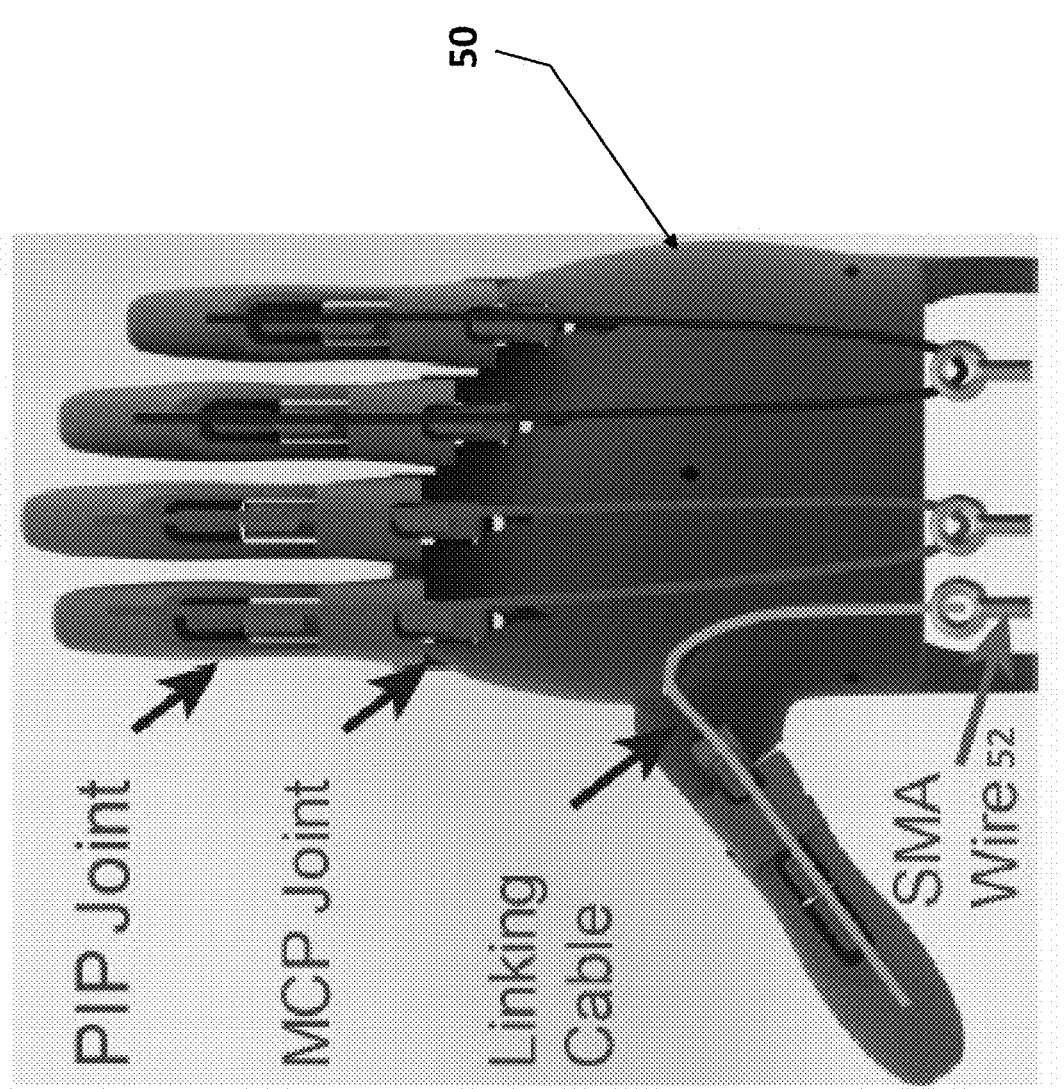

FIG. 12 is a color-coded diagram of applications of LMPEs according to exemplary embodiments of the invention to a robotic hand.

Figure 13:
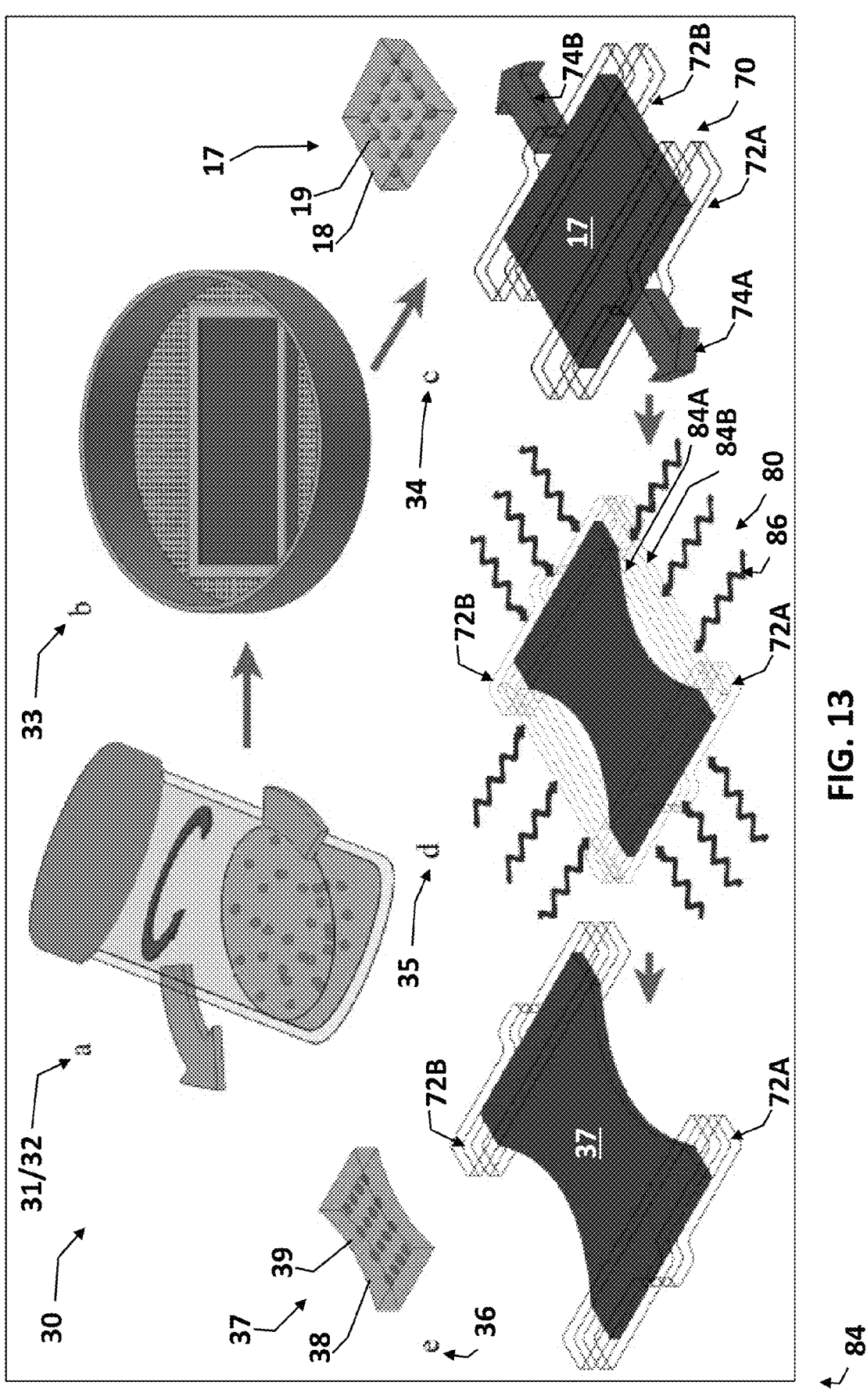

FIG. 13 is a diagrammatic illustration of a fabrication process for LMPEs according to exemplary embodiments of the invention.

Figure 14:
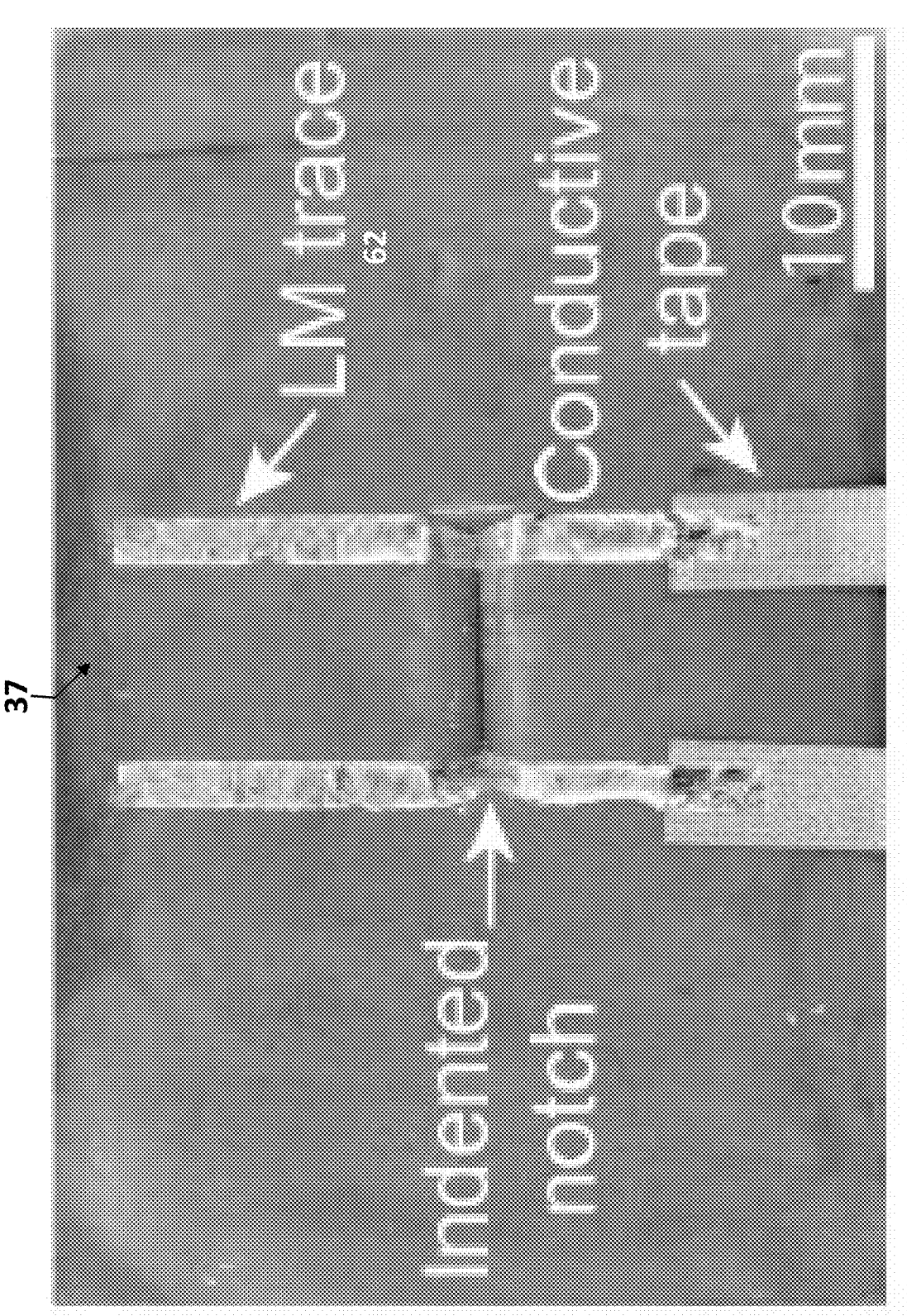

FIG. 14 is a magnified color photograph of a test set-up for measuring electrical insulation properties of LMPEs according to exemplary embodiments of the invention.

FIGS. 15A (title page) to 15P (@ 19s) are magnified color thermography still frames from a video movie M1 from Supplementing Information related to Haque, et al., Adv. Funct. Mater. 2020, 30, 2000832. Each still frame is taken from the corresponding time frame indicated. The notation "@ 5s" means a frame during the 5th second of the movie, "@ 6s" means a frame during the 6th second of the movie, and so on.

FIGS. 16A (title page) to 16T (@ 23s) are color photographs (left-side) and magnified color thermography images (right-side) still frames from a video movie M2 from Supplementing Information related to Haque, et al., Adv. Funct. Mater. 2020, 30, 2000832. Each still frame is taken from the corresponding time frame indicated.

FIGS. 17A (title page) to 17NN (@ 40s) are color photographs (left-side) and magnified color thermography images (right-side) still frames from a video movie M3 from Supplementing Information related to Haque, et al., Adv.

*Funct. Mater.* 2020, 30, 2000832. Each still frame is taken from the corresponding time frame indicated.

FIGS. 18, 19, 20, 21, 22, and 23 are highly diagrammatic (not to scale) illustrations of some variations to deformation of the composite before annealing to shape LM inclusions according to aspects of the invention.

4. DETAILED DESCRIPTION OF EXEMPLARY EMBODIMENTS OF THE INVENTION

4.1. Overview

For a better understanding of the invention, examples of ways the invention can be made and used will now be described in detail. These examples are neither inclusive nor exclusive of all the forms and embodiments the invention can take.

4.2. Generalized Embodiment

With particular reference to FIGS. 1A-1C, a generalized illustration of state-of-the-art techniques (FIGS. 1A and 1B) relative to one aspect according to the invention (FIG. 1C) are set forth. As discussed herein, attempts have been made to produce composite of elastomers with liquid metal inclusions.

FIG. 1A illustrates a method 10 of doing so selecting an elastomer and a liquid metal (step 11), mixing liquid phase elastomer with a concentration of liquid metal to create a suspension (step 12), and then curing the suspension (step 13). The result is a film or layer of the composite (see 17 at FIG. 2A) with generally spherically shaped liquid metal inclusions 19 distributed throughout the film or layer 18. This technique is described in Bartlett, et al., PNAS 2017 and Tutika, et al., Adv. Funct. Mater. 2018). In a stress-free state, the inclusions 19 are generally spherical. When the composite 17 is stretched or stressed, the inclusions elongate, as does the liquid metal inside them. But when stress is released, the elastomer 18 generally returns to original state and the inclusions return to generally spherical form factor 19. The composite 17 can be used in a selected application (step 16). Examples of uses or applications can be found at Bartlett, et al., PNAS 2017 and Tutika, et al., Adv. Funct. Mater. 2018. The technique of FIG. 1A can also be used to create a composite of polydisperse generally same-shaped LM inclusions in an elastomer, or polydisperse and randomly shaped and oriented LM inclusions. An example is at US 2017/0218167A1.

FIG. 1B illustrates a method 20 of doing so by mixing liquid phase elastomer with a concentration of liquid metal to create a suspension, and then curing the suspension (see steps 21, 22, and 23), which are the same or similar to steps 11, 12, and 13 of method 10. The result is a film or layer of the composite with generally spherically shaped liquid metal inclusions distributed throughout the film or layer like that of composite 17 of FIG. 2A. Then, the composite is stressed (e.g., mechanically stretched as in step 24) and the inclusions elongate in the direction of stress. A mechanical set-up is needed to hold the composite in the stressed state when the composite is in use (step 26). This technique is described in Tutika, et al., Adv. Funct. Mater. 2018) and Jeong, et al, Scientific Reports 2015. This gains some of the advantages of thermal performance with elongated liquid metal inclusions but requires the mechanical set-up to hold the composite in a stressed condition during use. It therefore is not in a stress-free natural state. The technique of FIG. 1B can also be used to create a composite of polydisperse generally same-shaped LM inclusions in an elastomer, or polydisperse and randomly shaped and oriented LM inclusions, and the composite strained and unloaded to stress-free but with unrecoverable strain (plastic deformation shaping). An example is at US 2017/0218167A1.

FIG. 1C illustrates, in comparison, an aspect of the present invention. To achieve both the benefits of high control shaping of elongated liquid metal inclusions and a stress-free state, a method 30 according to an aspect of the invention produces a stress-free original state with generally spherical liquid metal inclusions (steps 31, 32, and 33, like those of method 10, steps 11, 12, and 13), but produces a final stress-free state with programmable or tunable form-factor liquid metal inclusions different from the original generally spherical form factors (by steps 34, 35, and 36). As shown in FIG. 1C, the original stress-free state composite (steps 31, 32, and 33) is stressed (e.g., mechanically stretched) (step 34) in a direction and amount to change the shape of the liquid metal inclusions, and then annealed according to a regimen that is effective to relax the elastomer so that when the stress is released, the composite (see 37 at FIG. 2A) is stress-free but the liquid-metal inclusions 39 remain in at least substantially similar form factor as when the stress was applied (step 35). The annealing essentially locks the liquid-metal inclusions 39 in the form factors they were during stressing but converts the stressed elastomer 38 to a stress-free final state for use (step 36). As such, no mechanical set-up is needed to maintain the new liquid-metal inclusion form factors during use of the composite 37. And strain until plastic deformation is not required. The composite can be applied in its stress-free final form over other surfaces with or without added stress, and the composite provides the benefits of the modified liquid-metal inclusion form factors by annealed-deformation shaping. For example, when the composite according to aspects of the invention is by applying to another surface or object, new stresses could develop. Specific non-limiting examples include if the another surface is intended to flex or bend, such as clothing, human or animal skin, flexible circuits, or other. This might also occur if the composite in used to coat or encapsulate another object or assembly, or otherwise combine the LMPE composite with one or more other things. The method of FIG. 1C can be applied to other annealed-deformation shaping. Examples include thermo-mechanical shaping. Other examples include other ways to deform the elastomer to influence a desired different general statistically-significant LM inclusions shape and other ways to anneal the deformed composite to towards stress-free or at least an intermediate stress. Examples include but are not necessarily limited to thermal annealing, chemical annealing, and a combination of the two.

Discussion of thermal annealing of polymers can also be found at U.S. Pat. No. 9,173,979B2 to Kelly et al. published Nov. 3, 2015 and J. Musil, P. Zeman, P. Baroch, 4.13—Hard Nanocomposite Coatings, Editor(s): Saleem Hashmi, Gilmar Ferreira Batalha, Chester J. Van Tyne, Bekir Yilbas, Comprehensive Materials Processing, Elsevier, 2014, Pages 325-353, ISBN 9780080965338, https://doi.org/10.1016/B978-0-08-096532-1.00416-7. (https://www.sciencedirect.com/science/article/pii/B9780080965321004167), both incorporated by reference herein. Discussion of chemical annealing can be found at U.S. Pat. No. 10,912,860B2 to Griffin et al. published Feb. 9, 2021 and Dinachali, Saman & Bai, Wubin & Tu, Kun-Hua & Choi, Hong & Zhang, Jinshuo & Kreider, Melissa & Cheng, Li-Chen & Ross, Caroline. (2015). Thermo-Solvent Annealing of Polystyrene-Polydimethylsiloxane Block Copolymer Thin Films.

ACS Macro Letters. 4. 500-504. 10.1021/ acsmacrolett.5b00108, both incorporated by reference herein.

Thus, this generalized embodiment achieves at least one or more of the objects, features, advantages, or aspects of the invention as described herein.

It will be appreciated by those skilled in the art that the invention can be implemented in a variety of forms and embodiments. For example, the elastomer that is selected for mixing with liquid metal can vary according to need or desire, so long as it can be annealed with controlled heat when stressed and converted to an unstressed state but retaining the form factor of the liquid metal inclusions as they were when the elastomer was under stress. The liquid metal that is selected and the ways it is mixed into the liquid-phase elastomer in steps 21 and 22 can vary according to need or desire, as is the way it is cured in step 23. The way the original unstressed cured composite with generally spherical liquid metal inclusions is stressed (step 24) can also vary according to need or desire. This includes other annealed-deformation shaping techniques. Those skilled in the art will appreciate such variations, options, and alternatives in the context of the accompanying descriptions, and references such as Bartlett, et al., PNAS 2017; Tutika, et al., Adv. Funct. Mater. 2018; and Jeong, et al, Scientific Reports 2015 provide some examples. As will be appreciated by those skilled in this technical art, a designer with such skill would know, understand, or be able to find out the characteristics of a given elastomer and a given liquid metal when selecting those starting materials, as well as know, understand, or be able to find out how to mix them into a suspension with substantial distribution of liquid metal droplets in the liquid-phase elastomer, and cure the suspension into a solid-phase elastomer composite with distributed generally spherically-shaped liquid metal inclusions. Additionally, the foregoing references give examples of how a cured elastomer composite could be directionally stressed. One non-limiting example is by mechanical stretching or straining by grabbing opposite edges of the cured composite with s or analogous releasable members and controlling the separation distance of one or more of those clamps or connections. It could be by moving the clamps or connections in opposite directions or moving one away from the other. By further example, one could stretch the composite in different directions in a manner to achieve some desired influence on changing the starting shape of the LM inclusions. This could include elongation. A specific non-limiting example is biaxial stretching in the length and width plane of a composite that has a length and a width greater than thickness. Furthermore, axial or multi-axial stretching could be relative the plane through the thickness of the composite whether or not the thickness is less than or greater than length and/or width. The composite could be in the form factor of a block of material, and you could stretch in the any of the length, width, and/or thickness directions. There could be multiaxial stretching in more than two directions. This would require some mechanical technique of gripping appropriate edges or sides of the composite and imparting mechanical forces to stretch in desired a direction or directions a desired amount. This could require multiple connection points and one or more mechanical or electro-mechanical or other components to cause the stretching. The incorporated by reference publications provide some non-limiting examples, including clamp(s) or other ways to couple to the composite and controllable actuators to stretch and/or compress or otherwise influence the composite, including just clamps at opposed sides of the composite.

Some examples include a frame around at least one perimeter plane of the composite. Some examples include an under support and/or over support across one or both sides of the composite. As will be appreciated, the composite can be compressed on at least one direction by bringing clamps at opposed sides of the composite towards rather than away from one another. As will be appreciated by those skilled in the art, these various ways to influence a composite with LM inclusions can mechanically "shape" the LM inclusions to a desired/programmed shape generally (e.g. by uniaxial or multi-axial stretching, uniaxial or multiaxial compressing, or a combination of any of these), and then while mechanically shaped, an effective annealing can lock those shapes generally in that shape. This is sometimes referred to herein as annealed-deformation shaping the LM droplets in the composite, with thermo-mechanical shaping being just one form of the same.

Haque, et al., Adv. Funct. Mater. 2020, 30, 2000832, discusses some other non-limiting examples, options, variations, and alternatives of possible elastomers and liquid metals (step 31), how they could be mixed and cured (step 33), and how the cured composite could be directionally stressed (step 34) that can be used with apparatus, systems, and methods according to the present invention. As indicated generally at FIG. 1C, Haque, et al. Adv. Funct. Mater. 2020, 30, 2000832, also discusses non-limiting examples of how a cured composite can be annealed in a manner effective to relax the stressed composite to a stress-free state (step 35), 18 including discussion of non-limiting examples of annealing temperature and time. The following specific embodiment is a particular, non-limiting methodology, composite material, and systems for use of the method or composite (step 36) from Haque, et al. Adv. Funct. Mater. 2020, 30, 2000832. It provides specific non-limiting examples of how the invention can be made and used. Variations are, of course possible. One skilled in this art would know, understand, or can figure out what combination of annealing parameters (including temperature and time) would be effective to relax the stressed composite towards a stress-free state. It can be beneficial to relax the stressed composite to at or near a stress-free state. It can be beneficial to relax the stressed composite to a completely stress-free state.

4.3. Specific Embodiment 1

With particular reference to FIGS. 2-4, 5-14, and 15-17 (and subparts), a specific exemplary embodiment according to one or more aspects of the invention is set forth in detail. This description is taken from Haque, et al., Adv. Funct. Mater. 2020, 30, 2000832, available at www.advancedscien-cenews.com www.afm-journal.de and https://onlinelibrary. wiley.com/doi/abs/10.1002/adfm.202000832 and incorporated by reference herein in its entirety, along with Supplementing Information available at the foregoing web address, all of which is incorporated by reference into this description in its entirety.

As will be appreciated by those skilled in the art, the following is one non-limiting way to make and use the invention. Numbers in square brackets are to the references in the bibliography, infra. in this description. References to Figures are to the drawings summarized in the Brief Description of the Drawings, supra.

Programmable Liquid Metal Microstructures for Multifunctional Soft Thermal Composites Soft, elastically deformable composites can enable new generations of multifunctional materials for electronics, robotics, and reconfigurable structures. Liquid metal (LM) droplets dispersed in elastomer matrices represent an emerging material architecture that has shown unique combinations of soft mechanical response with exceptional electrical and thermal functionalities. These properties are strongly dependent on the material composition and microstructure. However, approaches to control LM microdroplet morphology to program mechanical and functional properties are lacking. Here, this limitation is overcome by thermo-mechanically shaping LM droplets in soft composites to create programmable microstructures in stress-free materials. This enables LM loadings up to 70% by volume with prescribed particle aspect ratios and orientation, enabling control of microstructure throughout the bulk of the material. Through this microstructural control in soft composites, a material which simultaneously achieves a thermal conductivity as high as 13.0 W m$^{-1}$ K$^{-1}$ (>70x increase over polymer matrix) with low modulus (<1.0 MPa) and high stretchability (>750% strain) is demonstrated in stress-free conditions. Such properties are required in applications that demand extreme mechanical flexibility with high thermal conductivity, which is demonstrated in soft electronics, wearable robotics, and electronics integrated into 3D printed materials.

1. Introduction

Emerging soft technologies such as stretchable devices, [1,2] soft robotics, [3] and programmable matter [4] demand efficient thermal management to dissipate and distribute heat. However, low modulus materials are typically thermal insulators (thermal conductivity k<<1 W m$^{-1}$ K$^{-1}$), which can accumulate heat leading to loss of function, material damage, and harm to users. [5] Composite materials with dispersion of rigid particles such as metal, [6] graphene, [7] CNTs, [8] and ceramics [9] can increase thermal conductivity but require high volume loadings, [9-11] which leads to degradation of the soft mechanical response such as increased modulus and decreased stretchability. [7,12] To overcome the limitations of rigid fillers in soft multifunctional systems, researchers have utilized gallium-based liquid metal (LM) embedded composites to achieve diverse functionalities such as tunable dielectric permittivity, [13, 14] soft circuits, [15-19] and high thermal conductivity, [20-24] while being soft and flexible. LM is chosen as it displays a unique combination of soft mechanical response with metal like functionality, including high thermal conductivity, [25-27] while having low viscosity, and low toxicity. These multifunctional LM composites have been adopted for soft robotics, [30,31] thermal interface layers, [21,23] and soft electronics. [13,32] Generally, these composites are fabricated by shear mixing LM droplets in uncured elastomers that leads to spherical particle shapes. [14,33,34] However, the microstructure (droplet shape, orientation, connectivity) of these systems is critical to their performance. This has been demonstrated in functionalities ranging from constant electrical resistance under deformation [16,30,35] to an increase in thermal conductivity through elongated droplets, [22,33] and strain induced reorientation for mechanical toughening. [36] In these examples the droplets are structured under mechanical deformation, however, once the stress is removed the inclusions lose their structure and are driven back to a spherical state. This limits the material functionality once restored to a stress-free condition. This necessity to sustain mechanical stress can limit applicability in diverse soft technologies, where residual stress will distort compliant materials and soft structures.

Tunable microstructures have been developed for rigid materials and composites with rigid inclusions. Techniques such as deforming above the glass transition temperature, [37,38] microfluidic synthesis, [39,40] electrohydrodynamic jetting, and magnetic stirring have been effectively utilized to shape rigid particles. In the case of liquid particles, spherical droplets of LM are generally created, [43-47] while additional techniques to create elongated LM droplets by microfluidic flow focusing, ultrasound, and sonication have also been demonstrated. However, these approaches cannot be readily adopted for embedding LM in composites as the processed droplets are collected in aqueous environments which are prone to reshaping and coalescing during dispersing in an elastomeric matrix. Moreover, these droplets are limited by moderate aspect ratio and would require intricate alignment if dispersed within a composite. Currently, systematic approaches to program LM microstructures in elastomers in stress-free conditions are not available.

Here we show a new class of LM elastomer composites where the liquid inclusion microstructure can be programmed across a range of LM loadings. These liquid metal programmed elastomers (LMPE) start from a pristine composite with spherical LM droplets dispersed in a thermoplastic elastomer matrix (see unprogrammed elastomer composite 17 at left section of FIG. 2A with diagrammatical view of section of composite 17, not to scale, included for illustration only). The inclusions are then mechanically shaped (e.g., stretching step 34) and the thermoplastic polymer matrix is thermally relaxed (annealing step 35) to create controlled microstructures in stress-free (stress-free state at step 35) configurations (see programmed LMPE composite 37 at right section of FIG. 2A with stress-free elastomer 38 with tuned elongated LM inclusions 39, with diagrammatical view of section of composite 37, not to scale, included for illustration only). This technique comprises three sequential stages: i) stretching (step 34), ii) annealing (step 35), and iii) stress-free (step 36), which are distinguished by applied strain ($\varepsilon_p$) and internal stress ($\sigma_{int}$). In the stretching stage, the $\varepsilon_p$ programs the underlying LM microstructure as the polymeric chains are stressed ($\sigma_{int}$>0). In the subsequent annealing stage, the developed $\sigma_{int}$ in the polymeric chains relaxes ($\sigma_{int}\rightarrow0$) while the microstructure is unperturbed. In the final stress-free stage, the programmed LMPE 37 with elongated and oriented LM microstructure 39 is recovered in a stress-free state ($\varepsilon=\varepsilon_p$ and $\sigma_{int}=0$). Through this microstructural programming, the composite 37 remains highly compliant (elastic modulus <1 MPa) and extremely stretchable (strain limit >700%) as shown in FIG. 2B. Furthermore, the combination of a programmed LM structure and high LM loading imparts an unprecedented high thermal conductivity and soft mechanical response, where we have programmed a set of LMPEs to obtain a mean thermal conductivity of 11.4±0.96 W m$^{-1}$ K$^{-1}$ with a maximum value of k=13.0 W ml K$^{-1}$ in a stress-free state. This enables the LMPE to stay cooler and dissipate heat more rapidly compared to an unfilled elastomer (see FIG. 2C and FIGS. 15A-P, selected still frames from Movie S1, Supporting Information). This combination of properties places LMPE materials in a unique location in the material property space, where FIG. 2D illustrates the exceptional combination of high mechanical compliance and high thermal conductivity of LMPE compared to a broad spectra of stress-free, soft materials.

Figure 2A:
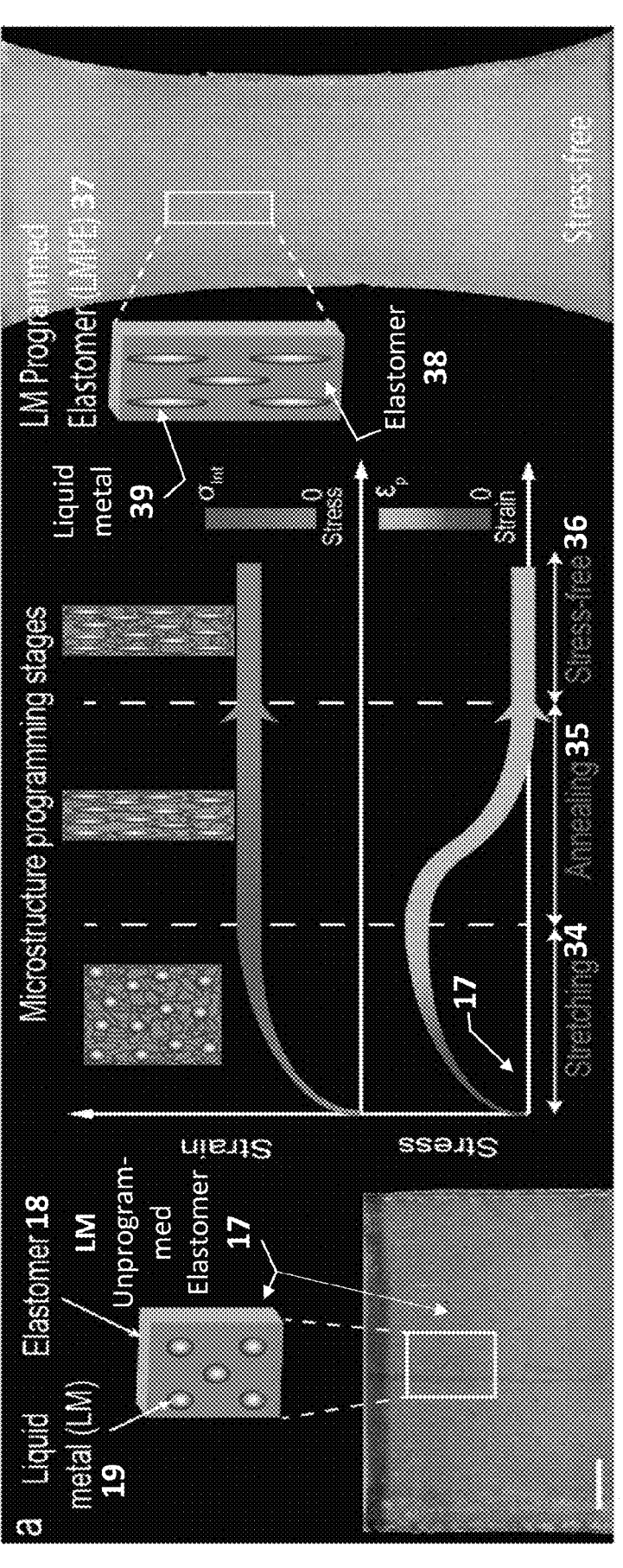
Figure 2B:
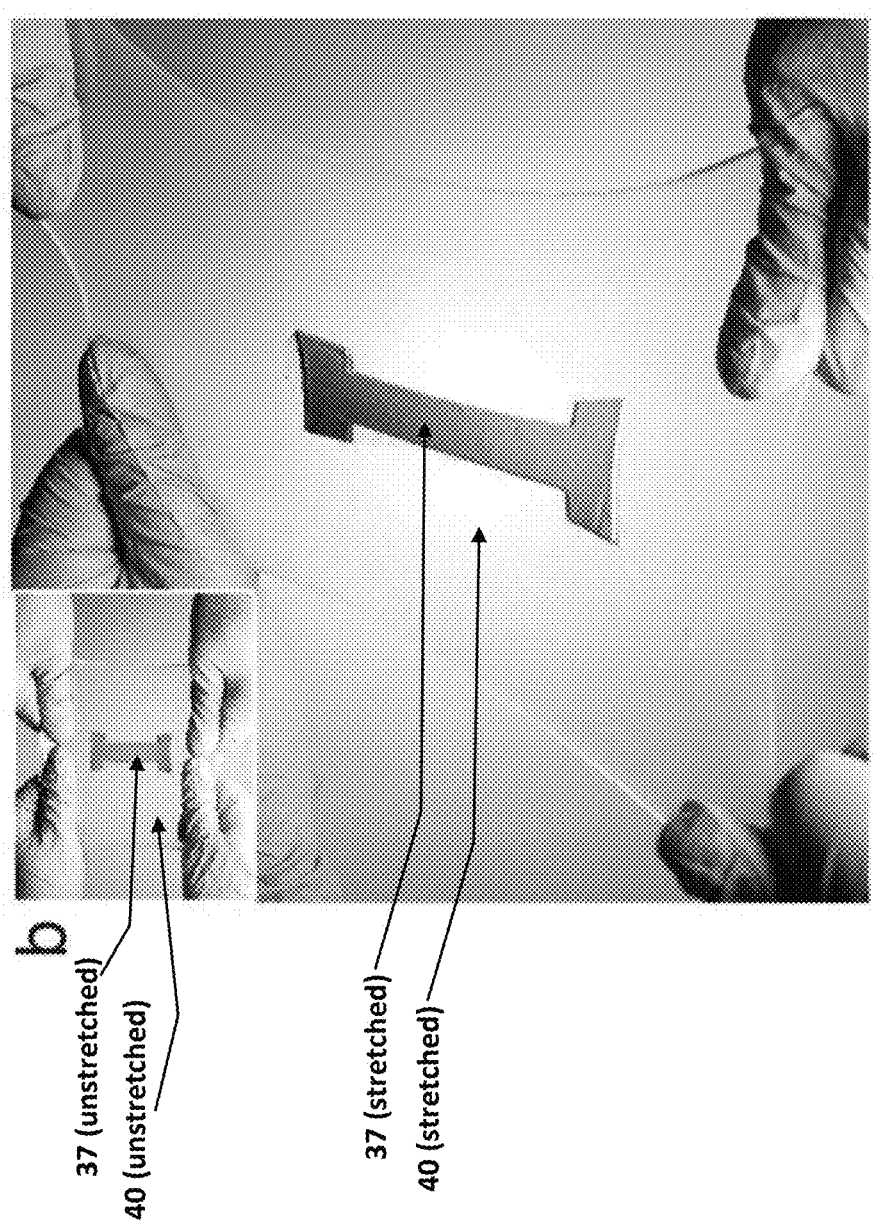
Figure 2C:
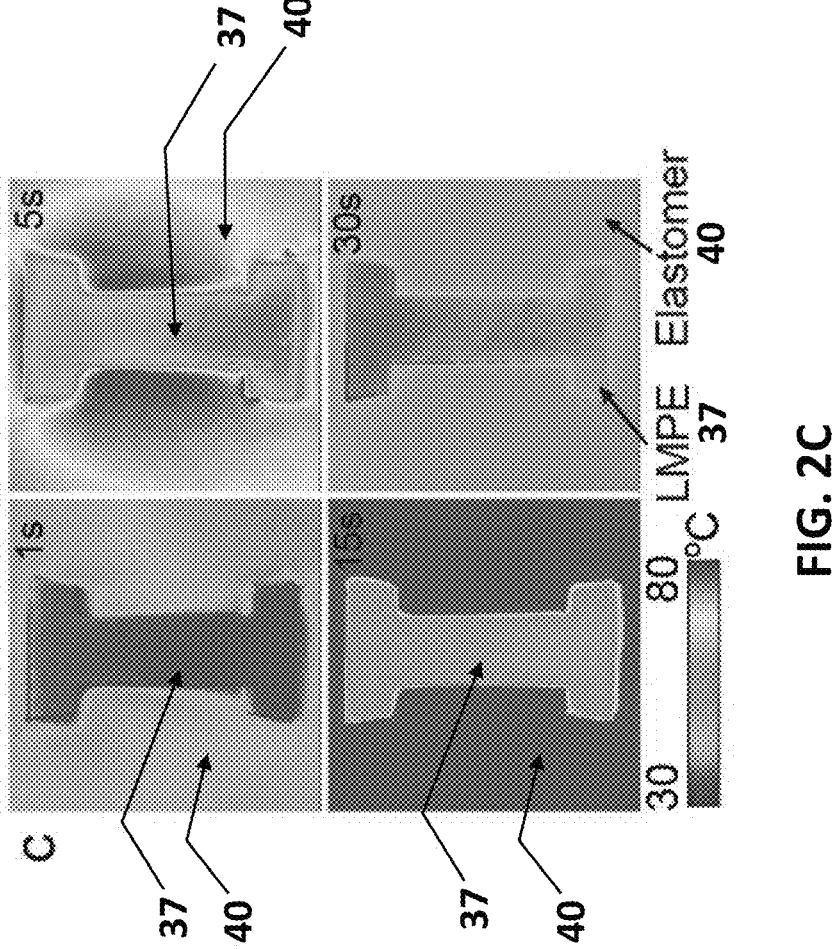
Figure 2D:
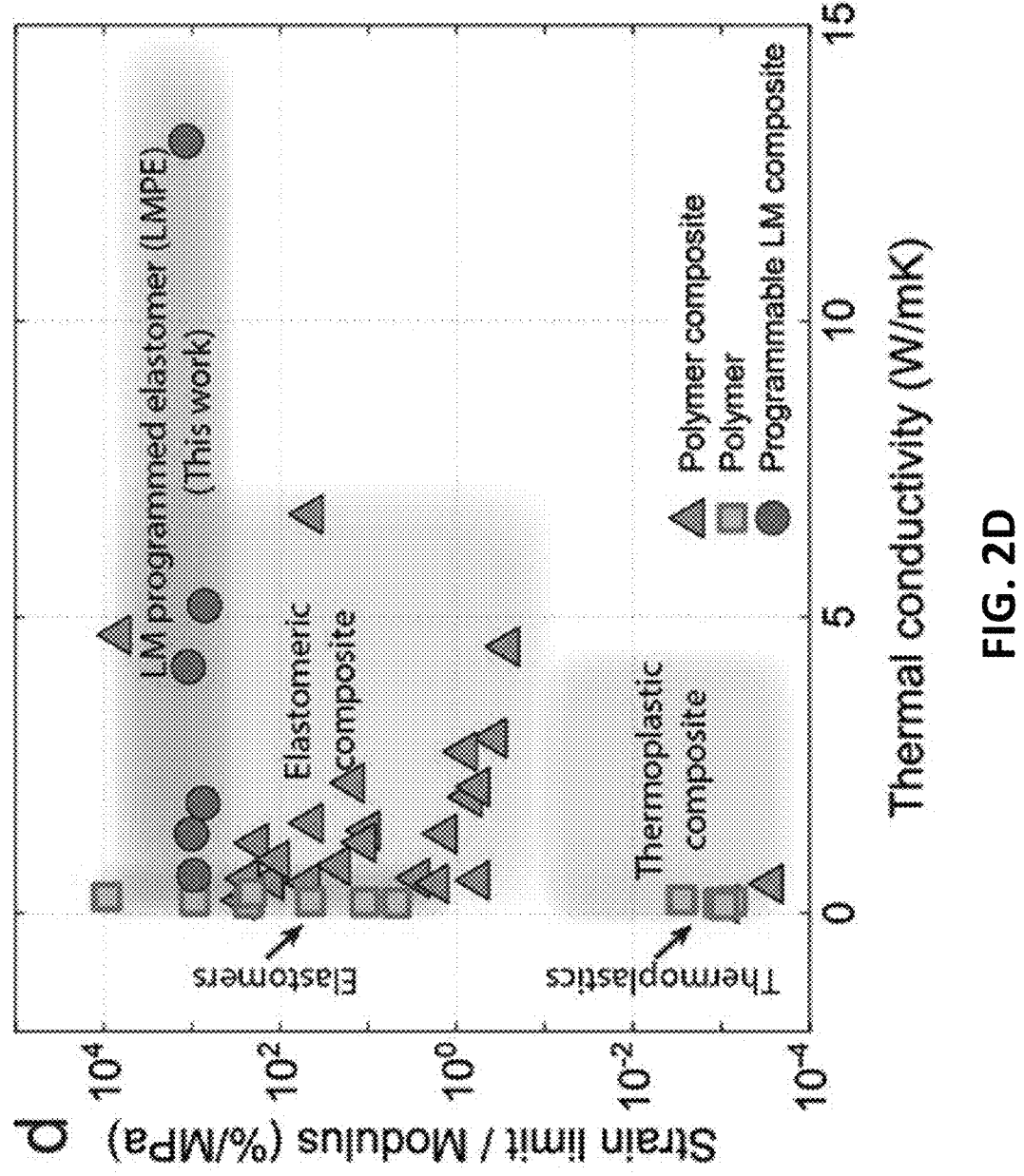

Specific description of FIGS. 2A-D. Microstructure programming of LMPE. FIG. 2A: Spherical LM droplets 19 in a thermoplastic elastomer 18 matrix 19 are programmed by stretching (step 34) to a strain $\varepsilon_p$ to create a prescribed droplet shape. The composite is annealed (step 35) to remove the internal stress ($\sigma_{int}$), which relaxes the matrix to a stress-free state ($\sigma_{int}=0$) (step 36) with the programmed liquid metal microstructure 39 locked-in in the elastomer 38 of final composite 37 (scale bar, 1 cm). FIG. 2B: The highly compliant behavior of LMPE 37 in the shape of the letter (I) can support extreme deformation where the LMPE shape 37 is adhered to, embedded, or fully or partially encapsulated in an elastic substrate or sheet 40. FIG. 2C: IR images show the superior thermal conductivity of the LMPE letter (I) shape 37 embedded in a substrate 40, here an unfilled styrene-isoprene-styrene (SIS) elastomer (no LM inclusions), where 15 s of heating shows that the LMPE 37 efficiently dissipates heat and rapidly cools after heat removal. FIG. 2D: Soft material property chart with mechanical compliance (strain limit/elastic modulus) versus thermal conductivity for materials in a stress-free state which shows the wide programmable range of LMPE and the maximum thermal conductivity of 13.0 W m$^{-1}$ K$^{-1}$ for $\phi=70\%$ and $\varepsilon_p=200\%$.

FIG. 2D helps illustrate how aspects of the invention can be used to improve one or more parameters of performance of LM-based composites. Examples of LMPE (data relating to "programmable LM composite") according to aspects of the invention allow a designer to balance how much stress to impose and lock-in with steps 34 and 35 to achieve a desired or needed thermal conductivity across a range of thermal conductivity, with at least some achieving thermal conductivity as high as or substantially higher than unprogrammed or stress-free LM composites (see "polymer composites" data), and substantially higher than thermoplastics without LM. But, additionally, across the range of programmable thermal conductivities possible, the LMPE retains on the order of as high of strain limit/elastic modulus, which is better than unprogrammed LM composite ("polymer composite") and much better than non-LM "polymer". Thus, for example, a designer might only need thermal conductivity at least as high as "polymer composites" or "polymers" of FIG. 2D. This would require less directional stress in step 34. But the resulting LMPE 37 would have a strain limit/elastic modulus at least as high as "polymer composites", if not predominantly better. On the other hand, a designer might want at least on the same order of thermal conductivity in the final LMPE composite 37 as "polymer composites", and much higher than "polymers", and could stress the composite in step 34 to higher levels to achieve the same. Through trial and error, calibration, or other techniques, the designer could get at least good estimations of the amount of stress needed to achieve a target thermal conductivity for a given starting elastomer and liquid metal, and compile such information to allow effective precision, accuracy, and repeatability for each programmed final composite 37. There may be applications where the designer wants to maximize thermal conductivity. Again, through empirical methods, the designer could compile information about stressing the composite in step 34 to something below its strain limit before breakage to achieve the same for any given starting elastomer and LM.

And, of course, the designer could extrapolate from empirical testing or calibration stresses to impose in step 34 to meet a target thermal conductivity anywhere along the possible range of thermal conductivities for a given combination of elastomer and LM.

As will be further discussed infra, other design parameters can be balanced by a designer to achieve an LMPE 37 of desired or needed functional characteristics.

2. Results and Discussion

Figure 5A:
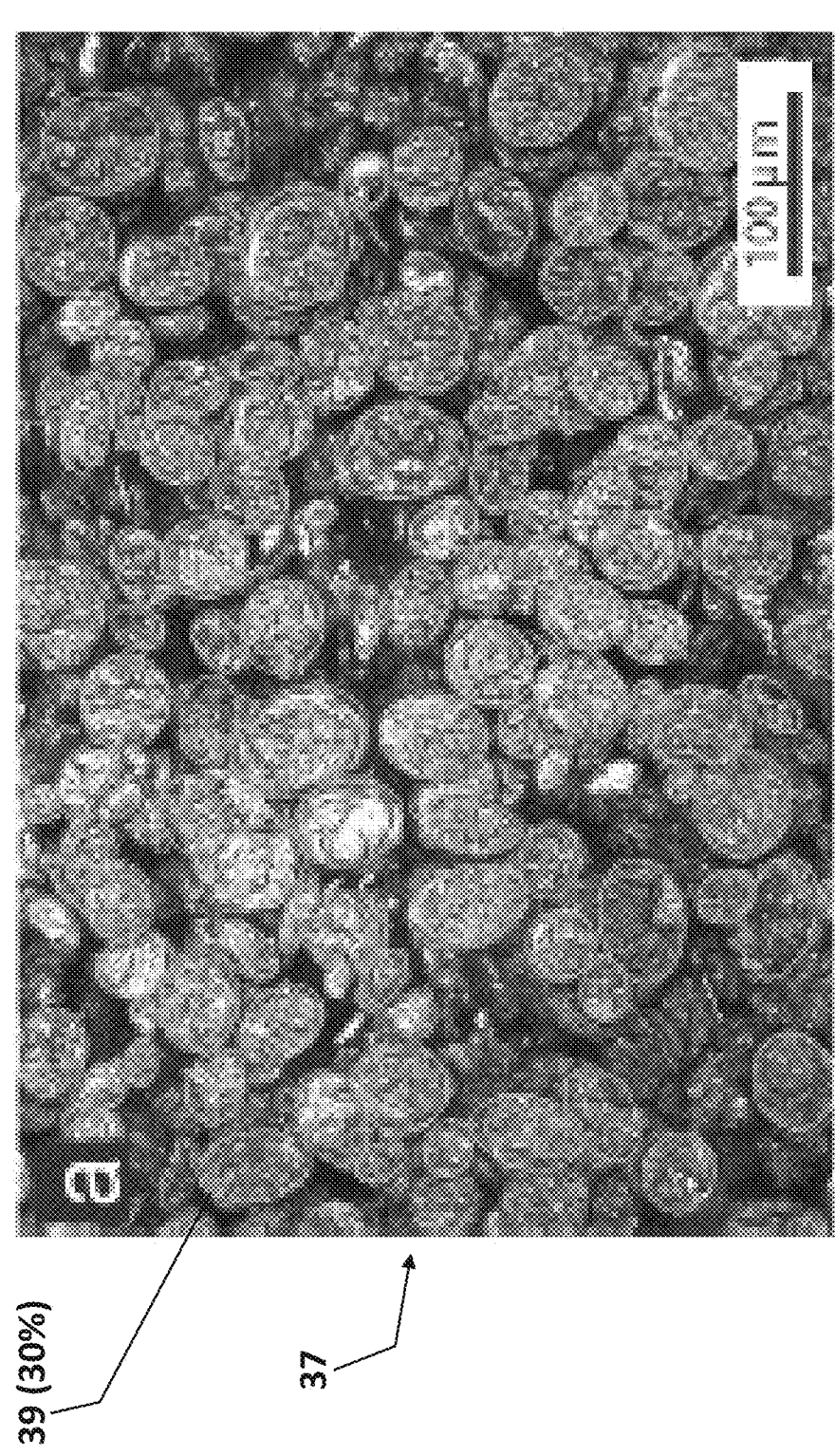
Figure 5B:
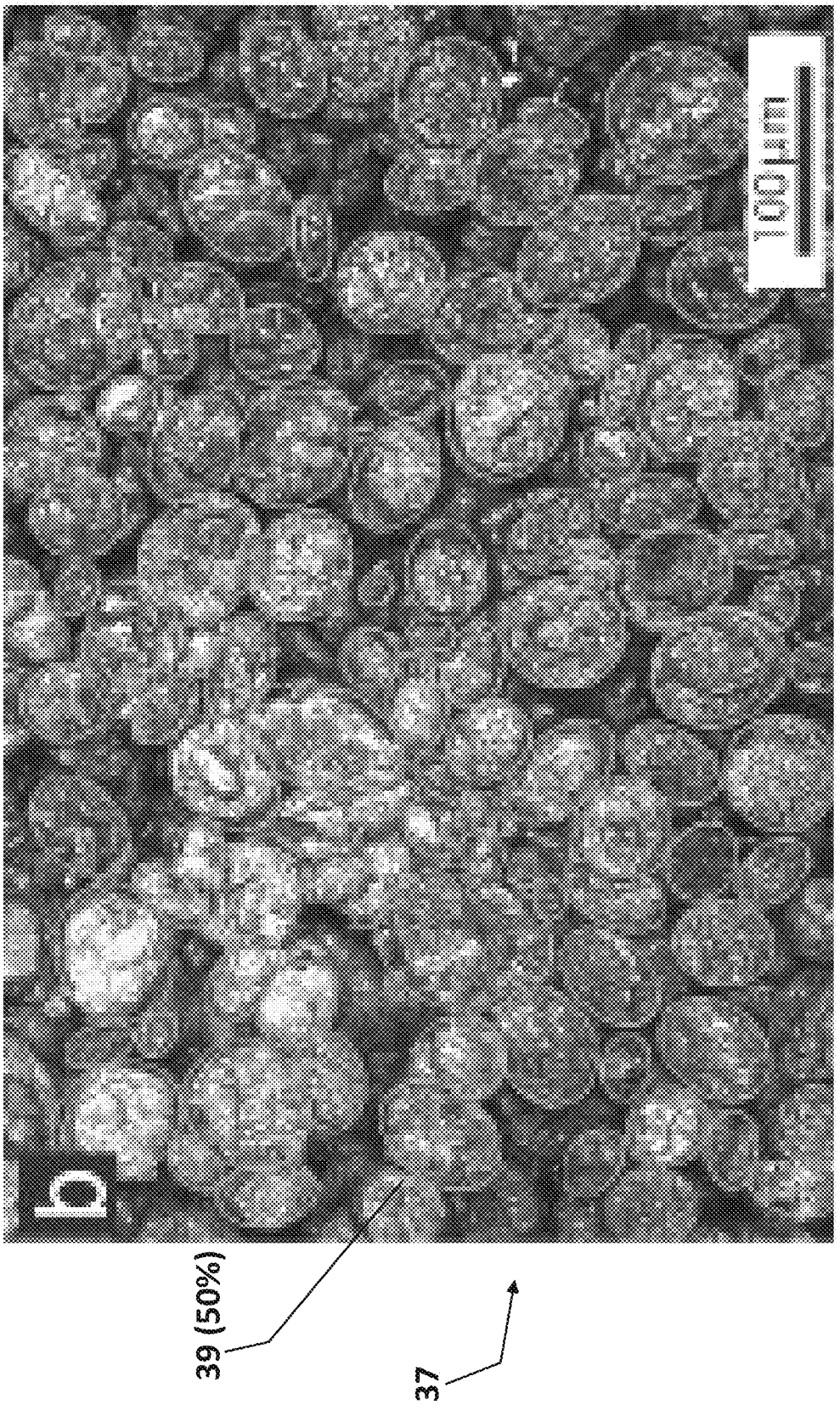
Figure 5C:
Figure 5D:
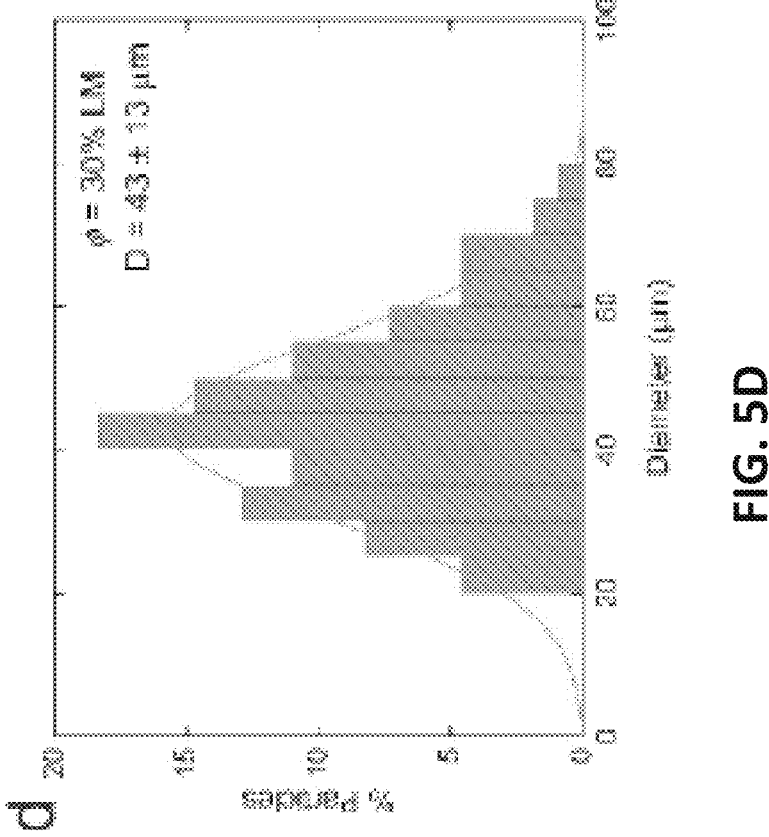
Figure 5E:
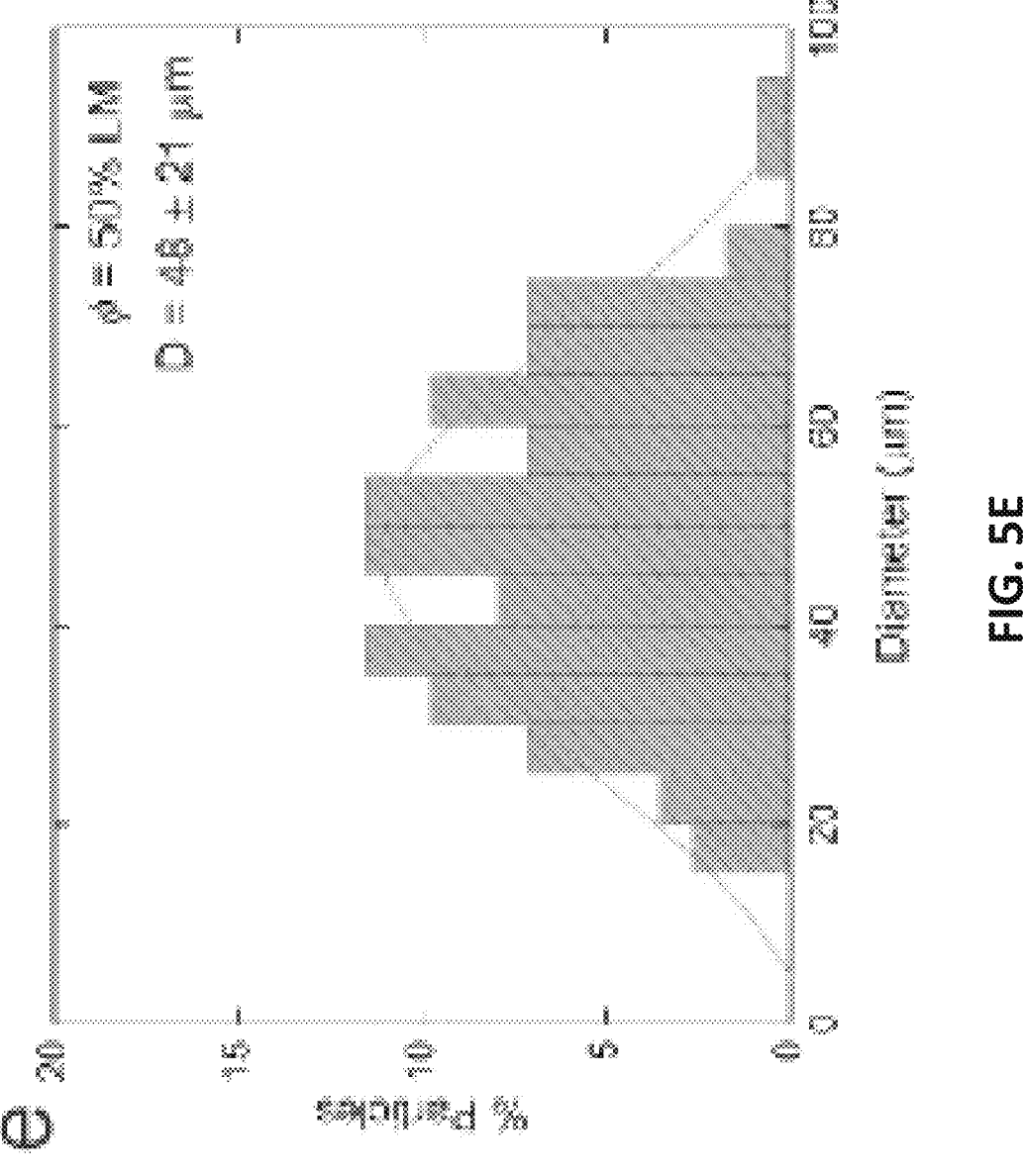
Figure 5F:
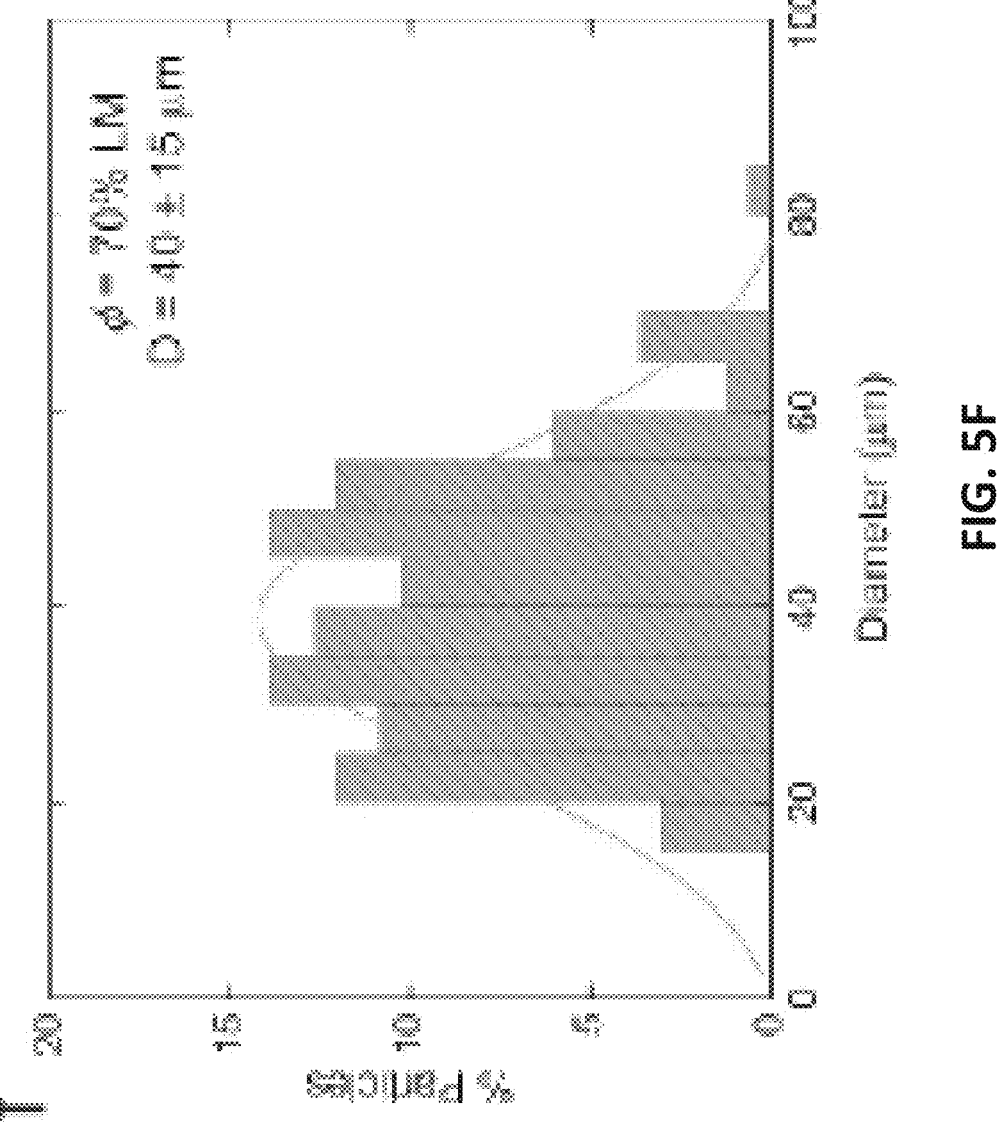

In this non-limiting example embodiment, styrene-isoprene-styrene (SIS) tri-block copolymer is selected as the soft matrix phase of the composite to embed the eutectic gallium indium (EGaIn) liquid metal. Due to weak van der Waals connection between the monomers, the thermoplastic polymer can be reshaped by annealing at elevated temperature. [51-53] To prepare the composite, a shear mixer is utilized to first dissolve the SIS in toluene and then to disperse LM droplets in the SIS-toluene mixture. The centrifugal flow of the SIS-toluene mix disperses the LM into micron size droplets. The resultant emulsion is a dispersion of LM droplets in the SIS-toluene mix which is cast on a micro-sieve to create films. The sieve has a nominal or average effective opening or pore size that allows the film to form on top of it without an appreciable volume of the mixture falling through, and then allow air or gas to reach both sides in the curing step 33. The sample is left on the sieve at room temperature to allow toluene evaporation, and then completely dried in an oven to ensure all solvent is removed. Initially, the LM droplets 19 in the elastomer 18 are generally spherical and are dispersed throughout the bulk of the composite material 17 (see FIG. 3A). Particle size and distribution are determined through particle analysis for different LM volume loadings $\phi$ in FIG. 5A-F, Supporting Information. FIGS. 5A-F are particle analysis results. FIGS. 5A-C are micrographs showing elliptical fit of LM particles for $\phi=30\%$, 50%, 70%. FIGS. 5D-F are histograms of uniform particle distribution for $\phi=30\%$, 50%, 70%. The micrographs and corresponding histograms show that the LM particles are nominally 40 µm in diameter for all compositions. To shape the LM particles, a composite film is stretched to a target strain $\varepsilon_p$ which elongates the embedded LM droplets. Then, to lock the microstructure in the prescribed shape, the composite is annealed to remove the internal stress. The annealing conditions are determined through dynamic mechanical analysis to ensure the stress drops to zero (see FIG. 6A, Supporting Information). FIGS. 6A-B are results of a dynamic mechanical analysis (DMA) test to determine annealing condition of LMPE. FIG. 6A is linear viscoelastic range detection by strain sweep between 0.001-3.0% at 1 Hz frequency and room temperature (i.e., 25° ('). FIG. 6B is the master relaxation curve of LMPE at 40° C. using the time-temperature superposition analysis which shows the composite relaxes by $3.5 \times 10^5$ secs (i.e., 4 days). Those skilled in the art can use this or other techniques to determine annealing conditions (including temperature and time) that are effective to promote relaxation of the elastomer by annealing towards no internal stress, to at or near no internal stress, or to no internal stress. The programmed LMPE adopts the stretched configuration in a stress-free state after annealing and contains the elongated and orientated LM microstructure. The micrographs of pristine 17 and programmed 37 composites are shown in the top and bottom rows of FIG. 3A, respectively. FIG. 3B demonstrates the ability of the presented fabrication technique to control particle aspect ratio (P$_{ar}$). Here, we stretch the composites to 50%, 100% and 200% to obtain well distributed P$_{ar}$ values for three LM volume loadings $\phi=30\%$, 50%, and 70%. Micrographs of all combinations of $\phi$ and $\varepsilon_p$ are shown in FIG. 7, Supporting Information, which confirms the systematic programming of LM microstructure in a relaxed LMPE. In addition, the LM microstructure is programmed uniformly over large areas, as demonstrated by two large micrographs (4.5 mm×1.75 mm) separated by 15 mm on a programmed sample (FIG. 8, Supporting Information). FIG. 7 is micrographs of a wide range of LMPE programming combinations. The rows and columns of the grid represent volume loadings $\phi=30\%$, 50% and 70% and applied strain $\varepsilon_p=0\%$, 50%, 100%, and 200%. FIG. 8 is 17                                                                                          18 uniform elongation of LM microstructure as demonstrated by two large micrographs (4.5 mm×1.75 mm) separated by 15 mm on a programmed sample (the grid structure is a result of image stitching. Furthermore, we conduct particle analysis of the micrographs to determine the aspect ratio of the elongated LM droplets for different strain levels of stress-free LMPE. FIG. 3B presents the results of experimentally measured $P_{ar}$ of elongated LM droplets for different programming strains ($\varepsilon_p$). To model the particle $P_{ar}$ as a function of strain, we assume affine deformation and that the elastomer and LM are incompressible, such that the composite is incompressible for all LM loadings. In this case, $P_{ar}=P_0(\varepsilon_p+1)^{3/2}$, where $P_0$ is the initial aspect ratio. We find good agreement between the theory (curve) and experimental data (symbols), even at a large strain of 200% where the maximum $P_{ar}$ value is around 5.0 (FIG. 3B). The micrographs of representative LM droplets 19 are placed at the top of FIG. 3B, where the theoretically predicted ellipsoidal shapes are provided as outlines to illustrate the strong agreement between the experimental and predicted programmed shapes. The left-most LM droplet labelled 19 or 39 (0%) is essentially a spherical particle.

Figure 3A:
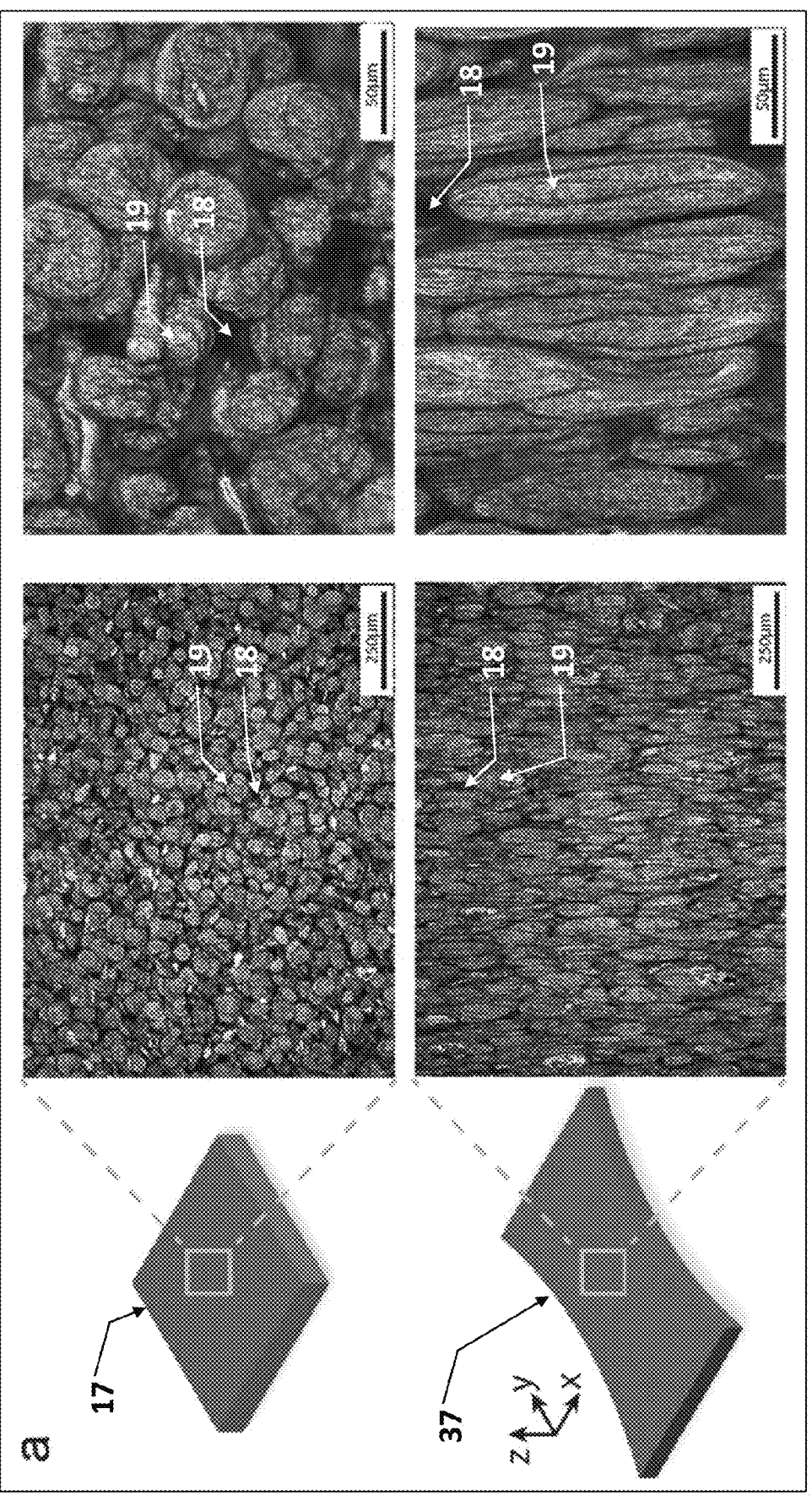
Figure 3B:
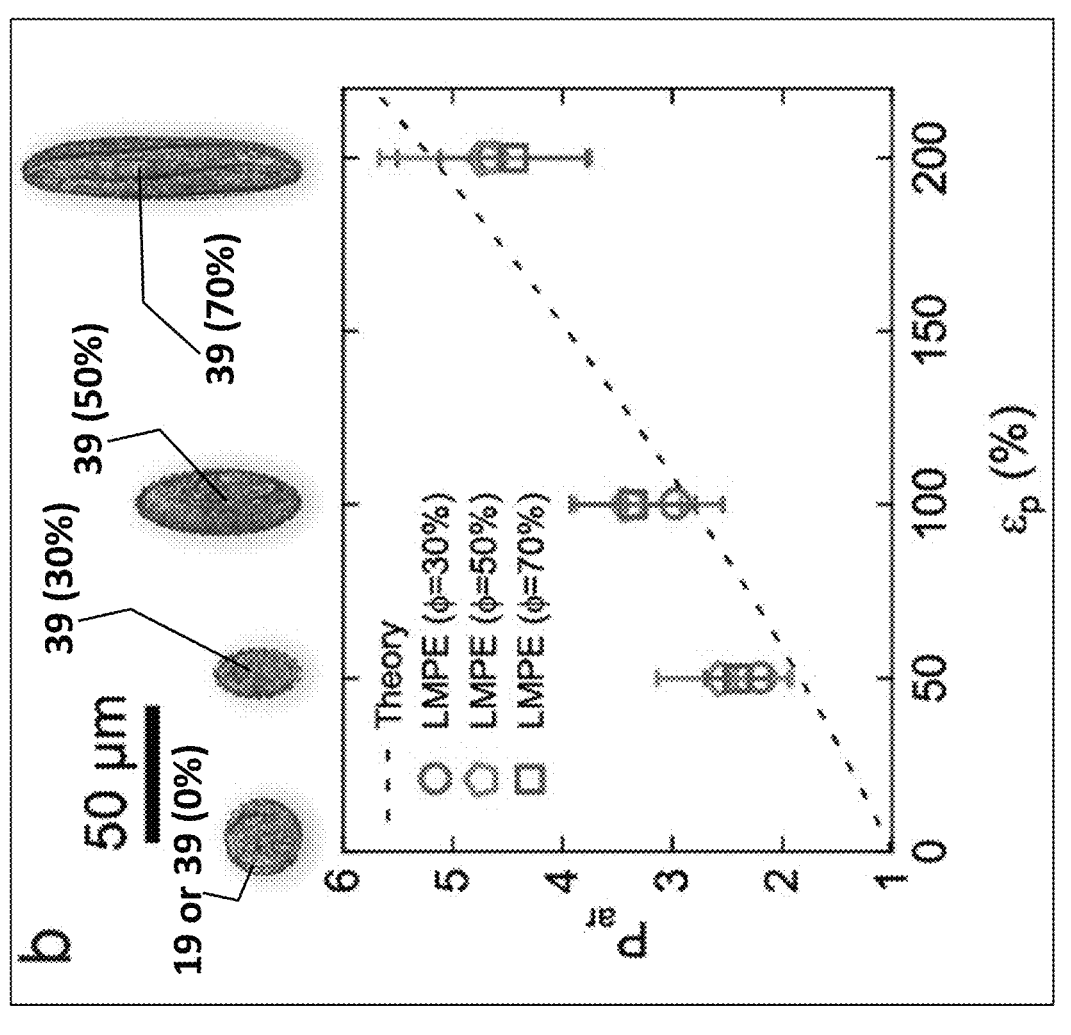
Figure 3C:
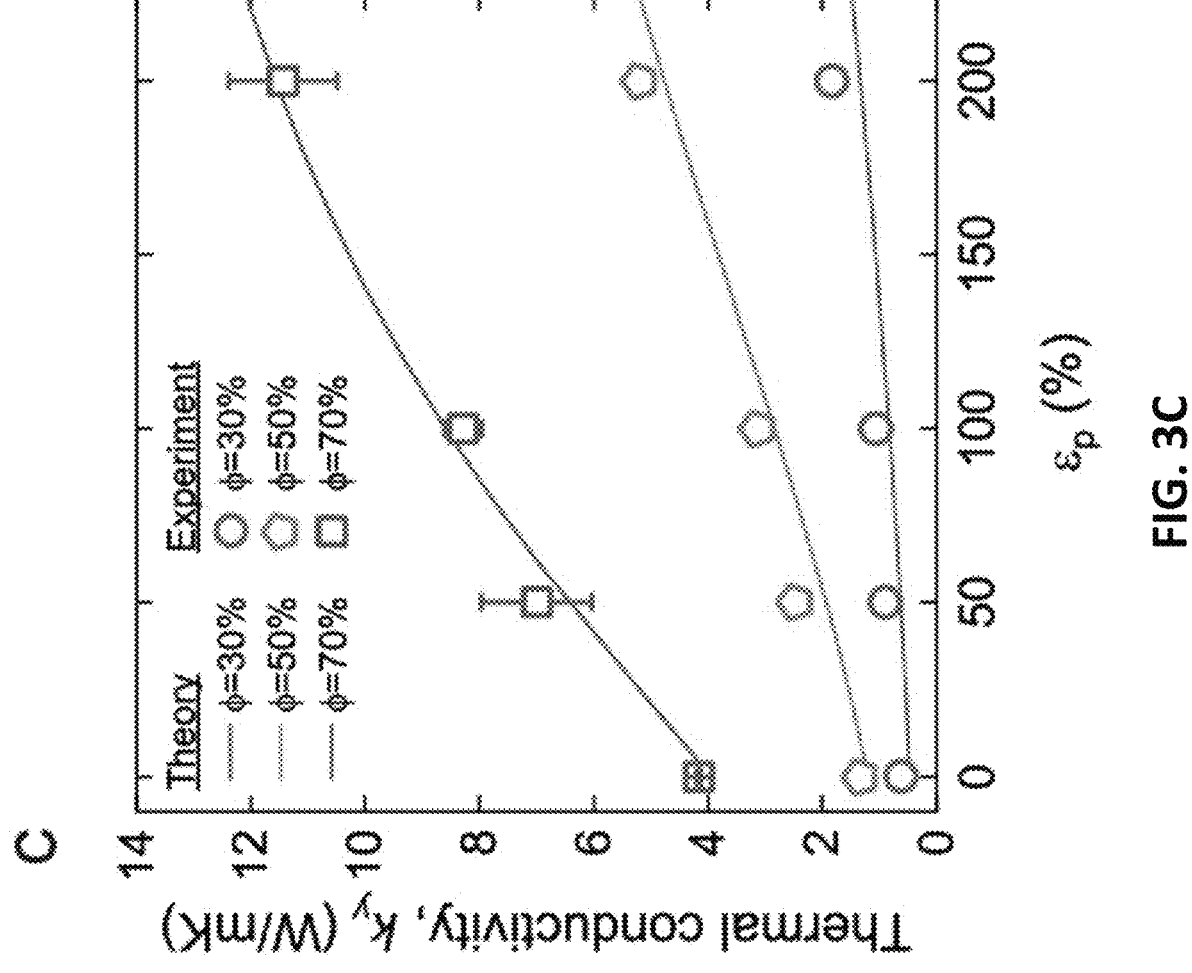
Figure 3D:
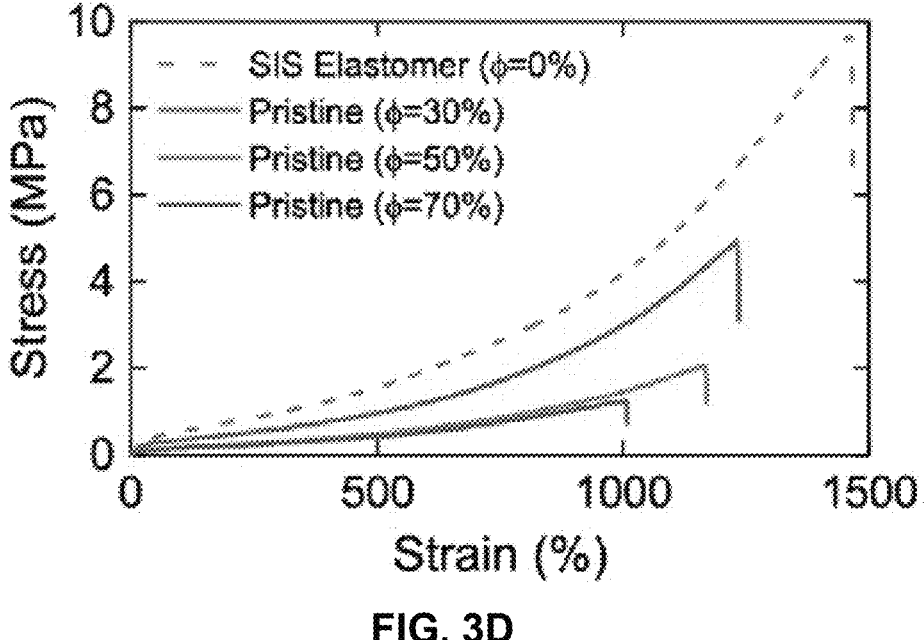
Figure 3E:
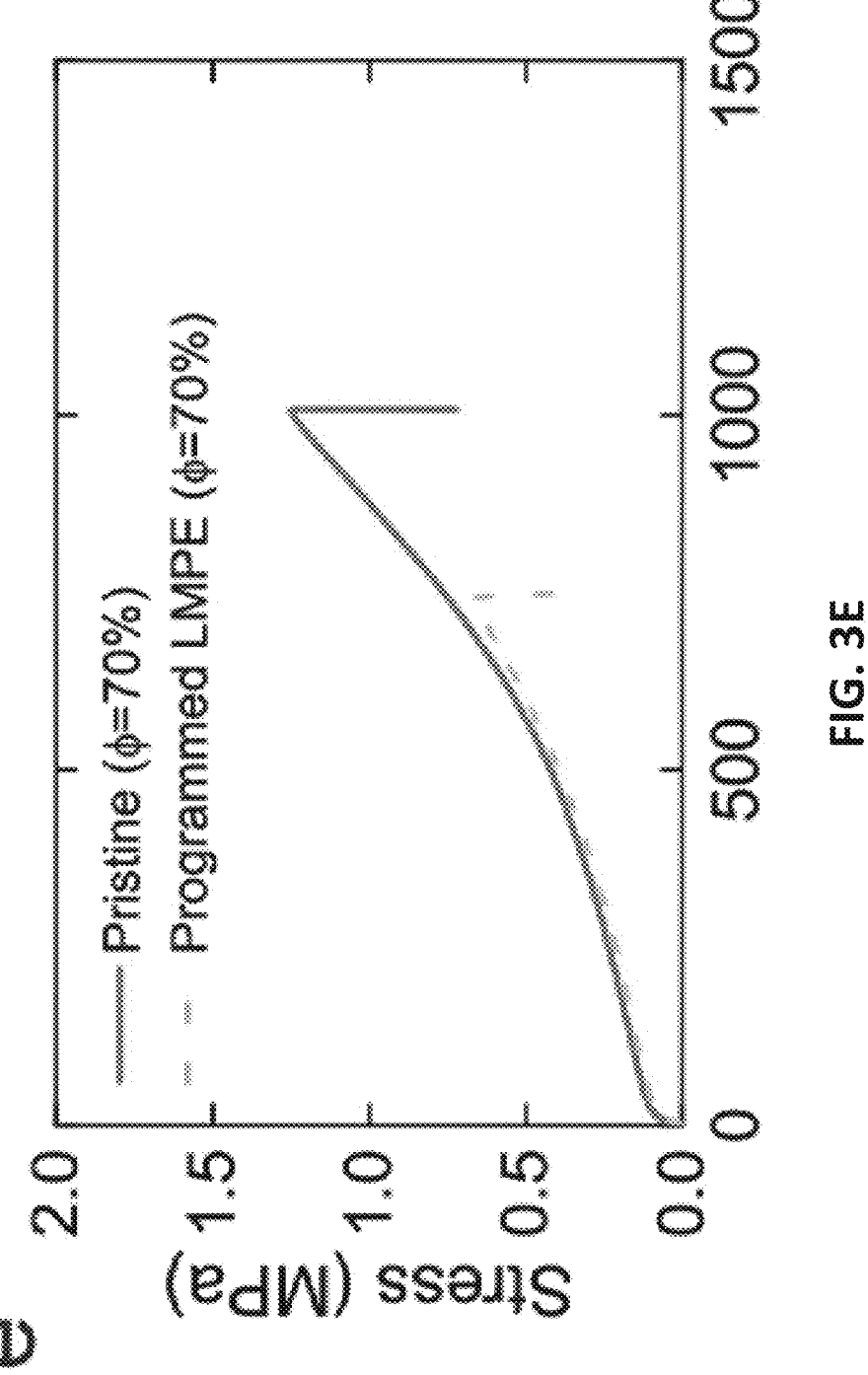
Figure 3F:
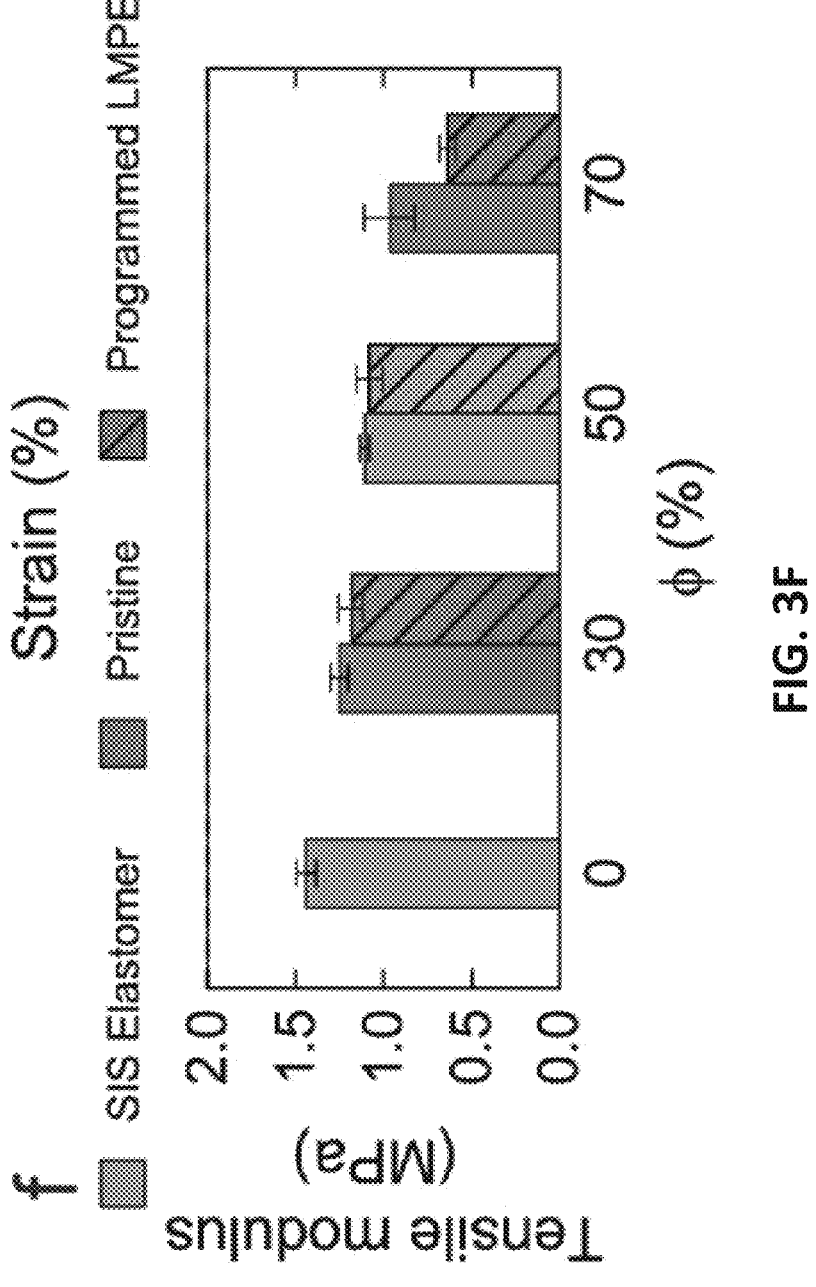
Figure 3G:
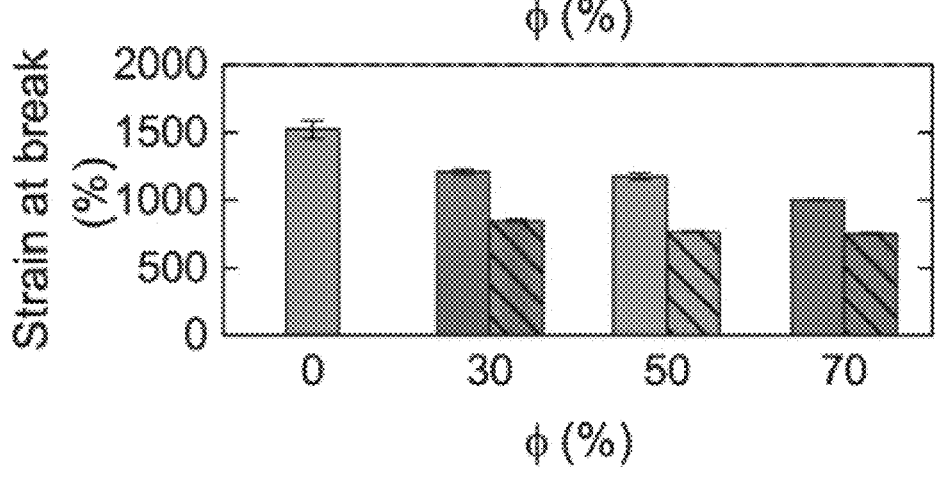

Specific description of FIGS. 3A-G. Characterization of LMPE composites. FIG. 3A is optical micrographs of the LM microstructure programming from spherical 17 (top row) to elongated droplets 19 (bottom row) in a stress-free condition. FIG. 3B is a plot of particle 17 aspect ratio (Par) in programmed LMPE as a function of applied strain ($\varepsilon_p$), where data points represent different LM loadings ø, which is in good agreement with the theoretical prediction (dotted line). Representative LM droplets 19 are shown on the top of the plot, where the dotted red outline shows the theoretically predicted ellipsoidal shapes. FIG. 3C is thermal conductivity of LMPE as a function of programmed strain $\varepsilon_p$ for different volume loadings. Experimental results are shown by symbols and the theoretical predictions from Equation (1) are shown by solid lines. FIG. 3D is stress-strain curves showing the effect of LM concentration ø in pristine composites ($\varepsilon_p=0\%$). FIG. 3E is the effect of LM microstructure programming on the stress-strain curve for φ=70% and $\varepsilon_p=200\%$. FIG. 3F is Tensile modulus and FIG. 3G is strain at break summary for pristine and programmed LMPE ($\varepsilon_p=200\%$)

As can be seen from the foregoing data, a designer can derive a target final aspect ratio, and desired functional properties (e.g., thermal conductivity) by extrapolating the data points. For example, such data can be used by the designer to not only program LMPE based on the specific applied strains but also for different loadings, including for LM loadings between 0% and 30%, between 30% and 50%, between 50% and 70%, and above 70%, by extrapolation.

3 2.1. Thermal and Mechanical Properties

The ability to program composite microstructure can enable control over functional properties such as thermal conductivity. Here, we determine the thermal conductivity of LMPE in the particle programmed direction ($k_y$) using a transient hot wire (THW) method which utilizes a platinum wire as a resistive heater and a thermometer simultaneously. We measure four different LM loadings ($0\leq\phi\leq70\%$) at four different programming strains ($0\leq\varepsilon_p\leq200\%$). We plot $k_y$ in FIG. 3C for the LMPE materials and find a maximum thermal conductivity $k_y=11.4\pm1.0$ W m$^{-1}$ K$^{-1}$ (highest 13.0 W m$^{-1}$ K$^{-1}$) for φ=70% at $\varepsilon_p=200\%$ (corresponding $P_{ar}=4.5\pm0.7$). This is a ≈70× increase over the SIS elastomer ($k_y=0.17\pm0.01$ W m$^{-1}$ K$^{-1}$) and ≈3× increase compared to φ=70% with spherical droplets ($k_y=4.1\pm0.03$ W m$^{-1}$ K$^{-1}$). The oriented and elongated LM structures in LMPEs provide enhanced thermally conductive pathways compared to spherical particles, which enable LMPEs to reach anisotropic thermal conductivities greater than conventional soft composites and similar to metals such as stainless steel while staying elastically compliant. The data also shows that the thermal conductivity of higher volume loadings (φ) increase more rapidly with increasing $\varepsilon_p$. To further understand this behavior, we theoretically model the thermal conductivity of composites through an effective medium theory (EMT) [33]

$$\left(\frac{k_p - k_c}{k_p - k_m}\right)\left(\frac{k_m}{k_c}\right)^L = 1 - \phi \qquad (1)$$

where $k_p$, $k_m$, and $k_c$ represent the thermal conductivity of the embedded particles ($k_{LM}=26.4$ W m$^{-1}$ K$^{-1}$, [56]), polymeric matrix ($k_{SIS}=0.17\pm0.01$ W m$^{-1}$ K$^{-1}$), and composite, respectively. The depolarization factor L in the equation represents the particle shape in the composite and can be modified to predict orthotropic thermal conductivity as a function of particle aspect ratio. [22,33] When plotting Equation (1) in FIG. 3C, we find that the theoretical predictions agree well with the experimental data over a wide range of $\varepsilon_p \in (0,200\%)$ and volume loading $\phi \in (0, 70\%)$. This is obtained without any data fitting parameters and shows the strong role particle aspect ratio plays in controlling thermal conductivity. The exceptional thermal conductivity demonstrated by the LMPEs is achieved by the ability to obtain both high LM loading and control of droplet microstructure. This is further illustrated in FIG. 9, Supporting Information, where by plotting Equation (1) it is seen that increasing LM volume loading (φ) or particle aspect ratio ($P_{ar}$) alone is insufficient to obtain $k_y>10$ W m$^{-1}$ K$^{-1}$. FIG. 9 is a thermal conductivity ($k_y$) contour plot of LMPE (based Eq. 1) as a function of LM aspect ratio ($P_{ar}$) and volume loading (φ) (color map is in log scale) where the black line represents $k_y=10$ Wm$^{-1}$K$^{-1}$. This shows that to achieve the metal-like thermal conductivity observed in LMPEs, the programmed LM droplets are critical. Furthermore, the high thermal conductivity is found to be stable after >200 days for the presented range of programming strains (FIG. 10, Supporting Information). FIG. 10 is thermal conductivity of LMPE (φ=50%) for different programming strains for an as made sample and sample aged 200 days.

We evaluate the effect of volume fraction φ and particle aspect ratio $P_{ar}$ on the mechanical behavior of LMPEs under uniaxial tension. Stress-strain curves are shown in FIG. 3D for the SIS and LMPEs in the pristine ($\varepsilon_p=0\%$) state for φ=30%, 50%, and 70%. The mechanical testing data of all the pristine LMPEs illustrate the effect of LM concentration, where increasing loading of EGaIn softens the composites, yet maintains high stretchability (>1000%). For the highest LM concentration (φ=70%), FIG. 3E compares a pristine sample to a programmed sample with an elongated microstructure. With the same LM loading, the programmed sample shows a similar stress-strain response, with increased compliance and reduced elongation. We summarize the tensile modulus (E) and failure strain ($\varepsilon_f$) respectively in FIGS. 3F and 3G to illustrate the mechanical behavior of LMPEs as a function of φ and $\varepsilon_p$. In all cases, the addition of LM in the elastomer reduces both E and $\varepsilon_f$. Specifically, the tensile modulus of both pristine and programmed ($\varepsilon_p=200\%$) LMPEs decreases with increase of φ, while the failure strain $\varepsilon_f$ of the programmed LMPEs remains high ($\varepsilon_f$>750%). In particular, E and $\varepsilon_f$ of the highest thermally conductive LMPE ($\phi$=70%, $\varepsilon_p$=200%) are measured as 0.64±0.1 MPa and 750±10%, respectively. In summary, the programming mechanism of the LMPEs maintains the compliant (<1 MPa) and stretchable (>700%) mechanical properties required for soft and flexible mechanisms. It is to be understood that the programming does in general decrease the strain at break of the stretched and annealed composite, but the material can still stretch substantially (e.g., >700% after annealing) which is very significant.

2.2. Implementation into Soft Technologies

Figure 4A:
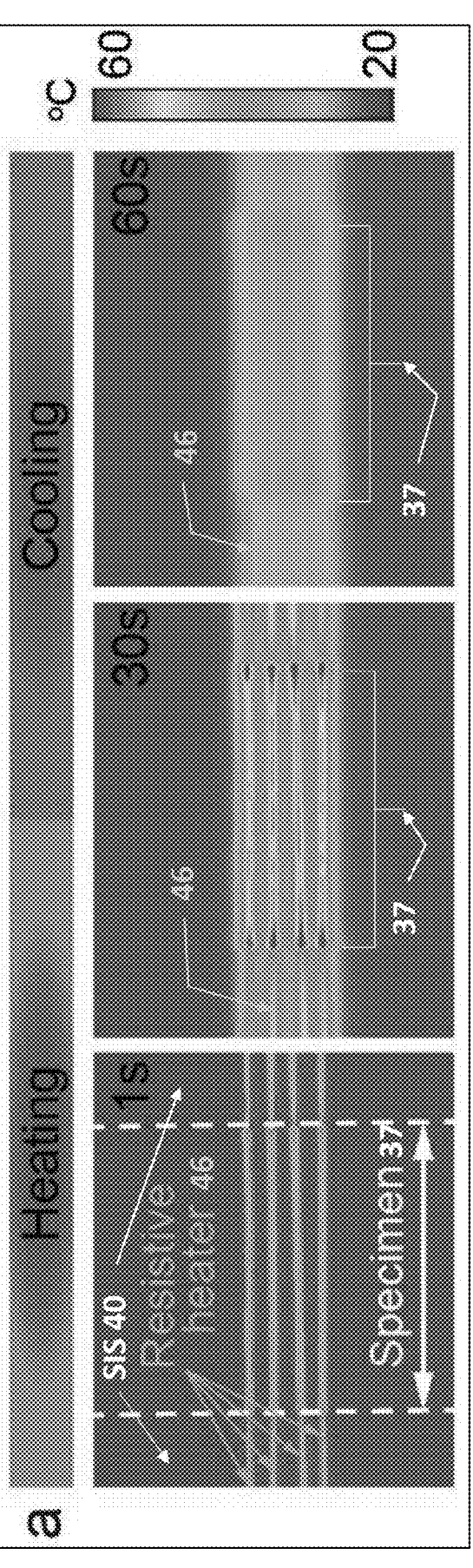
Figure 4B:
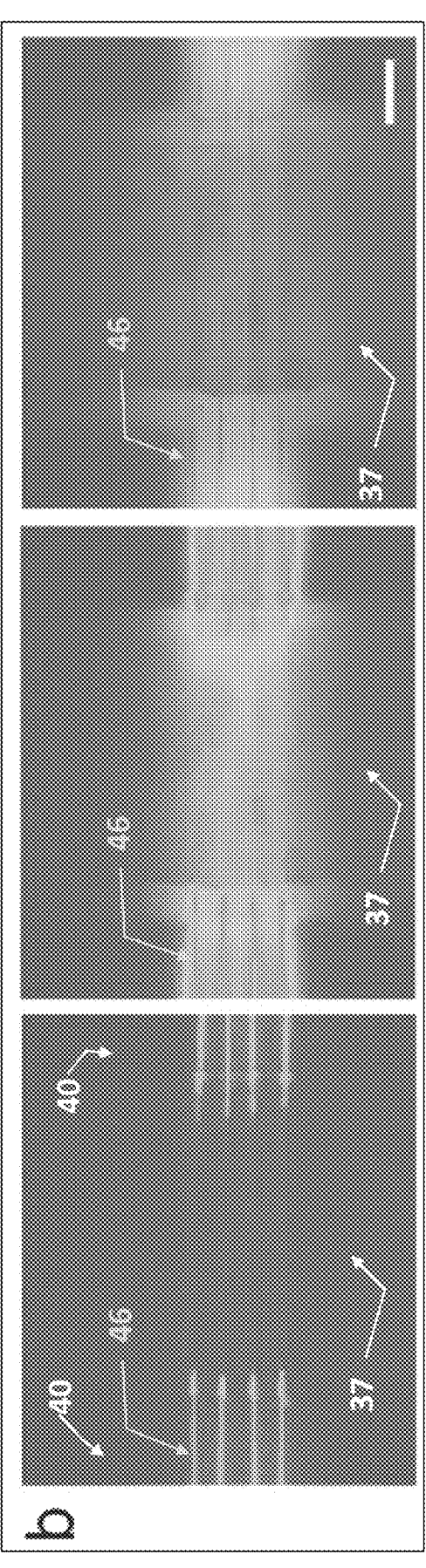
Figure 4C:
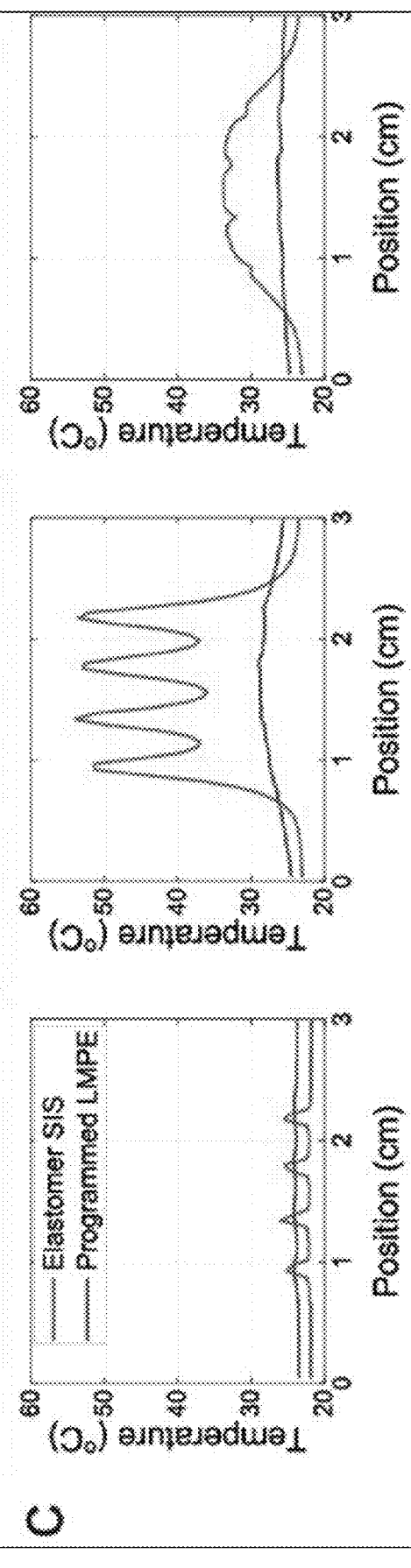

The ability to program LM microstructure in LMPEs enables a combination of high thermal conductivity and soft mechanical response which can support thermal management in emerging technologies such as active matter, stretchable devices, integrated electronics, and actuation into 3D printed structures. When integrating heating elements onto compliant materials, it may be desirable to protect the underlying substrate or user from the increasing temperature. To investigate the thermal management performance of the LMPEs, we compare the SIS elastomer ($\phi$=0%) and LMPE ($\phi$=70% and $\varepsilon_p$=200%) which are characterized by thermal conductivity of 0.17±0.1 and 11.4±1.0 Wm$^{-1}$ K$^{-1}$, respectively. We arrange a nichrome wire 46 in a serpentine shape (see FIGS. 11A-C and FIGS. 16A-T, selected still frames from Movie S2, Supporting Information) to create four heating lines, where the elongated microstructure direction of the LMPE is set orthogonal to the wires (FIG. 4A). FIGS. 11A-C are resistive heater experiment details. FIG. 11A is serpentine shaped resistive heating wire 46 laid on specimen (elastomer or LMPE 37). A serpentine shaped resistive heating wire 46 (nichrome wire) is placed across the samples to create four heating lines as shown. The ends of the wire 46 are tightly clamped to the acrylic plate 40 to make uniform contact with the rectangular films 37. A DC power supply module (BK Precision Model 9103) is attached to the ends of the wire 46 and the wire 46 is resistively heated by supplying 600 mA current for 30 s which induces heat over wide area of the films 37. FIG. 11B is electrical insulation verification of the LMPE 37 using a digital multimeter which shows that no current is passing (OL=open loop). FIG. 11C is the circuit connection check at different locations of resistive wire 46. FIGS. 4A and 4B show IR images of the heating (1-30 s) and cooling (30-60 s) phases at 30 s interval for SIS elastomer 40 (see portions to left and right of dashed lines in the left-most panel of FIG. 4A) and LMPE films 37 (the middle section between the dashed lines), respectively (see also FIGS. 16A-S, selected still frames from Movie S2, Supporting Information). The corresponding temperature of SIS (red) and LMPE (blue) specimens are plotted in FIG. 4C. The thermal distribution on the SIS specimen is distinguished by four peaks in the vicinity of the heating wires which exceeds 50° C. at the end of the heating phase at 30 s. In contrast, the LMPE shows a uniform temperature rise without any sharp peaks and remains below 30° C. after 30 s of heating (in FIG. 4C at 30 s). Furthermore, the last plot of FIG. 4C indicates that the thermal condition of LMPE is recovered to the initial state (25° C.) after 60 s while the temperature of SIS elastomer remains higher (35° C.). This shows that the LMPE keeps the substrate cooler, demonstrating the potential for LMPEs in thermal management of heat generating systems.

Figure 4D:
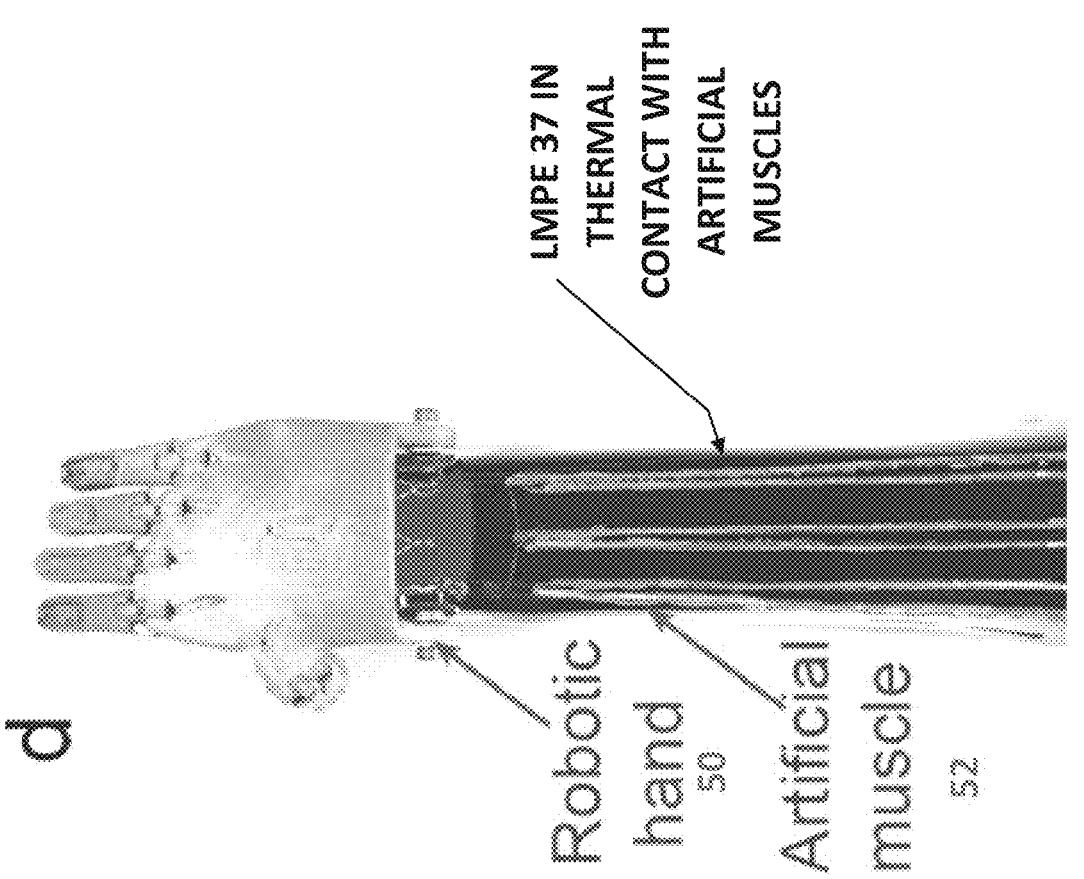

By isolating high temperatures from underlying substrates, LMPEs can be combined with active, heat generating components such as artificial muscles for actuation which protects underlying users or substrates from high temperatures for human-machine interaction. Here, an artificial muscle is developed for a 3D printed robotic hand 50 by encapsulating shape memory alloy 52 (SMA) between LMPE layers 37. The robotic motion of the fingers is achieved through an antagonistic mechanism where an LMPE coated SMA wire actuates linking cables and then the fingers are restored by elastic bands at the bottom and top sides of a finger, as seen in FIG. 4D (see FIG. 12, Supporting Information, for the wiring scheme). FIG. 12 is an outline of a linking cable and SMA wire to control the motion of proximal interphalangeal (PIP) and metacarpophalangeal (MCP) joints of robotic hand 50. All the finger segments (finger-tips and proximal phalanges), joints (PIP and MCP), and palm are 3D-printed using a filament-based printer (M3D-Crane Quad 3D Printer). The PIP and MCP joints are attached to the corresponding finger tips and metacarpals using 3D printed pins. The wrist of hand 50 is modified to lock the hinge rotation and the forearm segment is modified to incorporate the SMA-based artificial muscle 52. The fingers are linked using Kevlar® thread which is fixed to the finger tip and runs through the phalanx and palm. On the opposite side of the fingers, dental rubber bands (Sonic Dental 3/16″ X-Heavy) are placed at PIP and MCP joints to apply bias force on the SMA wires. We illustrate the functionality of the prosthetic hand 50 to grip and release a plastic cup in FIG. 4E. The muscles are actuated by joule heating which contracts the SMA wire 52 and bends the PIP and MCP joints for gripping an object. Then, the actuation is stopped by discontinuing the power supply and the elastic rubber bands elongate the SMA wire 52 to release the cup. The corresponding IR thermographs of the muscles are shown in the inset for each case. The temperature of the LMPE composite 37 during gripping and lifting positions remains below body temperature (i.e., ~37° C.), while the embedded SMA 52 reaches 70° C. to activate. Without the thermal management of LMPE 37, such a high temperature of the SMA wire 52 would be discomforting for a user. The LMPE 37 prevents heat accumulation while maintaining the functionality of the SMA 52. As will be appreciated, the LMPE 37 can be at each SMA wire 52 for thermal management of each wire 52. In one example LMPE 37 is coated or wrapped around each wire 52. In another example, a sheet of LMPE 37 is brought into abutment with the wires 52 or is positioned at least at or near wires 52. The LMPE 37 could be on one side of wires 52, on opposite sides, or otherwise encapsulate wires 52. In another example, the wires 52 could be embedded in LMPE 37.

The LMPE 37 can also function as a thermal management system for electronics integrated into 3D printed structures. Here, we create a 3D printed double-arch structure 60 made of PLA and integrate extreme high power (XHP) LEDs 64 (Cree Extreme-High-Power XHP LEDs) either directly on the as-built PLA 60 or onto a LMPE layer 37 to protect the structure (FIGS. 4F and 4G). In particular, the LEDs 64 are run at 3 W, much greater than the typical milliwatt power of conventional LEDs. At first, the LEDs 64 on the as-built system without any LMPE (see "3D printed structure" 60 at top row of FIG. 4G) rapidly heat up which initiates structural deformation from the softening of the PLA 60. This additionally causes the LEDs 64 to turn off at 35 s due to distortion of the circuit connection 62 (see top row of FIG. 4G). In contrast, the LEDs 64 on the LMPE 37 protected structure (see "Protected Structure" at bottom row of FIG. 4G) remain functional at 35 s, are turned off for comparison, and the LMPE protected structure 60 stays undeformed at 60 s (see FIGS. 17A-NN, selected still frames from Movie S3, Supporting Information). The deformation of the as-built structure ("3D printed structure") is highlighted by superimposing a double-arch curve (blue dashed curves) from the initial to final configuration. In contrast, the double arch curve fits both the on and off states of the LED in the protected structure. The temperature of the as-built structure at 35 s and 60 s approaches to 100° C. and 80° C., respectively. In contrast, the LMPE 37 limits the temperature to 60° C. at 35 s and quickly brings down to 45° C. by 60 s. This shows the efficiency of LMPE to protect the circuit components as well as the underlying 3D printed structure. Although we have utilized LEDs, we anticipate that LMPE will work with other circuit components for electronic devices integrated into a variety of substrates, including 3D printed, elastomeric, or on rigid materials.

Figure 4E:
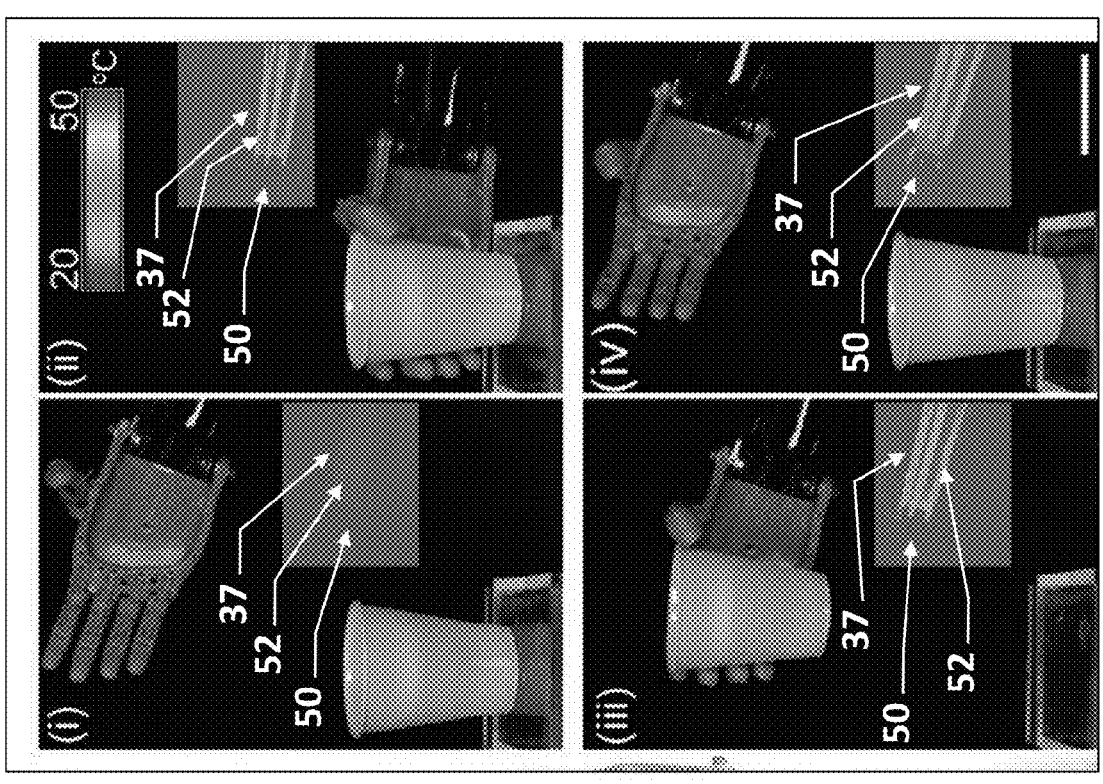
Figure 4F:
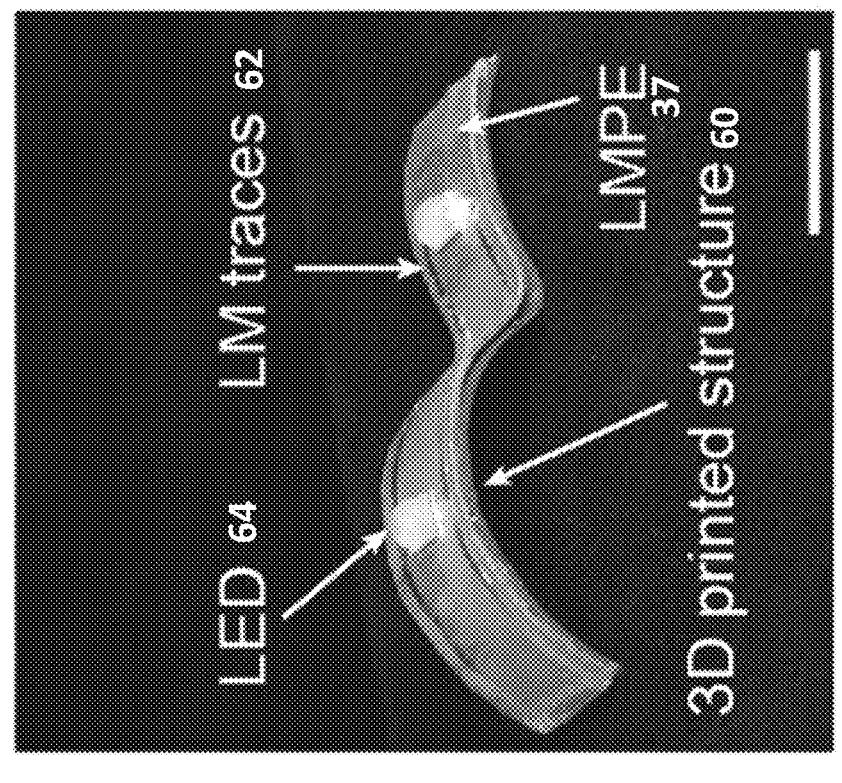
Figure 4G:
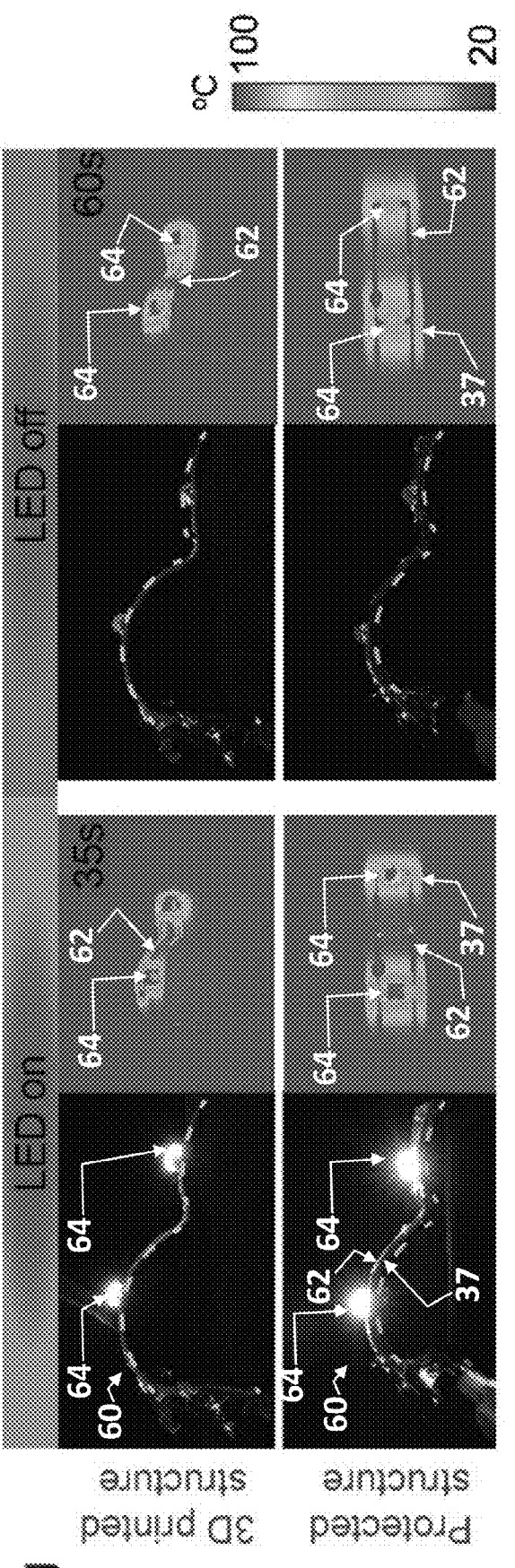

Specific description of FIGS. 4A-F. Functionality of LMPE as a compliant heat sink for flexible actuators and electronics. FIG. 4A is IR imaging of thermal management of a resistive heater 46 using SIS elastomer 40 and FIG. 4B is programmed LMPE 37 for heating (1-30 s) and cooling (30-60 s) phases (scale bar, 1 cm). FIG. 4A is temperature profile which shows superior heat dissipation by LMPE 37 compared to the elastomer 40. FIG. 4D is wearable prosthetic assembly using 3D printed robotic hand 50 and LMPE 37 encapsulated artificial muscle 52. FIG. 4E is sequential gripping (i, ii) and releasing (iii,iv) maneuver of artificial muscle controlled prosthetic hand 50. The inset shows the IR thermograph (scale bar, 5 cm). FIG. 4E is high power LEDs 64 integrated in flexible LMPE circuit 62 to protect the 3D printed structure 60 (scale bar, 2 cm). FIG. 4G is photographs and IR images showing the effect of LED 64 heating source on an as-built 3D printed structure 60 (top row) and LMPE 37 protected structure 60 (bottom row). The left column shows the samples immediately before the failure of the as-built structure (35 s after turning on the LEDs), and the right column is 60 s after turning on the LEDs. Dotted lines indicate the original shape of the structure 60. Again, the LMPE 37 can be placed on, coated on, abutted to, or otherwise in thermal connection with the structure 60 and/or electrical leads 62 and LED dies 64. This could include essentially partially or fully encapsulating the structure 60 with LMPE 37 except for allowing light emittance into space from the LEDs 64.

3. Conclusion

We have developed a new group of soft matter composites using a LM microstructure programming technique. We demonstrate the ability to greatly vary LM loading while predictably shaping LM particles in stress-free conditions. The LMPE is characterized by a rich combination of metal-like thermal conductivity and elastomer-like compliance and stretchability. By increasing the LM aspect ratio by at least $\approx 5\times$, we have reached thermal conductivity as high as 13.0 W m$^{-1}$ K$^{-1}$ in a stress-free state for a given elastomer. Furthermore, the superior heat dissipation ability of LMPEs is demonstrated as compliant heat sinks for resistive heaters, artificial muscles, and flexible circuits on 3D printed structures. The multifunctional composite development and the corresponding multiphysics applications presented here can impact diverse soft matter composites, as it adds a new dimension to control material microstructure from generally spherical liquid inclusions to "programmable" inclusions with controlled shape and orientation. Particularly, the ability to program liquid inclusion structure in soft elastomers enables exceptional control over mechanical and functional properties. It also opens possibilities for further investigations into anisotropic response of mechanical and functional properties, where the role of liquid inclusion orientation can provide designed properties in different orientations. Thus, we envision that the principles of our liquid microstructure programming approach will enable new multifunctional materials for fields such as flexible electronics, soft robotics, biomedical devices, and morphable metamaterials.

It is to be understood that by elongating the LM droplets (or otherwise annealing-deformation shaping them), anisotropy in mechanical and functional properties could be induced. Non-limiting examples of anisotropic composite materials could include rigid fillers (e.g., carbon fiber composites or wires) where the layout and orientation of the fibers or wires or other pieces gives properties in different directions. Examples of fillers and their functional effect on elastomers, including with elastomers with LM inclusions, can be found at the incorporated by reference citations including US 2017/0218167 A1, Bartlett et al. PNAS 2017, Tutika et al. Adv. Funct. Mater. 2018. Different properties can also be achieved by coupling the LMPE composite with other materials or surfaces. It is to be appreciated that other materials/substances could be mixed in when forming the starting composite for any number of purposes, so long as they do not materially adversely affect the reason the annealing-deformation shaping according to aspects of the invention is engineered into the final composite. For example, there could be solid or liquid additional components that provide some additional characteristic to the final composite. Again, some non-limiting examples are discussed in the incorporated by reference citations herein.

4. Experimental Section

Pristine Composite Fabrication: Solid pellets of SIS (polystyrene-blockpolyisoprene-block-polystyrene) containing 14 wt % of styrene (Sigma-Aldrich Corp.) were dissolved in toluene (Fisher Scientific) in a dual asymmetric centrifugal (DAC) mixer (Flaktek Speedmixer). Eutectic gallium indium (EGaln) was mixed at a 3:1 weight ratio (75% Ga:25% In) and heated at 200° C. for 24 h on a hot-plate to prepare the liquid metal. The composite was fabricated by shear mixing LM droplets at various volume fractions ($\phi$=LM/(LM+SIS)) in SIS-toluene solution in the DAC mixer. See FIG. 13, diagrammatically illustrating a method 30 according to aspects of the invention; including combining and mixing steps 31 and 32. The sample was cast on a micro-sieve (45 µm openings, McMaster Carr), dried for 3 days at room temperature, then oven-dried at 80° C. for 1 day. FIG. 13, step 33. This produces a composite layer 17 which includes the dried elastomer 18 and generally spherical LM droplets 19 distributed in the elastomer 18.

Stretching and Annealing: A 30 mm long composite film 17 was stretched in an Instron 5944 mechanical testing machine 70 using a 1 kN load cell. Opposite ends of the film 17 along the stretching axis indicated at arrows 74A and 74B were bonded to acrylic during stretching by moving one or both loading clamps 72A and 72B with machine 70. After reaching the target stretch along the stretching axis, the loading clamps 72A/B were attached to a frame 80 and elastomer coated acrylic plates 84A and 84B were used to provide support across the stretched film during annealing at 40° C. for 4 days (see diagrammatic illustration of annealing temperature at 86, FIG. 13, Supporting Information). FIG. 13 is fabrication steps of programming LMPE. (a) Shear mixing of LM droplets in dissolved SIS, (b) drying of mix on a sieve for quick solvent evaporation, (c) pristine LMPE stretching to prescribed strain, (d) thermo-mechanical annealing of LMPE in a frame, and (e) final annealed LMPE in a stress-free state. See diagrammatic illustration of end LMPE product 37 with the composite elastomer 38 locked into its stretched state by the annealing, and elongated LM inclusions distributed throughout, after the loading clamps 72A/B are removed. After annealing to a stress-free configuration, the surface was treated with toluene to ensure electrical insulation of the surface, which was confirmed with a multimeter. The electrical insulation of LMPE was further assessed through a controlled indentation test to puncture the specimen 37 using a cylindrical glass rod (diameter=3 mm and length=10 mm). After puncturing through the LMPE 37 with a contact pressure greater than 1 MPa, the material 37 remained electrically insulating. A picture of the indented LMPE 37 and setup is shown in FIG. 14, Supporting Information. FIG. 14 is an indentation test to demonstrate electrical insulation. A cylindrical glass rod (diameter=3 mm and length=10 mm) is placed across liquid metal traces 62 and the resistance between the traces 62 is measured during indentation. Even after puncturing through the LMPE 37 with a contact pressure greater than 1 MPa, the material 37 remains electrically insulating. Optical micrographs of LMPE were captured on a Leica DMi8 microscope in dark field mode. For each condition, a total of 30 LM droplets were measured from several specimens (Fiji software).

Mechanical and Thermal Measurements: The uniaxial tension tests were performed on an Instron 5944 mechanical testing machine using a 1 kN load cell. Each of the samples was cut in a dogbone shape by a die sized at 50% of ASTM D412 Type C sample size. The samples were stretched at a rate of 1 mm s$^{-1}$ until failure. Three samples were tested for each composition and the tensile modulus was calculated from the stress-strain curve up to a strain of 3% using a linear fit algorithm in MATLAB. Dynamic mechanical analysis (DMA) experiments were conducted on the composite with φ=70% in tension mode using RSA-G2 Solids Analyzer (TA Instruments). Thermal conductivity was measured using a transient hotwire approach where a 25 μm diameter platinum wire/probe was soldered to copper leads. A Keithley 2460 source measuring unit sends a constant current of 200 mA for ~0.5 s through the probe and measures the voltage over 50 data points. Each sample was measured five times with a 3 min interval between measurements. A detailed explanation can be found in previous works. [22,33] Thermal Demonstrations: Infrared thermography was performed on rectangular samples (80 mm×50 mm×1 mm thickness) of unfilled SIS elastomer (φ=0%) and programmed LMPE (φ=70% and ε=200%). Nichrome wire was placed across the samples and resistively heated by supplying 600 mA current for 30 s. IR videos were captured using FLIR E53 thermal imaging camera (emissivity=0.9). A robotic hand model 50 ("phoenix hand" from Thingiverse) was chosen from e-NABLE, an online global community that develops prosthetic limbs for musculoskeletal disability. The SMA wires 52 (0.25 mm diameter, 70° C. phase transition, Dynalloy) were encapsulated by two layers of LMPE 37 (φ=70% and ε=200%) using toluene.

The artificial muscles 52 (see FIG. 4D) were arranged in parallel and connected to a DC power source (BK Precision Model 9103) through a microcontroller (Arduino Mega 2560), which supplied 3 A of current for 5 s. The LED circuit on 3D printed structure 60 used extreme high power LEDs 64 (Cree XLamp XHP50.2, 5 mm×5 mm), which were characterized by large lumen density and high heat generation. The double-arched 3D structure 60 (80 mm×15 mm) was 3D printed (M3D-Crane Quad) using 1.75 mm diameter PLA filament (Monoprice, Inc.). A 1 mm thick LMPE film 37 was attached using 0.05 mm thin double sided tape (3M VHB F9469PC). Two LEDs 64 were run at 6 V and 1 A arranged in parallel with EGaIn traces 62 created by a stencil mask. The stencil mask allowed for selective deposition of EGaIn through a nitrogen-assisted spray coating technique. Once the EGaIn path was made, LEDs 64 were placed at the predetermined locations.

Supporting Information

Supporting Information is available from the Wiley Online Library or from the author.

BIBLIOGRAPHY

[1] D.-H. Kim, N. Lu, R. Ma, Y.-S. Kim, R.-H. Kim, S. Wang, J. Wu, S. M. Won, H. Tao, A. Islam, K. J. Yu, T.-i. Kim, R. Chowdhury, M. Ying, L. Xu, M. Li, H.-J. Chung, H. Keum, M. McCormick, P. Liu, Y.-W. Zhang, F. G. Omenetto, Y. Huang, T. Coleman, J. A. Rogers, *Science* 2011, 333, 838.

[2] R. Ma, S.-Y. Chou, Y. Xie, Q. Pei, *Chem. Soc. Rev.* 2019, 48, 1741.

[3] N. R. Sinatra, C. B. Teeple, D. M. Vogt, K. K. Parker, D. F. Gruber, R. J. Wood, *Sci. Rob.* 8 2019, 4, eaax5425.

[4] E. Hawkes, B. An, N. M. Benbernou, H. Tanaka, S. Kim, E. Demaine, D. Rus, R. J. Wood, *Proc. Natl. Acad. Sci.* 2010, 107, 12441.

[5] M. A. Vadivelu, C. R. Kumar, G. M. Joshi, *Compos. Interfaces* 2016, 23, 847.

[6] Y. P. Mamunya, V. V. Davydenko, P. Pissis, E. V. Lebedev, *Eur. Polym. J.* 2002, 38, 1887.

[7] S. Y. Yang, W. N. Lin, Y. L. Huang, H. W. Tien, J. Y. Wang, C. C. M. Ma, S. M. Li, Y. S. Wang, *Carbon* 2011, 49, 793.

[8] Y. A. Kim, T. Hayashi, M. Endo, Y. Gotoh, N. Wada, J. Seiyama, *Scr. Mater.* 2006, 54, 31.

[9] H. Hong, Y. H. Jung, J. S. Lee, C. Jeong, J. U. Kim, S. Lee, H. Ryu, H. Kim, Z. Ma, T.-i. Kim, *Adv. Funct. Mater.* 2019, 29, 1902575.

[10] G. W. Lee, M. Park, J. Kim, J. I. Lee, H. G. Yoon, *Composites, Part A* 2006, 37, 727.

[11] R. Bollampally, C. Wong, *J. Appl. Polym. Sci.* 1999, 74, 3396.

[12] S. Ghose, D. C. Working, J. W. Connell, J. J. G. Smith, K. A. Watson, D. M. Delozier, Y. P. Sun, Y. Lin, *High Perform. Polym.* 2006, 18, 961.

[13] M. D. Bartlett, A. Fassler, N. Kazem, E. J. Markvicka, P. Mandal, C. Majidi, *Adv. Mater.* 2016, 28, 3726.

[14] A. Koh, J. Sietins, G. Slipher, R. Mrozek, *J. Mater. Res.* 2018, 33, 2443.

[15] W. Shan, T. Lu, Z. Wang, C. Majidi, *Int. J. Heat Mass Transfer* 2013, 66, 271.

[16] C. J. Thrasher, Z. J. Farrell, N. J. Morris, C. L. Willey, C. E. Tabor, *Adv. Mater.* 2019, 31, 1903864.

[17] Y. Xin, H. Peng, J. Xu, J. Zhang, *Adv. Funct. Mater.* 2019, 29, 1808989.

[18] M. J. Ford, C. P. Ambulo, T. A. Kent, E. J. Markvicka, C. Pan, J. Malen, T. H. Ware, C. Majidi, *Proc. Natl. Acad. Sci.* 2019, 116, 21438.

[19] M. D. Bartlett, M. D. Dickey, C. Majidi, *NPG Asia Mater.* 2019, 11, 21.

[20] S. H. Jeong, S. Chen, J. Huo, E. K. Gamstedt, J. Liu, S.-L. Zhang, Z.-B. Zhang, K. Hjort, Z. Wu, *Sci. Rep.* 2015, 5, 18257.

[21]M. I. Ralphs, N. Kemme, P. B. Vartak, E. Joseph, S. Tipnis, S. Turnage, K. N. Solanki, R. Y. Wang, K. Rykaczewski, *ACS Appl. Mater. Interfaces* 2018, 10, 2083.

[22]R. Tutika, S. H. Zhou, R. E. Napolitano, M. D. Bartlett, *Adv. Funct. Mater.* 2018, 28, 1804336.

[23]L. Zhao, H. Liu, X. Chen, S. Chu, H. Liu, Z. Lin, Q. Li, G. Chu, H. Zhang, *J. Mater. Chem.* 8 C 2018.

[24]P. Fan, Z. Sun, Y. Wang, H. Chang, P. Zhang, S. Yao, C. Lu, W. Rao, *RSC Adv.* 2018, 8, 16232.

[25]K. Q. Ma, J. Liu, *J. Phys. D: Appl. Phys.* 2007, 40, 4722.

[26]Y. Gao, J. Liu, *Appl. Phys. A: Mater. Sci. Process.* 2012, 107, 701.

[27]S. Mei, Y. Gao, Z. Deng, J. Liu, *Trans. ASME: J. Electron. Packag.* 2014, 136, 011009.

[28]M. A. H. Khondoker, D. Sameoto, *Smart Mater. Struct.* 2016, 25, 093001.

[29]C. C. Chiechi, E. A. Weiss, M. D. Dickey, G. M. Whitesides, *Angew. Chem., Int. Ed.* 2008, 47, 142.

[30]E. J. Markvicka, M. D. Bartlett, X. Huang, C. Majidi, *Nat. Mater.* 2018, 17, 618.

[31]L. Zhu, Y. Chen, W. Shang, S. Handschuh-Wang, X. Zhou, T. Gan, Q. Wu, Y. Liu, X. Zhou, *J. Mater. Chem.* C 2019, 7, 10166.

[32]E. J. Markvicka, R. Tutika, M. D. Bartlett, C. Majidi, *Adv. Funct. Mater.* 2019, 29, 1900160.

[33]M. D. Bartlett, N. Kazem, M. J. Powell-palm, X. Huang, W. Sun, *Proc. Natl. Acad. Sci.* 2017, 114, 2143.

[34]R. Tutika, S. Kmiec, A. T. Haque, S. W. Martin, M. D. Bartlett, *ACS Appl. Mater. Interfaces* 2019.

[35]G. Yun, S.-Y. Tang, S. Sun, D. Yuan, Q. Zhao, L. Deng, S. Yan, H. Du, M. D. Dickey, W. Li, *Nat. Commun.* 2019, 10, 1300.

[36]N. Kazem, M. D. Bartlett, C. Majidi, *Adv. Mater.* 2018, 30, 1706594.

[37]K. Keville, E. Franses, J. Caruthers, *J. Colloid Interface Sci.* 1991, 144, 103.

[38]J. A. Champion, Y. K. Katare, S. Mitragotri, *Proc. Natl. Acad. Sci.* 2007, 104, 11901.

[39]R. K. Shah, H. C. Shum, A. C. Rowat, D. Lee, J. J. Agresti, A. S. Utada, L.-Y. Chu, J.-W. Kim, A. Fernandez-Nieves, C. J. Martinez, D. A. Weitz, *Mater. Today* 2008, 11, 18.

[40]D. Dendukuri, P. S. Doyle, *Adv. Mater.* 2009, 21, 4071.

[41]S. Bhaskar, K. M. Pollock, M. Yoshida, J. Lahann, *Small* 2010, 6, 404.

[42]B. Liu, D. Wang, *Langmuir* 2012, 28, 6436.

[43]J. W. Boley, E. L. White, R. K. Kramer, *Adv. Mater.* 2015, 27, 2355.

[44]T. R. Lear, S.-H. Hyun, J. W. Boley, E. L. White, D. H. Thompson, R. K. Kramer, *Extreme Mech. Lett.* 2017, 13, 126.

[45]S. Y. Tang, R. Qiao, Y. Lin, Y. Li, Q. Zhao, D. Yuan, G. Yun, J. Guo, M. D. Dickey, T. J. Huang, T. P. Davis, K. Kalantar-Zadeh, W. Li, *Adv. Mater. Technol.* 2018, 4, 1800420.

[46]I. D. Tevis, L. B. Newcomb, M. Thuo, *Langmuir* 2014, 30, 14308.

[47]B. S. Chang, R. Tutika, J. Cutinho, S. Oyola-Reynoso, J. Chen, M. D. Bartlett, M. M. Thuo, *Mater. Horiz.* 2018, 5, 416.

[48]T. Hutter, W. A. C. Bauer, S. R. Elliott, W. T. S. Huck, *Adv. Funct. Mater.* 2012, 22, 2624.

[49]D. Wang, C. Gao, W. Wang, M. Sun, B. Guo, H. Xie, Q. He, *ACS Nano* 2018, 12, 10212.

[50]Y. Lin, Y. Liu, J. Genzer, M. D. Dickey, *Chem. Sci.* 2017, 8, 3832.

[51]A. A. Aly, *Int. J. Mater. Chem.* Phys. 2015, 1, 132.

[52]F. A. Morrison, H. H. Winter, W. Gronski, J. D. Barnes, *Macromolecules* 1990, 23, 4200.

[53]Y. Takahashi, S. Yahata, A. Takano, Y. Matsushita, *Nihon Reoroji Gakkaishi* 2006, 34, 177.

[54]R. W. Style, R. Boltyanskiy, B. Allen, K. E. Jensen, H. P. Foote, J. S. Wettlaufer, E. R. Dufresne, *Nat. Phys.* 2015, 11, 82.

[55]Y. Nagasaka, A. Nagashima, *J. Phys. E: Sci. Instrum.* 1981, 14, 143 5.

[56]S. Yu, M. Kaviany, *J. Chem. Phys.* 2014, 140, 064303.

4.4. Options and Alternatives

As discussed herein, the foregoing embodiments are non-limiting examples of aspects of the invention. Variations, including variations obvious to those skilled in the art, will be included within the invention.

4.4. Options and Alternatives

As discussed herein, the foregoing embodiments are non-limiting examples of aspects of the invention. Variations, including variations obvious to those skilled in the art, will be included within the invention.

The Specific Example above discusses some options and alternatives.

Other examples of options and alternatives are as follows:
Elastomer Used in the Composite The elastomer used in the composite material can vary so long as it meets the following general rule: stretchable and capable of being annealed to remove residual stress.

Non-limiting examples are block copolymer elastomers, styrene ethylene butylene styrene, thermoplastic elastomers, propylene-ethylene co-polymer, polyurethane, polyacrylate, and natural latex rubber. See, also, examples at incorporated by reference US 2017/0218167A1); Bartlett et al. PNAS 2017; Tutika, et al., Adv. Funct. Mater. 2018; and Jeong, et al, Scientific Reports 2015.

Liquid Metal Used in the Composite

The liquid metal used in the composite material can vary so long as it meets the following general rule: the liquid metal should be compatible with the elastomer matrix such that droplets can be dispersed.

Non-limiting examples are eutectic gallium indium, gallium-indium-tin, gallium, Indalloy, NewMerc, mercury, and a eutectic alloy.

See, also, examples at incorporated by reference US 2017/0218167A1); Bartlett et al. PNAS 2017; Tutika, et al., Adv. Funct. Mater. 2018; and Jeong, et al, Scientific Reports 2015.

Technique(s) of Creating the Suspension of Liquid Metal Generally Spherical or Randomly Shaped, Sized, and Oriented Droplets in the Elastomer The technique(s) of mixing elastomer pre-cursor and liquid metal, including concentration/load of liquid metal, and forming a stress-free preliminary suspension with distributed generally spherical liquid metal droplets can vary so long as it meets the following general rule(s): the liquid metal can be dispersed as droplets in the elastomer matrix.

See, also, examples at incorporated by reference US 2017/0218167A1); Bartlett et al. PNAS 2017; Tutika, et al., Adv. Funct. Mater. 2018; and Jeong, et al, Scientific Reports 2015.

As discussed above, the designer can select the amount of LM loading of the mixture for different functional outcomes.

The Specific Example gives information about how different loadings can affect properties or performance of the end composite. In general, loadings of just above 0% to 99% are possible, but just above 0% to 70% are likely, and most times 30% to 70% would be considered.

As mentioned above, a designer can consider additional materials to be added to the composite. Non-limiting examples include solid particles or shaped materials or filler (e.g., wires) that produce specific physical or functional properties for the composite.

As discussed above, aspects according to the invention can apply to other composites of elastomer and liquid metal inclusions, including those created with a variety of loadings of either polydisperse LM inclusions and/or randomly sized and/or shaped and randomly oriented LM inclusions.

Technique(s) of Deforming the Preliminary
Composite Prior to Annealing

The technique(s) of selectively deforming the preliminary composite (direction, amount, etc.) can vary so long as it meets the following general rule(s): deformation is induced in the composite such that it changes the original general LM inclusion shapes from before deformation of the elastomer. In certain embodiments, this involves deformation induced in the composite such that the droplets in the LM inclusions elongate for, in some situations, increase in thermal conductivity properties of the final composite.

See, also, examples at incorporated by reference US 2017/0218167A1); Bartlett et al. PNAS 2017; Tutika, et al., Adv. Funct. Mater. 2018; and Jeong, et al, Scientific Reports 2015.

As discussed above, the LM inclusion shaping of the annealed-deformation shaping of the LM inclusions can take many forms and embodiments. The deformation part of the shaping can include non-limiting examples of uni-axial stretching, bi-axial stretching, multi-axial stretching in the direction of thickness or in the direction of width and/or length or both, or even compression in one or more directions. One example of a set-up uses a tensile test machine and conventional ways to couple the elastomer with LM inclusions to the machine, which allows a range of highly-controllable motion of the couplings towards or away from each other. The stretching or compressing can be in a single step or multiple steps. In many cases the deformation is mechanical deformation in the sense mechanical components are actuated relative to the composite. The invention is not necessarily limited thereto.

And as discussed above, the deformation part of the shaping can be any that changes the shape of the LM inclusions generally and differently than before shaping, which can include any difference in shape to relatively extreme elongation directionally (e.g., to needle-like) but is not necessarily limited thereto. Any elongation can increase thermal conductivity of such composites. The designer can program an estimated amount of elongation shaping according to need or desire just relative to thermal conductivity, or with consideration of other results of such shaping. Thus, if starting LM inclusions before shaping are generally spherical, any inducement of the starting composite to influence LM inclusion shapes to elongate even some but in a non-random generally common direction can be beneficial to improved thermal conductivity. FIG. 18 diagrammatically illustrate uniaxial stretching to achieve some common elongation of a statistically-significant number of LM inclusions whether or not the starting composite 17 includes all generally spherical LM inclusions 19A or a polydisperse (dif-ferent sizes) of spherical LM inclusions 19A and/or polydisperse, or not, non-spherical LM inclusions 19B. FIG. 18 are illustrative and not to scale and show a combination of the starting composite 17 with a plurality of internal LM inclusions 19. Only one generally spherical inclusion 19A and one non-spherical 19B are illustrated for clarity. As discussed herein, and as well-known to those skilled in the art, any deformation of elastomer 18, will induce not only changes in dimensions of the elastomer (e.g., length, width, thickness), but a proportional change of shape and dimensions (e.g., length, width, and/or thickness) of the LM inclusions. A simple example is that if an elastomer like a rubber band is stretched uniaxially in the axis of its length, a pin hole through its thickness would elongate in that direction of stretch (e.g., become more ellipsoid), but the thickness of the rubber band also reduces. This produces both a more elongated hole, but also narrower in both transverse directions, which produces a hole that has a volumetric space that is thinner than the starting pinhole in the direction of stretching but thinner than the starting hole in the traverse directions. As will be appreciated, just uniaxial stretching of a rubber band with a pin hole produces a shaped hole that is thinner in longitudinal and both transverse directions (changes from a transverse hole through the thickness to a more needle-like hole in longitudinal and both transverse directions).

As will be appreciate by those skilled in the art, the same is generally true of an inclusion in an elastomer. It is important to note that any stretching or compression of the elastomer in a uniaxial direction tends to induce elongation in either longitudinal direction of stretch or orthogonal to direction of compression. But it likewise tends to induce either thinning of the cross-section of the elastomer (in the case of stretching) or thickening of cross-section (in the case of compression), either of which can accentuate the three-dimensional elongation of the inclusion. In other words, in the case of uni-axial stretching an elastomer with well-distributed generally similar spherical LM inclusions throughout, this will influence or induce those LM inclusions away from generally spherical towards elongation in direction of stretch and thinning in both traverse directions to direction of stress. Both effects induce 3D elongation and moving toward needle-like from generally spherical. This tends to preserve the same overall volumetric space of the starting LM generally spherical inclusions, such that the liquid metal occupies that same overall volumetric space. There is no substantial internal volumetric space of the LM inclusions when stretched that is not occupied by liquid metal.

Thus, it is to be understood that aspects and embodiments according to the invention can involve any techniques to apply forces to the starting composite 17 that would cause deformation of the elastomer 17 in a manner which would influence a change of shape, generally, to the LM inclusions 19, whether in the form of 19A or 19B or a combination of both. Once some deformation of the composite is accomplished, annealing is applied to lock in the reshaped LM inclusions. The designer, therefore, is given flexibility to influence the re-shaping of LM in any of a variety of ways. Still further, it will be understood by those skilled in the art that the re-shaping can be basically mechanical in the sense the starting composite is influenced by forces that alter the shape of the elastomer, and thus alter the shapes of the LM inclusions, and such typically requires forces that stretch and/or compress the composite, which typically involves some type of mechanical coupling to the composite and imposition of mechanical energy relative the composite. But it is important to note that the imposition of mechanical energy can be actuated in a number of ways. Some could be purely mechanical (e.g., manually turning of a screw or other mechanical advantage combination to move clamps on the composite towards or away from each other). Some could be electro-mechanical (e.g., some electrically powered actuator to move at least one clamp on the composite away from or towards another clamp at an opposite side of the composite; one example of uni-axial movement being a linear actuator). Some could include liquid or air pressure, magneto restrictive, magnetic, or other forms of influencing the starting composite, or combinations of the same.

FIG. 18 illustrates some of the foregoing for deformation prior to annealing by uniaxial stretching in the following highly diagrammatic way. Some form of coupling 72A and 72B to the composite 17 (e.g., clamps across at least most of opposite ends or sides of composite 17) are established. They could take different forms so long as any relative separation between 72A and B would generally stretch the whole composite 17. Stretching can be by some technique that moves one or both of couplings (e.g., clamps) 72A and B so that the separation distance is increased along the axis between them. FIG. 18 shows just one generally spherical LM inclusion 19A and just one non-spherical randomly-oriented LM inclusion 19B for illustration purposes only, and totally out of scale to the actual dimensions of elastomer 18. Perspective, view, FIG. 18 tries to help illustrate the following concepts.

The starting composite material 17 before shaping and annealing could have the elastomer 18 in any of a variety of form factors (regular shapes and sheet-like, film-like, or block form, or irregular shapes), and include a plurality of LM inclusions 19A and/or 19B.

At least one coupling means 72 couples to at least one portion of the composite 17, and also couples to some means or form of actuation. In on example, the actuation moves coupling means 72 in space in a direction to apply force on composite 17 that deforms it. A few non-limiting examples are shown in FIGS. 18 through 23.

In FIG. 18, a starting composite form factor before deformation and annealing is sheet-form (longer and wider than thick) has couplers 72A and 72B and opposite ends. General shapes of single LM inclusions 19A and 19B (to roughly and diagrammatically illustrate their starting shapes) are shown in greatly enlarge scale to actual. LM inclusion 19A is generally spherical. LM inclusion 19B is non-spherical and elongated in a random direction which as oblique to the longitudinal axis between ends of composite 17.

In FIG. 19, actuation force(s) of at least one coupler 72A and 72B in one or more actuation directions 74A and/or 74B increase the separation distance between couplers 72A and B along its longitudinal axis between ends. This changes undeformed composite 17 into uni-axially stretched composite 37 which, in turn, induces a change of shape from the starting LM inclusions 19A and 19B to inclusions 39A and 39B, which are primarily elongated in the actuation direction(s) (see arrows showing primary directions of deformation 75). Because stretched elastomer 38 is also thinner than starting elastomer 18, both inclusions 39A and 39B are also thinned somewhat in a transverse direction (see arrows showing secondary directions of deformation 77). The specific change of shape of LM inclusion 39B is not possible to show in these drawings. Both LM inclusions 39A and 39B are thus deformed away from their starting undeformed shapes 19A and 19B. Inclusion 39A is elongated and thinned in direction of stretch. Inclusion 39B is elongated and thinned in direction of stretch, however, because of its starting shape, it still remains oblique to the longitudinal axis between ends of composite 37. It is to be understood that the elongation of LM inclusion 39A is a shaping that can improve thermal conductivity through composite 37 in direction of stretch, and the amount of stretch can allow a designer to program that function. But it is to be also understood, that there may be other reasons to uni-axially stretch a sheet-like composite to induce elongation of LM inclusions in a direction throughout the composite. It is to be understood that randomly-oriented non-spherical LM inclusions can be shaped by uni-axial stretching. There is some common directional reshaping, but the oblique starting elongation generally remains. It is possible that stretching would improve thermal conductivity in the direction of stretch of the composite 37 as a whole as the stretching does generally influence all LM inclusions in the same direction. And, if the starting composite 17 had both generally spherical and non-spherical LM inclusions, uni-axial stretching would at least directionally elongate the generally spherical LM inclusions. But it is to be also understood that there may be other reasons to uni-axially stretch to shape randomly-oriented non-spherical LM inclusions.

In FIG. 20, reshaping LM inclusions 39A and 39B by uni-axial compression is diagrammatically illustrated. Actuation of one or more of couplers 72A and B to bring separation distance closer, would squeeze elastomer 38 and cause elongation of the LM inclusions in a direction transverse to the longitudinal axis of composite 37. The LM inclusions would be influenced to elongate in a primary transverse direction, and the elastomer compression would influence the LM inclusions to thin in that transverse direction.

In FIG. 21, reshaping is by a set up to allow bi-axial stretching. An additional coupler or set of couplers 72C and D couple to one or more opposite sides of starting composite 17, along with 2 couplers 72A and B at opposite ends as in FIG. 20. As will be appreciated, separation distance between the different sets of couplers 72A/B and 72C/D can be controlled to further influence shaping of any type of LM inclusions.

In FIG. 22, increasing separation between couplers 72A/B and 72C/D, with separation distance increased more between couplers 72C/D than 72A/B, would elongate the LM inclusions 39A and 39B in that direction. But controlled separation of couplers 72A/B could resist thinning in that direction. There may be situations where this is desirable, for thermal conductivity programming and/or other functional programming.

In FIG. 23, couplers 72C/D are brought closer together while couplers 72A/B are moved farther apart. By control of these bi-axial movements, composite 37 is compressed in one direction (between couplers 72C/D) and stretched in another (between couplers 72A/B). This combination of bi-axial forces would tend to induce elongation and thinning of the LM inclusions 39A and B because stretching does so and compression in the transverse direction induces elongation in a direction transverse to the direction of compression.

But, as will be understood by those skilled in the art, uniaxial directional elongation of a starting LM inclusion will both lengthen the inclusion along its primary axis (in the direction of deformation to cause the elongation) but also narrow its width in transverse directions. This is a result of stretching an elastomer. What will be further understood is that other ways of deformation could also induce increased elongation of LM inclusions to a statistically-significant degree in the composite. For example, compressing the composite in the direction of one axis would narrow the inclusion in that direction, but it would lengthen the inclusion in an orthogonal direction. The compressed direction would be the minor axis and the orthogonal axis perpendicular to it would become the major axis in the direction of elongation. A still further example would be multiaxial stretching and/or compressing. By appropriate coordination of forces on the composite, the LM inclusions can be influenced into a variety of shapes different than before application of those forces into shapes that can be beneficial according to desire or need. One example is that at least a statistically-significant number of LM inclusions would have at least a generally common directionally elongation, even if the deformation re-shapes them by other than just stretching or compressing uni-axially. As can be understood, bi-axial stretching in orthogonal directions to the LM inclusion could widen an inclusion in one direction but flatten it in another. This could result in general directional elongation in a common direction.

There may be uses where elongation is not needed or desired, but a different shaped LM inclusion generally is desired. Aspects of the invention apply to annealed-deformation of LM inclusions for any number of purposes because it is an effective and efficient way to engineer LM inclusion general shape and lock that influenced shape into the composite. For example, bi- or multi-axial stretching and/or compressing can change starting LM inclusion shapes generally for reasons including programmable thermal conductivity, or for purposes other than thermal conductivity. There be other functional reasons such as programming a different electrical or physical property into the composite.

Technique(s) of Annealing the Preliminary Stressed Composite

The technique(s) of annealing (type, temperature, time, conditions, etc.) can vary so long as it meets the following general rule(s): the composite is effectively relaxed. By "effectively relaxed" it is meant that the elastomer of the composite is at least relaxed some from its stressed state after deformation shaping of the LM inclusions. This, of course, includes reducing internal stress in the deformed composite to near fully relaxed, but also includes reducing the internal stress in the mechanically stretched composite to 0% or stress-free. For many applications, near fully relaxed or stress-free will be beneficial and preferred.

As discussed herein, annealing can be accomplished in any manner that effectively relaxes the elastomer to the estimated degree needed or desired. As is known in the art, thermal annealing of polymers relates to heating and allowing it to cool in order to reduce or remove internal stresses. See, e.g., Di Vona M. L. (2014) Annealing of Polymer Membranes. In: Drioli E., Giorno L. (eds) Encyclopedia of Membranes. Springer, Berlin, Heidelberg. https://doi.org/10.1007/978-3-642-40872-4_627-1, incorporated by reference here, which discusses annealing in the context of polymer members.

As discussed above, whether by trial or error, empirical testing, information from others' work or from the manufacturer of an elastomer, the designer can determine an annealing technique effective for a given desired end composite and/or its intended end use. This can involve annealing to make the elastomer and LM inclusions precisely stress free, close to completely stress-free, near stress-free, or some intermediate state of stress that is less than when mechanically shaped before annealing. The designer can select the amount of stress-reduction based on need or desire. In many cases, it is beneficial to anneal to be effective to be at least close to stress-free. The annealing can be thermal annealing in an oven with a highly-controllable range of temperatures. Other thermal annealing set-ups are possible. Chemical annealing is possible, or a combination of thermal and chemical annealing See also references [51]-[53] in the bibliography above, namely, A. A. Aly, *Int. J. Mater. Chem. Phys.* 2015, 1, 132; F. A. Morrison, H. H. Winter, W. Gronski, J. D. Barnes, *Macromolecules* 1990, 23, 4200; and Y. Takahashi, S. Yahata, A. Takano, Y. Matsushita, *Nihon Reoroji Gakkaishi* 2006, 34, 177, which discuss annealing and are incorporated by reference herein. Generally, annealing conditions vary depending on the polymer. Many polymers can be thermally annealed. Solvent annealing could also be possible.

Form Factor of the LMPE

As will be appreciated by those skilled in the art, the final form factor of the LMPE composite for use can vary according to need or desire. It can be in sheet form. It can be in block form. It can be in a variety of 3D shapes. It can be originally processed into LMPE and then cut into pieces, portions removed and used, or otherwise further shaped. Pieces of it can be used individually or combined.

Ends Uses and Applications

Several non-limiting examples of use of LPME composite according to aspects of the invention have been discussed herein. As will be appreciated by those skilled in the art, applications and end uses can include those that would benefit from one or more of the functional properties of the LPME composite.

A few examples are:
a. Applying the stress-reduced annealed elastomer and elongated droplets and inclusions to a heat generating surface for thermal conduction from the heat generating surface.
b. The heat-generated surface could be a thermal interface material (TIM).
c. The TIM could be operably used with:
    i. a shape memory alloy (SMA) actuator or other heat generating actuators;
    ii. a heat generating electrical circuit;
    iii an LED or other heat generating light source;
    iv. a computer processor or other heat generating electronic components; or
    V. Heat Generating Energy Sources.

Of course, other uses or applications are possible that take advantage of one or more of the functional properties of LPME.

See, also, examples at incorporated by reference US 2017/0218167A1); Bartlett et al. PNAS 2017; Tutika, et al., Adv. Funct. Mater. 2018; and Jeong, et al, Scientific Reports 2015. Non-limiting examples include use of LMPE in or with sensors, interconnects, electrical or electronic circuits or components, optical components, microfluidics, and other.

As can be seen from the foregoing, LMPE according to aspects of the invention can be engineered balancing a number of factors including type of elastomer, type of LM, loading of the LM and intended end use.

Loading can be almost any loading, from just above 0% to just under 100%. One non-limited range is just above 0% to 80%. Another is on the order of 30% to 70%.

Parameters can be adjusted, including LM inclusion size. There is not necessarily a technical limitation on such size. They can be quite small (e.g., on nano-scale) to larger. If nanoscale (e.g., 5 nm in longest aspect) there may be difficulties in obtaining uniformity. One non-limiting size range is on the order of 100 nm to on the order of 100 μm).

Programmed aspect ratio of LM inclusions can be according to need or desire. One range ratio is (just above 1):1. As discussed herein, embodiments according to aspects of the invention can be produced with aspect ratios of on the order of (just above 1):1 to on the order of 10:1, and sometimes greater.

What is claimed is:

1. A composite comprising:

an elastically deformed and annealed elastomer of a class of elastomers which are annealable to remove stress, wherein the elastically deformed and annealed elastomer is towards a stress-free state and without substantial unrecoverable plastic strain, and a dispersion of permanent annealed-deformation shaped liquid metal inclusions in the elastically deformed and annealed elastomer, wherein the annealed-deformation shaped liquid metal inclusions are programmed in one or more of size, shape, orientation, and concentration by:

elastically deforming the elastomer with initial embedded liquid metal inclusions to shape the initial embedded liquid metal inclusions from an initial shape to a different shape by applied strain creating internal stress, and then annealing the deformed elastomer with the differently shaped liquid metal inclusions effective to relax the elastomer to remove internal stress while substantially retaining the differently shaped liquid metal inclusions without substantial plastic deformation to form a liquid metal programmable elastomer (LMPE).

2. The composite of claim 1, wherein the elastomer is selected from the group consisting of block copolymer elastomers, styrene ethylene butylene styrene, thermoplastic elastomers, propylene-ethylene co-polymer, polyurethane, polyacrylate, and natural latex rubber.

3. The composite of claim 1, wherein the liquid metal comprises eutectic gallium indium, gallium-indium-tin, gallium, mercury, or a eutectic alloy.

4. The composite of claim 1, wherein the annealing is effective to relax the elastomer to at or near a stress-free state.

5. The composite of claim 1, wherein each inclusion of the dispersion of inclusions has a diameter from nanoscale size to microscale size, or larger.

6. The composite of claim 1, wherein each inclusion of the dispersion of inclusions containing the liquid metal are generally separated by at least a portion of the elastomer.

7. The composite of claim 1, wherein a volume loading of the liquid metal is about just above 0 to on the order of 70%.

8. The composite of claim 1, wherein the composite has a thermal conductivity up to on the order of 13.0 W/mK.

9. A method of fabricating the elastomer composite of claim 1 comprising:

combining an elastomer with a liquid metal, wherein a volume ratio of the elastomer to the liquid metal is between just above 0 to 70 volume percent;

mixing the elastomer and liquid metal until the liquid metal forms generally spherical droplets suspended in generally spherical inclusions in the elastomer;

curing the elastomer;

stretching the cured elastomer and suspended generally spherical droplets in a direction and amount to elongate the spherical droplets and inclusions in the direction of stretching;

annealing the stretched elastomer and elongated droplets and inclusions effective to relax the elastomer to at or near a stress-free state while maintaining the elongated droplets and inclusions.

10. The method of claim 9, further comprising:

mixing the elastomer and liquid metal until the droplets have a generally spherical diameter from nanoscale size to microscale size, or larger.

11. The method of claim 9, wherein mixing the elastomer and liquid metal comprises shear mixing the elastomer and liquid metal.

12. The method of claim 11, wherein the shear mixing uses a dual asymmetric centrifugal mixer.

13. The method of claim 9, further comprising:

creating a pattern in the composite.

14. The method of claim 13, wherein the pattern is created by at least one of 3D printing, soft lithography, laser ablation, and stencil lithography.

15. The method of claim 9 further comprising applying the stress-reduced annealed elastomer and elongated droplets and inclusions to a heat generating surface for thermal conduction from the heat generating surface.

16. The method of claim 9 wherein the heat-generated surface comprises a thermal interface material (TIM).

17. The method of claim 16 wherein the TIM is operably used with one of:

a. a shape memory alloy (SMA) actuator or other heat generating actuators;

b. a heat generating electrical circuit;

c. an LED or other heat generating light source;

d. a computer processor or other heat generating electronic components; and e. heat generating energy sources.

18. A soft elastomer composite comprising:

strain or stress shape-controlled liquid metal inclusions in a stress free state in an elastically deformed and annealed elastomer of the type of elastomer that can be annealed to remove stress wherein the elastically deformed and annealed elastomer is towards a stress-free state and without substantial unrecoverable plastic strain, and a dispersion of permanent annealed-deformation shaped liquid metal inclusions in the elastically deformed and annealed elastomer, wherein the annealed-deformation shaped liquid metal inclusions are programmed in one or more of size, shape, orientation, and concentration by:

elastically deforming the elastomer with initial embedded liquid metal inclusions to shape the initial embedded liquid metal inclusions from an initial shape to a different shape by applied strain creating internal stress, and then annealing the deformed elastomer with the differently shaped liquid metal inclusions effective to relax the elastomer to remove internal stress while substantially retaining the differently shaped liquid metal inclusions without substantial plastic deformation to form a liquid metal programmable elastomer (LMPE).

* * * * *